US012324192B2

(12) United States Patent
Chung et al.

(10) Patent No.: US 12,324,192 B2
(45) Date of Patent: *Jun. 3, 2025

(54) STACKED MULTI-GATE STRUCTURE AND METHODS OF FABRICATING THE SAME

(71) Applicant: Taiwan Semiconductor Manufacturing Co., Ltd., Hsin-Chu (TW)

(72) Inventors: Cheng-Ting Chung, Hsinchu (TW); Hou-Yu Chen, Hsinchu County (TW); Kuan-Lun Cheng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/401,764

(22) Filed: Jan. 2, 2024

(65) Prior Publication Data

US 2024/0170553 A1 May 23, 2024

Related U.S. Application Data

(63) Continuation of application No. 17/332,715, filed on May 27, 2021, now Pat. No. 11,862,701.

(Continued)

(51) Int. Cl.

*H10D 30/67* (2025.01)
*H10D 30/01* (2025.01)

(Continued)

(52) U.S. Cl.

CPC ....... *H10D 30/6735* (2025.01); *H10D 30/024* (2025.01); *H10D 30/6211* (2025.01);

(Continued)

(58) Field of Classification Search

CPC ............ H01L 29/785; H01L 29/78696; H01L 29/42392; H01L 29/0653; H01L 29/41791;

(Continued)

(56) References Cited

U.S. PATENT DOCUMENTS 8,772,109 B2 7/2014 Colinge
8,785,285 B2 7/2014 Tsai et al.

(Continued)

FOREIGN PATENT DOCUMENTS

CN 106328539 A 1/2017
CN 110556374 A 12/2019

(Continued)

*Primary Examiner* — Changhyun Yi

(74) *Attorney, Agent, or Firm* — HAYNES AND BOONE, LLP

(57) ABSTRACT

A semiconductor device according to the present disclosure includes a stack of first channel layers, first and second source/drain (S/D) epitaxial features adjacent to opposite sides of at least a portion of the first channel layers, respectively, a stack of second channel layers stacked over the first channel layers, third and fourth S/D epitaxial features adjacent to opposite sides of at least a portion of the second channel layers, respectively, and a dielectric isolation layer disposed under the first and second S/D epitaxial features. A total active channel layer number of the first channel layers is different from a total active channel layer number of the second channel layers. The dielectric isolation layer is in physical contact with at least a bottommost one of the first channel layers.

20 Claims, 107 Drawing Sheets

Related U.S. Application Data

(60) Provisional application No. 63/059,455, filed on Jul. 31, 2020.

(51) Int. Cl.
*H10D 30/62* (2025.01)
*H10D 62/10* (2025.01)
*H10D 84/01* (2025.01)
*H10D 84/03* (2025.01)

(52) U.S. Cl.
CPC ....... *H10D 30/6219* (2025.01); *H10D 62/116* (2025.01); *H10D 62/121* (2025.01); *H10D 84/013* (2025.01); *H10D 84/0151* (2025.01); *H10D 84/0158* (2025.01); *H10D 84/038* (2025.01)

(58) Field of Classification Search
CPC ..... H01L 21/823418; H01L 21/823431; H01L 21/823481; H10D 30/6735; H10D 30/024; H10D 30/6211; H10D 30/6219; H10D 84/0158
See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 11,862,701 B2 * | 1/2024 | Chung | H01L 27/0688 |
| 2017/0040321 A1 | 2/2017 | Mitard | |
| 2019/0131184 A1 | 5/2019 | Ando et al. | |
| 2019/0148376 A1 | 5/2019 | Chanemougame et al. | |
| 2019/0172828 A1 | 6/2019 | Smith et al. | |
| 2020/0098756 A1 | 3/2020 | Lilak et al. | |
| 2020/0075574 A1 | 5/2020 | Smith et al. | |
| 2020/0219979 A1 | 7/2020 | Rachmady et al. | |

FOREIGN PATENT DOCUMENTS

| | | |
|---|---|---|
| TW | 201921454 A | 6/2019 |
| TW | 201937611 A | 9/2019 |

* cited by examiner

STACKED MULTI-GATE STRUCTURE AND METHODS OF FABRICATING THE SAME

PRIORITY DATA

This is a continuation application of U.S. patent application Ser. No. 17/332,715, filed May 27, 2021, which claims priority to U.S. Provisional Patent Application No. 63/059,455, filed on Jul. 31, 2020, the entire disclosures of which are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high-performance and low-leakage applications. GAA transistors get their name from the gate structure which can extend around the channel region providing access to the stacked semiconductor channel layers on four sides. Compared to planar transistors, such configuration provides better control of the channel and drastically reduces SCEs (in particular, by reducing sub-threshold leakage). The channel region of an GAA transistor is formed from stacked semiconductor channel layers, such as nanowires, nanosheets, other nanostructures, and/or other appreciable variations. The number of stacked semiconductor channel layers is chosen based on device performance considerations, particularly current driving capability of the transistors.

As the semiconductor industry further progresses into sub-10 nanometer (nm) technology process nodes in pursuit of higher device density, higher performance, and lower costs, challenges from both fabrication and design issues have led to stacked device structure configurations, such as complementary field effect transistors (FET). In a complementary FET, semiconductor channel layers of n-type FET (nFET) and p-type FET (pFET) are stacked on top of one another, and numbers of semiconductor channel layers are often the same in each nFET and pFET. However, nFET and pFET usually have different current driving capability. Accordingly, there is a need for numbers of stacked semiconductor channel layers in nFET and pFET to be different to obtain balanced driving currents from a pair of stacked transistors. Therefore, while existing GAA transistor fabrication flow is generally adequate for its intended purposes, it is not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
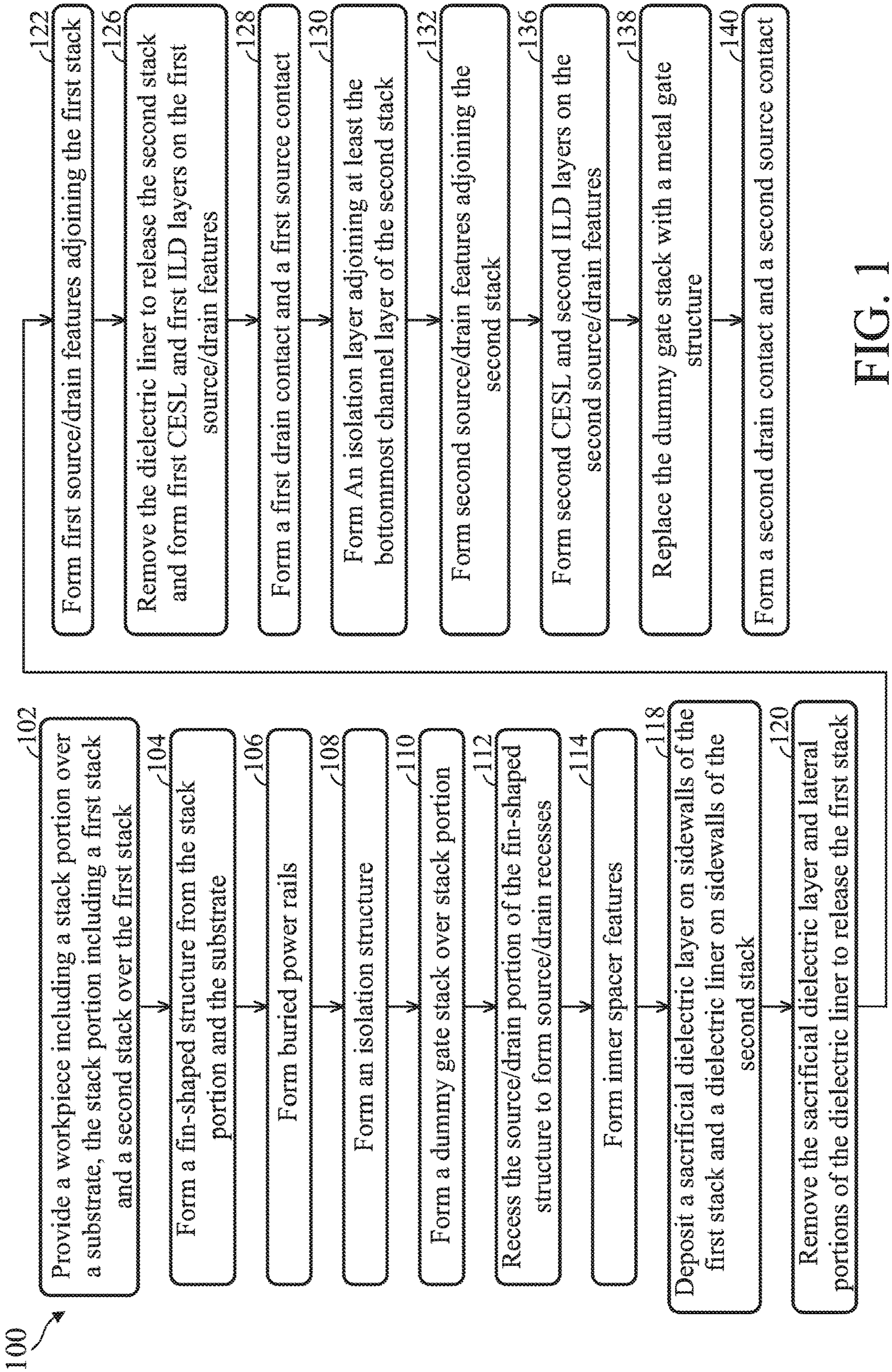
FIG. 1 illustrates a flow chart of a method for forming a semiconductor device having stacked GAA transistors, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to integrate circuit (IC) chips having stacked transistors with different numbers of active channel layers. In various embodiments, at least two gate-all-around (GAA) transistors with different (or varying) numbers of active channel layers are stacked on top of one another. The different numbers of active channel layers help to obtain balanced driving currents from the GAA transistor on the top and the GAA transistor at the bottom. The two stacked GAA transistors may have the same number of semiconductor channel layers (or referred to as channel layers) but at least one or more are floating ones that leads to different numbers of active channel layers, according to various aspects of the present disclosure. The pair of stacked GAA transistors can be of opposite conductivity types, such as one n-type FET (nFET) over one p-type FET (pFET), or vice versa, or of the same conductivity type, such as two stacked nFETs or two stacked pFETs. Further, one IC chip may include two regions, one having stacked GAA transistors with the same number of active channel layers, and another having stacked GAA transistors with different numbers of active channel layers, fitting different application needs on one chip.

The details of the structure and fabrication methods of the present disclosure are described below in conjunction with the accompanied drawings, which illustrate a process of making stacked GAA transistors, according to some embodiments. A GAA transistor refers to a transistor having vertically-stacked horizontally-oriented channel layers, such as nanowires, nanosheets, other nanostructures, and/or other appreciable variations. Stacked GAA devices are promising candidates to take CMOS to the next stage of the roadmap due to their high device density, better gate control ability, lower leakage current, and fully FinFET device layout compatibility. Stacked GAA transistors refer to two or more GAA transistors vertically stacked on one another. The stacked GAA transistors may be of the same conductivity type (n-type or p-type) or different conductivity types (n-type and p-type). Channel layers of the GAA transistors may share the same gate structure, e.g., a common gate structure. Alternatively, each GAA transistor may have its own individual gate structure.

Figure 99:
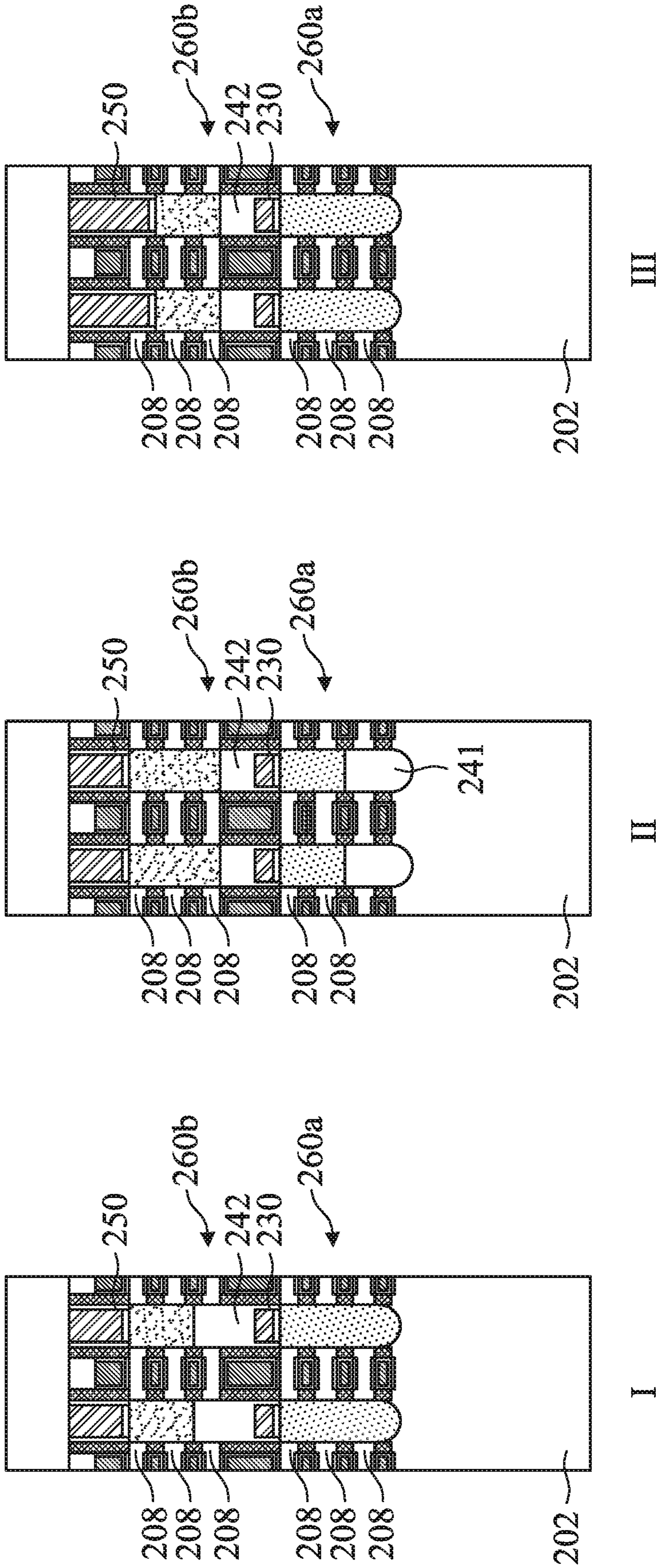
FIGS. 99 and 100 illustrate fragmentary cross-sectional views of a workpiece, according to various aspects of the present disclosure.
Figure 99:
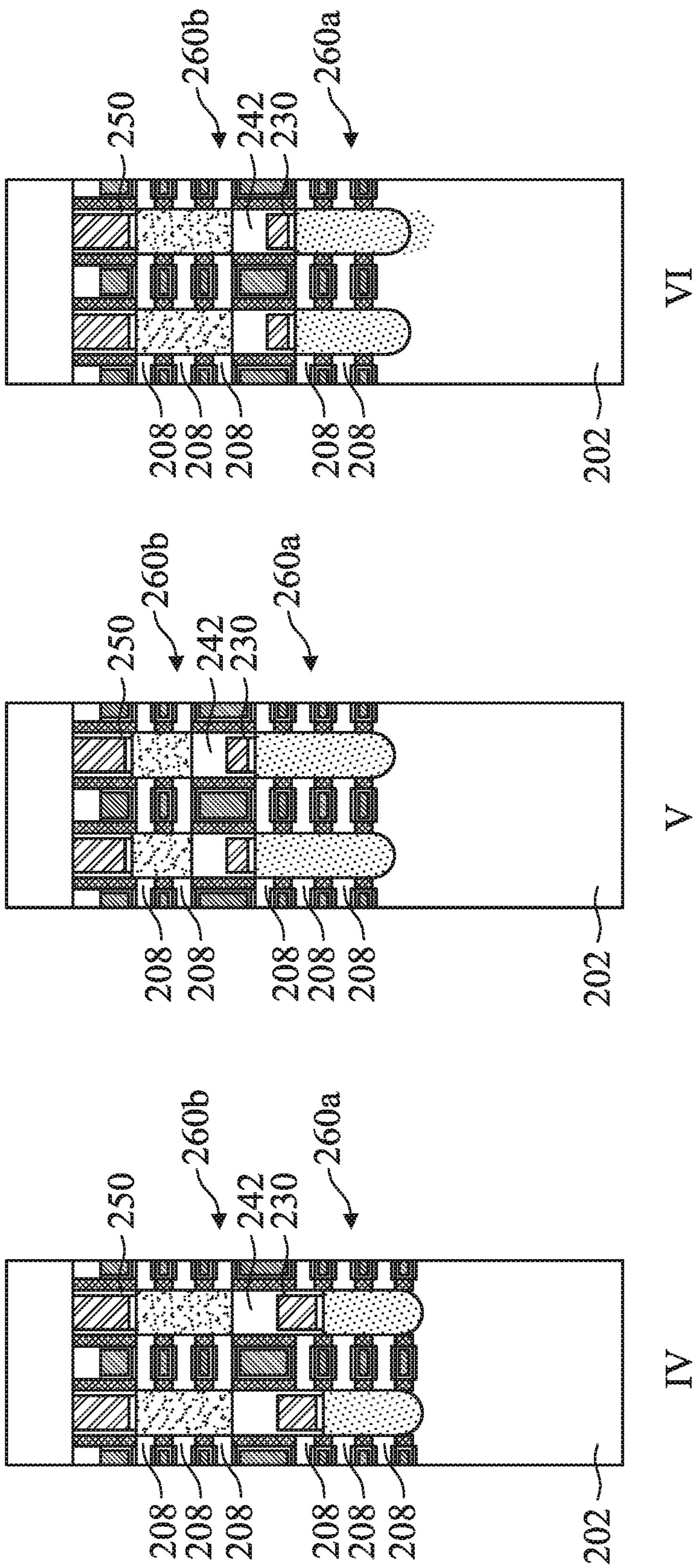
Figure 100:
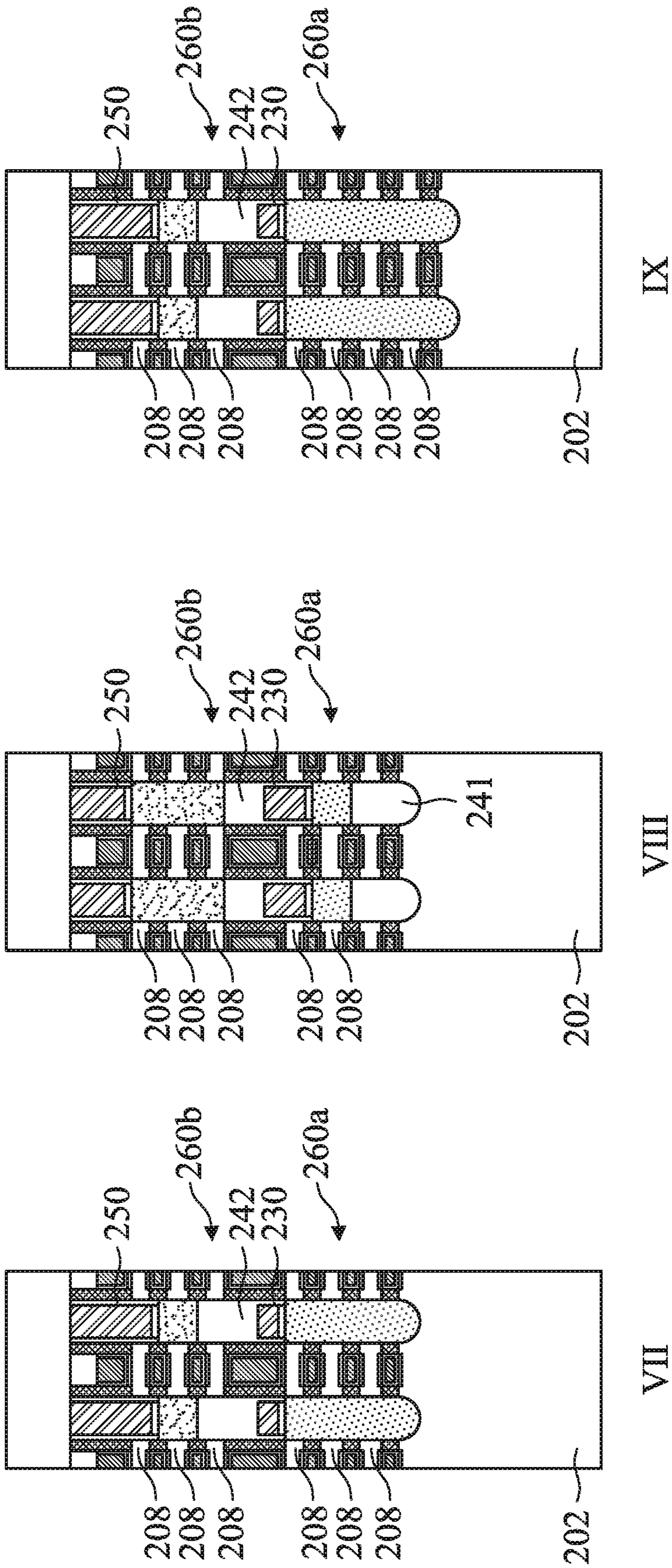
Figure 100:
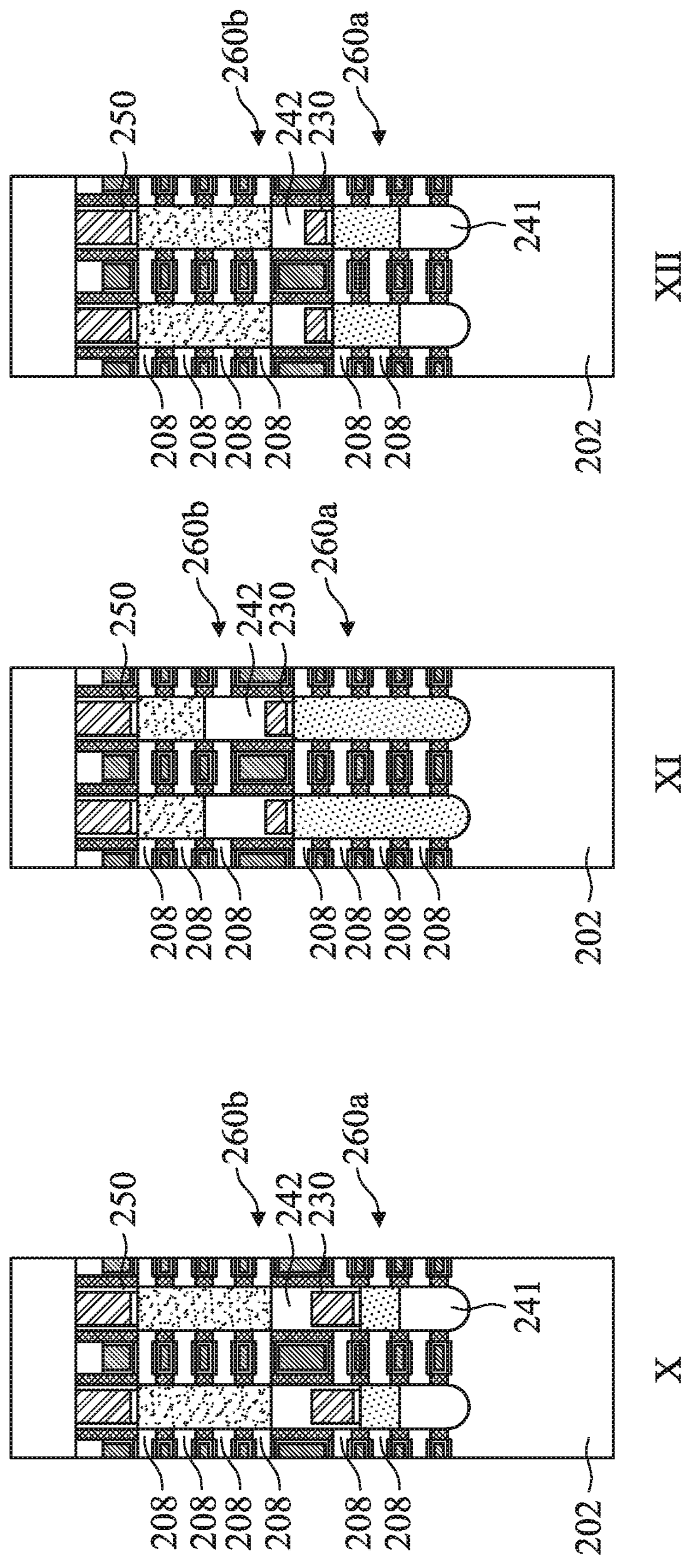
Figure 100:
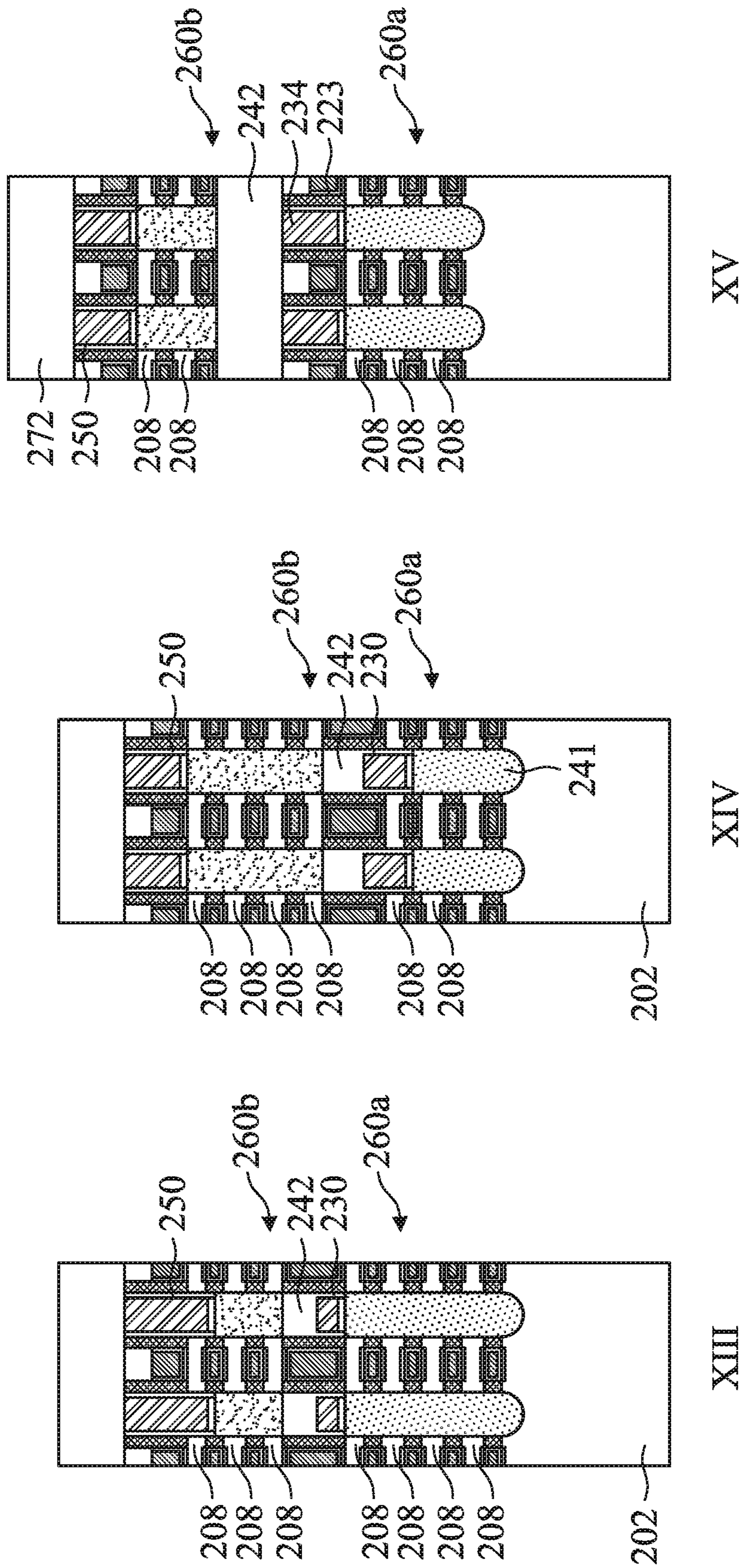

The various aspects of the present disclosure will now be described in more detail with reference to the figures. In that regard, FIGS. 1, 17, 34, 51, 68, and 85 are flowcharts illustrating methods 100, 300, 500, 700, 900, and 1100 of forming a semiconductor device from a workpiece according to embodiments of the present disclosure. Methods 100, 300, 500, 700, 900, and 1100 are merely examples and are not intended to limit the present disclosure to what is explicitly illustrated in methods 100, 300, 500, 700, 900, and 1100. Additional steps can be provided before, during and after the methods 100, 300, 500, 700, 900, and 1100, and some steps described can be replaced, eliminated, or moved around for additional embodiments of the methods. Not all steps are described herein in detail for reasons of simplicity. Methods 100, 300, 500, 700, 900, and 1100 are described below in conjunction with FIGS. 2A-16C, 18A-33C, 35A-50C, 52A-67C, 69A-84C, 86A-98C, respectively, which are fragmentary cross-sectional views of the workpiece at different stages of fabrication according to embodiments of methods 100, 300, 500, 700, 900, and 1100. FIGS. 99-100 provides fragmentary cross-sectional views along a channel region that provide summary and further illustrate alternative embodiments according to various aspects of the present disclosure. For better illustration of various aspects of the present disclosure, each of the figures ending with the capital letter A illustrates a fragmentary cross-sectional view along a channel region (i.e., a cut along a lengthwise direction of a channel layer), each of the figures ending with the capital letter B illustrates a fragmentary cross-sectional view of a source region (i.e., a cut in a source region that is perpendicular to the lengthwise direction of a channel layer), and each of the figures ending with the capital letter C illustrates a fragmentary cross-sectional view of a drain region (i.e., a cut in a drain region that is perpendicular to the lengthwise direction of a channel layer).

Referring to FIGS. 1 and 2A-C, method 100 includes a block 102 where a workpiece 200 is provided. It is noted that because the workpiece 200 will be fabricated into a semiconductor device, the workpiece 200 may also be referred to as the semiconductor device (or device) 200 as the context requires. The workpiece 200 may include a substrate portion 202 and a stack portion 204 disposed above the substrate portion 202. The substrate portion 202 may also be referred to as the substrate 202. Although not explicitly shown in the figures, the substrate 202 may include an n-type well region and a p-type well region for fabrication of transistors of different conductivity types. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. When present, each of the n-type well and the p-type well is formed in the substrate 202 and includes a doping profile. An n-type well may include a doping profile of an n-type dopant, such as phosphorus (P) or arsenic (As). A p-type well may include a doping profile of a p-type dopant, such as boron (B). The doping in the n-type well and the p-type well may be formed using ion implantation or thermal diffusion and may be considered portions of the substrate 202. For avoidance of doubts, the X direction, the Y direction and the Z direction are perpendicular to one another.

Figure 2C:
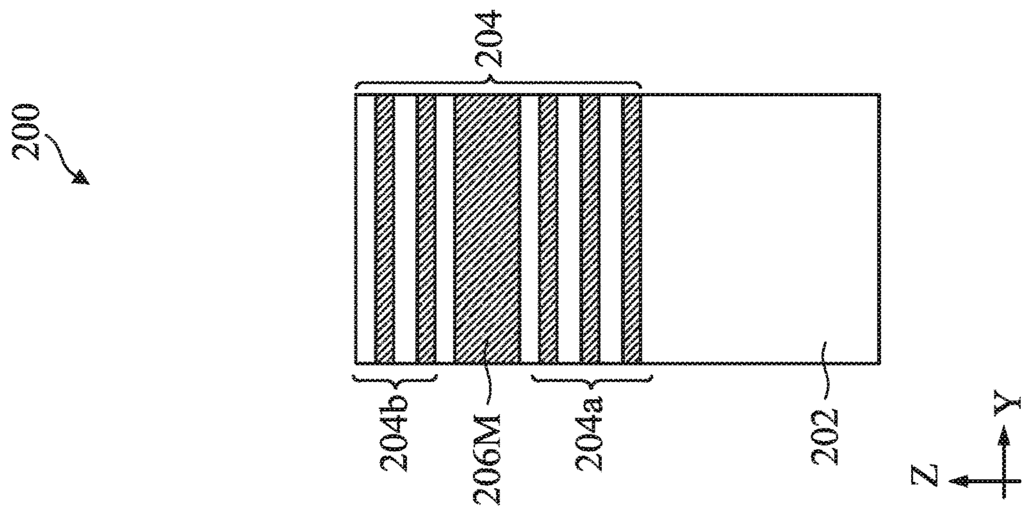
FIGS. 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, and 16C illustrate fragmentary cross-sectional views of a workpiece during a fabrication process according to the method of FIG. 1, according to one or more aspects of the present disclosure.
Figure 2B:
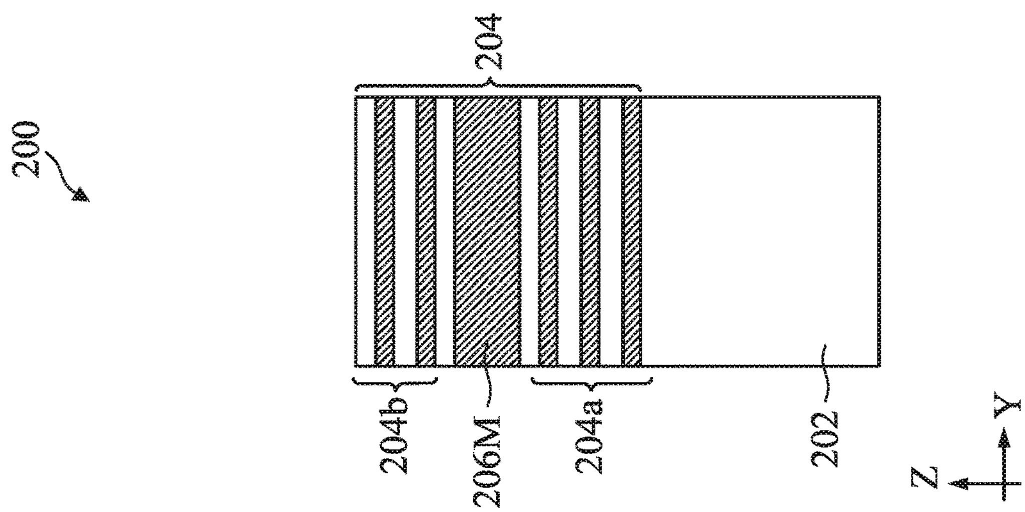
Figure 2A:
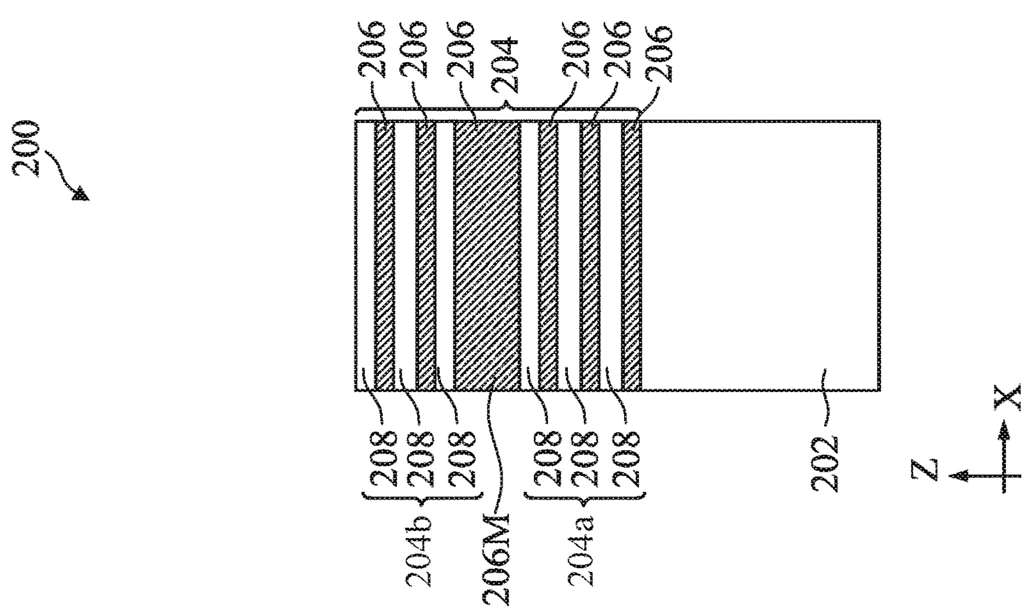

As shown in FIGS. 2A-C, the stack portion 204 includes a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 are epitaxy layers and may be deposited using an epitaxy process. Suitable epitaxy processes include vapor-phase epitaxy (VPE), ultra-high vacuum chemical vapor deposition (UHV-CVD), molecular beam epitaxy (MBE), and/or other suitable processes. The sacrificial layers 206 and the channel layers 208 are deposited alternatingly, one-after-another, to form the stack portion 204. As explained in greater detail below, the channel layers 208 in the bottom portion of the stack portion 204 will provide channel members of a bottom GAA transistor, and the channel layers 208 in the top portion of the stack portion 204 will provide channel members of a top GAA transistor. The term "channel member(s)" is used herein to designate any material portion for channel(s) in a transistor with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. Accordingly, the channel layers 208 in the bottom portion of the stack portion 204 and respective interleaved sacrificial layers 206 collectively define a first stack 204*a*, and the channel layer 208 in the top portion of the stack portion 204 and respective interleaved sacrificial layers 206 collectively define a second stack 204*b*. The one sacrificial layer 206 sandwiched between the first stack 204*a* and the second stack 204*b* is particularly denoted as the middle sacrificial layer 206M. State differently, the first stack 204*a* includes sacrificial layers 206 and channel layers 208 below the middle sacrificial layer 206M, and the second stack 204*b* includes sacrificial layers 206 and channel layers 208 above the middle sacrificial layer 206M.

It is noted that three (3) layers of the channel layers 208 in the first stack 204*a* and an equal number of the channel layers 208 in the second stack 204*b* are illustrated in FIGS. 2A-C, which is for illustrative purposes only and not intended to be limiting beyond what is specifically recited in the claims. It can be appreciated that any number of the channel layers 208 can be independently formed in the first stack 204*a* and the second stack 204*b*. The number of layers depends on the desired number of channels members for the device 200. In some embodiments, the number of the channel layers 208 in each stack is between 2 and 10.

In some embodiments, each sacrificial layer 206 has a thickness ranging from about 2 nanometers (nm) to about 6 nm. The sacrificial layers 206 may be substantially uniform in thickness. Yet in the illustrated embodiment, the middle sacrificial layer 206M is thicker (e.g., double or triple the thickness) than other sacrificial layers 206. In some embodiments, each channel layer 208 has a thickness ranging from about 6 nm to about 12 nm. In some embodiments, the channel layers 208 of the stack are substantially uniform in thickness. The thickness of each sacrificial layer 206 and channel layer 208 is chosen based on device performance considerations.

Figure 3C:
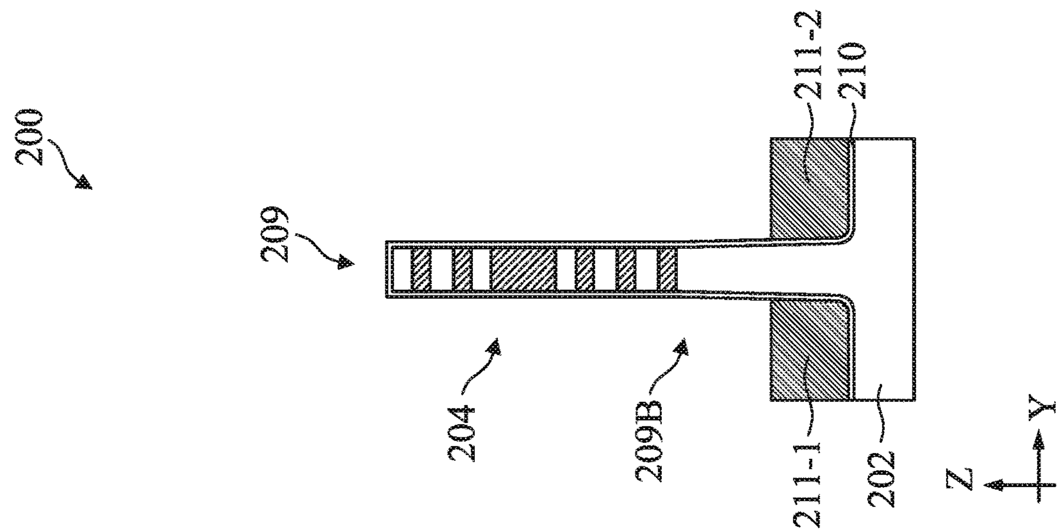
Figure 3B:
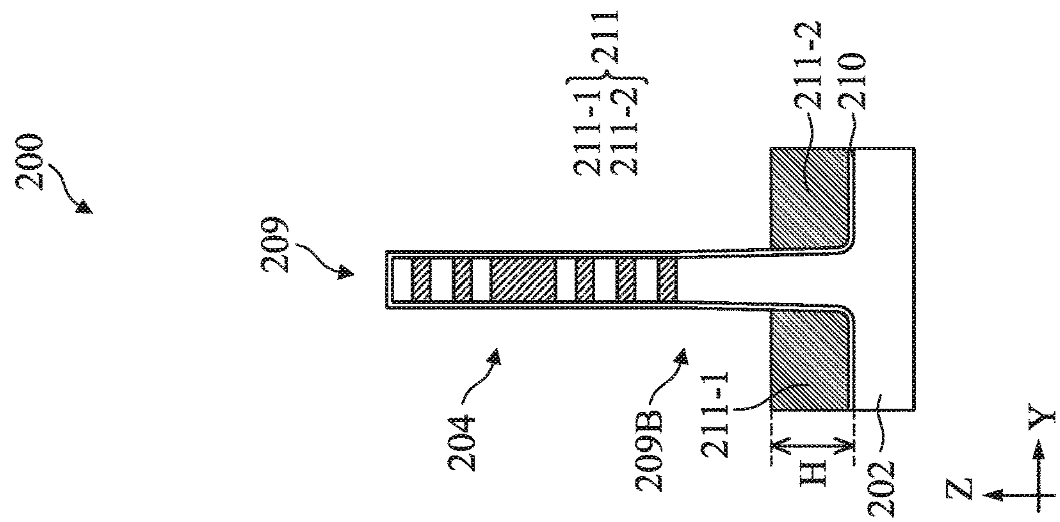
Figure 3A:
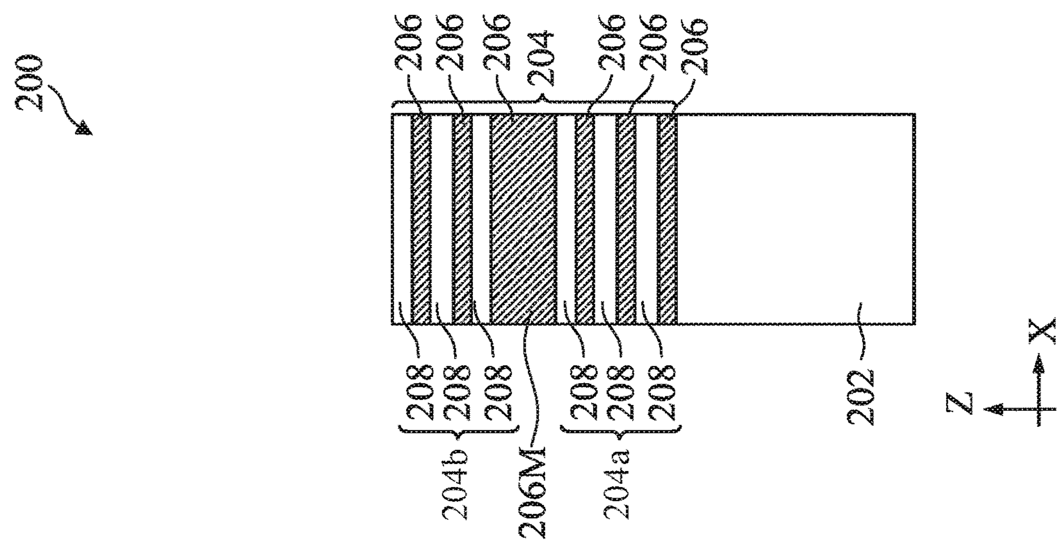

Referring to FIGS. 1 and 3A-C, method 100 includes a block 104 where a fin-shaped structure 209 is formed from the stack portion 204. In some embodiments, the stack portion 204 and a top portion of the substrate 202 are patterned to form the fin-shaped structure 209. For patterning purposes, a hard mask layer may be deposited over the stack portion 204. The hard mask layer may be a single layer or a multilayer. In one example, the hard mask layer includes a silicon oxide layer and a silicon nitride layer over the silicon oxide layer. As shown in FIGS. 3A-C, the fin-shaped structure 209 extends vertically along the Z direction from the substrate 202 and extends lengthwise along the X direction. The fin-shaped structure 209 includes a base portion 209B formed from the substrate 202 and a stack portion 209S formed from the stack of channel layers 208 and interleaved sacrificial layers 206. The fin-shaped structure 209 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 209 by etching the stack portion 204 and the substrate 202. The etching process can include dry etching, wet etching, reactive ion etching (RIE), and/or other suitable processes. In some implementations shown in FIGS. 3A-C, after the fin-shaped structure 209 is formed, a first liner 210 may be deposited conformally over the workpiece 200. The first liner 210 may include silicon nitride and may be deposited using chemical vapor deposition (CVD) or atomic layer deposition (ALD).

Still referring to FIGS. 1 and 3A-C, method 100 includes a block 106 where buried power rails (or referred to as bottom power rails) 211 are formed. In some embodiments, before the first liner 210 is etched back, a metal layer for the buried power rails 211 is deposited over the workpiece 200 using metal-organic CVD or PVD. The deposited metal layer is recessed to form buried power rails 211. The metal layer for the buried power rails 211 may include tungsten (W), ruthenium (Ru), copper (Cu), aluminum (al), silver (Ag), molybdenum (Mo), rhenium (Re), iridium (Ir), cobalt (Co), or nickel (Ni). In the depicted embodiment, each of the buried power rails 211 includes a width W between about 40 nm and 80 nm and a height H between about 30 nm and about 50 nm. As shown in FIGS. 3A-C, the buried power rails 211 includes a first buried power rail 211-1 and a second buried power rail 211-2.

Figure 4C:
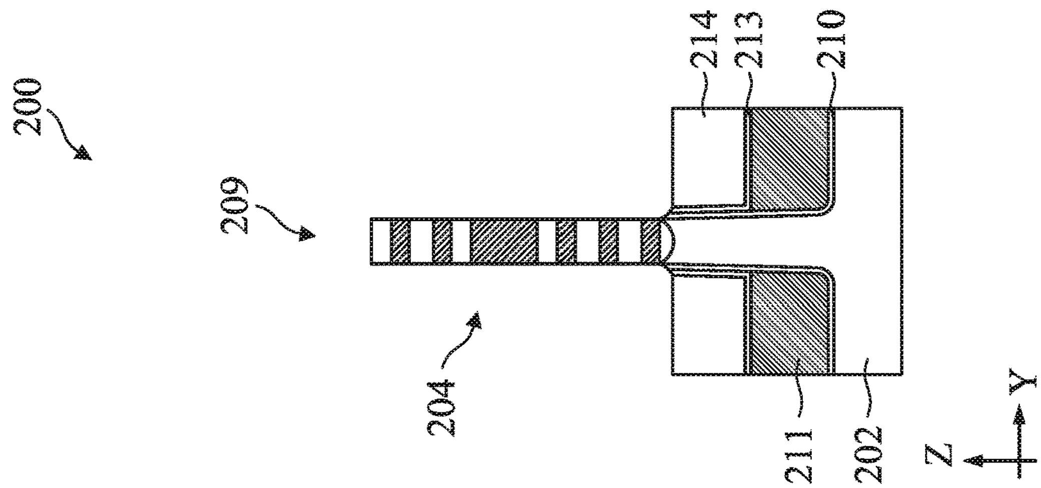
Figure 4B:
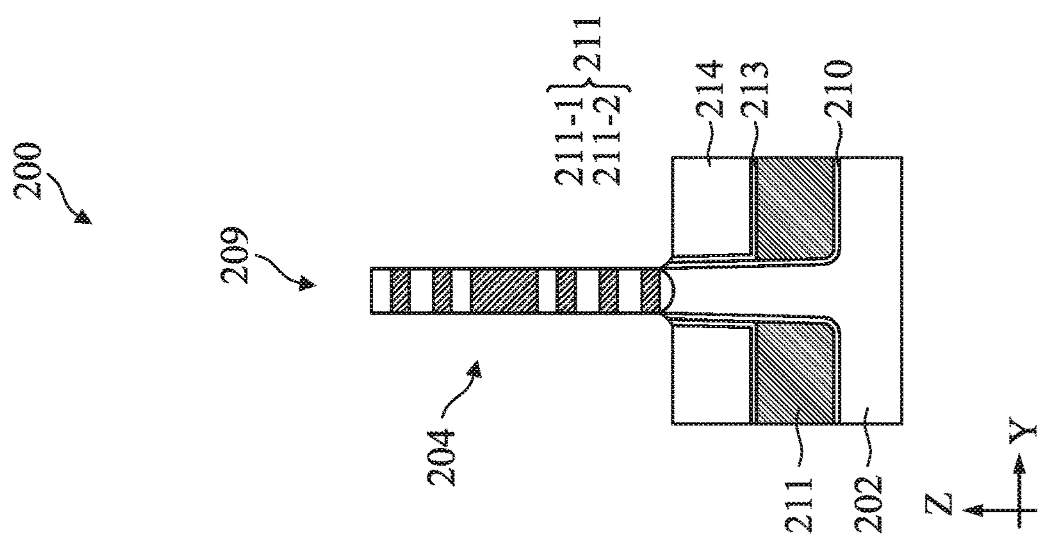
Figure 4A:
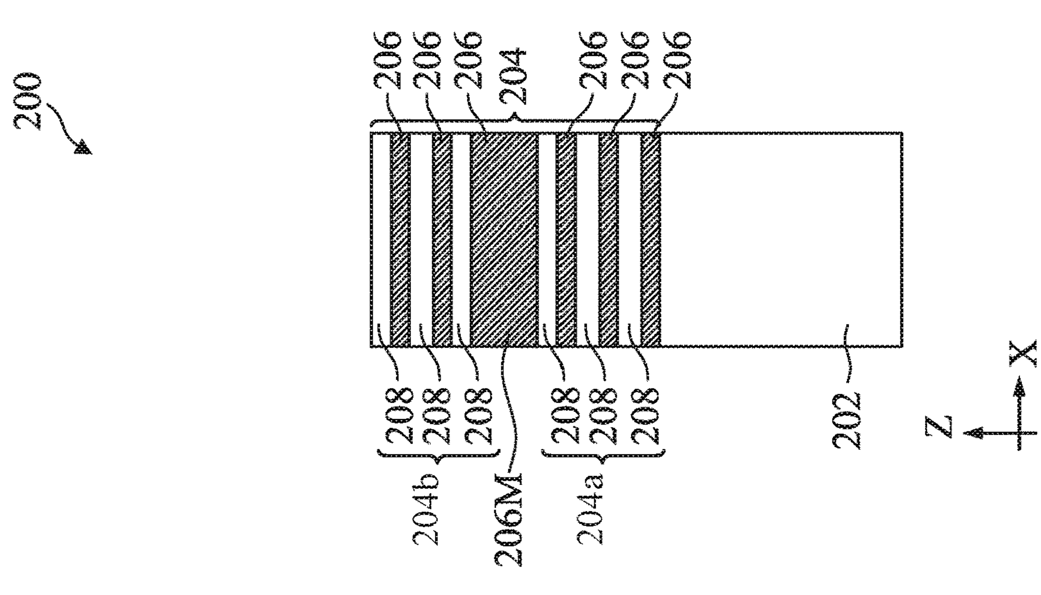
Figure 5C:
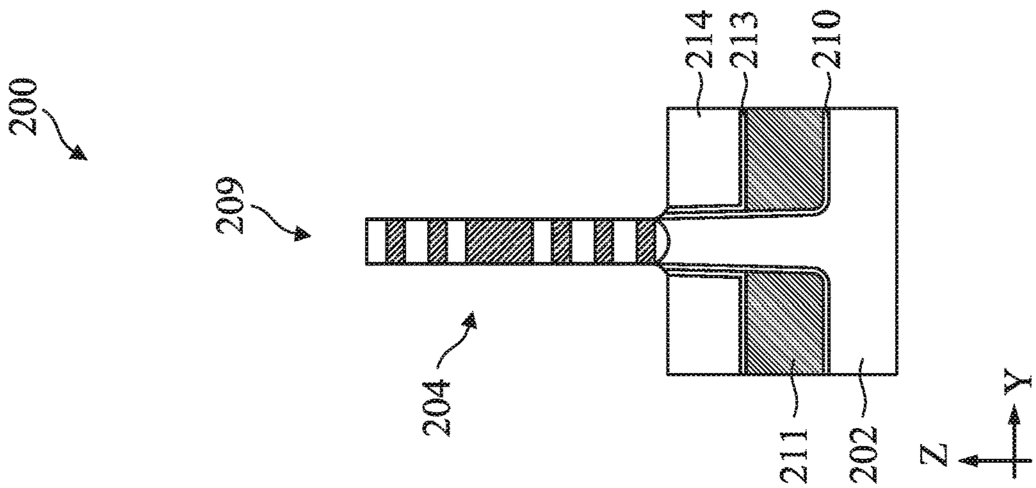
Figure 5B:
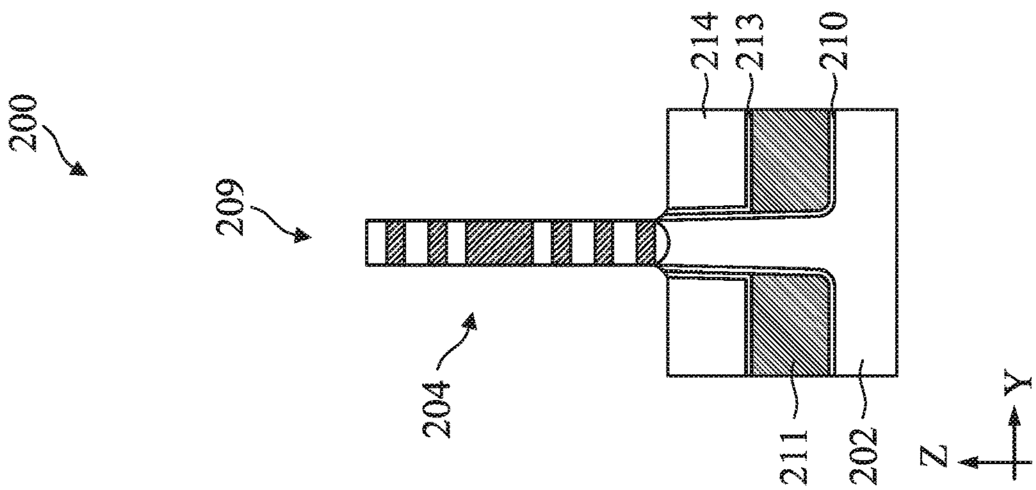
Figure 5A:
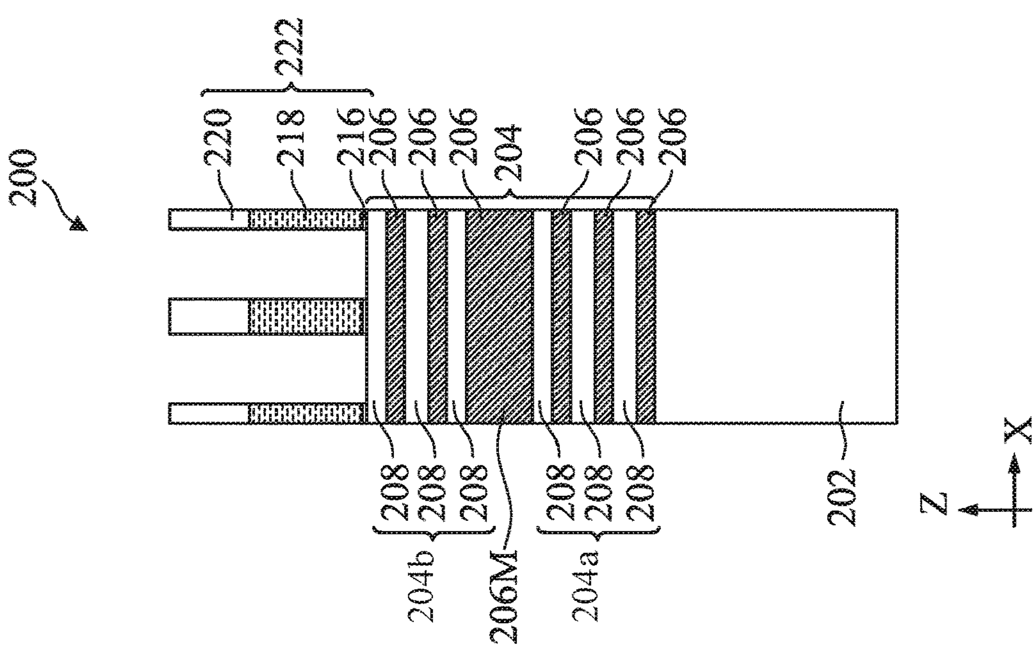

Referring to FIGS. 1 and 4A-C, method 100 includes a block 108 where an isolation feature 214 is formed. In some embodiments, to protect the buried power rails 211 from oxidation, a second liner 213 is deposited over the buried power rails 211. The second liner 213 may be similar to the first liner 210 in terms of composition and formation. As shown in FIGS. 4A-C, the buried power rails 211 are sandwiched by the first liner 210 and the second liner 213. The isolation feature 214 is then formed over the second liner 213. The isolation feature 214 may also be referred to as a shallow trench isolation (STI) feature 214. In an example process, a dielectric material for the isolation feature 214 is deposited over the first liner 210 using CVD, subatmospheric CVD (SACVD), flowable CVD, atomic layer deposition (ALD), physical vapor deposition (PVD), spin-on coating, and/or other suitable process. Then the deposited dielectric material is planarized and recessed until the fin-shaped structure 209 rises above the isolation feature 214. That is, after the recess of the isolation feature 214, the base portion 209B of the fin-shaped structure 209 is surrounded by the isolation feature 214. The dielectric material for the isolation feature 214 may include silicon oxide, silicon oxynitride, fluorine-doped silicate glass (FSG), a low-k dielectric, combinations thereof, and/or other suitable materials. After the isolation feature 214 is formed, the first liner 210 and the second liner 213 are selectively recessed until the stack portion 204 of the fin-shaped structure 209 is exposed.

Referring to FIGS. 1 and 5A-C, method 100 includes a block 110 where a dummy gate stack 222 is formed over the stack portion 204. In some embodiments, a gate replacement process (or gate-last process) is adopted where the dummy gate stack 222 serves as placeholders for a functional gate structure. Other processes and configuration are possible. To form the dummy gate stack 222, a dummy dielectric layer 216, a dummy gate electrode layer 218, and a gate-top hard mask layer 220 are deposited over the workpiece 200. The deposition of these layers may include use of low-pressure CVD (LPCVD), CVD, plasma-enhanced CVD (PECVD), PVD, ALD, thermal oxidation, e-beam evaporation, or other suitable deposition techniques, or combinations thereof. The dummy dielectric layer 216 may include silicon oxide, the dummy gate electrode layer 218 may include polysilicon, and the gate-top hard mask layer 220 may be a multi-layer that includes silicon oxide and silicon nitride. Using photolithography and etching processes, the gate-top hard mask layer 220 is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Thereafter, using the patterned gate-top hard mask 220 as the etch mask, the dummy dielectric layer 216 and the dummy gate electrode layer 218 are then etched to form the dummy gate stack 222. The dummy gate stack 222 extends lengthwise along the Y direction to wrap over the fin-shaped structure 209 and lands on the isolation feature 214. The portion of the fin-shaped structure 209 underlying the dummy gate stack 222 is a channel region. The channel region and the dummy gate stack 222 also define source/drain regions that are not vertically overlapped by the dummy gate stack 222. The channel region is disposed between two source/drain regions along the X direction.

Figure 6C:
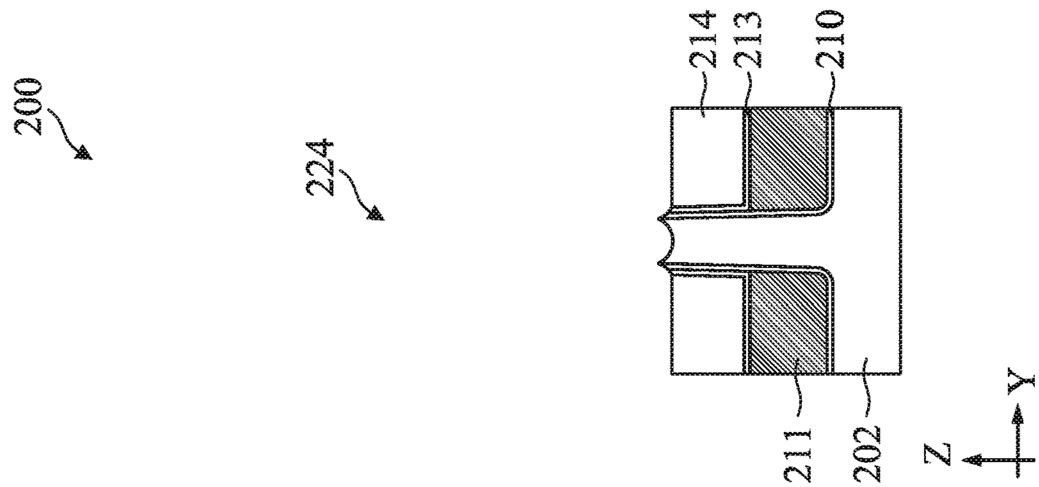
Figure 6B:
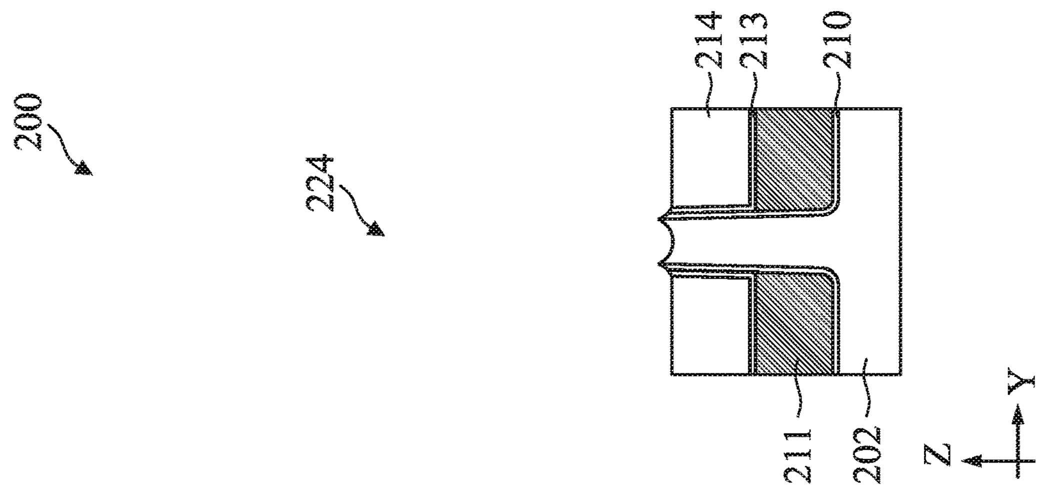
Figure 6A:
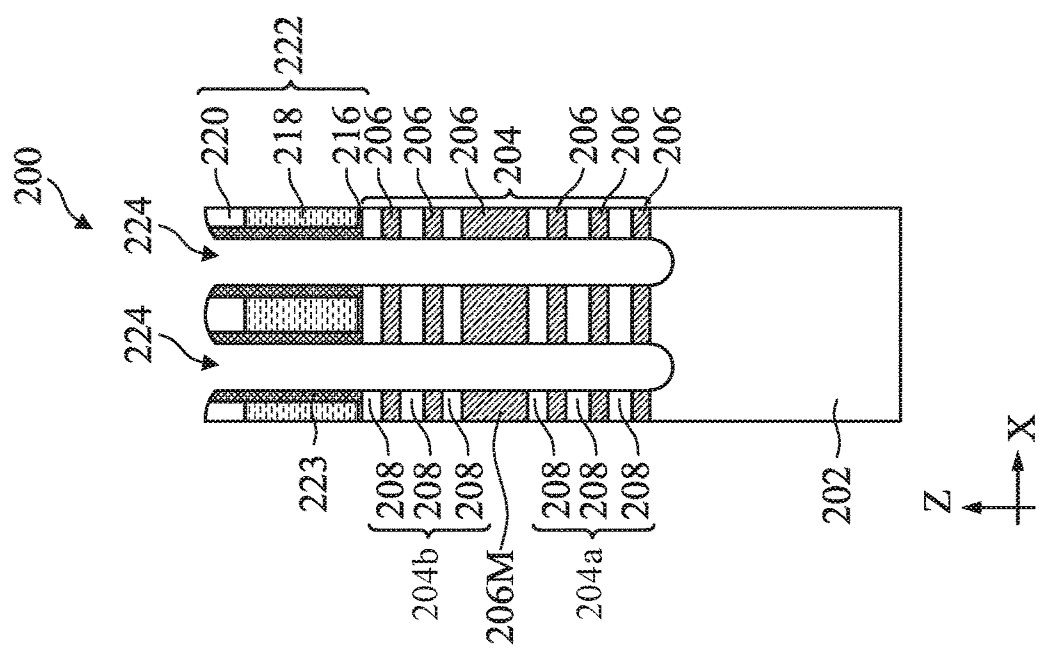

Referring to FIGS. 1 and 6A-C, method 100 includes a block 112 where source/drain portions of the fin-shaped structure 209 are recessed to form source/drain recesses 224. Operations at block 112 may include formation of a gate spacer layer 223 over the sidewalls of the dummy gate stack 222 before the source/drain portions of the fin-shaped structure 209 are recessed. In some embodiments, the formation of the gate spacer layer 223 includes deposition of one or more dielectric layers over the workpiece 200. In an example process, the one or more dielectric layers are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof. In an example process, after the deposition of the gate spacer layer 223, the workpiece 200 is etched in an etch process that selectively recesses the source/drain regions of the fin-shaped structure 209. The selective recess of the source/drain regions results in source/drain trenches 224 between adjacent dummy gate stacks 222. The etch process at block 112 may be a dry etch process or a suitable etch process. An example dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 6A, sidewalls of the sacrificial layers 206 and the channel layers 208 in the channel region are exposed in the source/drain trenches 224.

Figure 7C:
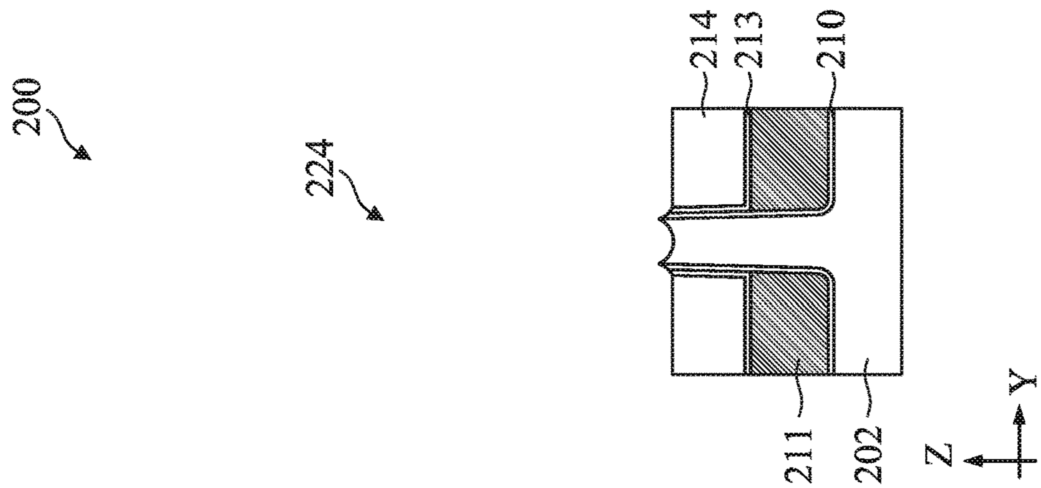
Figure 7B:
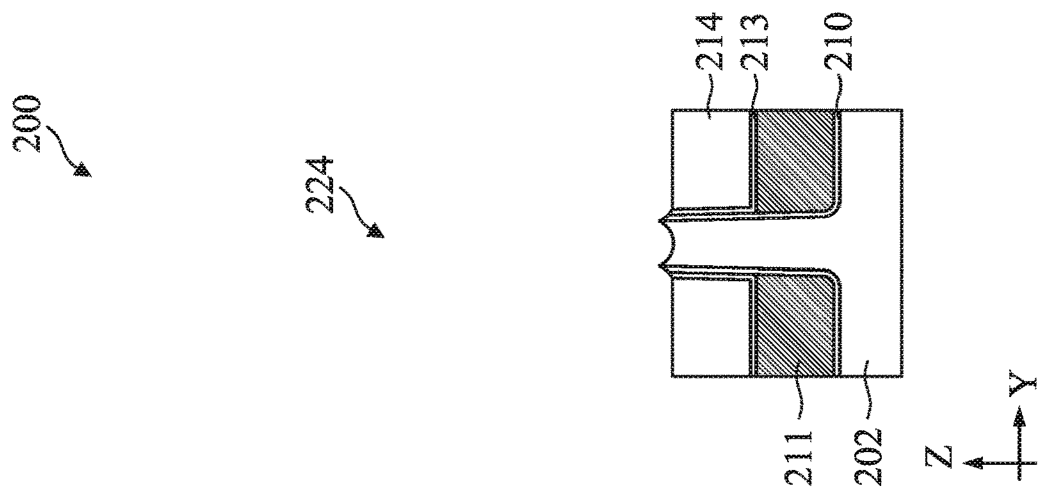
Figure 7A:
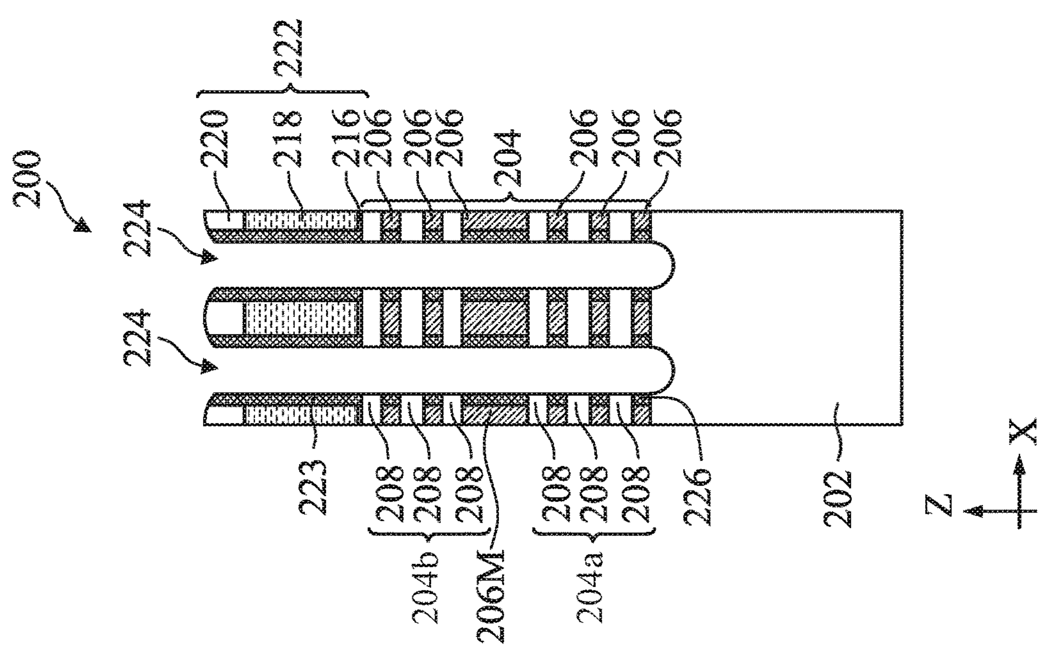
Figure 8C:
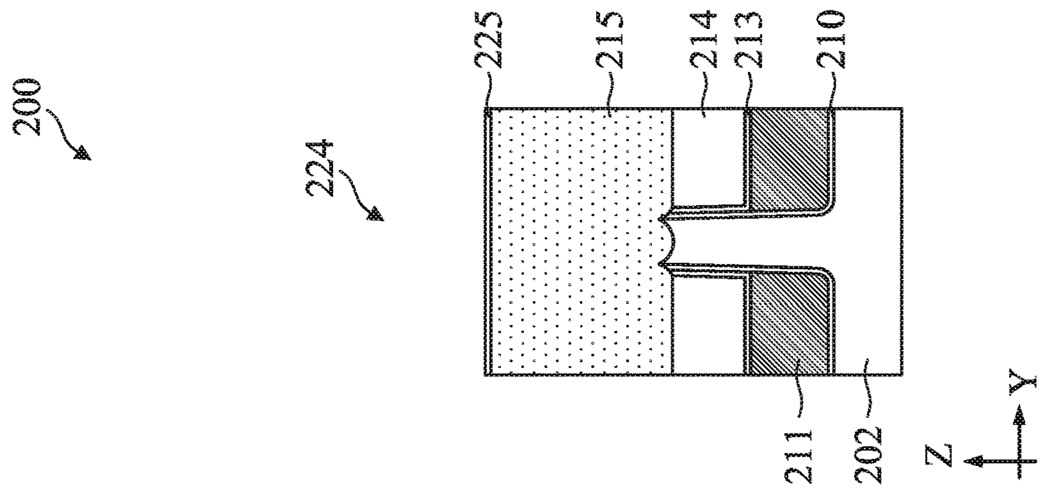
Figure 8B:
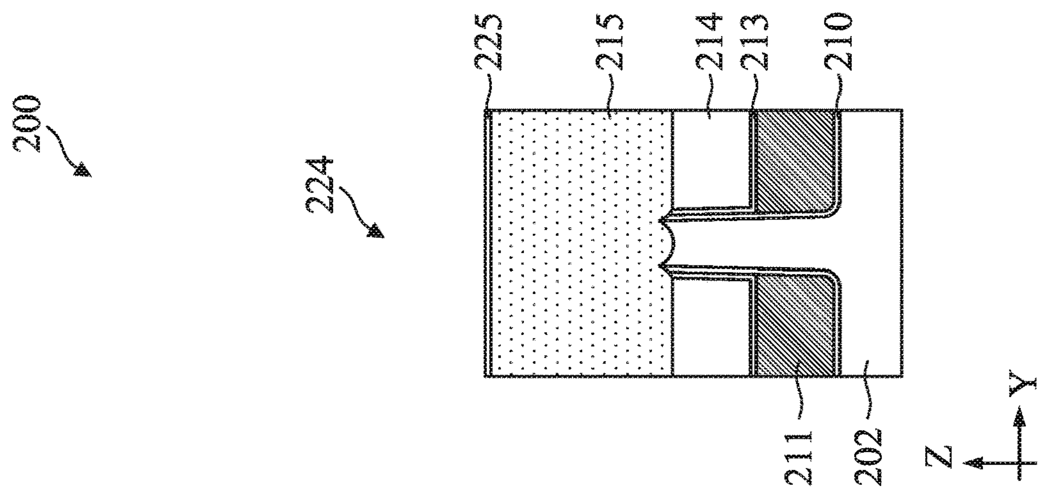
Figure 8A:
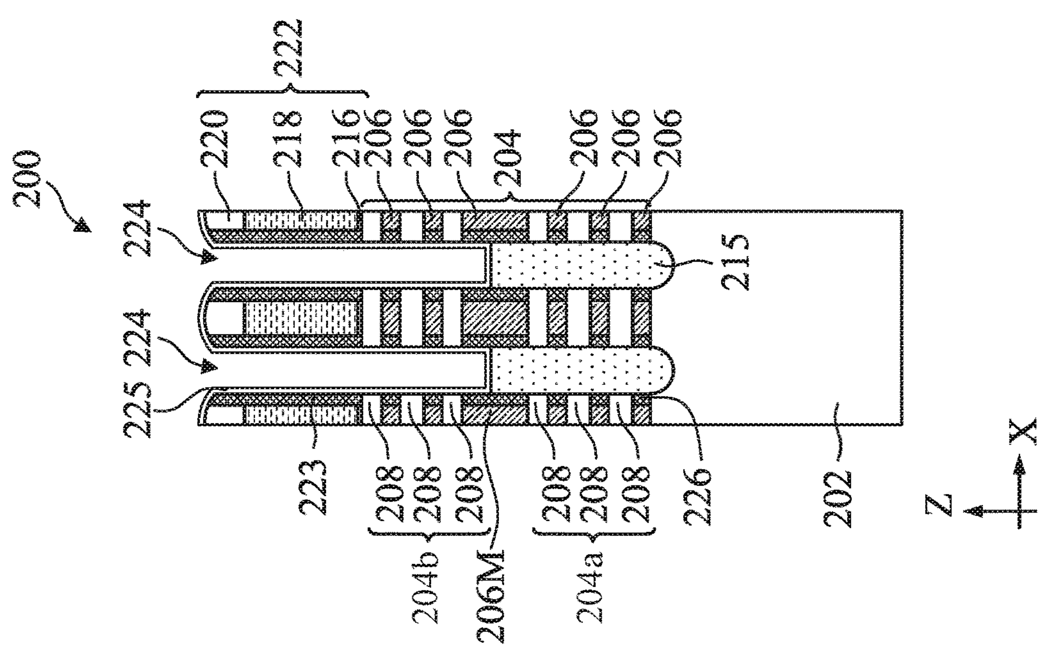
Figure 9A:
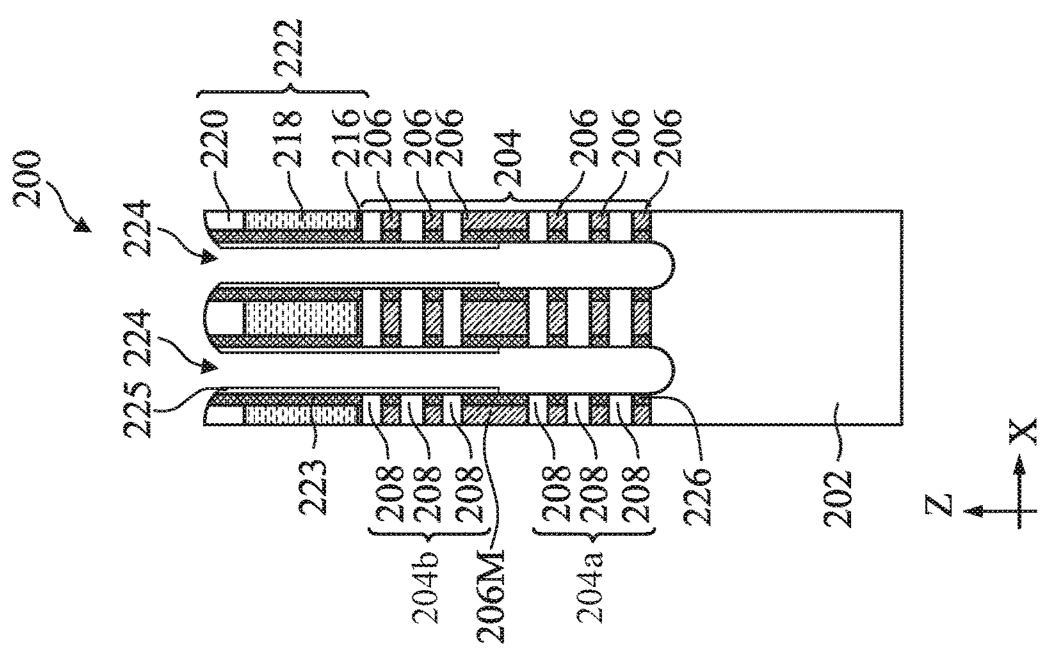
Figure 9B:
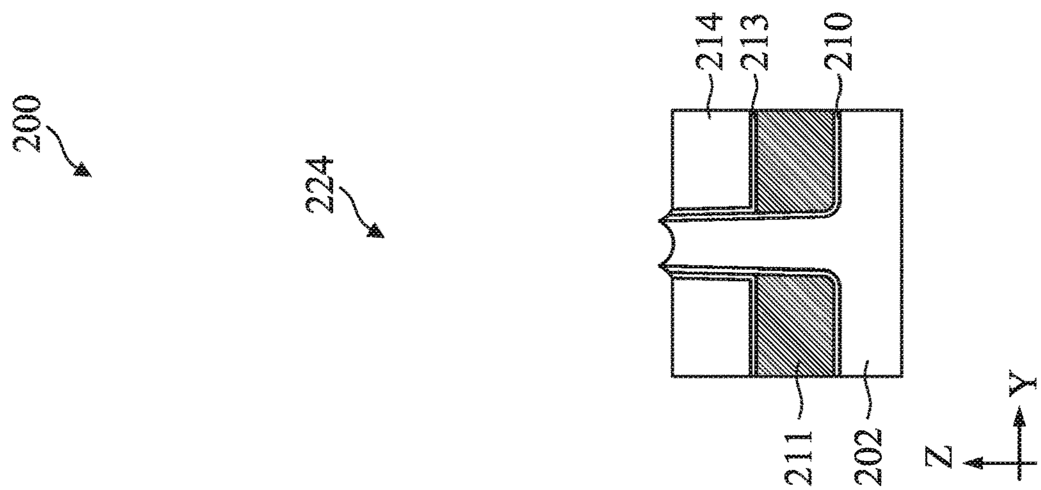
Figure 9C:
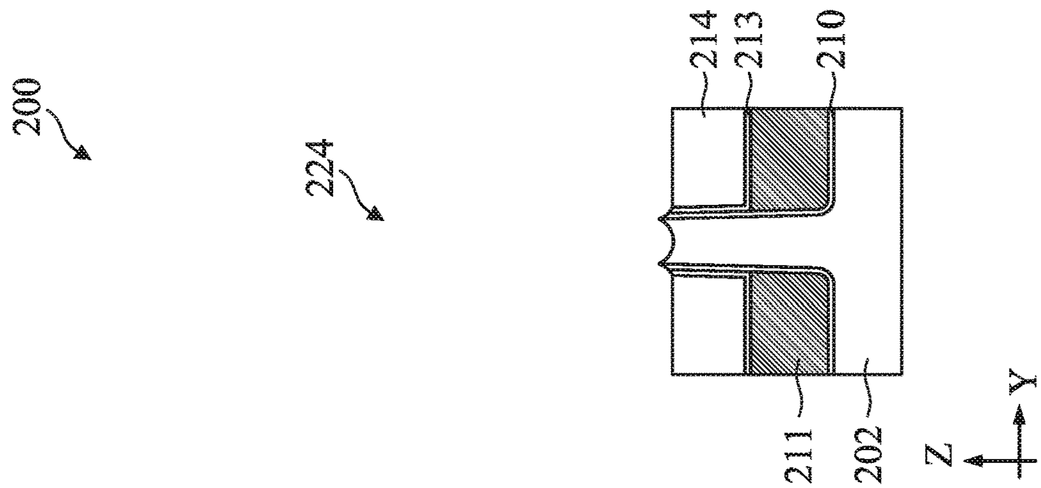

Referring to FIGS. 1 and 7A-C, method 100 includes a block 114 where inner spacer features 226 are formed. At block 114, the sacrificial layers 206, including the middle sacrificial layer 206M, exposed in the source/drain trenches 224 are selectively and partially recessed to form inner spacer recesses, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone ($O_3$). In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant. After the formation of the inner spacer recesses, an inner spacer material layer is deposited over the workpiece 200, including in the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over the gate spacer layer and sidewalls of the channel layers 208, thereby forming the inner spacer features 226 as shown in FIG. 7A. In some embodiments, the etch back process at block 114 may be a dry etch process that includes use of an oxygen-containing gas, hydrogen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas (e.g., $CF_3I$), other suitable gases and/or plasmas, and/or combinations thereof.

Referring to FIGS. 1 and 8A-C, method 100 includes a block 118 where a sacrificial dielectric layer 215 is deposited in the source/drain trenches 224. The sacrificial dielectric layer 215 may include silicon oxide, silicon oxycarbide, or a dielectric material that allows selective etching of the sacrificial dielectric layer 215 while keeping the inner spacer features 226 substantially intact. The sacrificial dielectric layer 215 may be deposited using CVD. Then the sacrificial dielectric layer 215 is etched back to expose the second stack 204*b*, while sidewalls of the first stack 204*a* remains covered. That is, after the etching back of the sacrificial dielectric layer 215, sidewalls of the channel layers 208 of the second stack 204*b* and respective inner spacer features interleaved therein are exposed in the source/drain trenches 224. The etch process may be a dry etch process, a wet etch process, or a suitable etch process. The extent at which the sacrificial dielectric layer 215 are recessed is controlled by duration of the etching process. Operations at block 118 also includes conformally depositing a third liner 225 over the workpiece 200. The sidewalls of the first stack 204*b* are covered by the third liner 225. The third liner 225 may include silicon nitride, silicon carbonitride, or other suitable dielectric material that provides etching contrast to the sacrificial dielectric layer 215. The third liner 225 may be deposited using CVD, ALD, or other suitable deposition process.

Referring to FIGS. 1 and 9A-C, method 100 includes a block 120 where lateral portion of the third liner 225 is removed. By using an anisotropic etching, such as RIE or other suitable dry etch process, vertical portion of the third liner 225 remains covering the sidewalls of the second stack 204*b*, while lateral portion of the third liner 225 is removed from the source/drain trenches 224, exposing the sacrificial dielectric layer 215. Operations at block 120 also includes removing the sacrificial dielectric layer 215 in a selective etch process to release the first stack 204*a*. In an example where the sacrificial dielectric layer 215 is formed of an oxide and the inner spacer features 226 and the third liner 225 are formed of nitrides, the sacrificial dielectric layer 215 may be selectively removed using diluted hydrofluoric acid (DHF) or buffered hydrofluoric acid (BHF). Here, BHF includes hydrofluoric acid and ammonium fluoride. Upon conclusion of the operations at block 120, the sidewalls of the channel layers 208 of the first stack 204*a* are exposed in the source/drain trenches 224, while the sidewalls of the channel layers 208 of the second stack 204*b* and a top portion of the middle sacrificial layer 206M remain covered by the third liner 225.

Figure 10C:
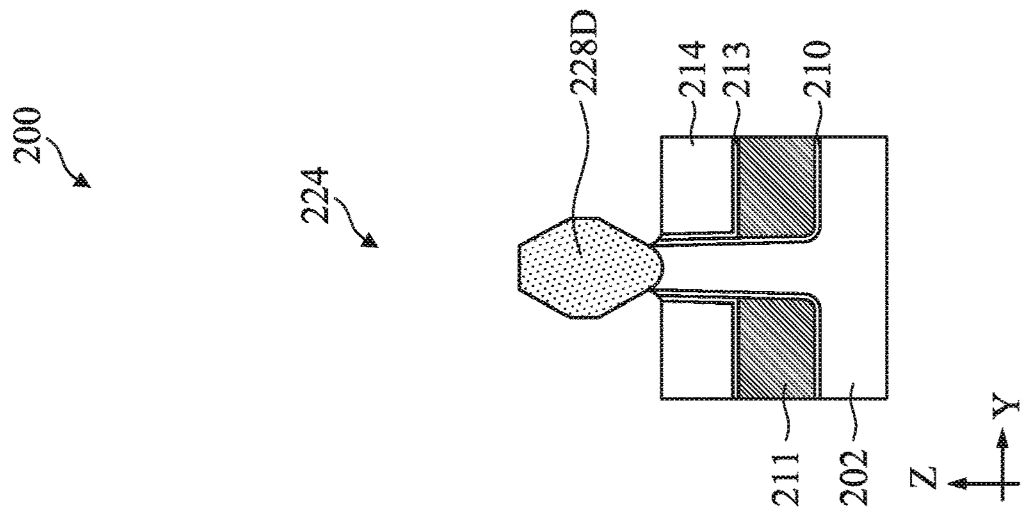
Figure 10B:
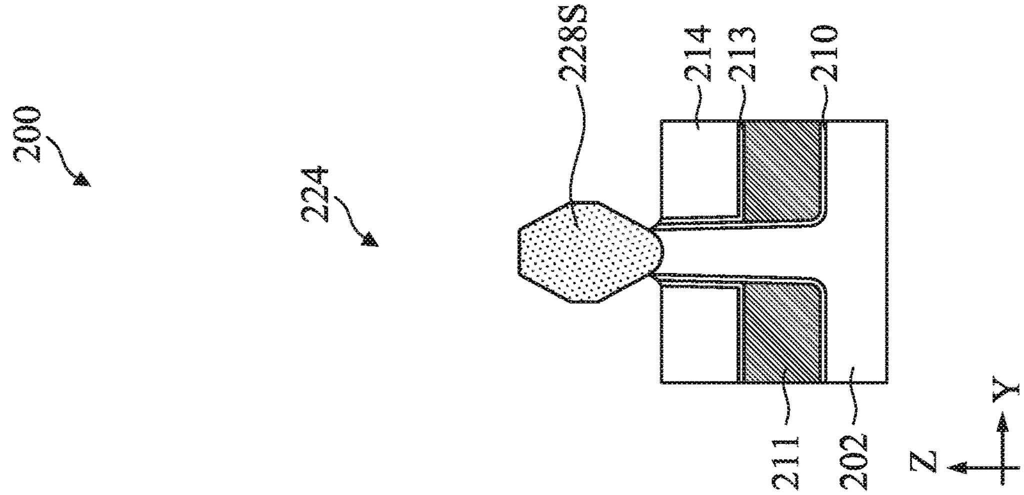
Figure 10A:
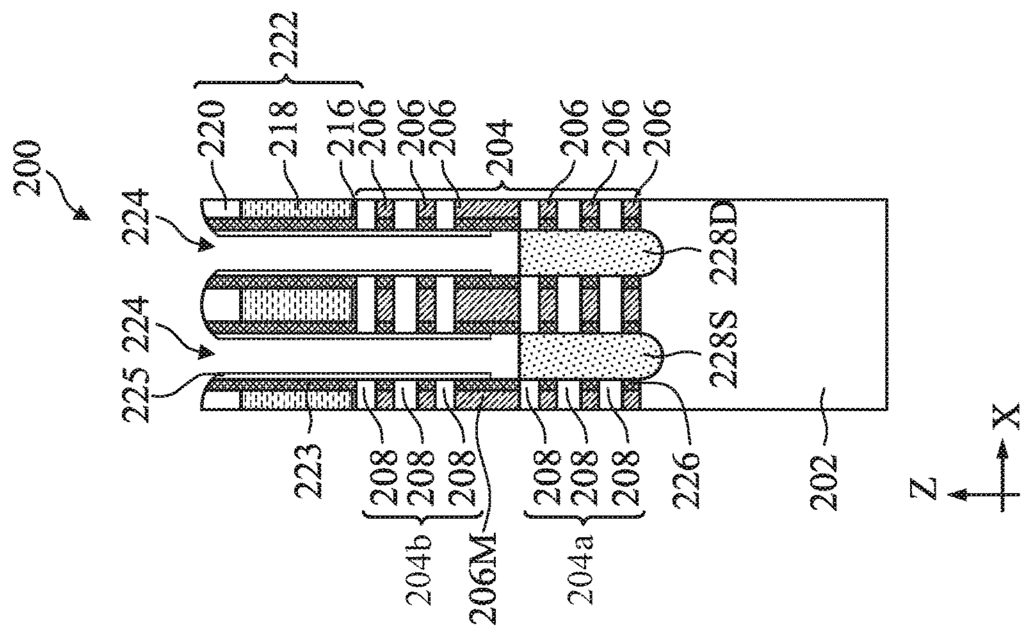
Figure 11C:
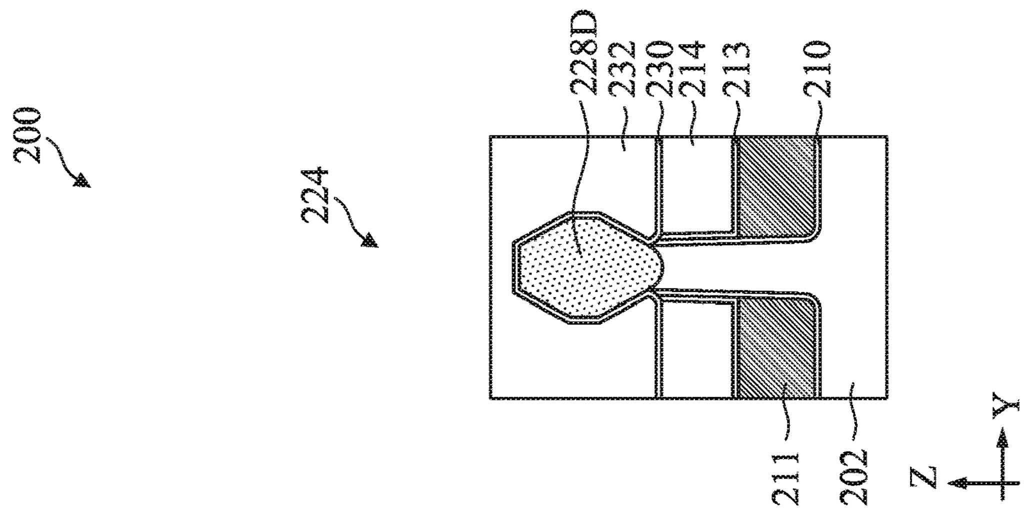
Figure 11B:
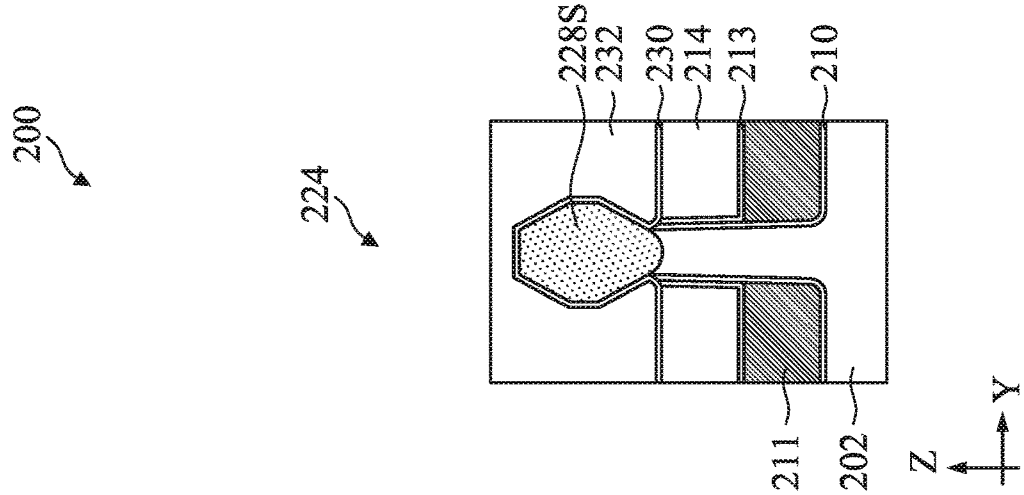
Figure 11A:
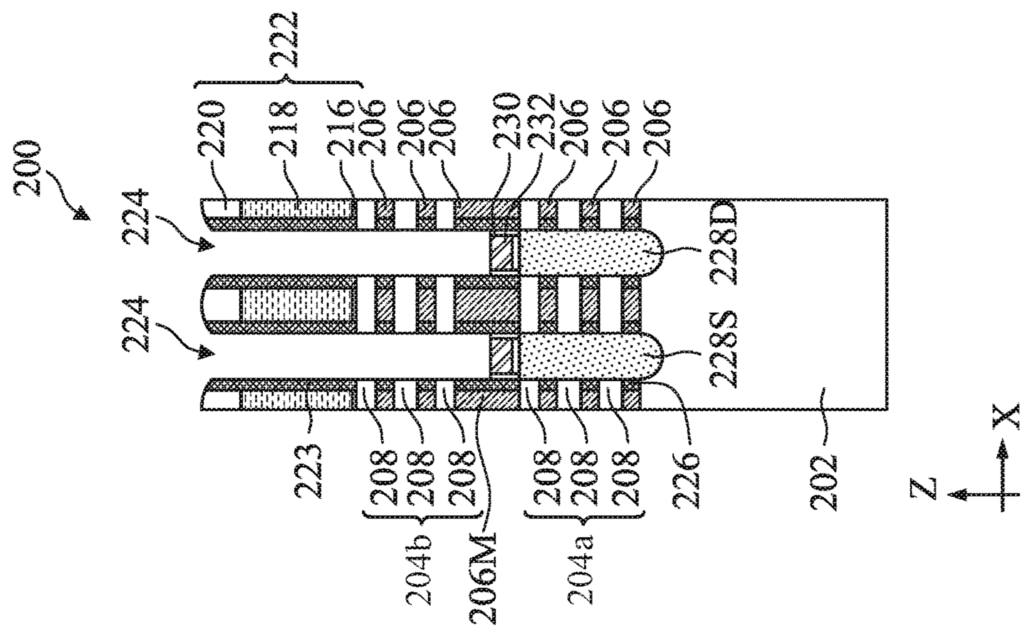

Referring to FIGS. 1 and 10A-C, method 100 includes a block 122 where a first source feature 228S and a first drain feature 228D are formed in the source/drain trenches 224. In some embodiments, the first source feature 228S and the first drain feature 228D may be formed using an epitaxial process, such as VPE, UHV-CVD, MBE, and/or other suitable processes. The epitaxial growth process may use gaseous and/or liquid precursors, which interact with the composition of the substrate 202 as well as the channel layers 208. The exposed sidewalls of the channel layers 208 of the first stack 204*a* functionally serve as semiconductor seed layers. Therefore, the epitaxial growth of the first source feature 228S and the first drain feature 228D may take place from both the top surface of the substrate 202 and the exposed sidewalls of the channel layers 208 of the first stack 204*a*. As illustrated in FIG. 10A, the first source feature 228S and the first drain feature 228D are therefore in physical contact with (or adjoining) the channel layers 208 or the released channel of the first stack 204*a*. Since the channel layers 208 in the second stack 204*b* are covered by the third liner 225, epitaxial growth won't take place from the sidewalls thereof. The duration of the epitaxial growth is controlled such that the first source feature 228S and the first drain feature 228D do not extend upwardly beyond the middle sacrificial layer 206M. Depending on the conductivity type of the to-be-formed bottom GAA transistor, the first source feature 228S and the first drain feature 228D may be n-type source/drain features or p-type source/drain features. Example n-type source/drain features may include Si, GaAs, GaAsP, SiP, or other suitable material and may be in-situ doped during the epitaxial process by introducing an n-type dopant, such as phosphorus (P), arsenic (As), or ex-situ doped using an implantation process (i.e., a junction implant process). Example p-type source/drain features may include Si, Ge, AlGaAs, SiGe, boron-doped SiGe, or other suitable material and may be in-situ doped during the epitaxial process by introducing a p-type dopant, such as boron (B), or ex-situ doped using an implantation process (i.e., a junction implant process).

Referring to FIGS. 1 and 11A-C, method 100 includes a block 126 where a first contact etch stop layer (CESL) 230 and a first interlayer dielectric (ILD) layer 232 are deposited on the first source feature 228S and the first drain feature 228D. Operations at block 126 includes removal of the third liner 225 to release the second stack 204*b* in an etching process. The etching process can include dry etching, wet etching, reactive ion etching (RIE), and/or other suitable processes. The first CESL 230 may include silicon nitride, silicon oxynitride, and/or other materials known in the art and may be formed by ALD, plasma-enhanced chemical vapor deposition (PECVD) process and/or other suitable deposition or oxidation processes. In some embodiments, the first CESL 230 is first conformally deposited on the workpiece 200 and the first ILD layer 232 is deposited over the first CESL 230 by a PECVD process or other suitable deposition technique. Subsequently the first CESL 230 and the first ILD layer 232 are etched back in a selective etching process. Both the first CESL 230 and the first ILD layer 232 are recessed below the bottommost channel layer 208 of the second stack 204*b*. Upon conclusion of the operations at block 126, the first CESL 230 is conformally deposited on surfaces of the first source feature 228S, the first drain features 228D, and partially on the sidewalls of the middle sacrificial layer 206M. The first ILD layer 232 may include materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the first ILD layer 232, the workpiece 200 may be annealed to improve integrity of the first ILD layer 232.

Referring to FIGS. 1 and 12A-C, method 100 includes a block 128 where interconnection features, such as a first drain contact 234, a first source contact 236, a first source contact via 238 are formed. Taking interconnection features in the source region to illustrate an example process, lithography processes are used to form a contact opening that exposes the first source feature 228S. Additional lithography processes may be used to form a via opening for the first source contact via 238 and the via opening extends through at least the CESL 230 and the isolation feature 214 and exposes the first buried power rail 211-1. To reduce contact resistance, a silicide layer 240 may be formed on the first source feature 228S by depositing a metal layer over the first source feature 228S and performing an anneal process to bring about silicidation between the metal layer and the first source feature 228S. Suitable metal layer may include titanium (Ti), tantalum (Ta), nickel (Ni), cobalt (Co), or tungsten (W). The silicide layer 240 may include titanium silicide (TiSi), titanium silicon nitride (TiSiN), tantalum silicide (TaSi), tungsten silicide (WSi), cobalt silicide (CoSi), or nickel silicide (NiSi). After the formation of the silicide layer 240, a metal fill layer may be deposited into the contact opening and the contact via openings. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). Similar to the first source contact 236, a contact opening is first made to expose the first drain feature 228D, a silicide layer 240 is formed on the first drain feature 228D, and a metal fill layer is deposited to fill the rest of the contact opening to form the first drain contact 234. A contact etch back process may follow to remove excess material to recess a top surface to the first drain contact 234 and the first source contact 236 below the bottommost channel layer 208 of the second stack 204*b*. Notably, a source and a drain can be interchangeably used in various other embodiments, such as interconnection features electrically couple the first drain feature 228D to the first buried power rail 211-1 in one embodiment.

Figure 12C:
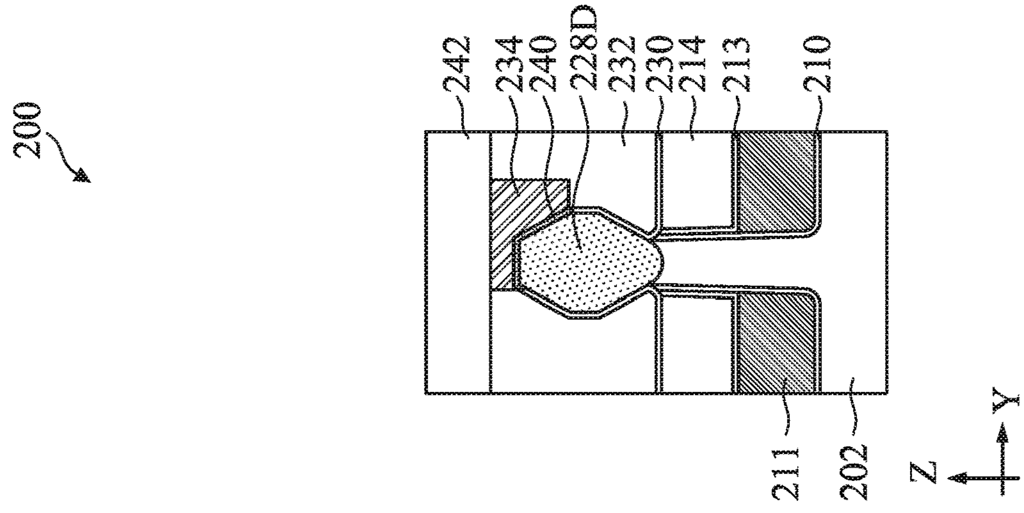
Figure 12B:
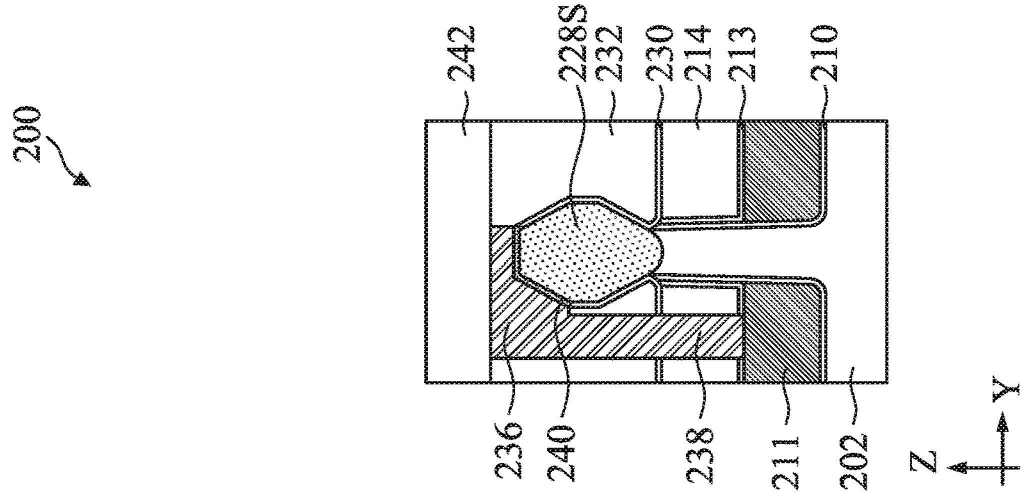
Figure 12A:
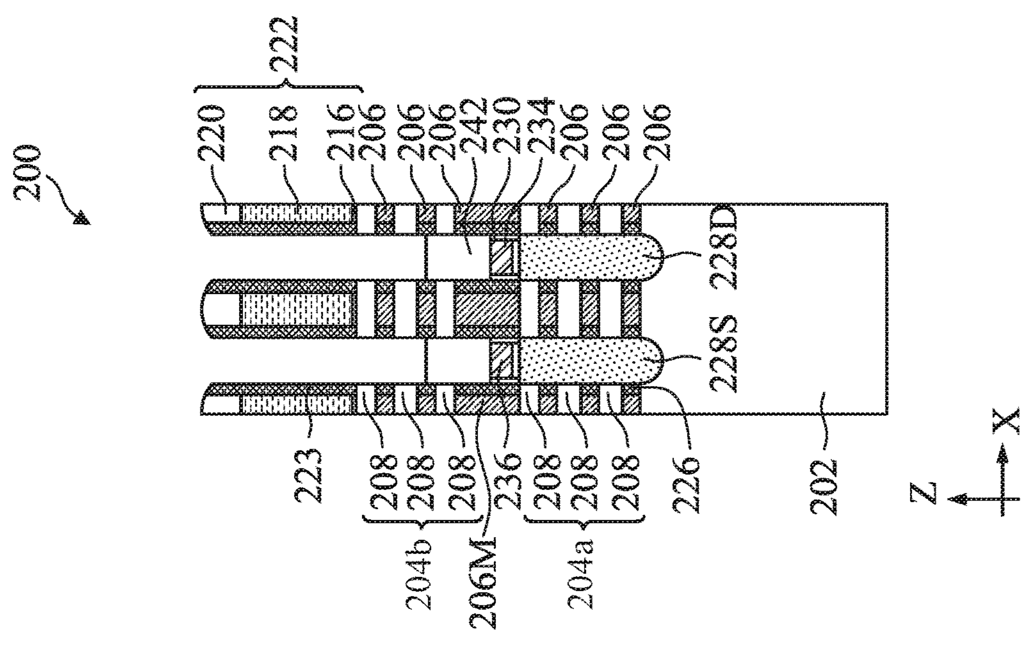

Still referring to FIGS. 1 and 12A-C, method 100 includes a block 130 where a dielectric isolation layer 242 is deposited over the first ILD layer 232 and covering interconnection features formed in earlier operations at block 128. The dielectric isolation layer 242 may include silicon nitride, silicon oxide, silicon oxynitride, hafnium oxide, aluminum oxide, zirconium oxide, or other suitable isolation material. In an embodiment, the dielectric isolation layer 242 may be formed by filling the source/drain trenches 224 with dielectric isolation material (e.g., by using a CVD process or a spin-on glass process), and etching back the dielectric isolation material in a selective etching process. As shown in FIG. 12A, the dielectric isolation layer 242 covers opposite sidewalls of at least the bottommost channel layer 208 of the second stack 204*b*. In some embodiments, the dielectric isolation layer 242 adjoins more than one bottom channel layers 208 in the second stack 204*b*.

Figure 13A:
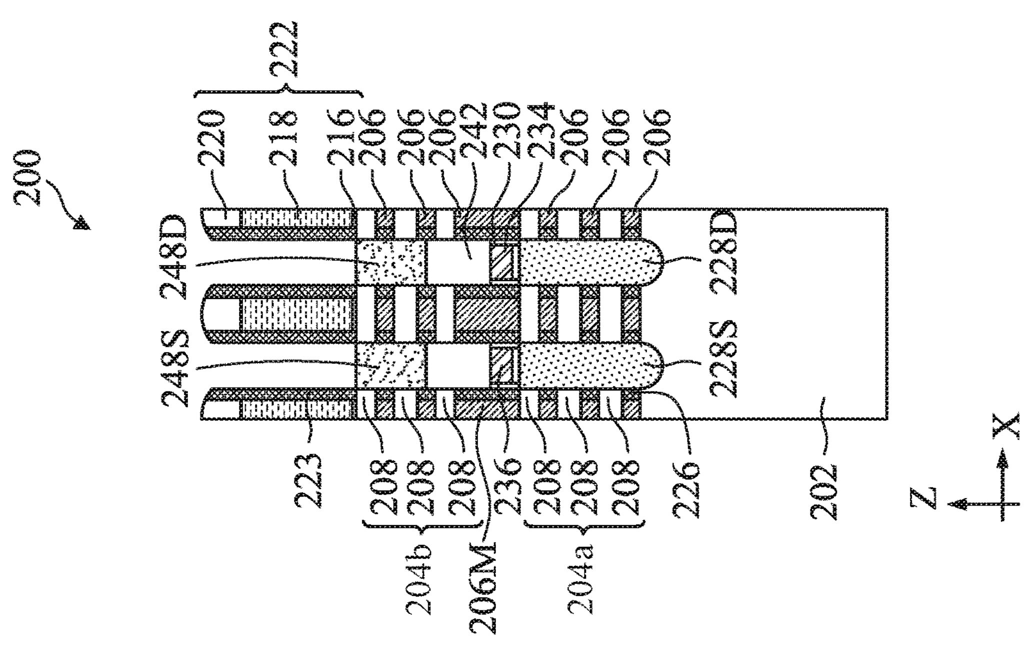

Referring to FIGS. 1 and 13A-C, method 100 includes a block 132 where a second source feature 248S and a second drain feature 248D are formed in the source/drain trenches 224. Similar to the first source feature 228S and the first drain feature 228D, the second source feature 248S and the second drain feature 248D may be formed using an epitaxial process, such as VPE, UHV-CVD, MBE, and/or other suitable processes. The epitaxial growth process may use gaseous and/or liquid precursors, which interact with the channel layers 208. The exposed sidewalls of the channel layers 208 of the second stack 204*b* functionally serve as semiconductor seed layers. Therefore, the epitaxial growth of the second source feature 248S and the second drain feature 248D may take place from the exposed sidewalls of the channel layers 208 of the second stack 204*b*, but not from the ones adjoined by the dielectric isolation layer 242. As illustrated in FIG. 13A, the second source feature 248S and the second drain feature 248D are therefore in physical contact with (or adjoining) the upper channel layers 208 of the second stack 204*b*, forming active channel layers. The term "active channel layer" refers to a channel layer adjoined by source/drain features on both ends such that carriers can travel through. Since the bottommost channel layer 208 in the second stack 204*b* is covered by the dielectric isolation layer 242, epitaxial growth won't take place from the sidewalls thereof. Isolated from the second source feature 248S and the second drain feature 248D by the dielectric isolation layer 242, the bottommost channel layer 208 of the second stack 204*b* becomes a "floating" (or inactive) channel layer. The term "floating channel layer" refers to a channel layer insulated from contacting source/drain features on one or both ends such that carriers cannot travel through. Depending on the conductivity type of the to-be-formed top GAA transistor, the second source feature 248S and the second drain feature 248D may be n-type source/drain features or p-type source/drain features. Example n-type source/drain features may include Si, GaAs, GaAsP, SiP, or other suitable material and may be in-situ doped during the epitaxial process by introducing an n-type dopant, such as phosphorus (P), arsenic (As), or ex-situ doped using an implantation process (i.e., a junction implant process). Example p-type source/drain features may include Si, Ge, AlGaAs, SiGe, boron-doped SiGe, or other suitable material and may be in-situ doped during the epitaxial process by introducing a p-type dopant, such as boron (B), or ex-situ doped using an implantation process (i.e., a junction implant process). In some embodiments, the to-be-formed top and bottom GAA transistors are of opposite types, such as an nFET over a pFET, or vice versa. Accordingly, the second source/drain features and the first source/drain features have opposite conductivity type, in some embodiments. In some other embodiments, the to-be-formed top and bottom GAA transistors are of the same types, such as nFET over an nFET, or a pFET over a pFET. Accordingly, the second source/drain features and the first source/drain features have the same conductivity type, in some other embodiments.

Figure 13B:
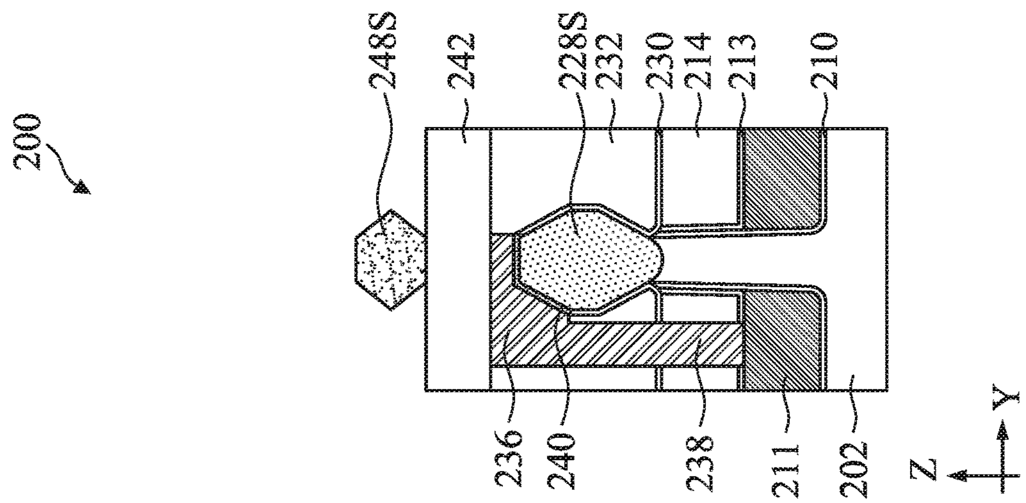
Figure 13C:
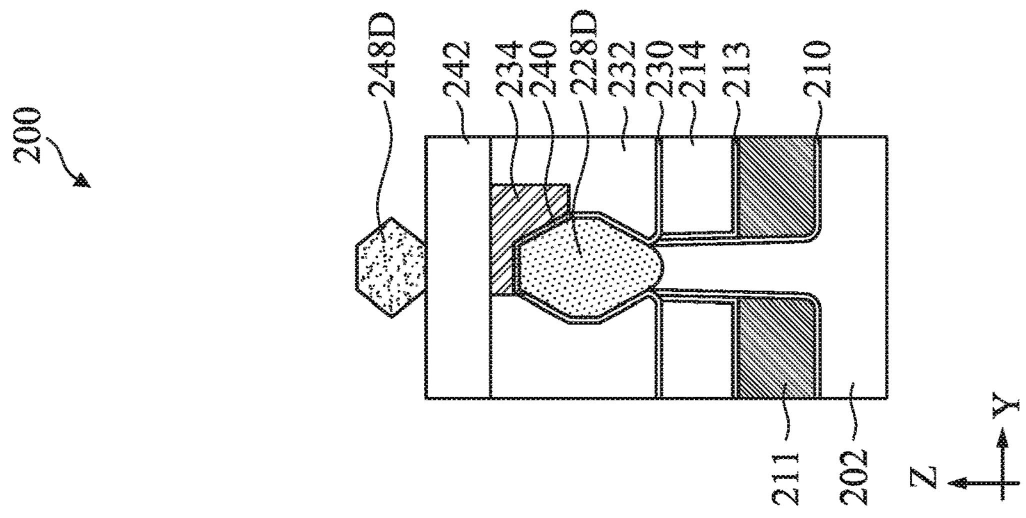
Figure 14C:
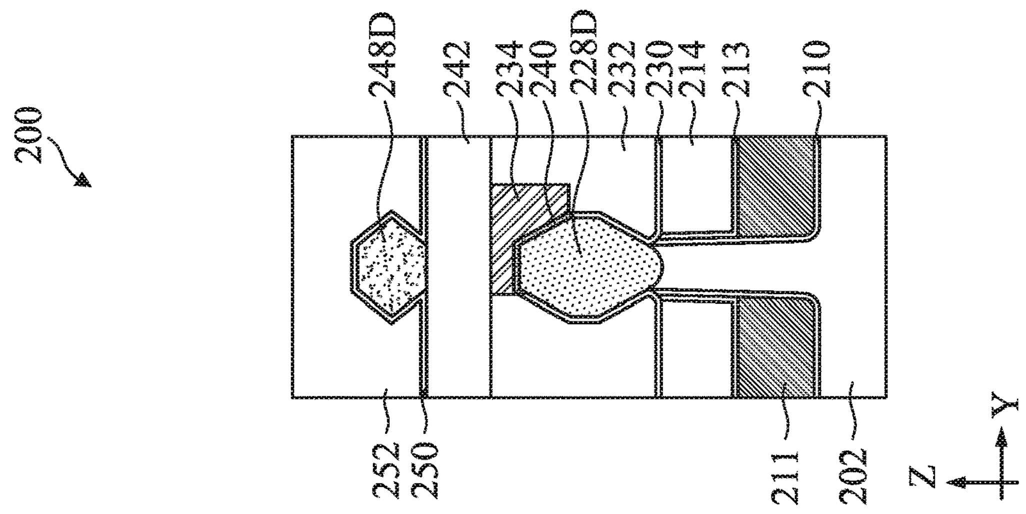
Figure 14B:
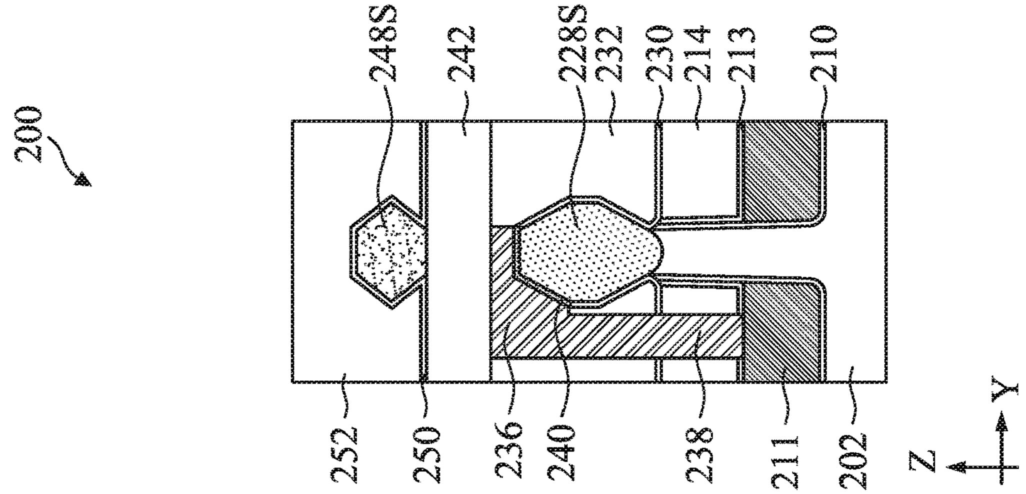
Figure 14A:
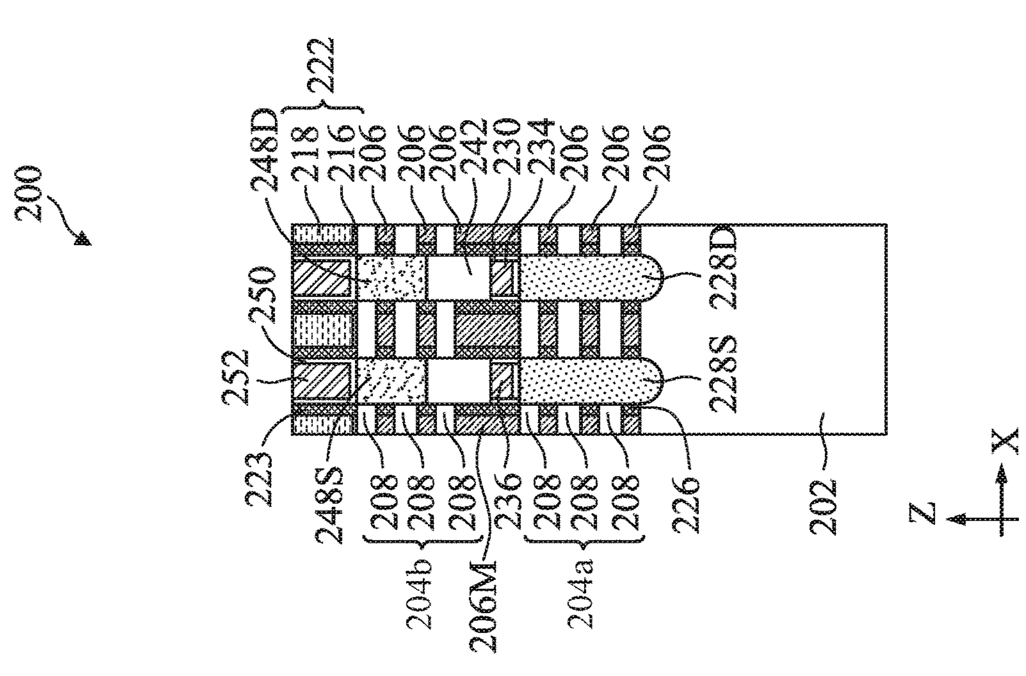
Figure 15A:
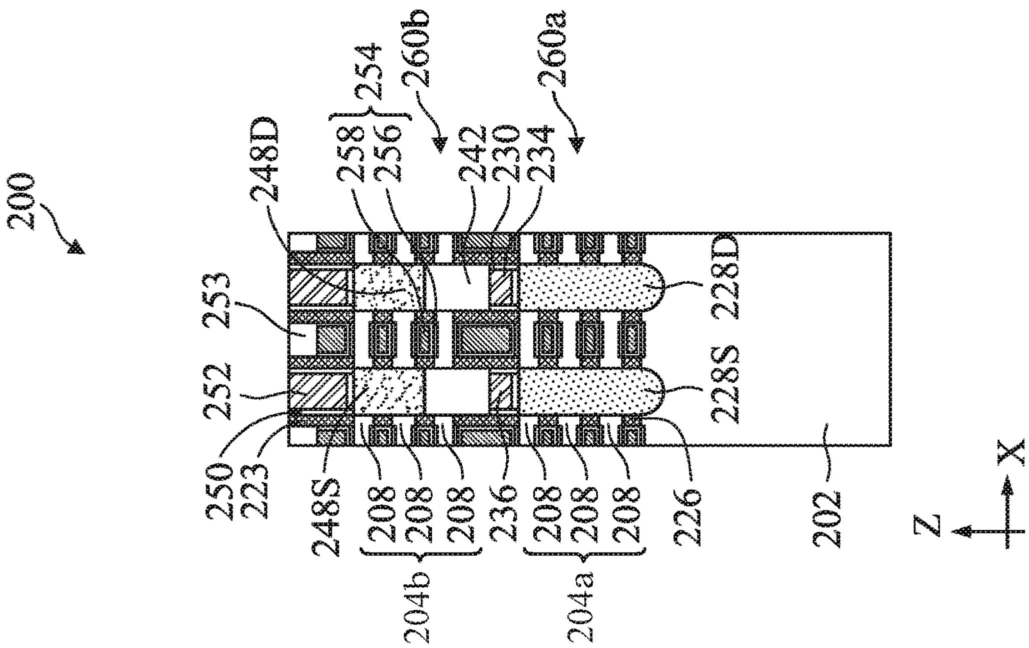
Figure 15B:
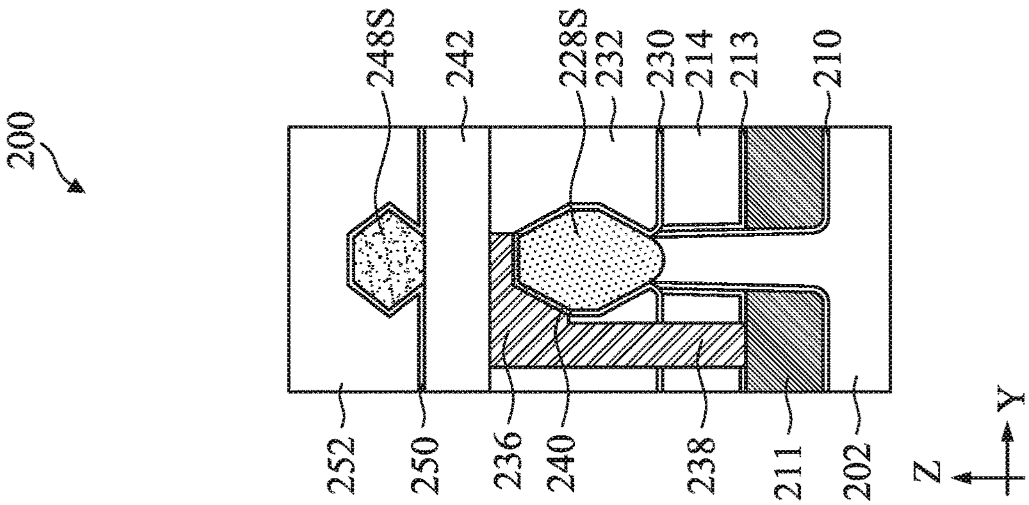
Figure 15C:
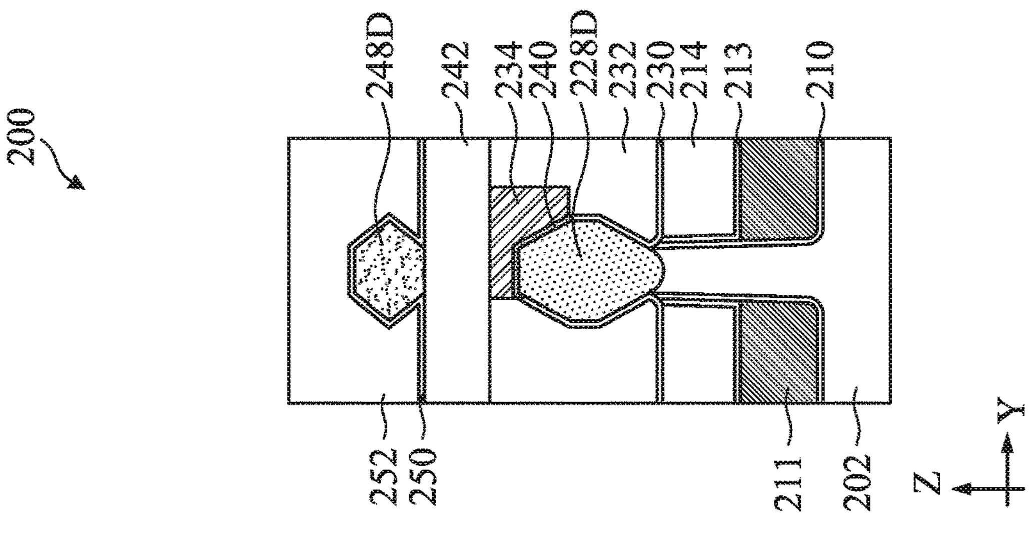
Figure 102A:
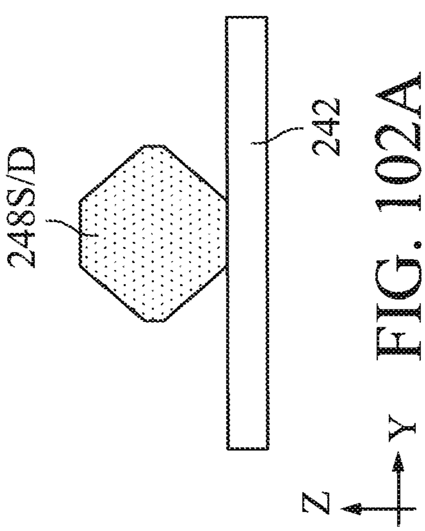
FIGS. 102A, 102B, 102C, 102D, 102E, 103A, 103B, 103C, and 103D illustrate fragmentary cross-sectional views of various embodiments of source/drain epitaxial features, according to one or more aspects of the present disclosure.
Figure 102B:
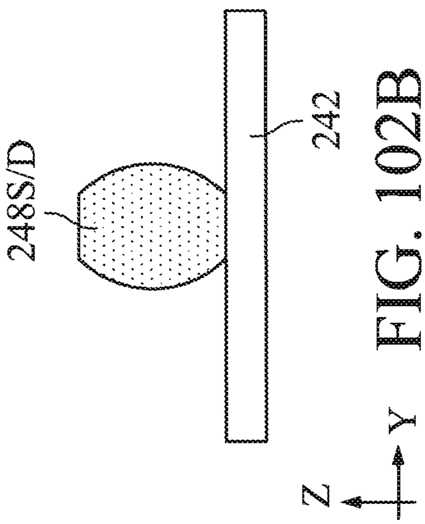
Figure 102C:
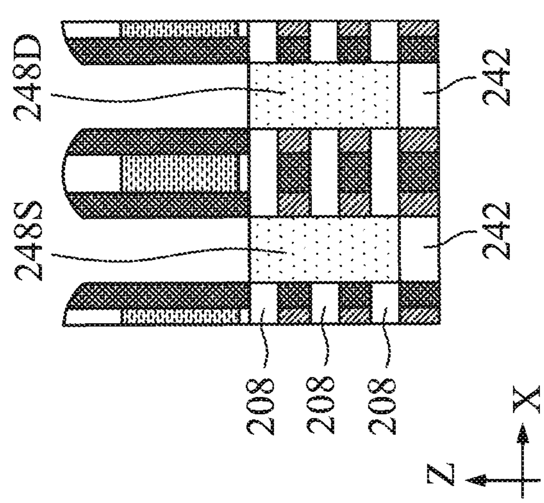
Figure 102D:
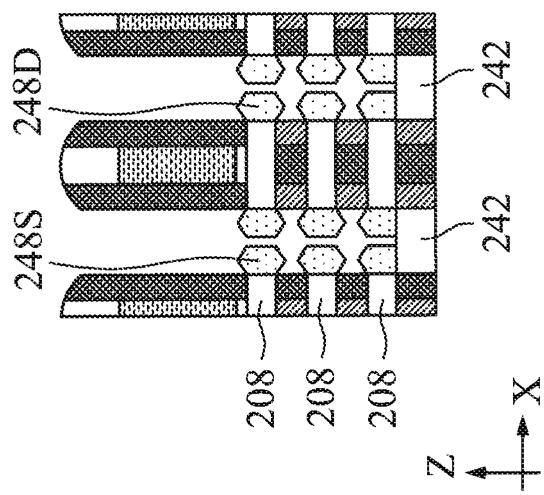
Figure 102E:
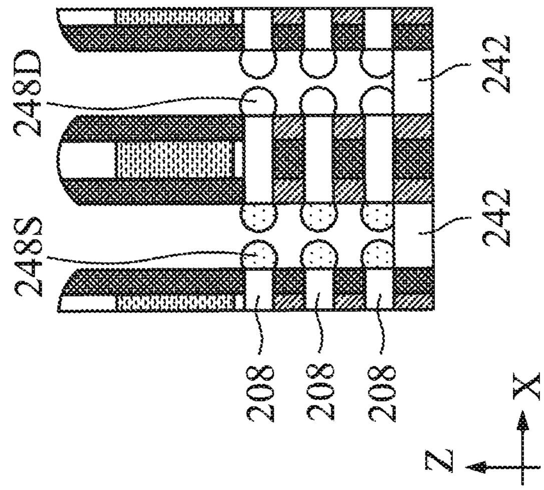
Figure 103A:
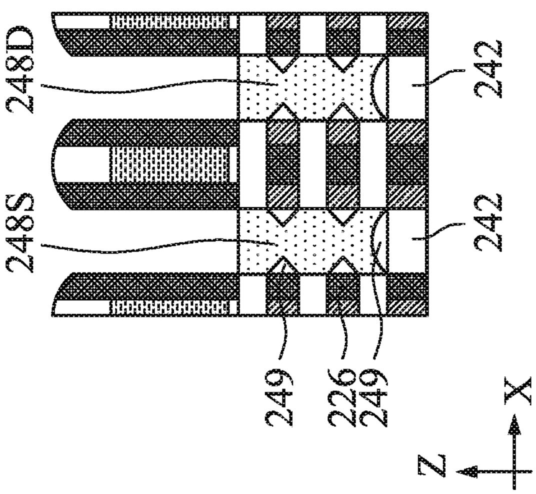
Figure 103B:
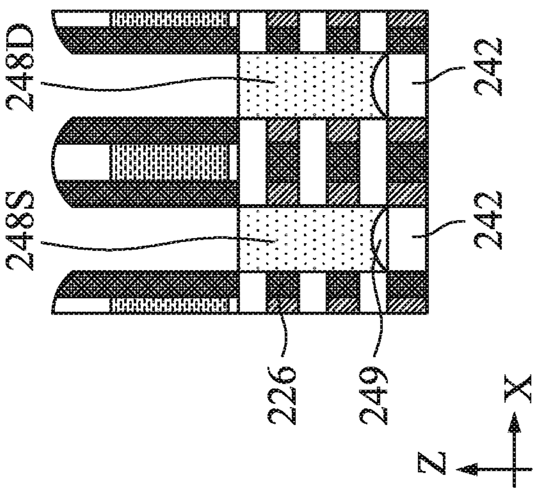
Figure 103C:
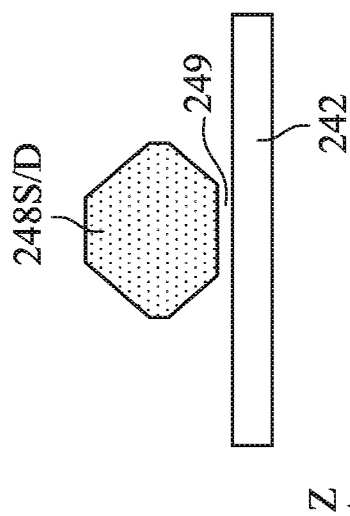
Figure 103D:
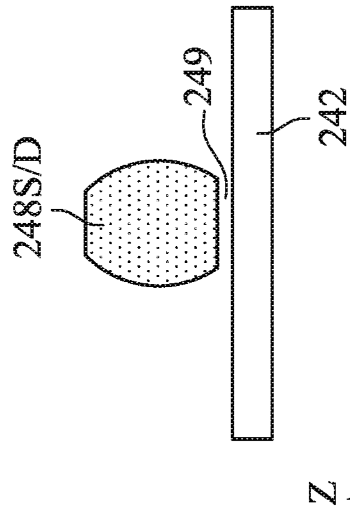

Notably, directly stacked above the first source feature 228S and the first drain feature 228D, respectively, the second source feature 248S and the second drain feature 248D are less in height and less in volume, due to the less total number of active channel layers of the second stack for epitaxial source/drain feature growth. Also, although first and second source/drain features in FIGS. 13A-C are illustrated as with crystalline facets (e.g., hexagon shape) in Y-Z plane (reproduced in FIG. 102A), other shapes are possible, such as bar-like shape, such as shown in FIG. 102B. Further, although first and second source/drain features in FIGS. 13A-C are illustrated as filling up the source/drain trenches 224 in X-Z plane (reproduced in FIG. 102C), since the source/drain features in a same source/drain trench 224 are grown from the opposing sidewalls of active channel layers, the source/drain features may not laterally merged, such as shown in FIG. 102D which corresponds to source/drain features with crystalline facets, and as shown in FIG. 102E which corresponds to source/drain features with bar-like shape. Furthermore, since the first and second source/drain features are epitaxially grown from the sidewalls of the active channel layers, air gaps may be trapped when neighboring source/drain features merge, such as shown in FIGS. 103A-B. In FIG. 103A, air gaps 249 are trapped adjacent to inner spacer features 226 and between dielectric isolation layer 242 and merged source/drain features. In FIG. 103B, air gaps 249 are trapped between dielectric isolation layer 242 and merged source/drain features. FIGS. 103C-D illustrate fragmentary cross-sectional views in Y-Z plane with air gaps 249 trapped between dielectric isolation layer 242 and merged source/drain features with crystalline facets or bar-like shape, respectively. For avoidance of doubts, both the first source/drain features 228S/D and the second source/drain features 248S/D can have the various source/drain feature profiles illustrated in FIGS. 102A-103D.

Referring to FIGS. 1 and 14A-C, method 100 includes a block 136 where a second CESL 250 and a second interlayer dielectric (ILD) layer 252 are deposited on the second source feature 248S and the second drain feature 248D. The second CESL 250 may include silicon nitride, silicon oxynitride, and/or other materials known in the art and may be formed by ALD, plasma-enhanced chemical vapor deposition (PECVD) process and/or other suitable deposition or oxidation processes. In some embodiments, the second CESL 250 is first conformally deposited on the workpiece 200 and the second ILD layer 252 is deposited over the second CESL 250 by a PECVD process or other suitable deposition technique. The second ILD layer 252 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the second ILD layer 252, the workpiece 200 may be annealed to improve integrity of the second ILD layer 252. Upon conclusion of the operations at block 136, the second CESL 250 is conformally deposited on surfaces of the second source feature 248S, the second drain features 248D, and on the sidewalls of the gate spacer layer 223. To remove excess materials and to expose top surfaces of the dummy gate stacks 222, a planarization process, such as a chemical mechanical polishing (CMP) process may be performed. In some embodiments, the gate-top hard mask layer 220 is removed in the CMP process and the dummy gate electrode layer 218 is exposed.

Referring to FIGS. 1 and 15A-C, with the exposure of the dummy gate stack 222, method 100 proceeds to block 138 where the dummy gate stack 222 is removed and replaced by a gate structure 254. The removal of the dummy gate stack 222 may include one or more etching processes that are selective to the material in the dummy gate stack 222. For example, the removal of the dummy gate stack 222 may be performed using as a selective wet etch, a selective dry etch, or a combination thereof. After the removal of the dummy gate stack 222, sidewalls of the channel layers 208 and sacrificial layers 206 of both the first and second stack 204*a/b* in the channel region, which is disposed between the source region and the drain region, are exposed. Thereafter, the sacrificial layers 206 in the channel region are selectively removed to release the channel layers 208 as the channel members. Here, because the dimensions of the channel members are nanoscale, the channel members may also be referred to as nano structures. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a silicon germanium oxide removal. For example, the oxidation may be provided by ozone clean and then silicon germanium oxide removed by an etchant such as $NH_4OH$.

With the channel members released, the gate structure 254 is deposited to wrap around each of the channel layers (including active or floating ones) of both the first and second stack 204*a/b* in the channel region, thereby forming a bottom GAA transistor 260*a* and a top GAA transistor 260*b* stacked on the bottom GAA transistor 260*a*. Since the gate structure 254 engages channel layers in both the top and bottom GAA transistors, the gate structure 254 is also referred to as a common gate structure 254. The common gate structure 254 includes a common gate dielectric layer 256 and a common gate electrode layer 258 over the gate dielectric layer 256. The common gate dielectric layer 256 includes an interfacial layer (not explicitly shown) and a high-k dielectric layer around and in contact with the channel members. In some embodiments, the interfacial layer includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). The high-k dielectric layer is then deposited over the interfacial layer using ALD, CVD, and/or other suitable methods. The high-k dielectric layer is formed of high-K dielectric materials. As used and described herein, high-k dielectric materials include dielectric materials having a high dielectric constant, for example, greater than that of thermal silicon oxide (~3.9). The high-k dielectric layer may include hafnium oxide. Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material.

The common gate electrode layer 258 is then deposited over the common gate dielectric layer 256 using ALD, PVD, CVD, e-beam evaporation, or other suitable methods. The common gate electrode layer 258 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the common gate electrode layer 258 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. Further, where the semiconductor device 200 includes n-type transistors and p-type transistors, different common gate electrode layers may be formed separately for n-type transistors and p-type transistors, which may include different metal layers (e.g., for providing different n-type and p-type work function metal layers).

Operations at block 138 may also include forming a self-aligned capping (SAC) layer 253 over the common gate structure 254. In some embodiments, the SAC layer 253 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The SAC layer 253 protects the common gate structure 254 from etching and CMP processes that are used for etching S/D contact holes. The SAC layer 253 may be formed by recessing the gate structure, depositing one or more dielectric materials over the recessed gate structure, and performing a CMP process to the one or more dielectric materials.

Referring to FIGS. 1 and 16A-C, method 100 includes a block 140 where interconnection features, such as a second source contact 262, a second drain contact 264, a second source contact via 266, a second drain contact via 268, and a first drain contact via 270 are formed. The second drain contact 264 is formed over and in contact with the second drain feature 248D. Similar to the formation of the first drain contact 234 at block 128, a contact opening is first made to expose the second drain feature 248D, a silicide layer 269 is formed on the second drain feature 248D, and a metal fill layer is deposited to fill the rest of the contact opening. Additional lithography processes may be used to form a via opening for the second source contact via 266 and the via opening extends through at least the second CESL 250, the dielectric isolation layer 242, the first ILD layer 232, the first CESL 230, and the isolation feature 214 and exposes the second buried power rail 211-2. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). In some embodiments, each of the contact vias may include a liner between the metal fill layer and neighboring dielectric material to improve electrical integrity. Such liner may include titanium (Ti), tantalum (Ta), titanium nitride (TiN), cobalt nitride (CoN), nickel nitride (NiN), or tantalum nitride (TaN). The second source contact via 266 serves to couple the second source contact 262 and the second buried power rail 211-2.

Operations at block 140 also includes forming a top interconnect layer 272 above the second ILD layer 252. The top interconnect layer 272 includes a dielectric layer and a second power rail in the dielectric layer. The second power rail includes conductive lines (not explicitly shown) and via features coupling the underneath contacts to the conductive lines in the second power rail, such as the second drain contact via 268 and the first drain contact via 270. Lithography processes may be used to form a via opening for the first drain contact via 270 which extend through at least dielectric isolation layer 242, the second CESL 250, the second ILD layer 252, and a metal fill layer is deposited to fill the via opening. In a similar fashion, the second drain contact via 268 is formed over and couples the second drain contact 264 to the second power rail in the top interconnect layer 272. Because formation of the second drain contact via 268 and the first drain contact via 270 requires forming a via opening that extends into the top interconnect layer 272, these via openings may not be simultaneously formed with via openings for the first and second source contact features. In some other embodiments, the via openings for the first and second drain contact features are separately formed and are etched in several etch stages.

Figure 16C:
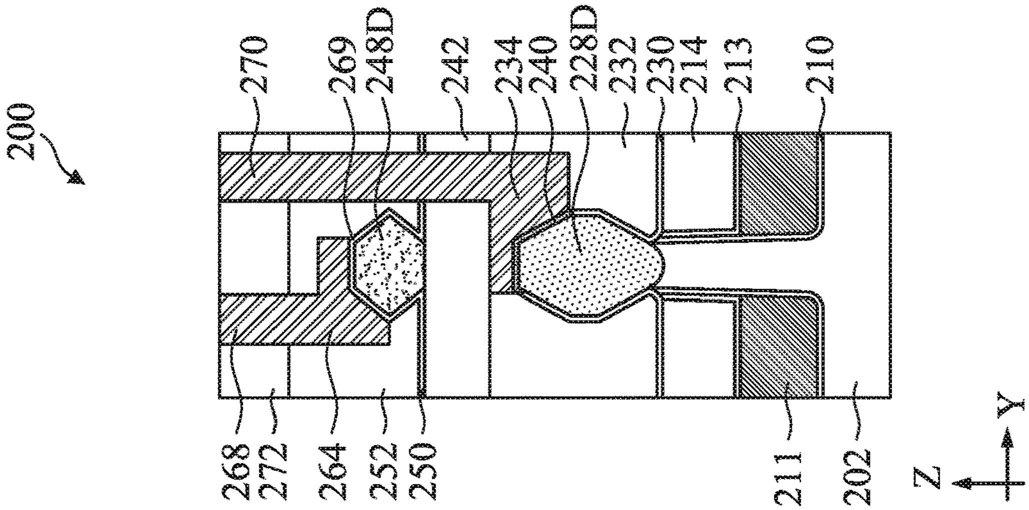
Figure 16B:
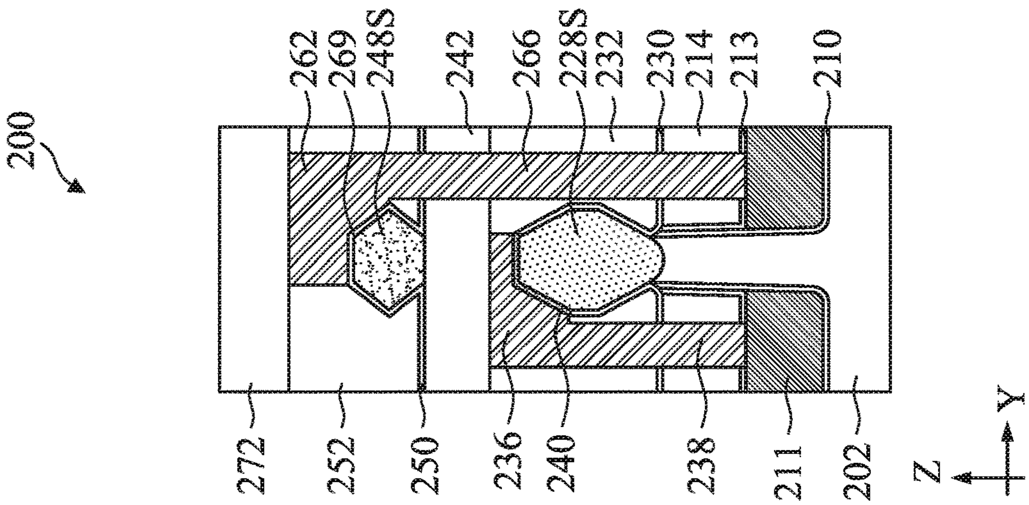
Figure 16A:
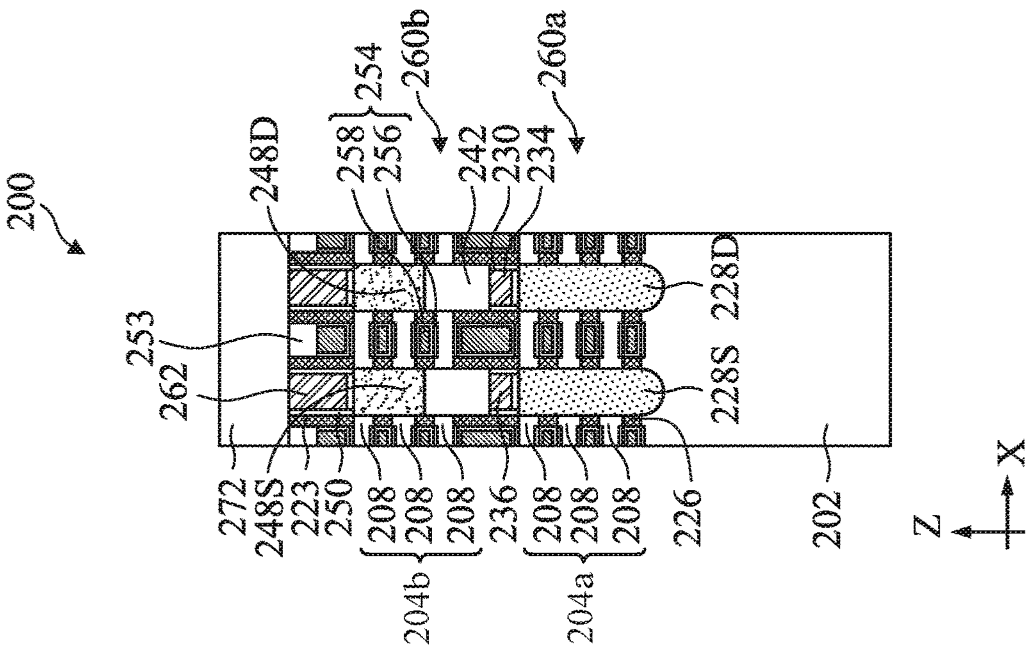

Reference is now made to FIGS. 16A-C. Upon conclusion of the operations in method 100, a bottom GAA transistor 260*a* and a top GAA transistor 260*b* stacked over the bottom GAA transistor 260*a* are formed. The bottom GAA transistor 260*a* includes channel layers (or referred to as channel members) sandwiched between the first source feature 228S and the first drain feature 228D. The top GAA transistor 260*b* includes a same number of channel layers as the bottom GAA transistor 260*a*. One difference is that not all channel layers of the top GAA transistor 260*b* are sandwiched between the second source feature 248S and the second drain feature 248D and function as active channel layers for carriers to flow through. At least a bottommost channel layer is adjoined by the dielectric isolation layer 242 and becomes a “floating” (inactive) channel layer. Accordingly, the top GAA transistor 260*b* has one less active channel layer than the bottom GAA transistor 260*a*. In various embodiments, two or more bottom channel layers of the top GAA transistor 260*b* may be adjoined by the dielectric isolation layer 242, and thus the top GAA transistor 260*b* may have two or more active channel layers less than the bottom GAA transistor 260*a*. Less number of active channel layers weakens current driving capability of the top GAA transistor 260*b*, which however may balance the current output in the pair of stacked GAA transistors. For example, when the top GAA transistor is an nFET and the bottom GAA transistor is a pFET, an nFET often provides a stronger current driving capability due to higher carrier mobility. By reducing a total active channel layer number of the nFET, a balanced current output from the pair of nFET and pFET can be achieved.

A common gate structure 254 wraps around each channel layer of the top and bottom GAA transistors 260*a* and 260*b*, while the dielectric isolation layer 242 interposes the first source 228S and the second source 248S, and also interposes the first drain 228D and the second drain 248D. The first source feature 228S is coupled to a bottom power rail by way of the first source contact 236 and the first source contact via 238. The second source feature 248S is couple to the bottom power rail by way of the second source contact 262 and the second source contact via 266. The first source contact via 238 and the second source contact via 266 are disposed on two sides of the first source 228S. The first drain feature 228D is coupled to a top power rail by way of the first drain contact 234 and the first drain contact via 270. The second drain feature 248D is coupled to the top power rail by way of the second drain contact 264 and the second drain contact via 268. The top power rail is disposed in the top interconnect layer 272.

Figure 17:
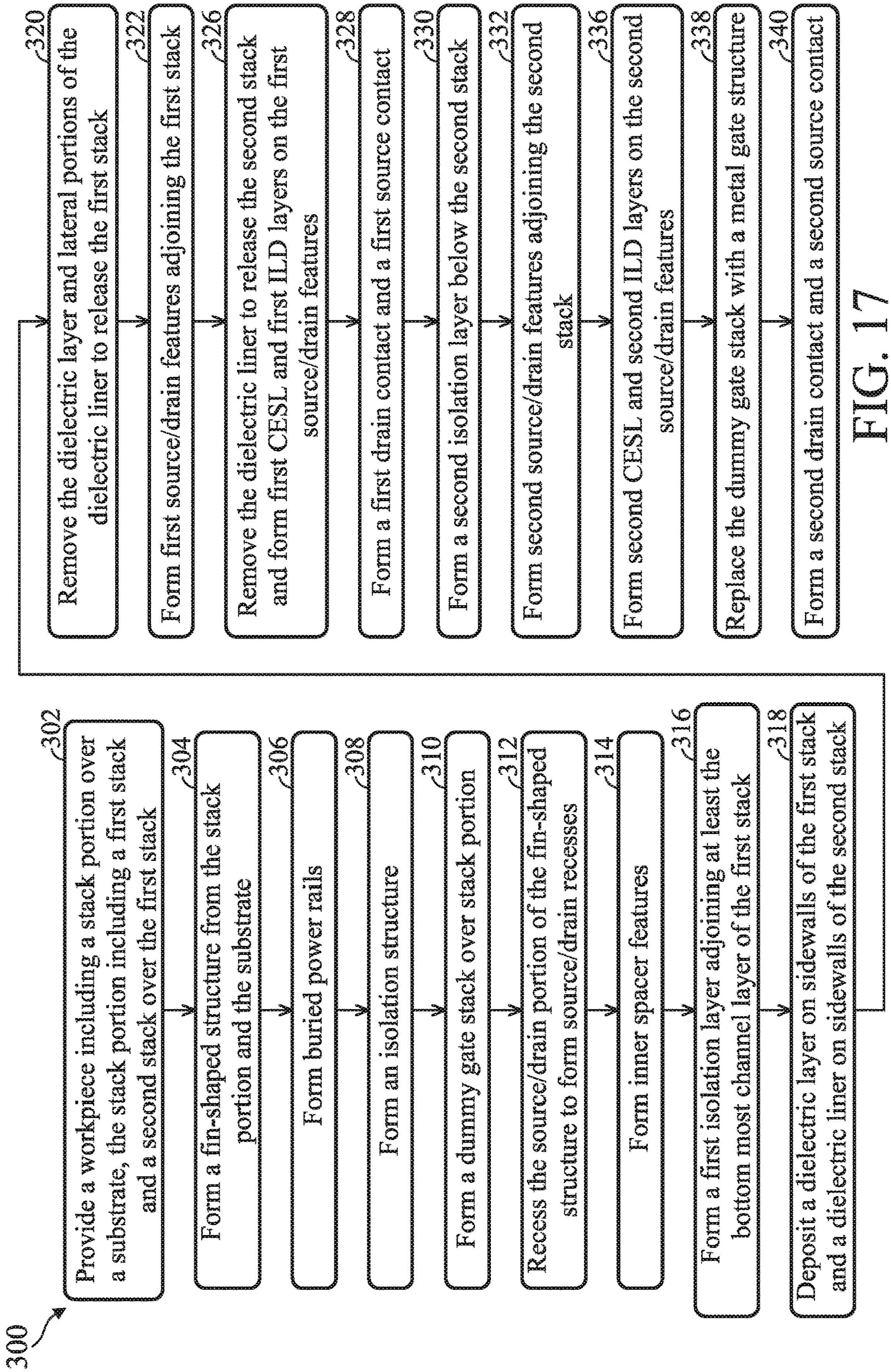
FIG. 17 illustrates a flow chart of a method for forming a semiconductor device having stacked GAA transistors, according to one or more aspects of the present disclosure.
Figure 18C:
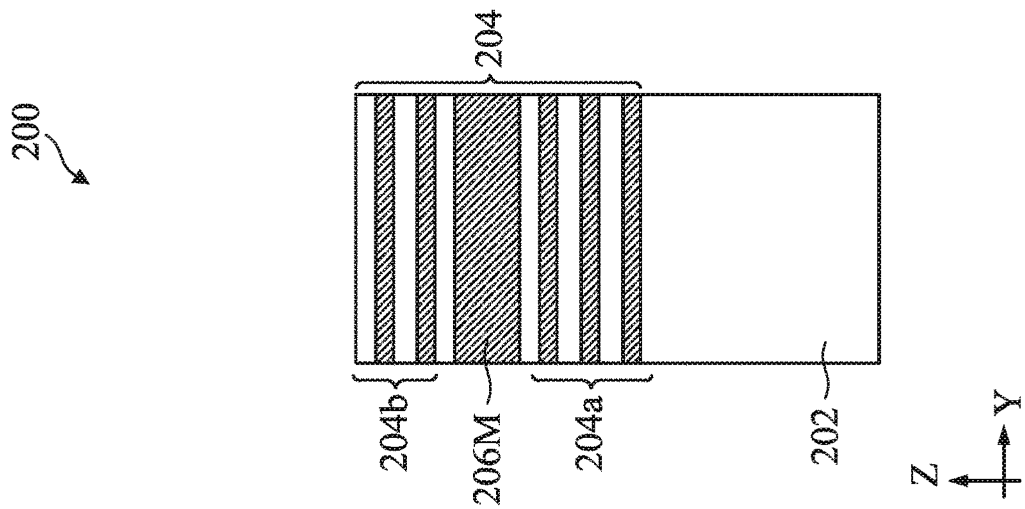
FIGS. 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, and 33C illustrate fragmentary cross-sectional views of a workpiece during a fabrication process according to the method of FIG. 17, according to one or more aspects of the present disclosure.
Figure 18B:
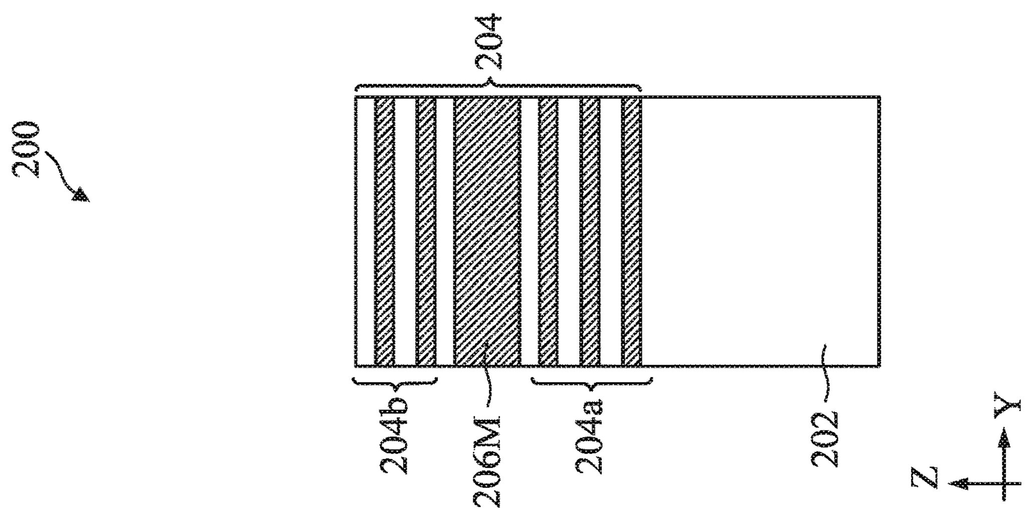
Figure 18A:
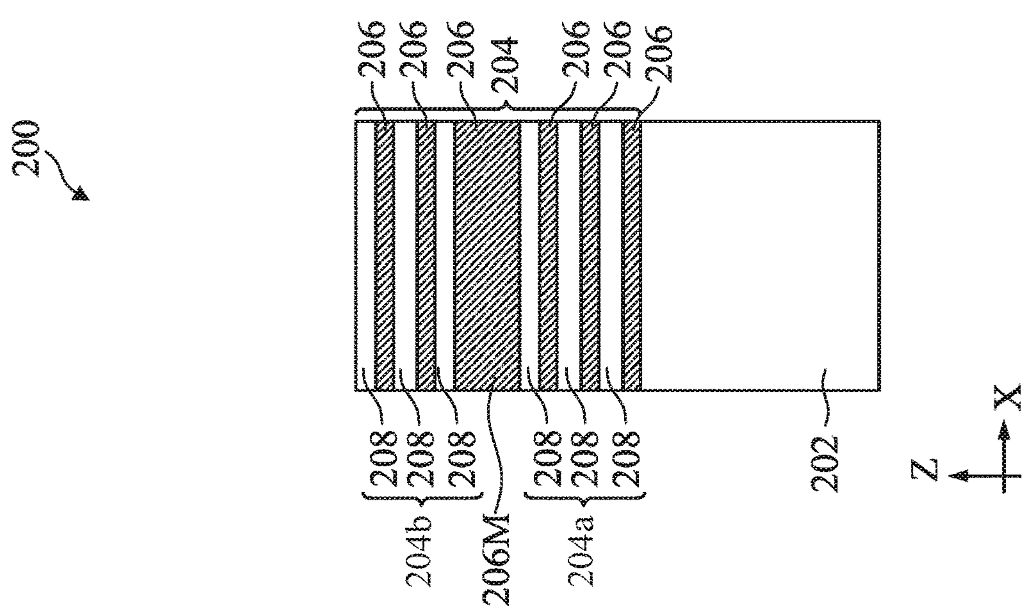
Figure 19A:
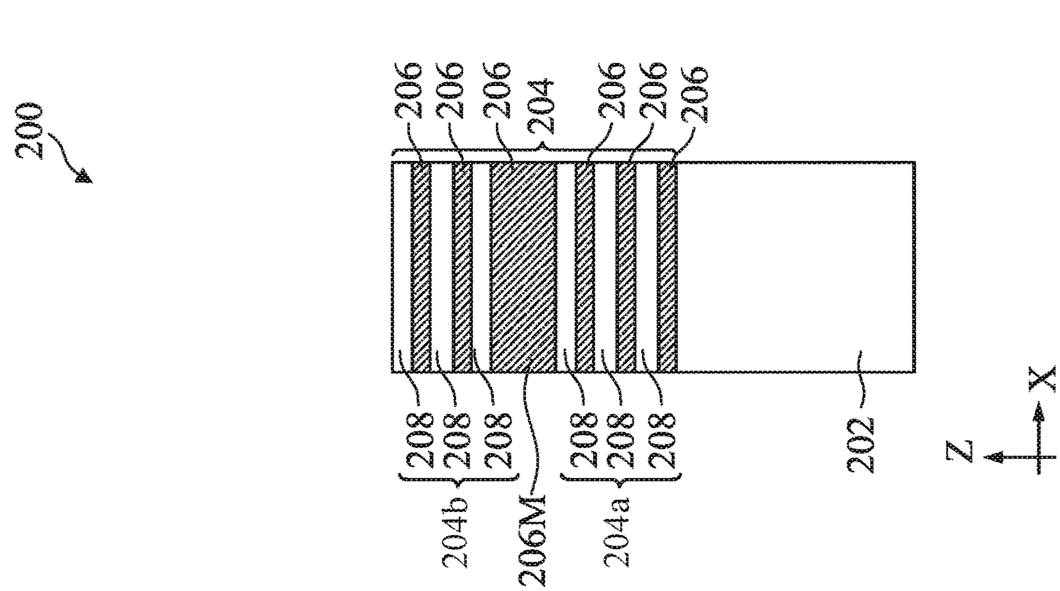
Figure 19B:
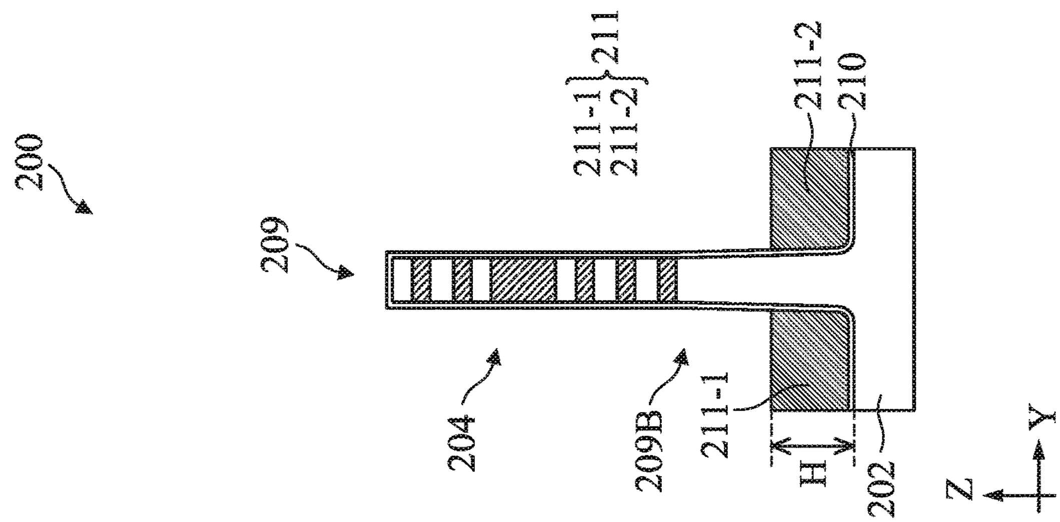
Figure 19C:
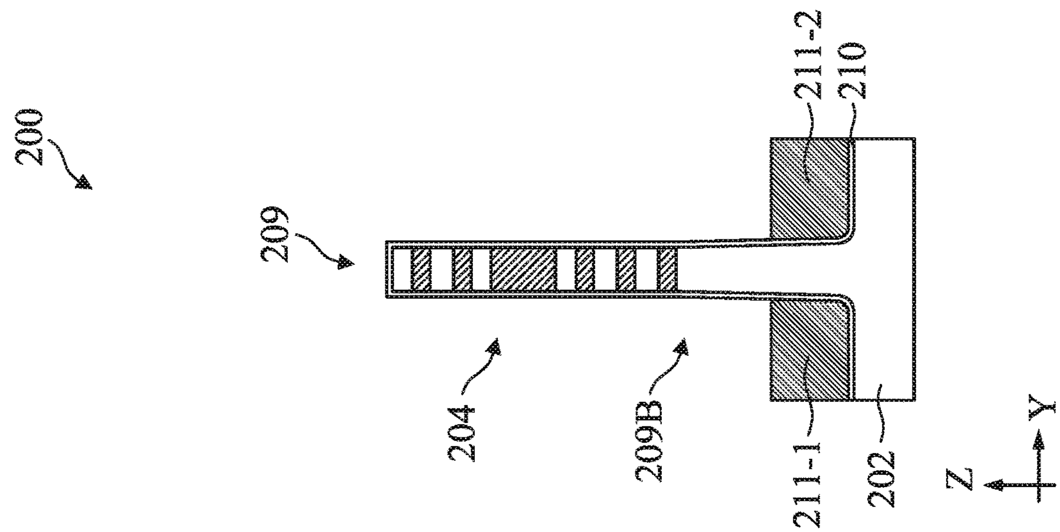
Figure 20A:
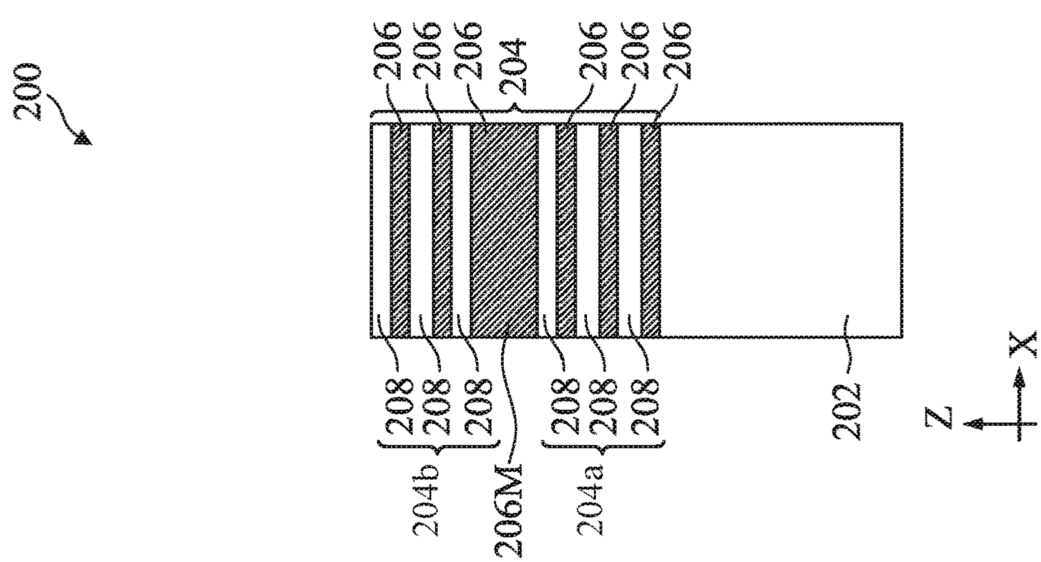
Figure 20B:
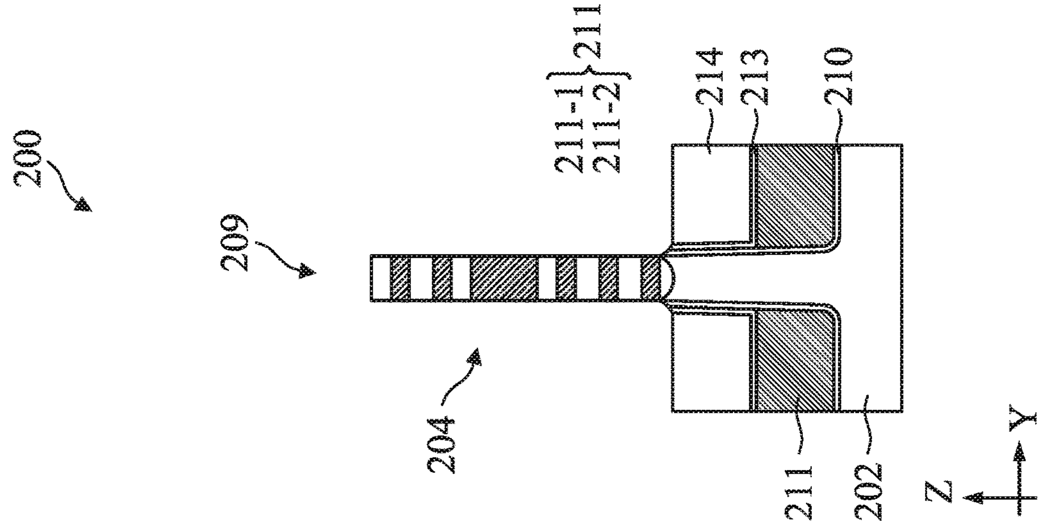
Figure 20C:
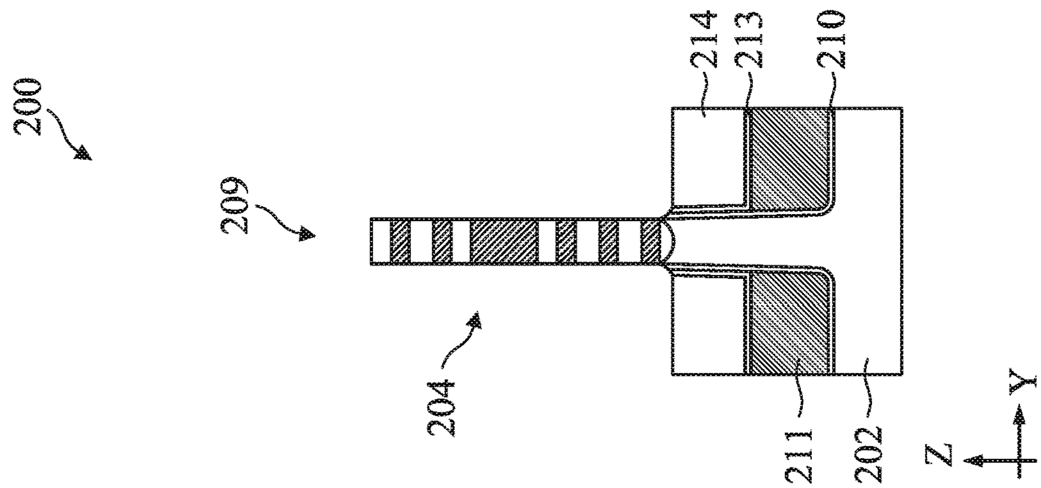
Figure 21C:
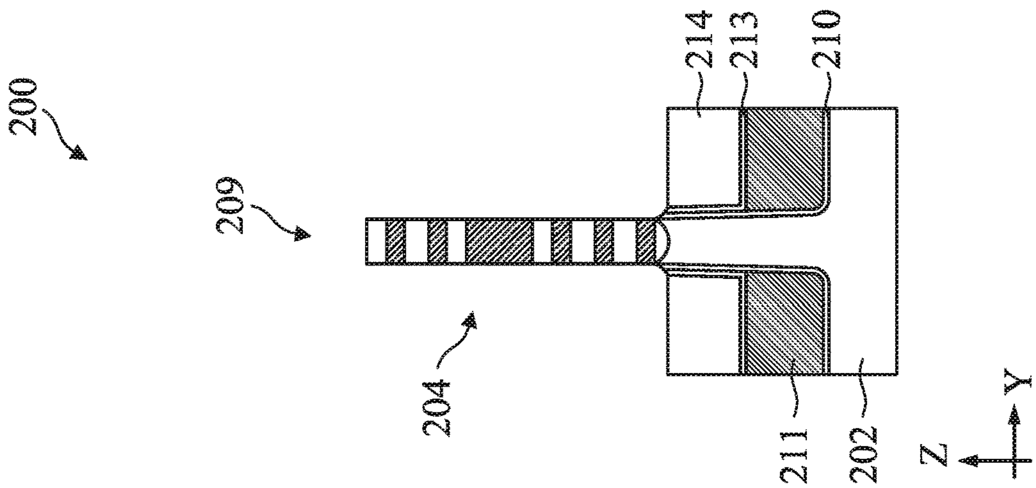
Figure 21B:
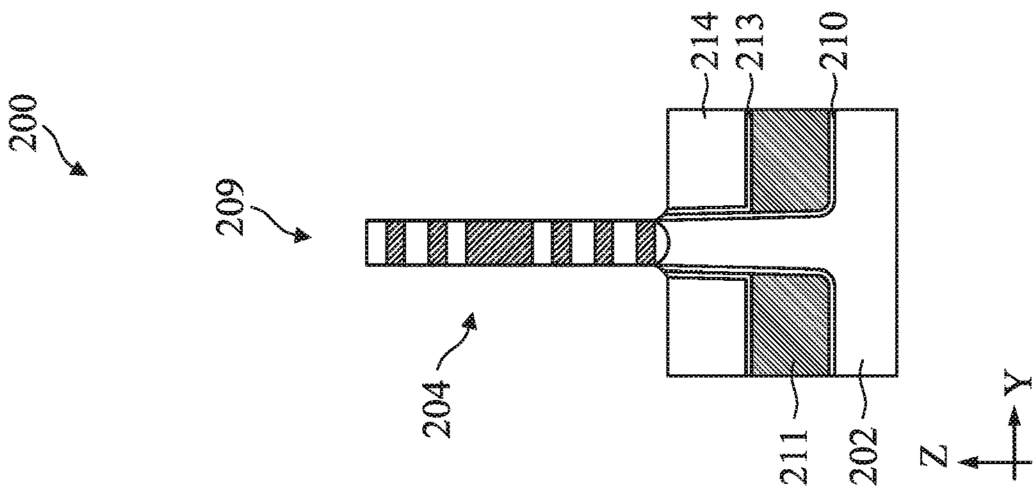
Figure 21A:
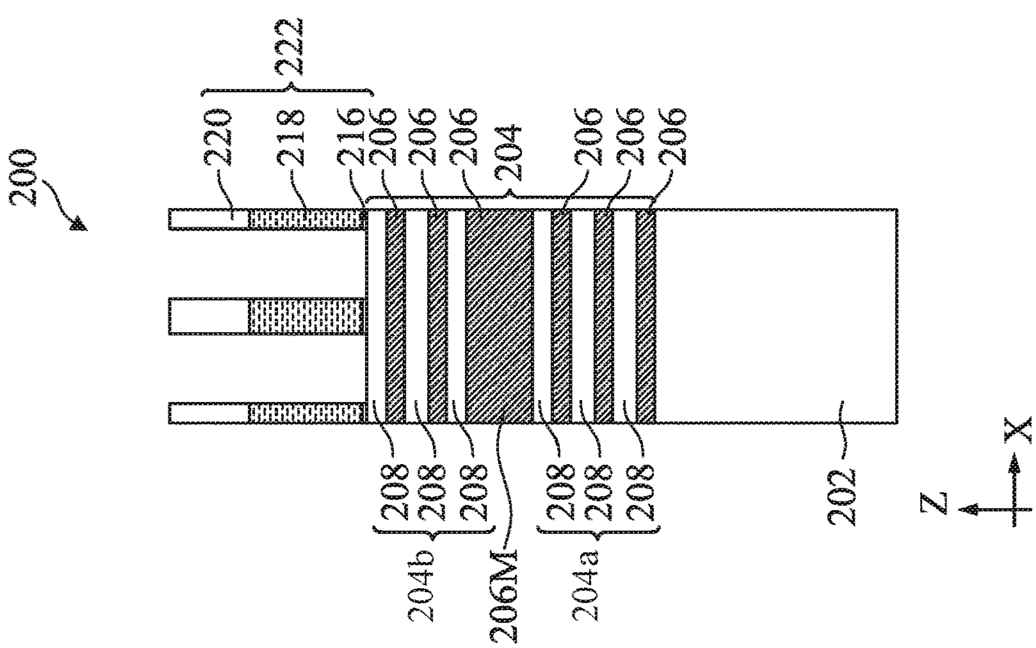
Figure 22A:
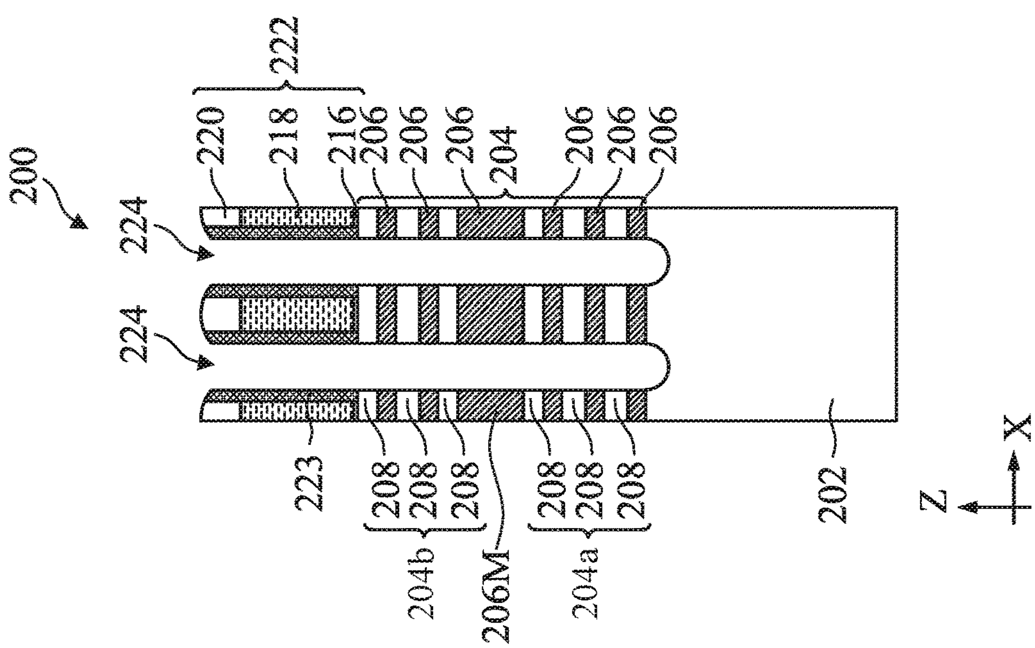
Figure 22B:
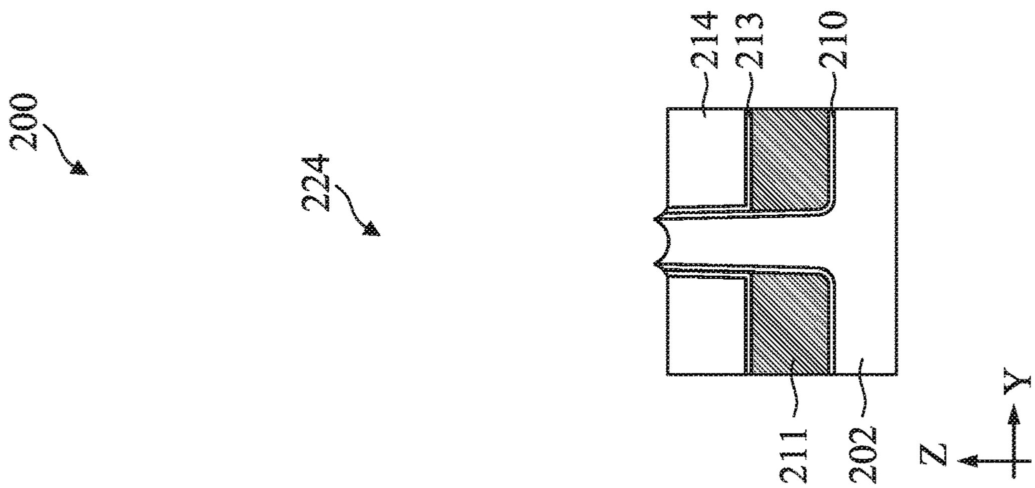
Figure 22C:
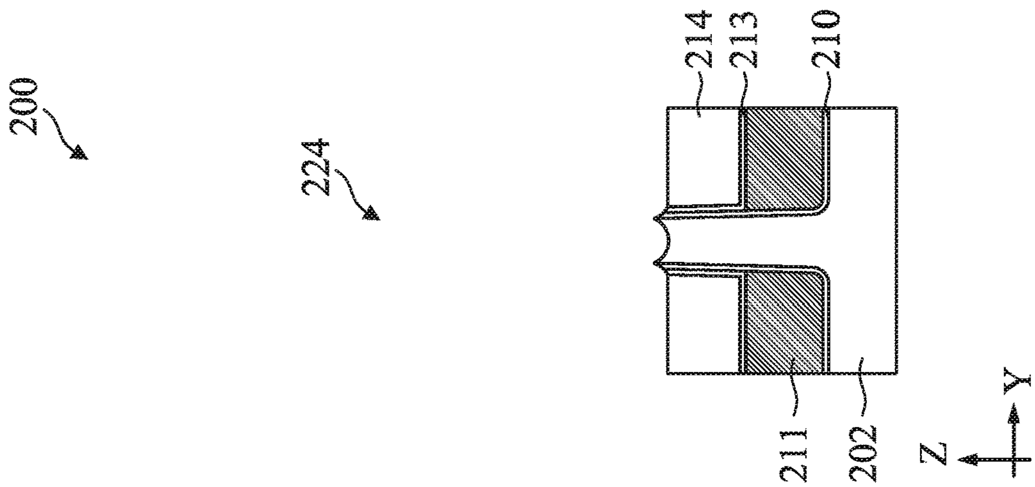
Figure 23C:
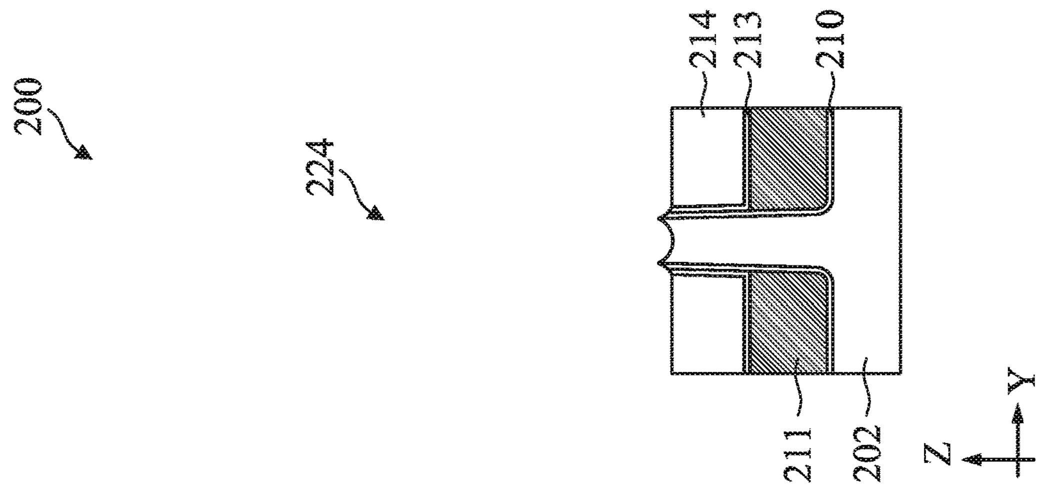
Figure 23B:
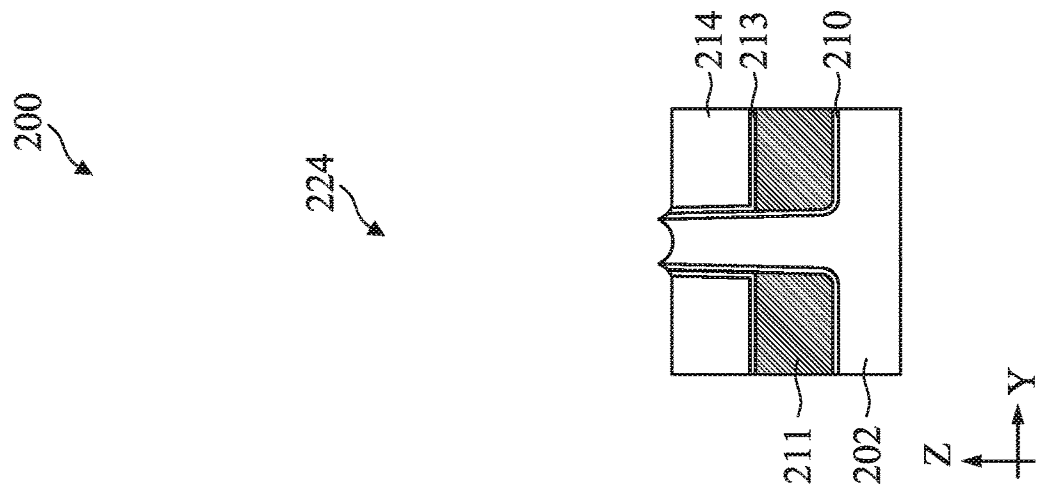
Figure 23A:
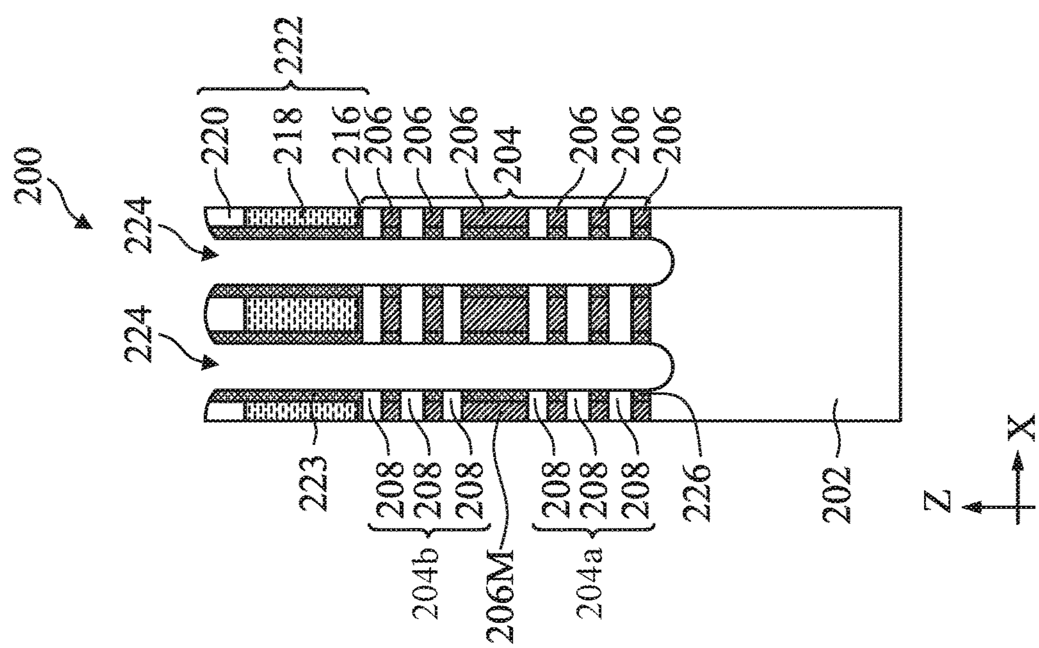

Attention is now turned to method 300. FIG. 17 illustrates a flow chart of method 300, according to various aspects of the present disclosure. Throughout the present disclosure, similar reference numerals denote similar features in terms composition and formation. Some details of operations in method 300 may be simplified or omitted if similar details have been described in conjunction with method 100.

Referring to FIGS. 17 and 18A-C, method 300 includes a block 302 where a workpiece 200 is provided. The workpiece 200 includes a substrate portion (also referred to as substrate) 202 and a stack portion 204 over the substrate 202. The stack portion 204 includes a first stack 204*a* and a second stack 204*b* over the first stack 204*a*. Because the substrate 202 and the stack portion 204 have been described above, detailed descriptions thereof are omitted here.

Referring to FIGS. 17 and 19A-C, method 300 includes a block 304 where a fin-shaped structure 209 is formed from the stack portion 204. Because operations at block 304 are similar to those at block 104, detailed descriptions thereof are omitted for brevity.

Still referring to FIGS. 17 and 19A-C, method 300 includes a block 306 where buried power rails 211 are formed. Because operations at block 306 are similar to those at block 106, detailed descriptions thereof are omitted for brevity.

Referring to FIGS. 17 and 20A-C, method 300 includes a block 308 where an isolation feature 214 is formed. Because operations at block 308 are similar to those at block 108, detailed descriptions thereof are omitted for brevity.

Referring to FIGS. 17 and 21A-C, method 300 includes a block 310 where a dummy gate stack 222 is formed over the stack portion 204. Because operations at block 310 are similar to those at block 110, detailed descriptions thereof are omitted for brevity.

Referring to FIGS. 17 and 22A-C, method 300 includes a block 312 where source/drain portions of the fin-shaped structure 209 are recessed to form source/drain recesses 224. Because operations at block 312 are similar to those at block 112, detailed descriptions thereof are omitted for brevity.

Referring to FIGS. 17 and 23A-C, method 300 includes a block 314 where inner spacer features 226 are formed. Because operations at block 314 are similar to those at block 114, detailed descriptions thereof are omitted for brevity.

Figure 24A:
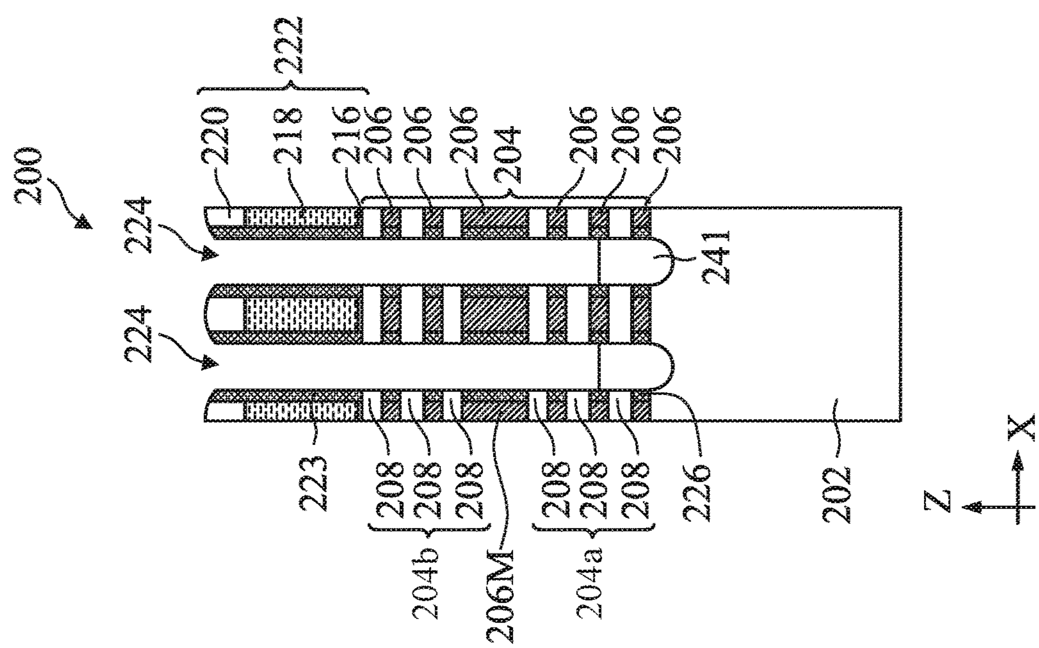
Figure 24B:
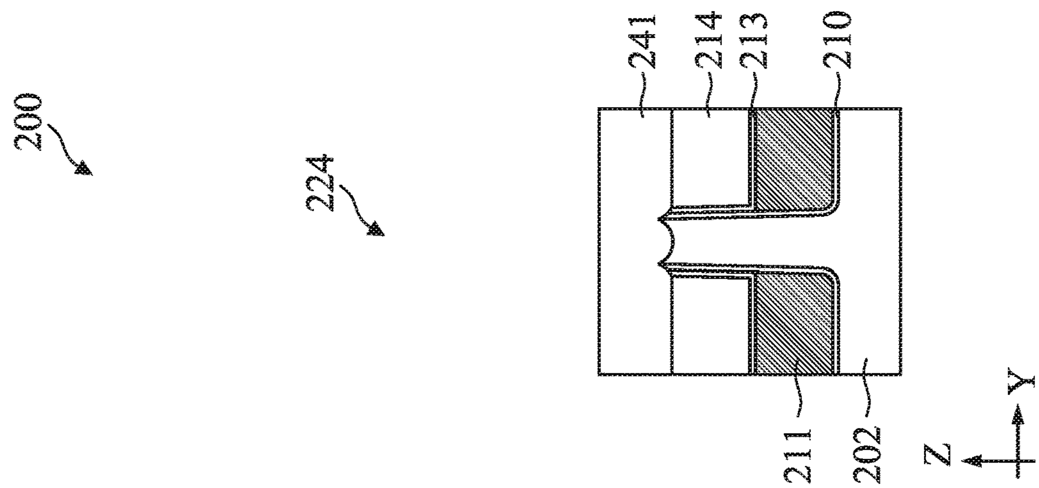
Figure 24C:
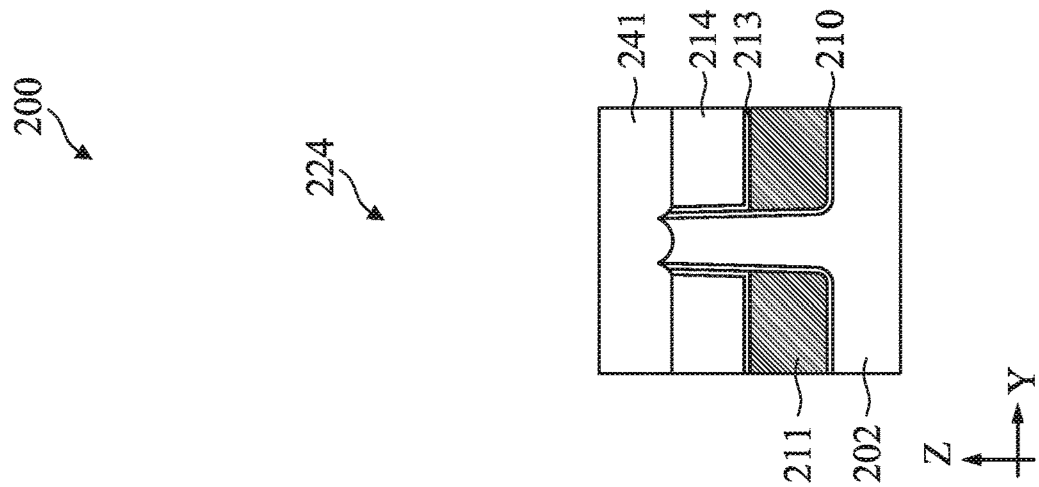
Figures 25A, 25B, 25C:
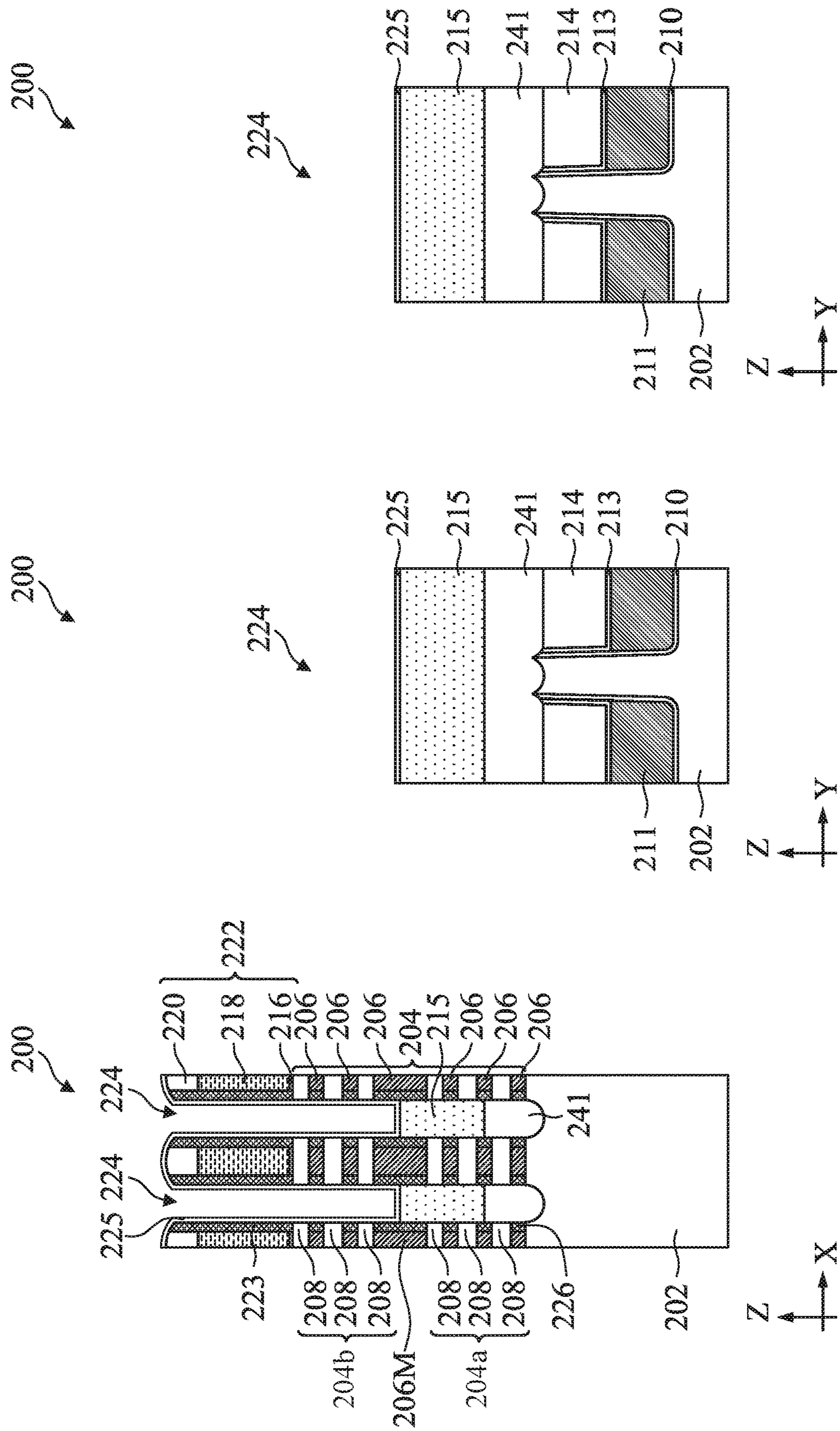
Figure 26A:
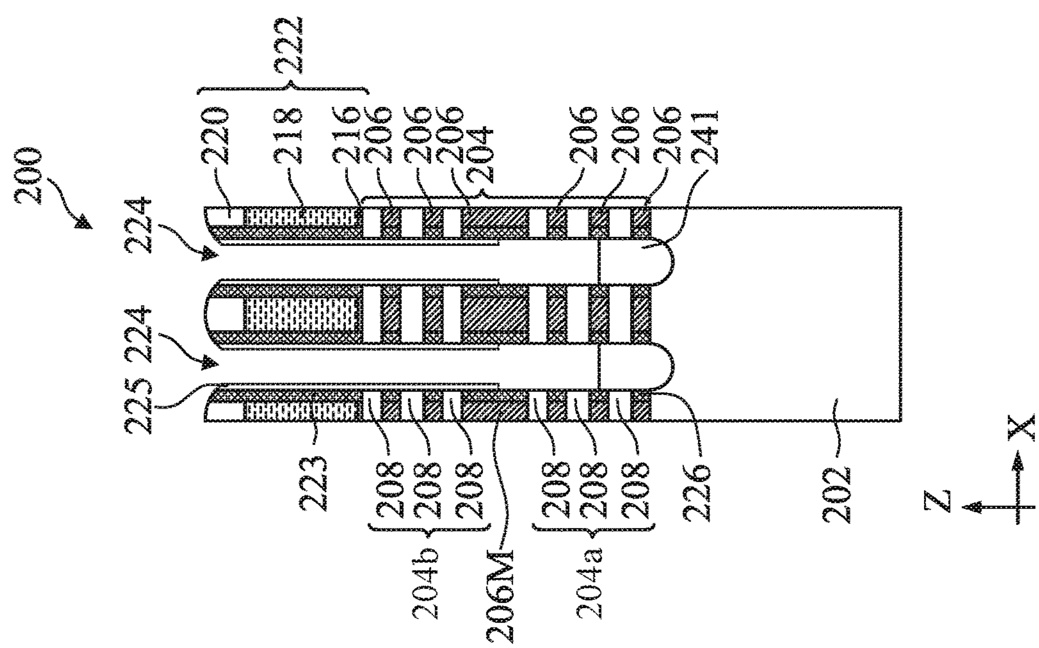
Figure 26B:
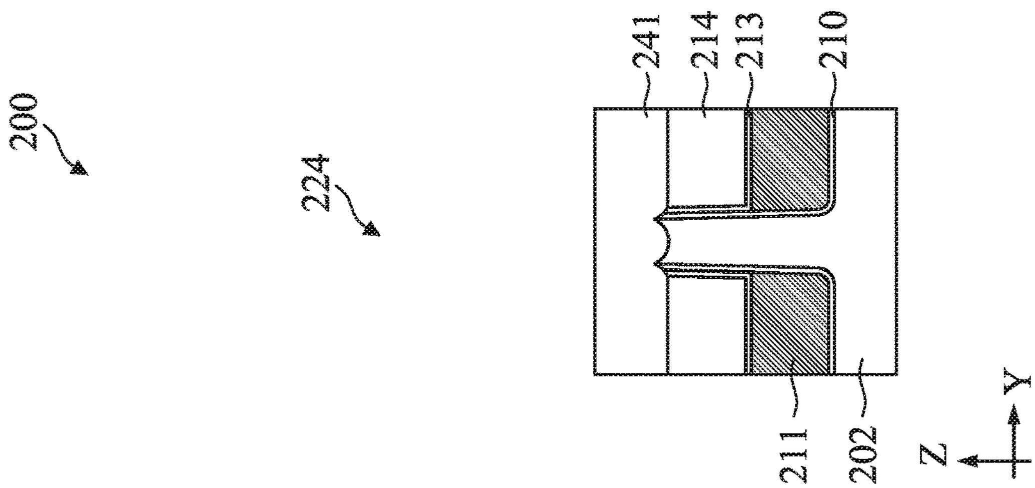
Figure 26C:
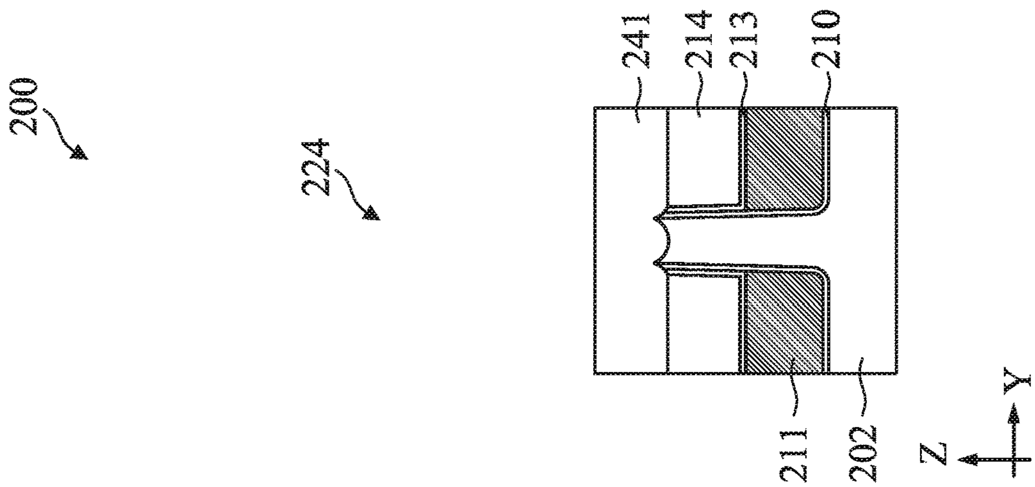

Referring to FIGS. 17 and 24A-C, method 300 includes a block 316 where a first dielectric isolation layer 241 is deposited in the source/drain recesses 224. The first dielectric isolation layer 241 may include silicon nitride, silicon oxide, silicon oxynitride, hafnium oxide, aluminum oxide, zirconium oxide, or other suitable isolation material. In an embodiment, the dielectric isolation layer 241 may be formed by filling the source/drain trenches 224 with dielectric isolation material (e.g., by using a CVD process or a spin-on glass process), and etching back the dielectric isolation material in a selective etching process. As shown in FIG. 24A, the first dielectric isolation layer 241 covers opposite sidewalls of at least the bottommost channel layer 208 of the first stack 204*a*. In some embodiments, the first dielectric isolation layer 241 adjoins more than one bottom channel layers 208 in the first stack 204*a*.

Referring to FIGS. 17 and 25A-C, method 300 includes a block 318 where a sacrificial dielectric layer 215 is deposited in the source/drain trenches 224 and covers the first dielectric isolation layer 241. The sacrificial dielectric layer 215 may include silicon oxide, silicon oxycarbide, or a dielectric material that allows selective etching of the sacrificial dielectric layer 215 while keeping the inner spacer features 226 substantially intact. The sacrificial dielectric layer 215 may be deposited using CVD. Then the sacrificial dielectric layer 215 is etched back to expose the second stack 204*b*, while sidewalls of the first stack 204*a* remains covered. That is, after the etching back of the sacrificial dielectric layer 215, sidewalls of the channel layers 208 of the second stack 204*b* and respective inner spacer features interleaved therein are exposed in the source/drain trenches 224. The etch process may be a dry etch process, a wet etch process, or a suitable etch process. The extent at which the sacrificial dielectric layer 215 are recessed is controlled by duration of the etching process. Operations at block 318 also includes conformally depositing a third liner 225 over the workpiece 200. The sidewalls of the first stack 204*b* are covered by the third liner 225. The third liner 225 may include silicon nitride, silicon carbonitride, or other suitable dielectric material that provides etching contrast to the sacrificial dielectric layer 215. The third liner 225 may be deposited using CVD, ALD, or other suitable deposition process.

Referring to FIGS. 17 and 26A-C, method 300 includes a block 320 where lateral portion of the third liner 225 is removed. By using an anisotropic etching, such as RIE or other suitable dry etch process, vertical portion of the third liner 225 remains covering the sidewalls of the second stack 204*b*, while lateral portion of the third liner 225 is removed from the source/drain trenches 224, exposing the sacrificial dielectric layer 215. Operations at block 320 also includes removing the sacrificial dielectric layer 215 in a selective etch process to release upper portions of the first stack 204*a*, while the bottommost channel layer 208 remains covered by the first dielectric isolation layer 241. In an example where the sacrificial dielectric layer 215 is formed of an oxide and the inner spacer features 226, the third liner 225, and the first dielectric isolation layer 241 are formed of nitrides, the sacrificial dielectric layer 215 may be selectively removed using diluted hydrofluoric acid (DHF) or buffered hydrofluoric acid (BHF). Here, BHF includes hydrofluoric acid and ammonium fluoride. Upon conclusion of the operations at block 320, the sidewalls of the upper channel layers 208 of the first stack 204*a* are exposed in the source/drain trenches 224, while the sidewalls of the channel layers 208 of the second stack 204*b* and a top portion of the middle sacrificial layer 206M remain covered by the third liner 225.

Figure 27A:
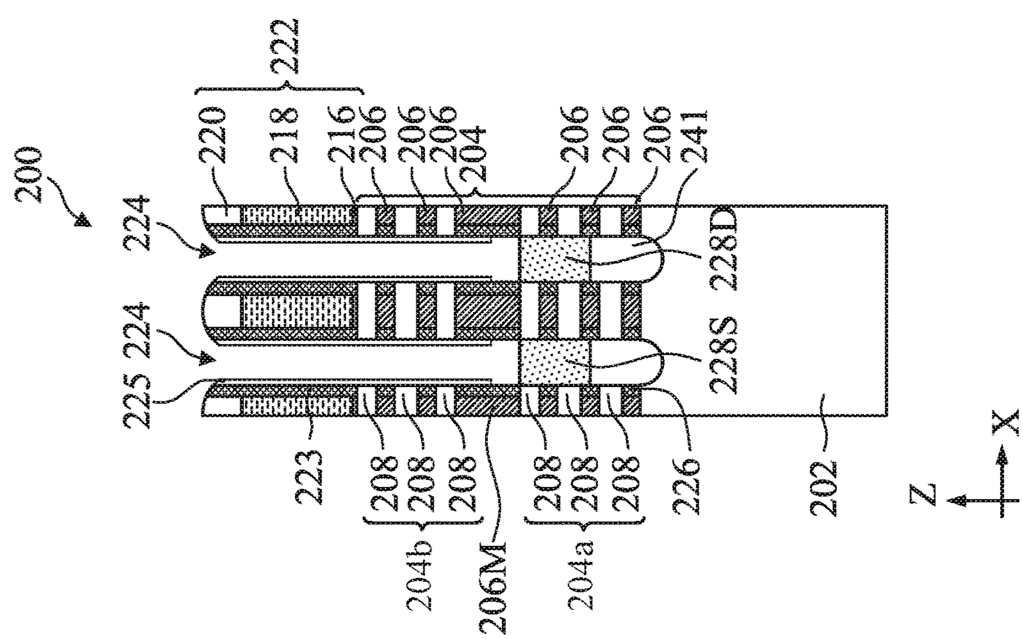
Figure 27B:
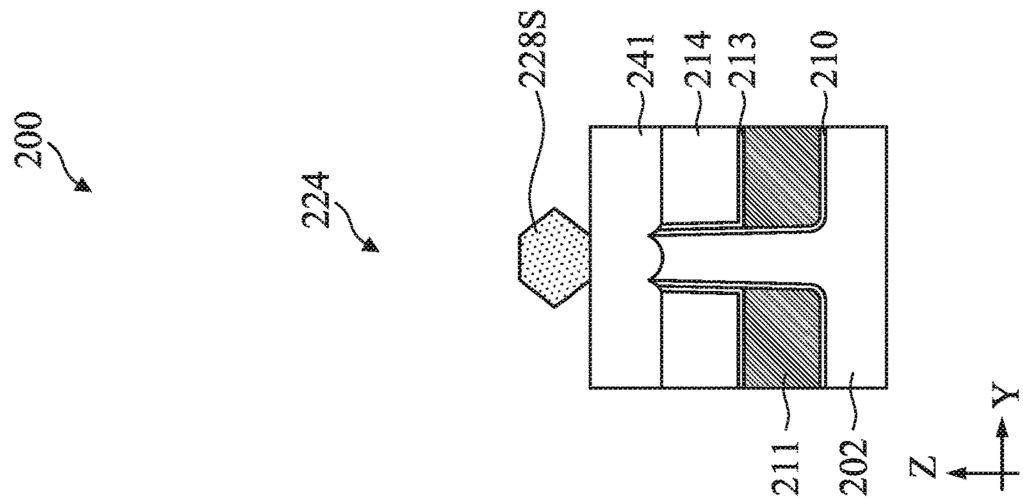
Figure 27C:
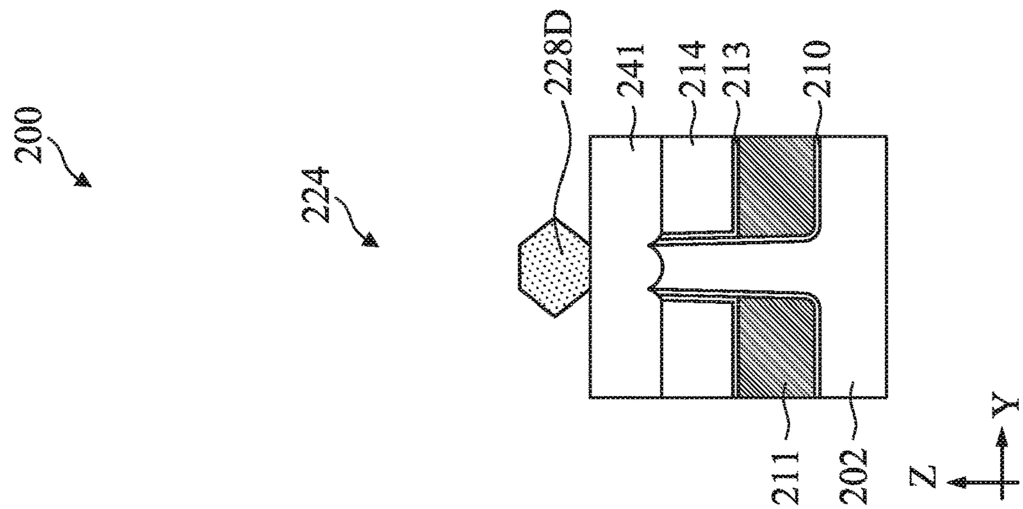
Figure 28A:
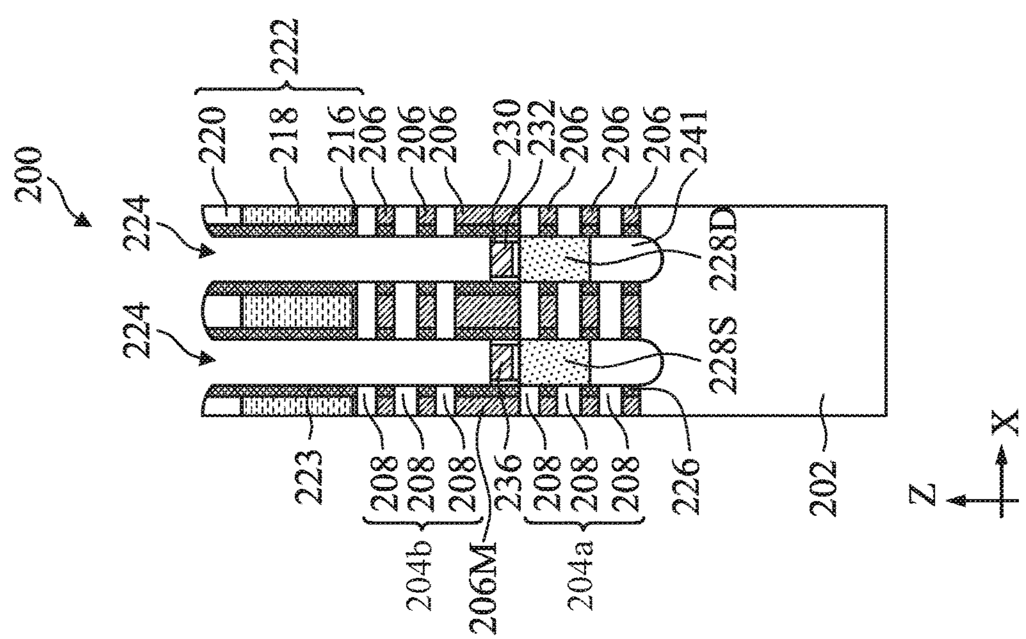
Figure 28B:
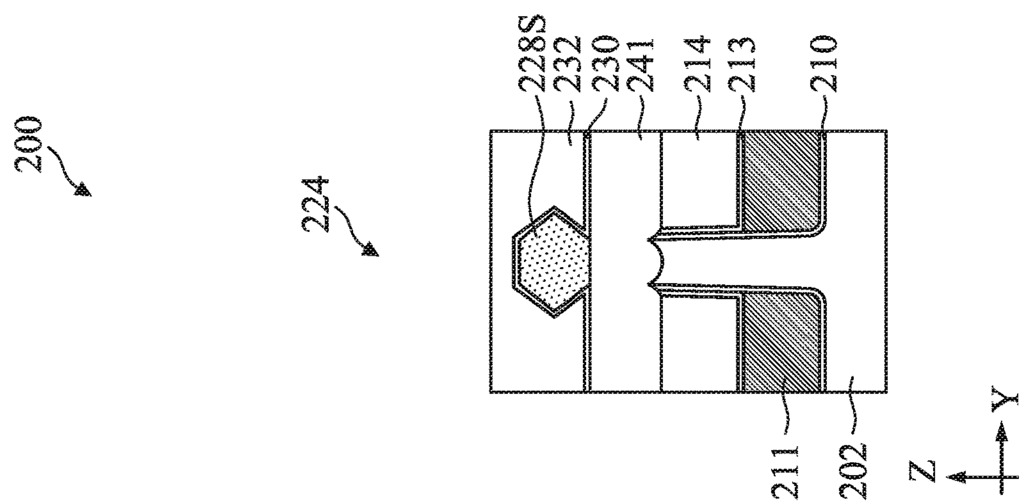
Figure 28C:
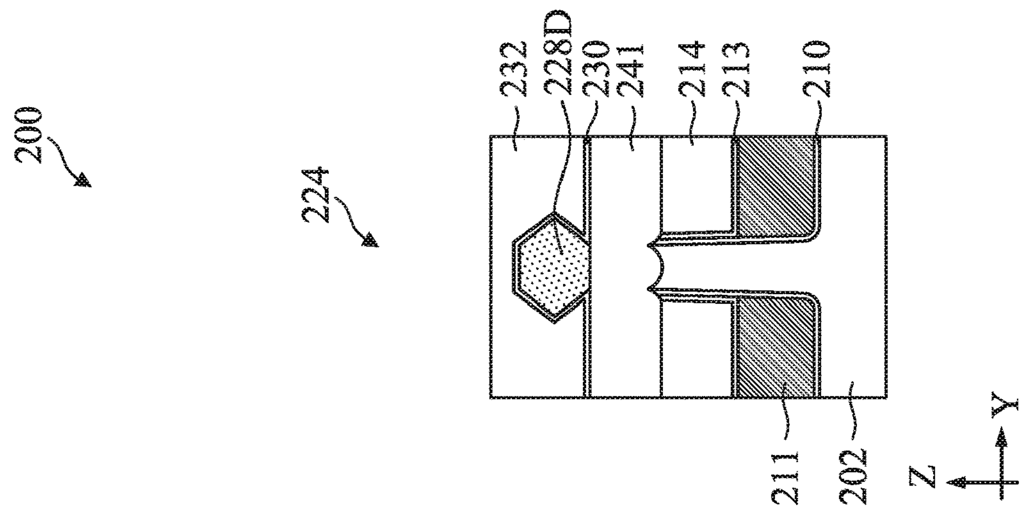

Referring to FIGS. 17 and 27A-C, method 300 includes a block 322 where a first source feature 228S and a first drain feature 228D are formed in the source/drain trenches 224. The first source feature 228S and the first drain feature 228D may be formed using an epitaxial process, such as VPE, UHV-CVD, MBE, and/or other suitable processes. The epitaxial growth process may use gaseous and/or liquid precursors, which interact with the channel layers 208. The exposed sidewalls of the channel layers 208 of the first stack 204*a* functionally serve as semiconductor seed layers. Therefore, the epitaxial growth of the first source feature 228S and the first drain feature 228D may take place from the exposed sidewalls of the channel layers 208 of the first stack 204*a*, but not from the ones (e.g., the bottommost one in the illustration) adjoined by the first dielectric isolation layer 241. As illustrated in FIG. 27A, the first source feature 228S and the first drain feature 228D are therefore in physical contact with (or adjoining) the upper channel layers 208 of the first stack 204*a*, forming active channel layers. Since the bottommost channel layer 208 in the first stack 204*a* is covered by the first dielectric isolation layer 241, epitaxial growth won't take place from the sidewalls thereof. Isolated from the first source feature 228S and the first drain feature 228D by the first dielectric isolation layer 241, the bottommost channel layer 208 of the first stack 204*a* becomes a "floating" (or inactive) channel layer. Since the channel layers 208 in the second stack 204*b* are covered by the third liner 225, epitaxial growth won't take place from the sidewalls thereof. The duration of the epitaxial growth is controlled such that the first source feature 228S and the first drain feature 228D do not extend upwardly beyond the middle sacrificial layer 206M. Because the material compositions of the first source feature 228S and the first drain feature 228D have been described above, detailed descriptions thereof are omitted here.

Referring to FIGS. 17 and 28A-C, method 300 includes a block 326 where a first contact etch stop layer (CESL) 230 and a first interlayer dielectric (ILD) layer 232 are deposited on the first source feature 228S and the first drain feature 228D. Because operations at block 326 are similar to those at block 126, detailed descriptions thereof are omitted for brevity.

Referring to FIGS. 17 and 29A-C, method 300 includes a block 328 where interconnection features, such as a first drain contact 234, a first source contact 236, a first source contact via 238 are formed. Because operations at block 328 are similar to those at block 128, detailed descriptions thereof are omitted for brevity.

Figure 29A:
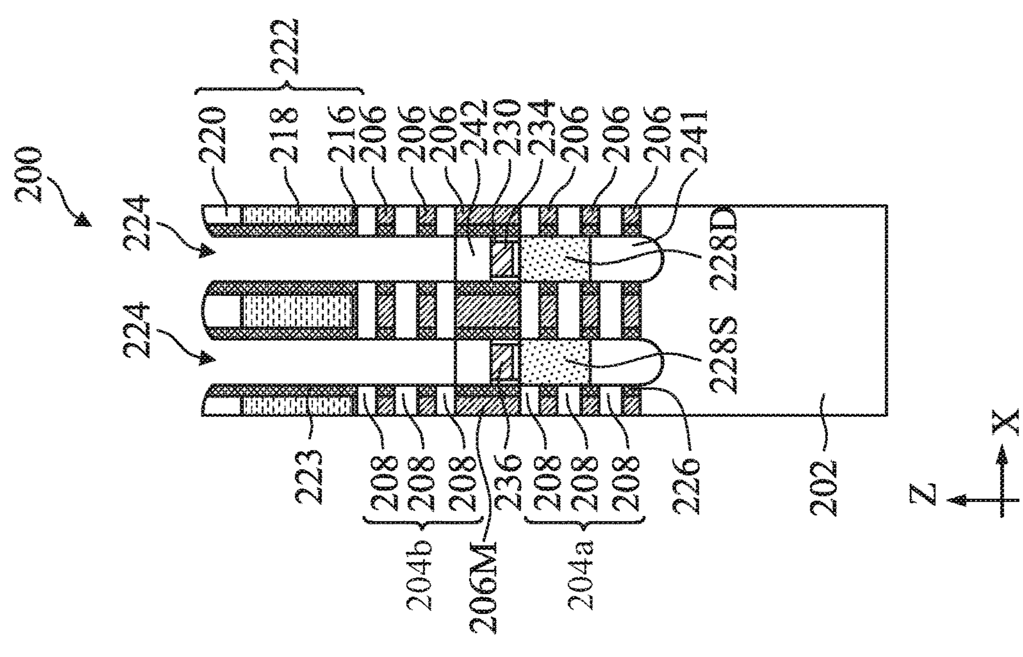
Figure 29B:
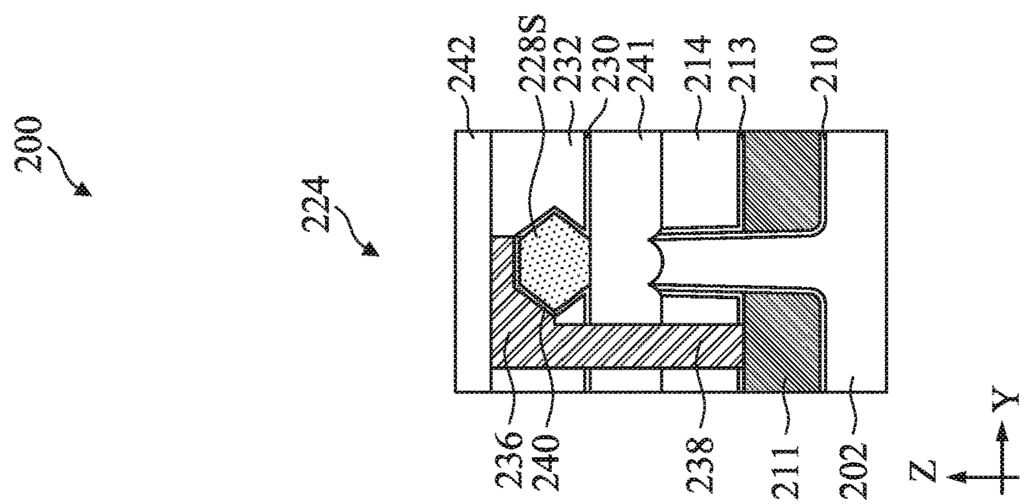
Figure 29C:
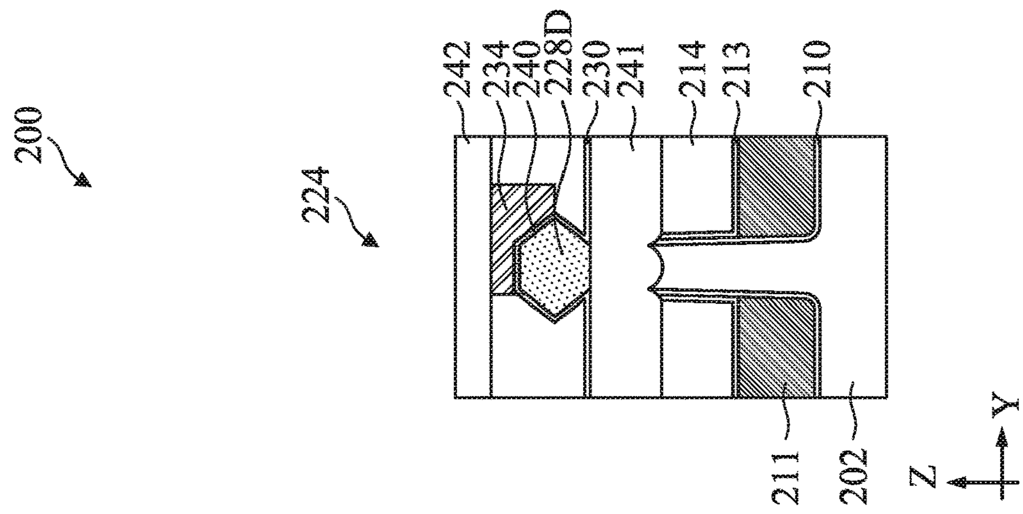

Still referring to FIGS. 17 and 29A-C, method 300 includes a block 330 where a second dielectric isolation layer 242 is deposited over the first ILD layer 232 and covering interconnection features formed in earlier operations at block 328. The second dielectric isolation layer 242 may include silicon nitride, silicon oxide, silicon oxynitride, hafnium oxide, aluminum oxide, zirconium oxide, or other suitable isolation material. In an embodiment, the dielectric isolation layer 242 may be formed by filling the source/drain trenches 224 with dielectric isolation material (e.g., by using a CVD process or a spin-on glass process), and etching back the dielectric isolation material in a selective etching process. As shown in FIG. 29A, the dielectric isolation layer 242 covers the inner spacer features 226 that are on sidewalls of the middle sacrificial layer 206M but not on sidewalls of the bottom channel layer 208 of the second stack 204*b*. State differently, the sidewalls of the bottom channel layers 208 of the second stack 204*b* remain exposed in the source/drain trenches 224.

Figures 30A, 30B, 30C:
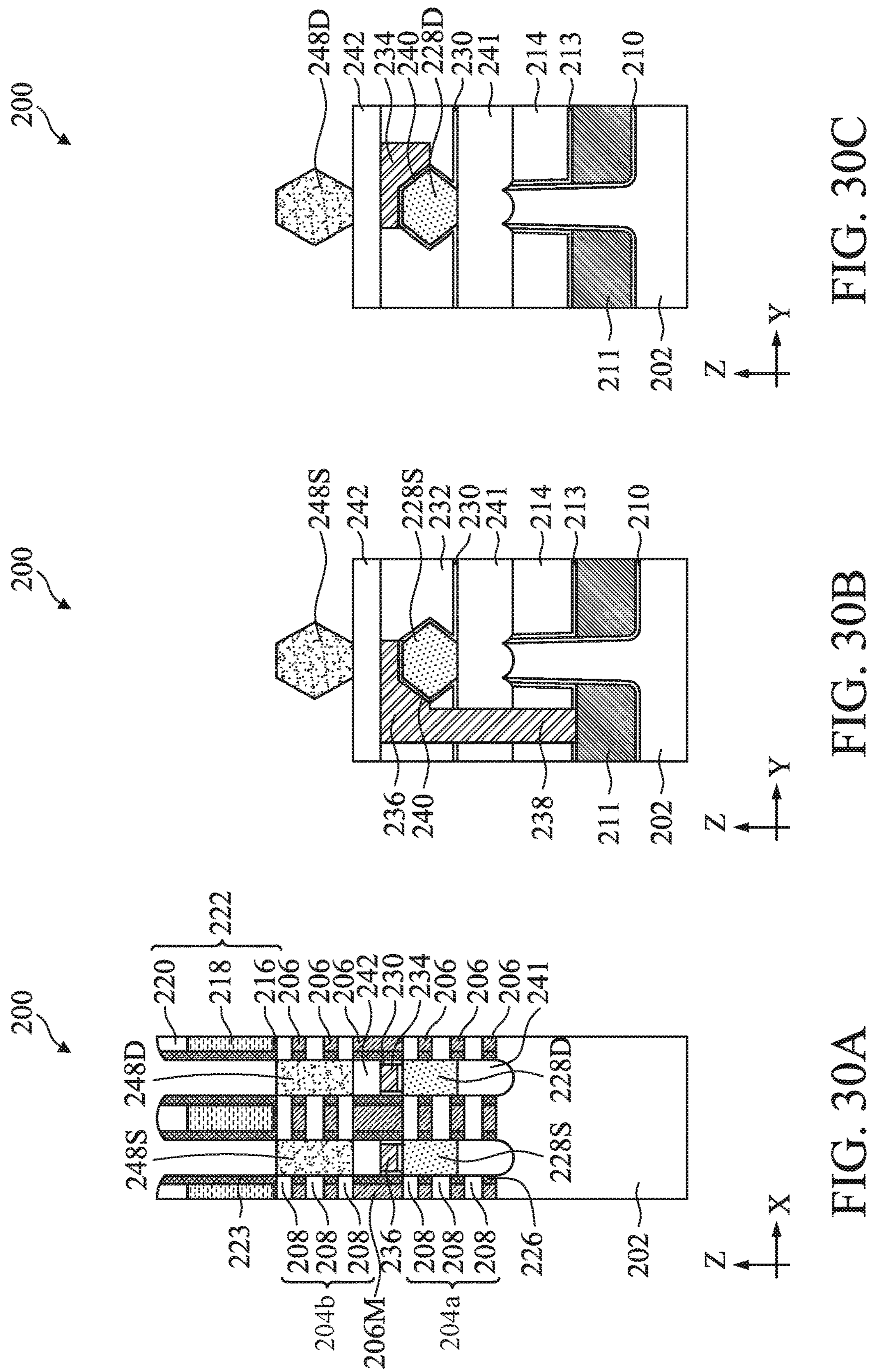
Figure 31C:
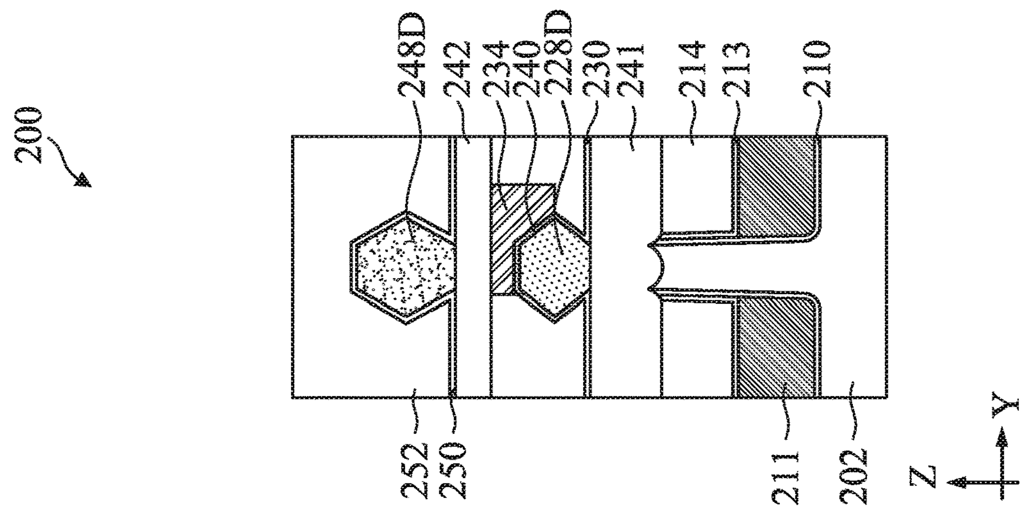
Figure 31B:
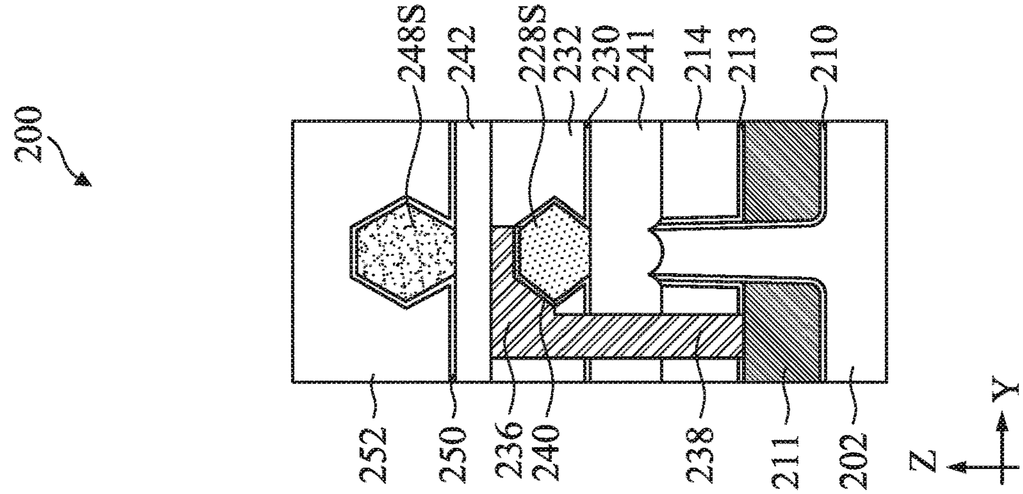
Figure 31A:
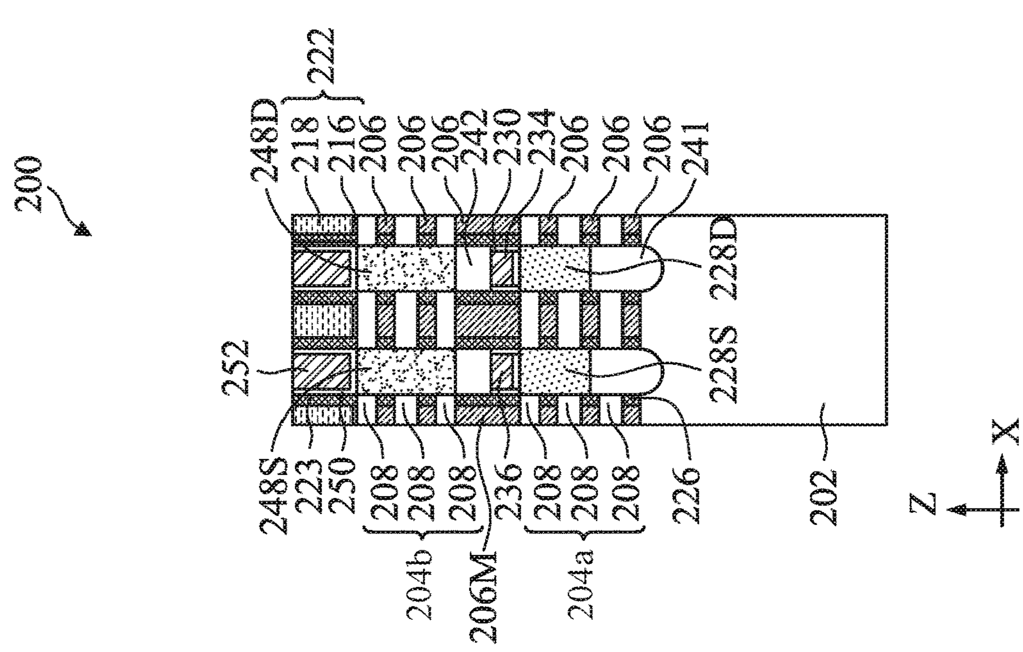
Figure 32C:
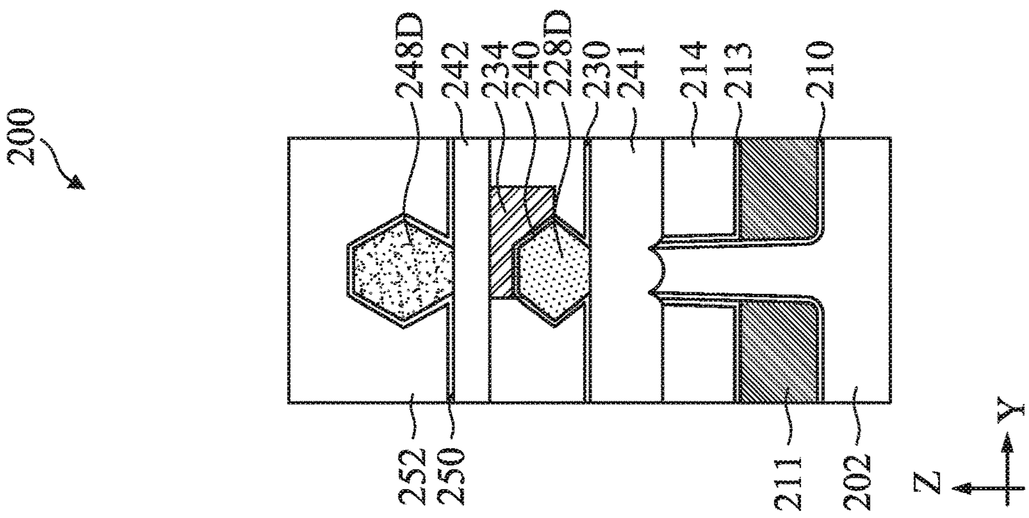
Figure 32B:
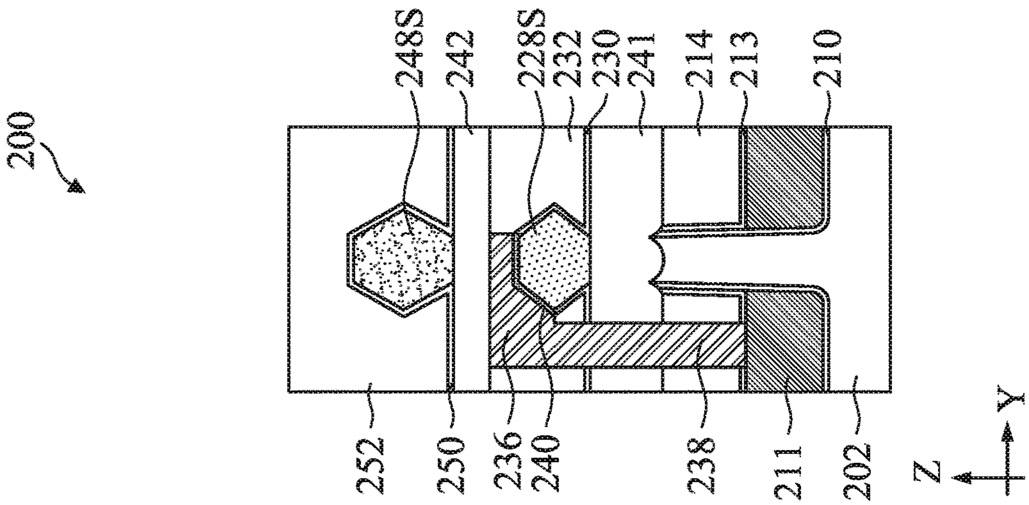
Figure 32A:
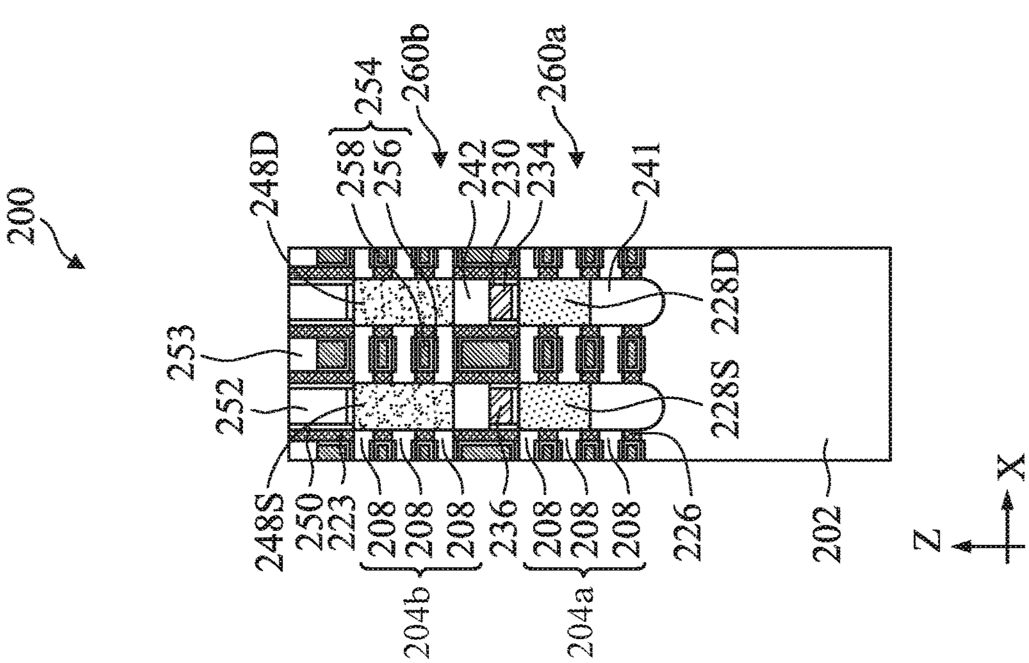

Referring to FIGS. 17 and 30A-C, method 300 includes a block 332 where a second source feature 248S and a second drain feature 248D are formed in the source/drain trenches 224. The second source feature 248S and the second drain feature 248D may be formed using an epitaxial process, such as VPE, UHV-CVD, MBE, and/or other suitable processes. The epitaxial growth process may use gaseous and/or liquid precursors, which interact with the channel layers 208. The exposed sidewalls of the channel layers 208 of the second stack 204*b* functionally serve as semiconductor seed layers. Since there are no channel layers 208 adjoined to the second dielectric isolation layer 242, the epitaxial growth of the second source feature 248S and the second drain feature 248D may take place from the exposed sidewalls of all the channel layers 208 of the second stack 204*b*. As illustrated in FIG. 30A, the second source feature 248S and the second drain feature 248D are therefore in physical contact with (or adjoining) each channel layers 208 of the second stack 204*b*, turning all the channel layers 208 of the second stack 204*b* into active channel layers. Because the material compositions of the second source feature 248S and the second drain feature 248D have been described above, detailed descriptions thereof are omitted here.

Referring to FIGS. 17 and 31A-C, method 300 includes a block 336 where a second CESL 250 and a second interlayer dielectric (ILD) layer 252 are deposited on the second source feature 248S and the second drain feature 248D. Because operations at block 336 are similar to those at block 136, detailed descriptions thereof are omitted for brevity.

Referring to FIGS. 17 and 32A-C, method 300 includes a block 338 where the dummy gate stack 222 is removed and replaced by a common gate structure 254. Because operations at block 338 are similar to those at block 138, detailed descriptions thereof are omitted for brevity.

Referring to FIGS. 17 and 33A-C, method 300 includes a block 340 where interconnection features, such as a second source contact 262, a second drain contact 264, a second source contact via 266, a second drain contact via 268, a first drain contact via 270, and a top interconnect layer 272 are formed. Because operations at block 340 are similar to those at block 140, detailed descriptions thereof are omitted for brevity.

Figure 33A:
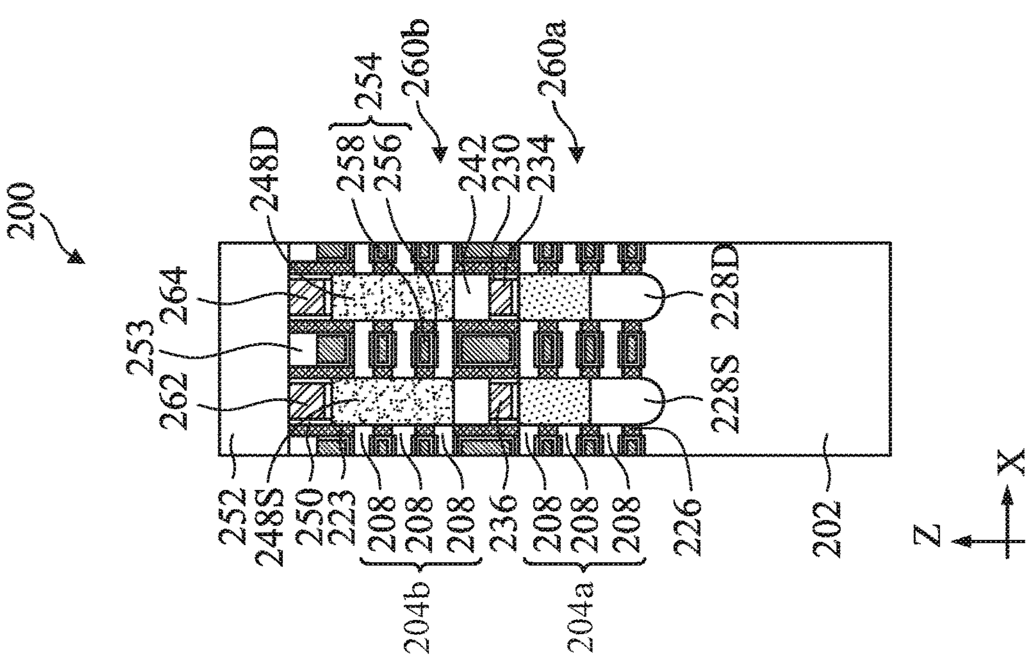
Figure 33B:
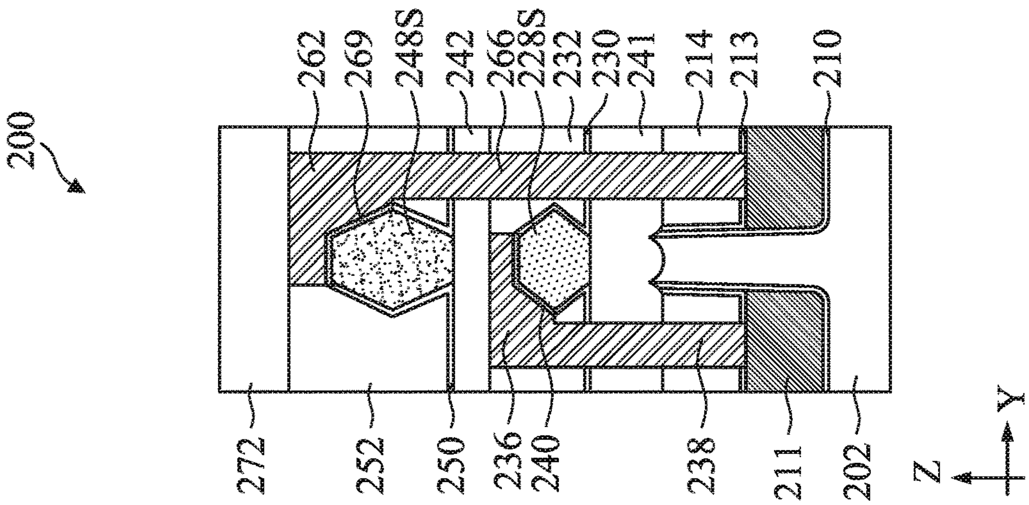
Figure 33C:
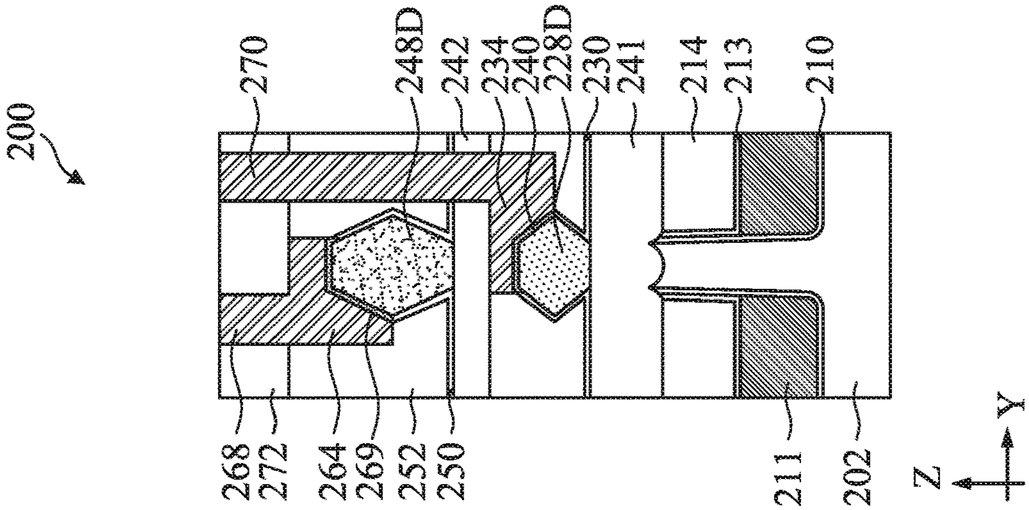

Reference is now made to FIGS. 33A-C. Upon conclusion of the operations in method 300, a bottom GAA transistor 260*a* and a top GAA transistor 260*b* stacked over the bottom GAA transistor 260*a* are formed. The top GAA transistor 260*b* includes channel layers (or referred to as channel members) sandwiched between the second source feature 248S and the second drain feature 248D. The bottom GAA transistor 260*a* includes a same number of channel layers as the top GAA transistor 260*b*. One difference is that not all channel layers of the bottom GAA transistor 260*a* are sandwiched between the first source feature 228S and the first drain feature 228D and function as active channel layers for carriers to flow through. At least a bottommost channel layer is adjoined by the first dielectric isolation layer 241 and becomes a "floating" (inactive) channel layer. Accordingly, the bottom GAA transistor 260*a* has one less active channel layer than the top GAA transistor 260*b*. In various embodiments, two or more bottom channel layers of the bottom GAA transistor 260*a* may be adjoined by the first dielectric isolation layer 241, and thus the bottom GAA transistor 260*a* may have two or more active channel layers less than the top GAA transistor 260*b*. Less number of active channel layers weakens current driving capability of the bottom GAA transistor 260*a*, which however may balance the current output in the pair of stacked GAA transistors. For example, when the top GAA transistor is an pFET and the bottom GAA transistor is an nFET, an nFET often provides a stronger current driving capability due to higher carrier mobility. By reducing a total active channel layer number of the nFET, a balanced current output from the pair of nFET and pFET can be achieved.

A common gate structure 254 wraps around each channel layer of the top and bottom GAA transistors 260*b* and 260*a*, while the second dielectric isolation layer 242 interposes the first source 228S and the second source 248S, and also interposes the first drain 228D and the second drain 248D. The first source feature 228S is coupled to a bottom power rail by way of the first source contact 236 and the first source contact via 238. The second source feature 248S is couple to the bottom power rail by way of the second source contact 262 and the second source contact via 266. The first source contact via 238 and the second source contact via 266 are disposed on two sides of the first source 228S. The first drain feature 228D is coupled to a top power rail by way of the first drain contact 234 and the first drain contact via 270. The second drain feature 248D is coupled to the top power rail by way of the second drain contact 264 and the second drain contact via 268. The top power rail is disposed in the top interconnect layer 272.

Figure 34:
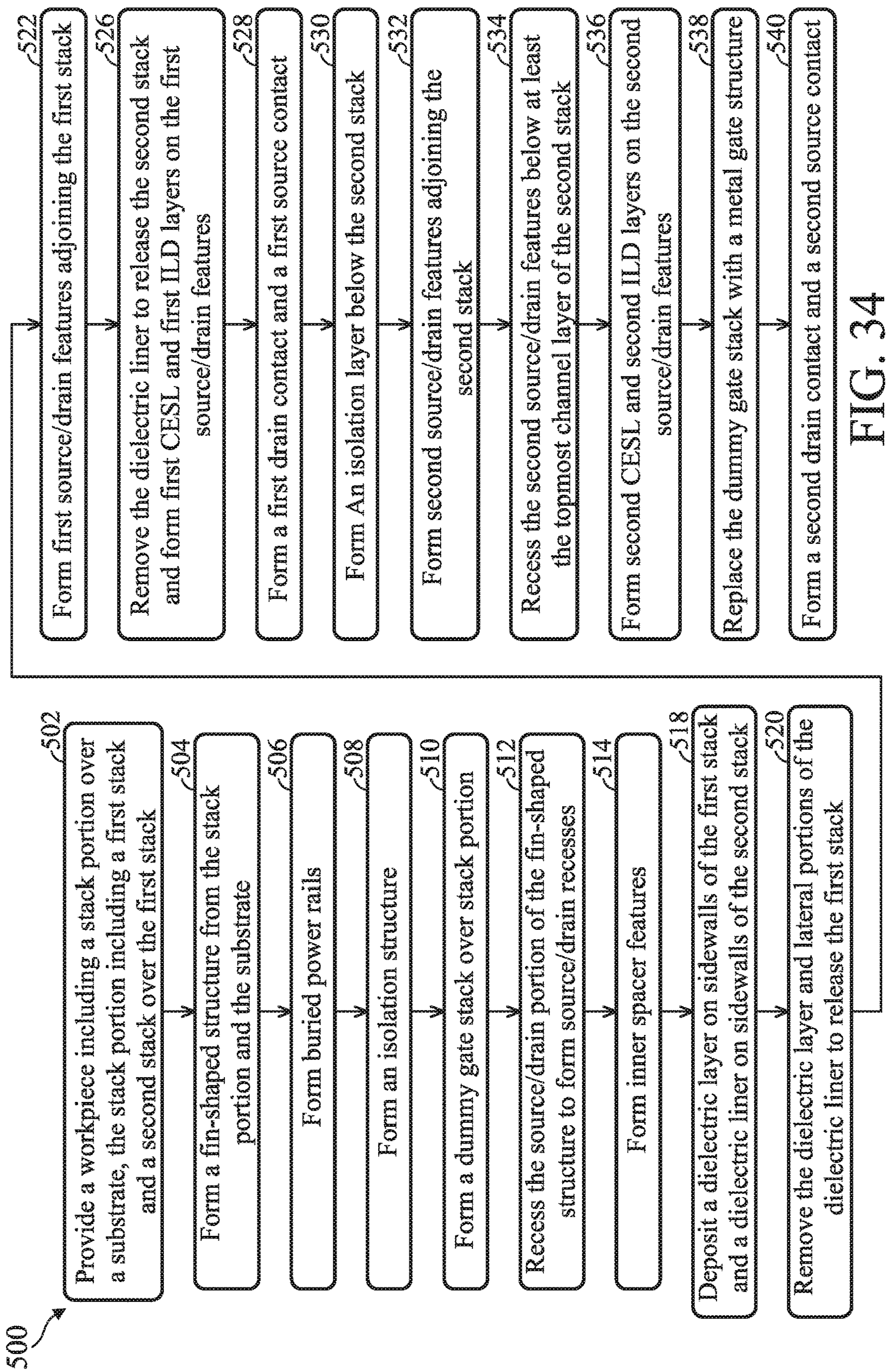
FIG. 34 illustrates a flow chart of a method for forming a semiconductor device having a backside power rail, according to one or more aspects of the present disclosure.
Figure 35C:
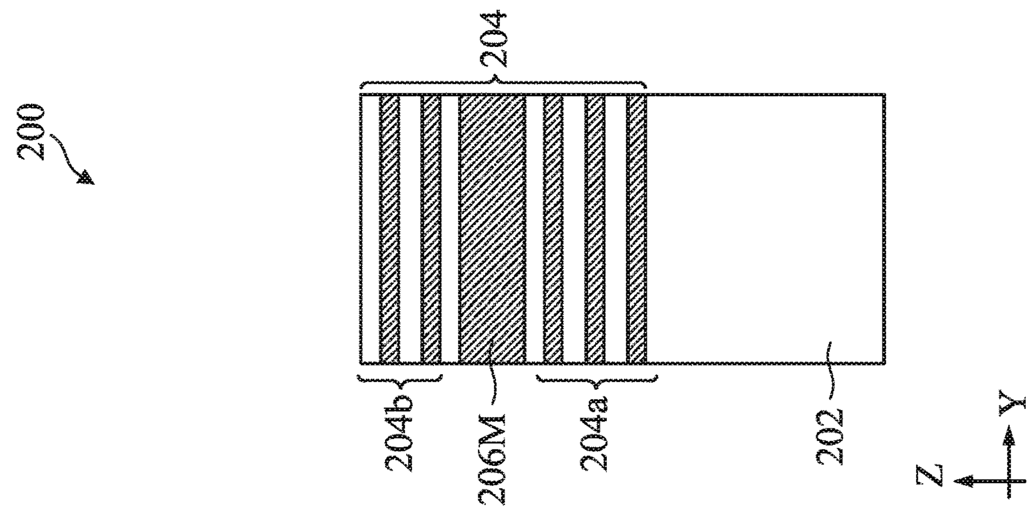
FIGS. 35A, 35B, 35C, 36A, 36B, 36C, 37A, 37B, 37C, 38A, 38B, 38C, 39A, 39B, 39C, 40A, 40B, 40C, 41A, 41B, 41C, 42A, 42B, 42C, 43A, 43B, 43C, 44A, 44B, 44C, 45A, 45B, 45C, 46A, 46B, 46C, 47A, 47B, 47C, 48A, 48B, 48C, 49A, 49B, 49C, 50A, 50B, and 50C illustrate fragmentary cross-sectional views of a workpiece during a fabrication process according to the method of FIG. 34, according to one or more aspects of the present disclosure.
Figure 35B:
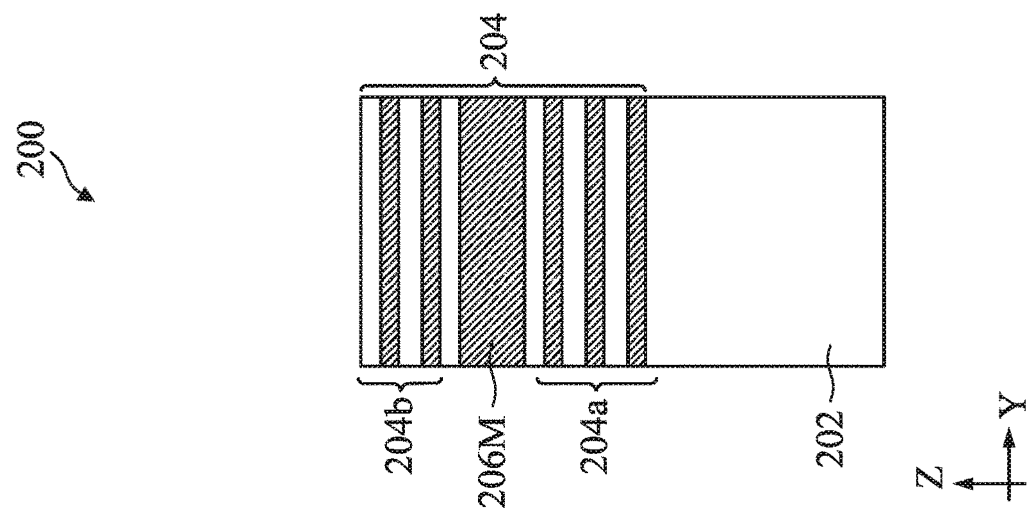
Figure 35A:
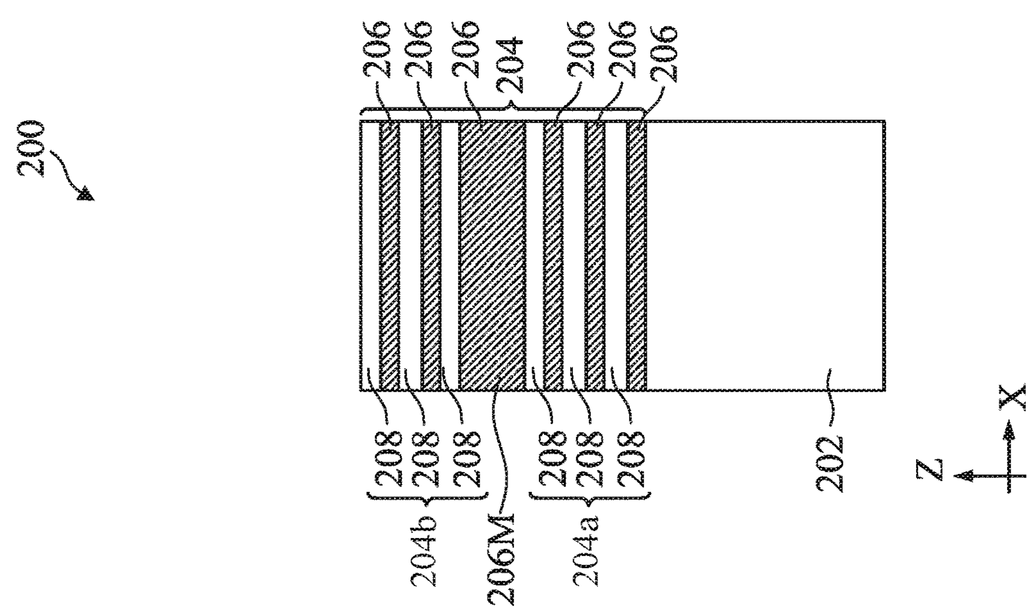
Figures 36A, 36B, 36C:
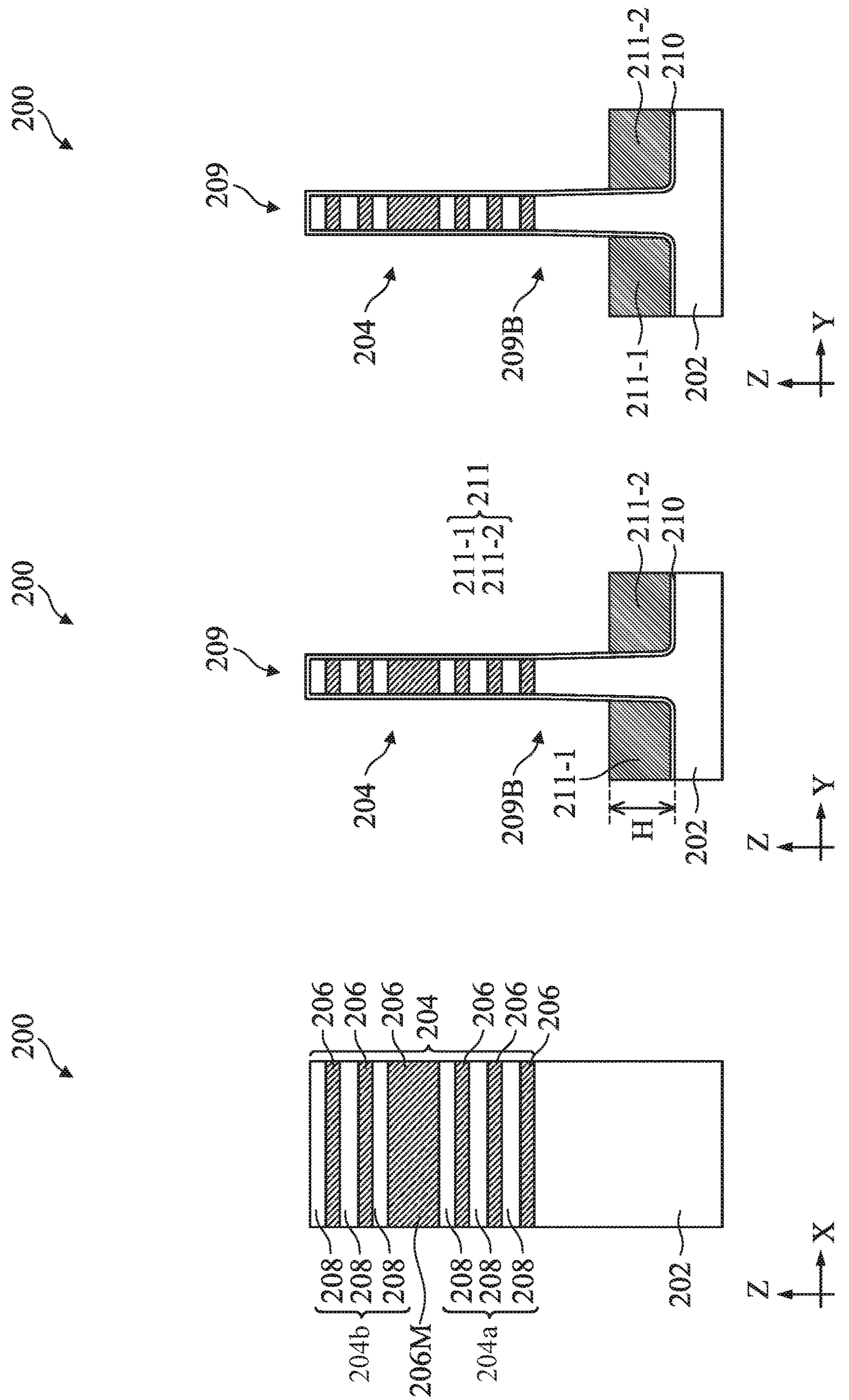
Figure 37C:
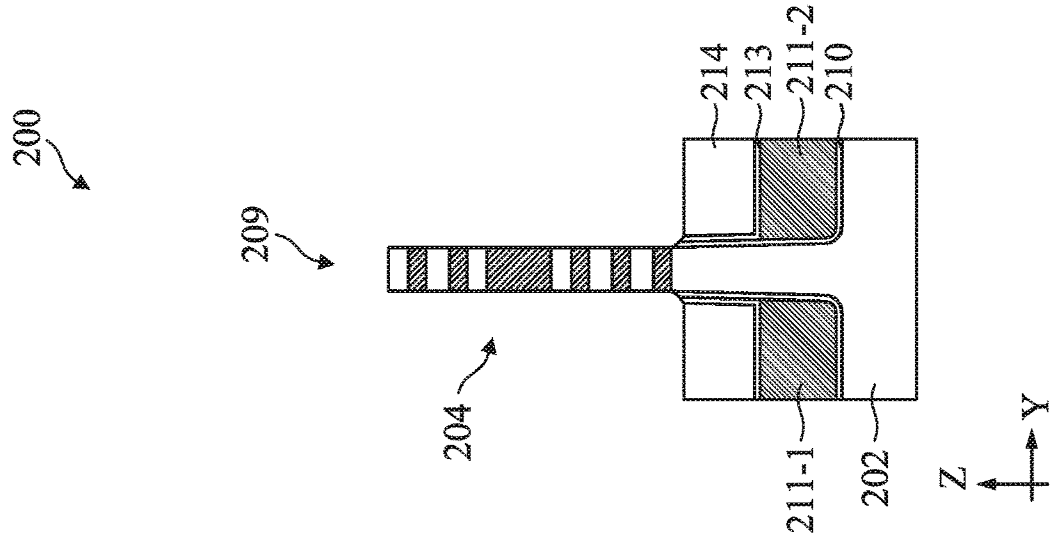
Figure 37B:
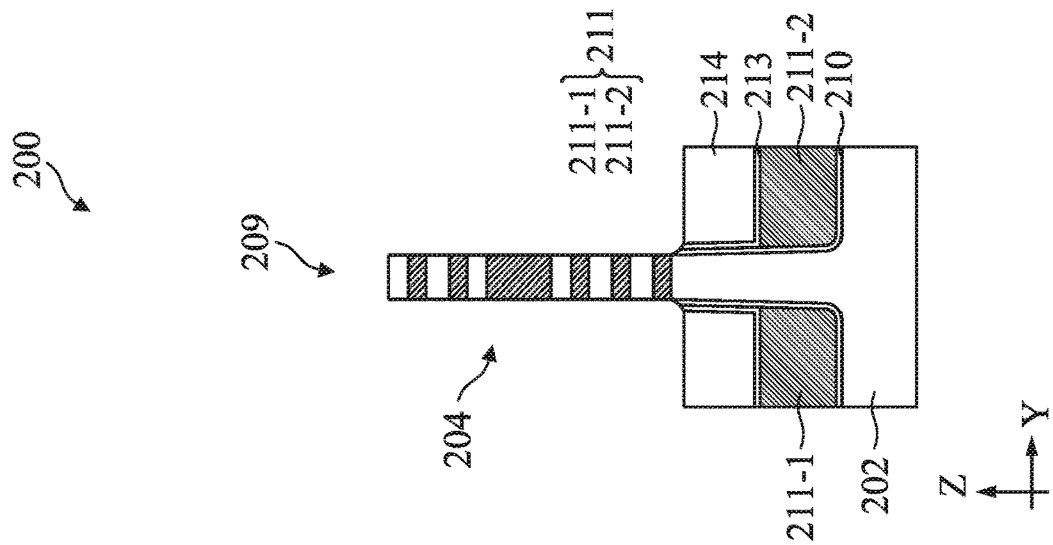
Figure 37A:
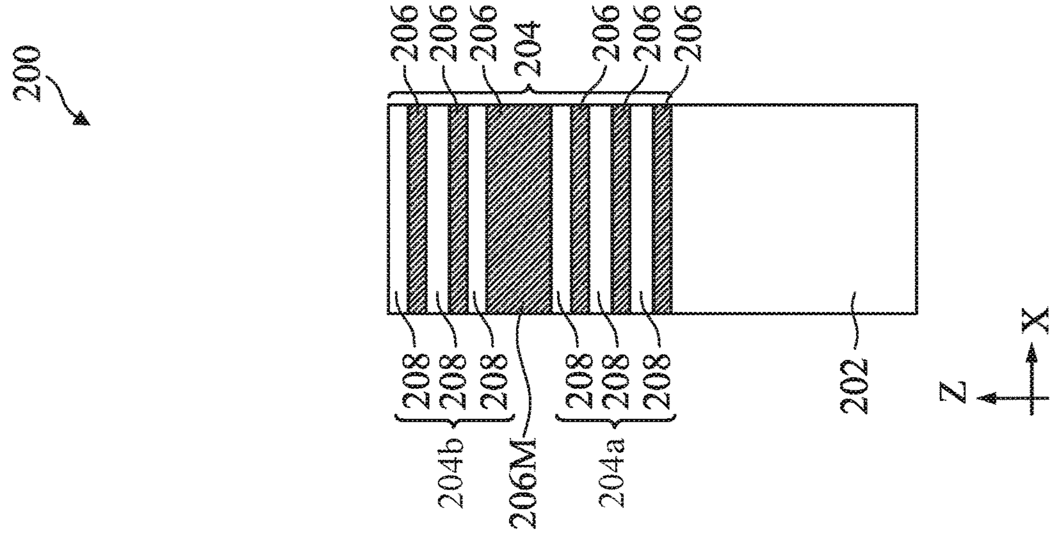
Figure 38A:
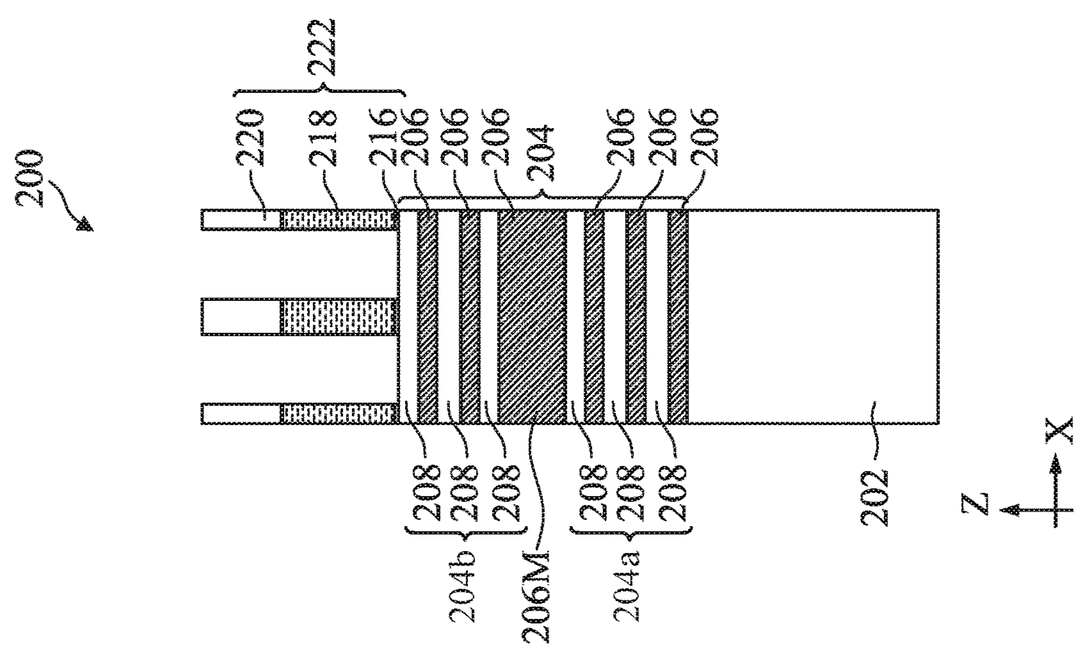
Figure 38B:
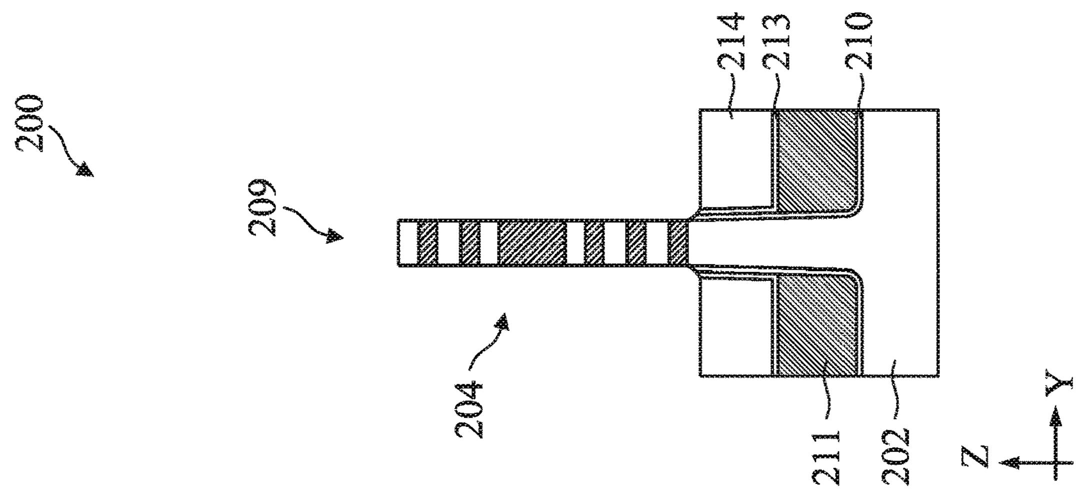
Figure 38C:
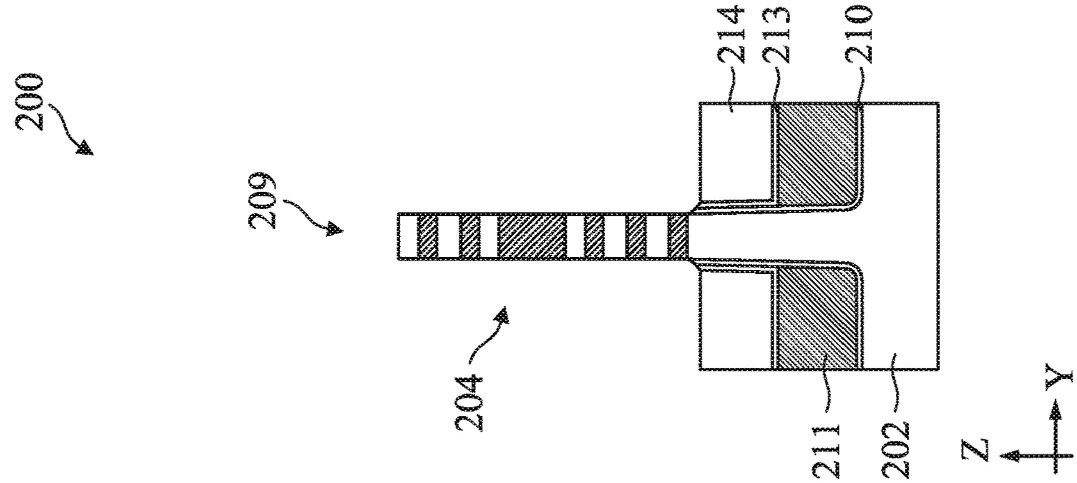
Figure 39C:
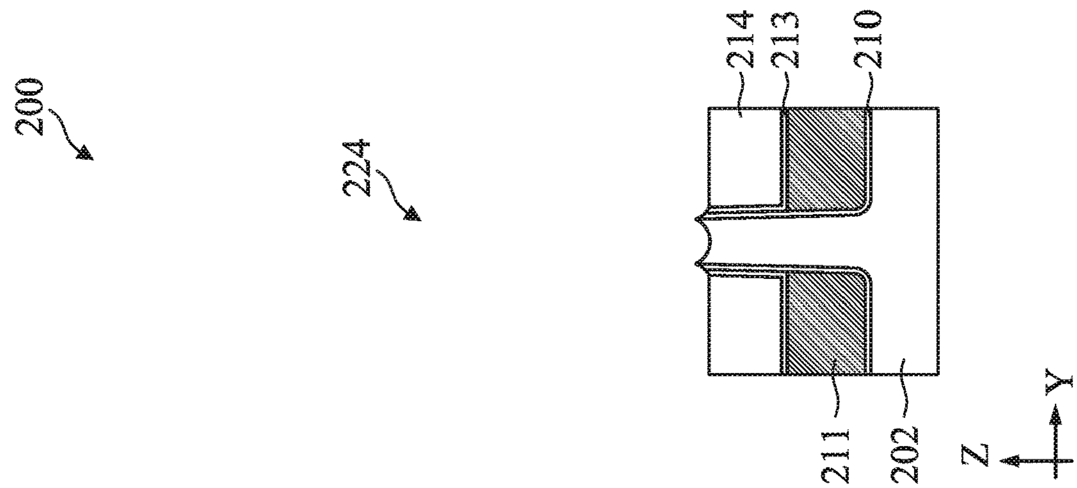
Figure 39B:
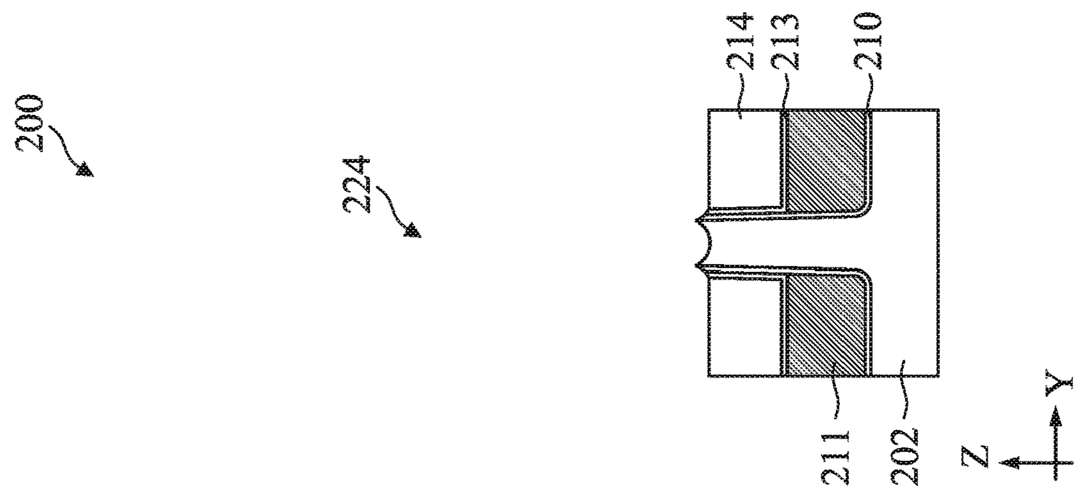
Figure 39A:
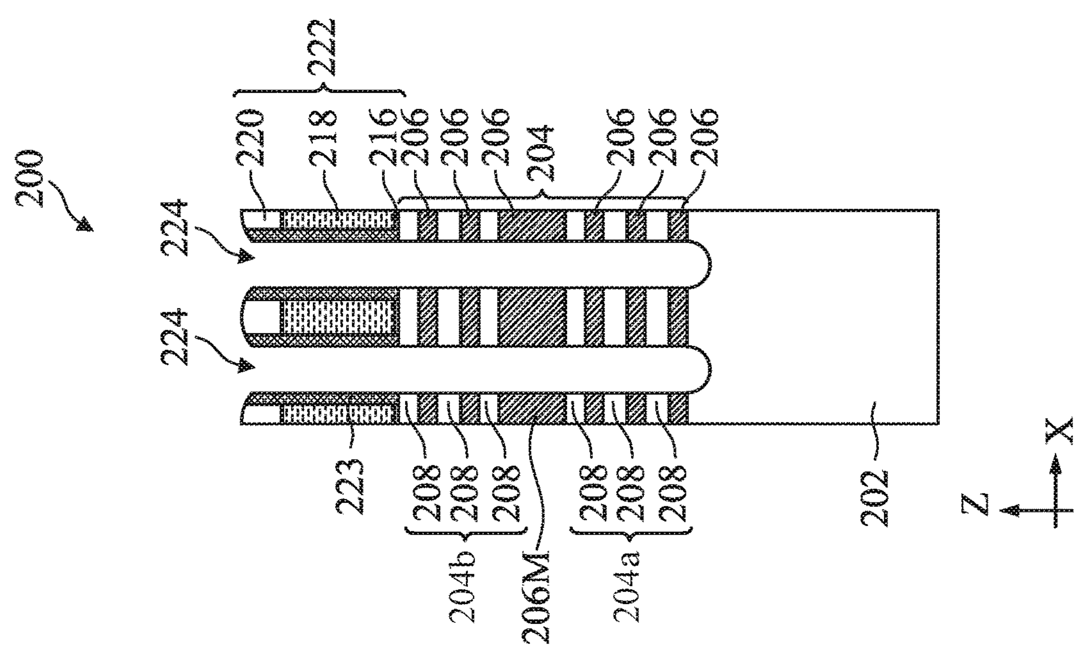
Figure 40C:
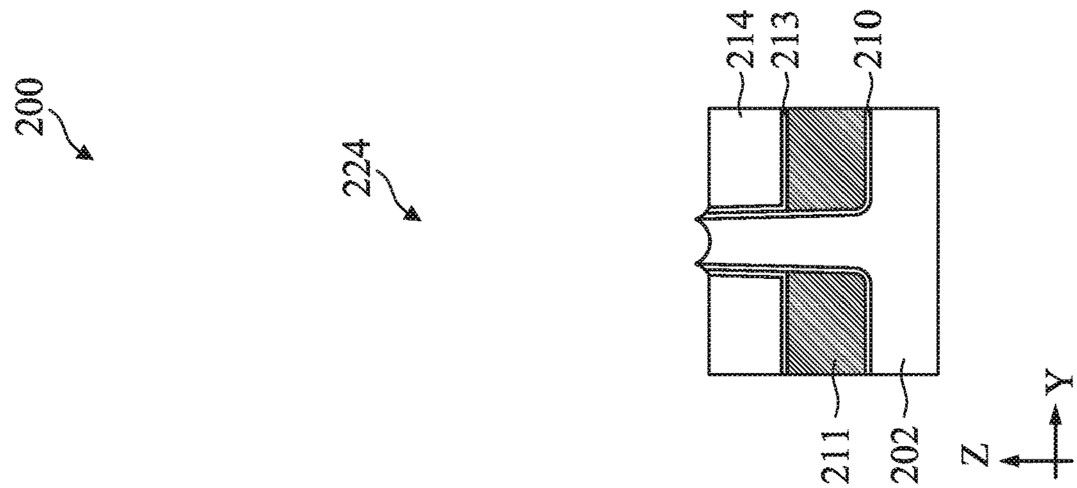
Figure 40B:
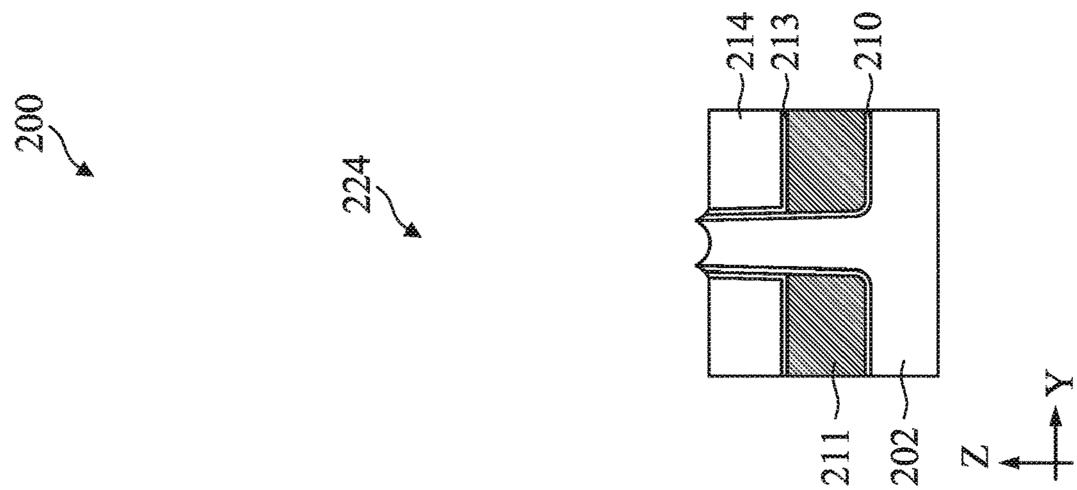
Figure 40A:
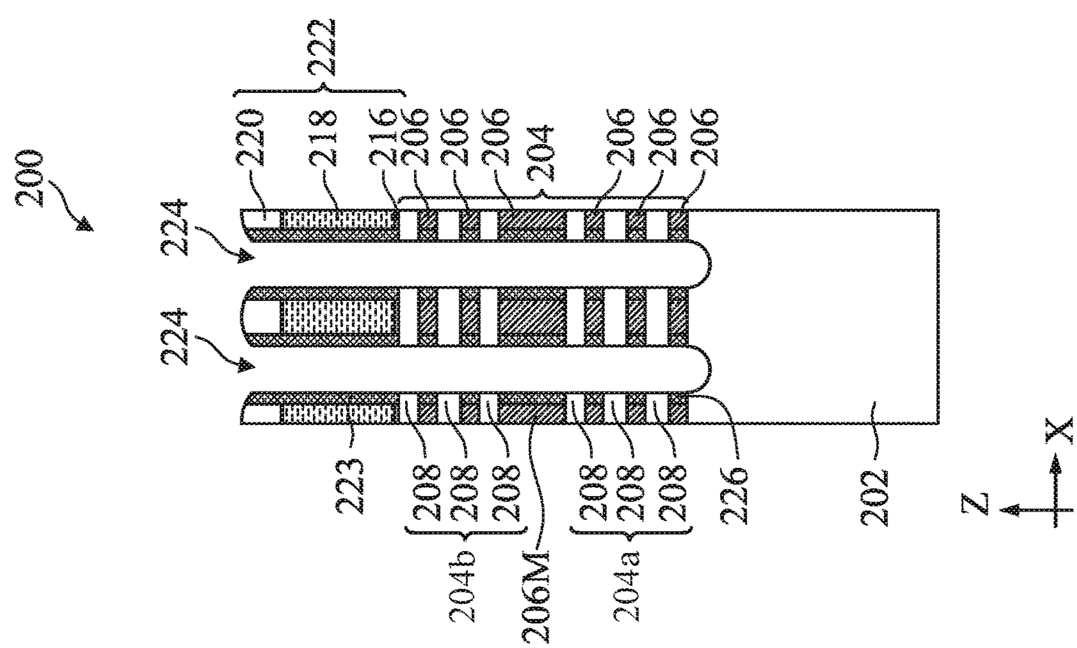
Figure 41A:
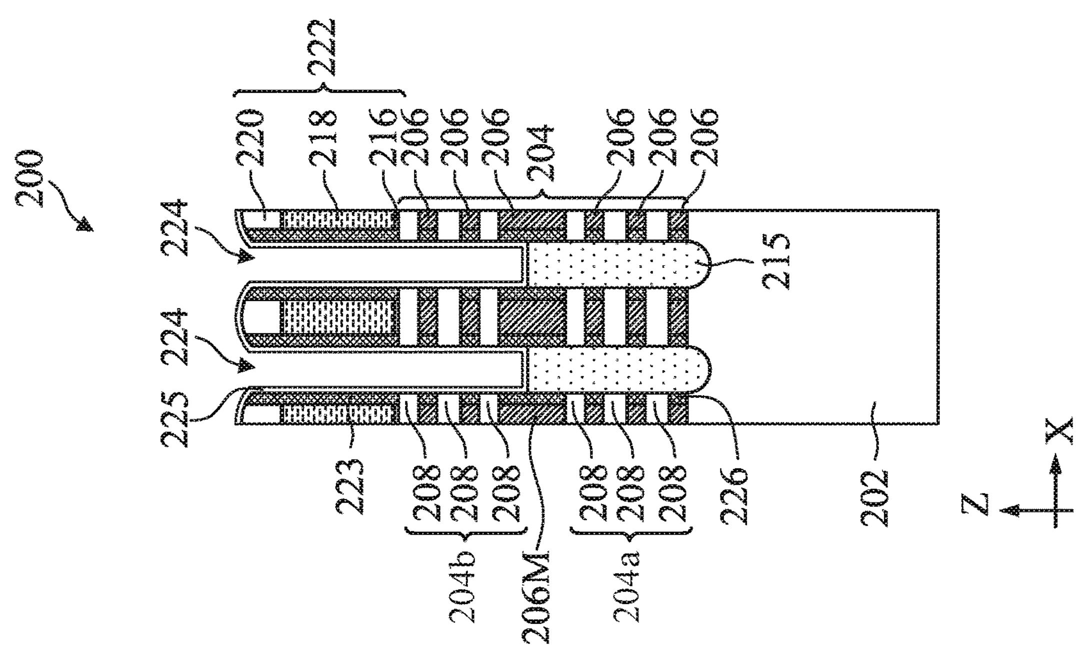
Figure 41B:
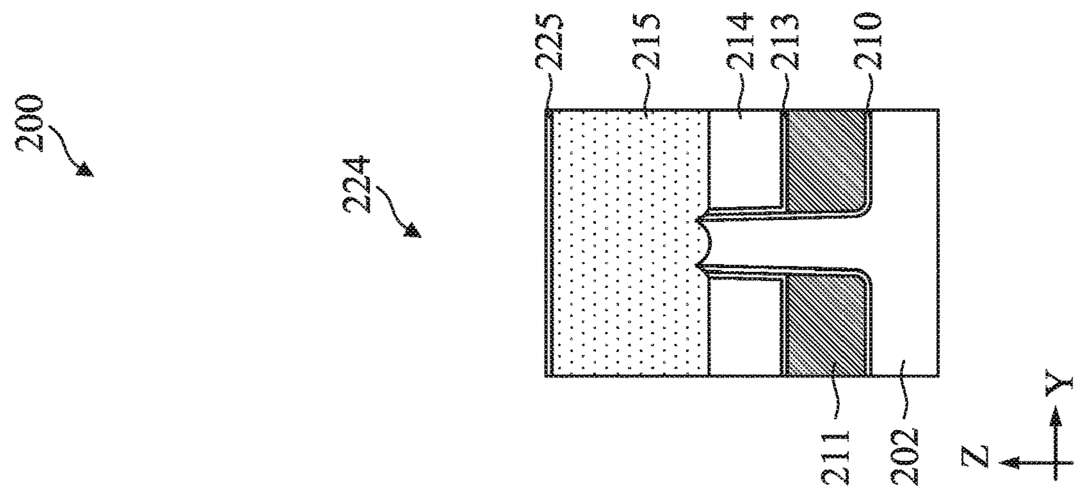
Figure 41C:
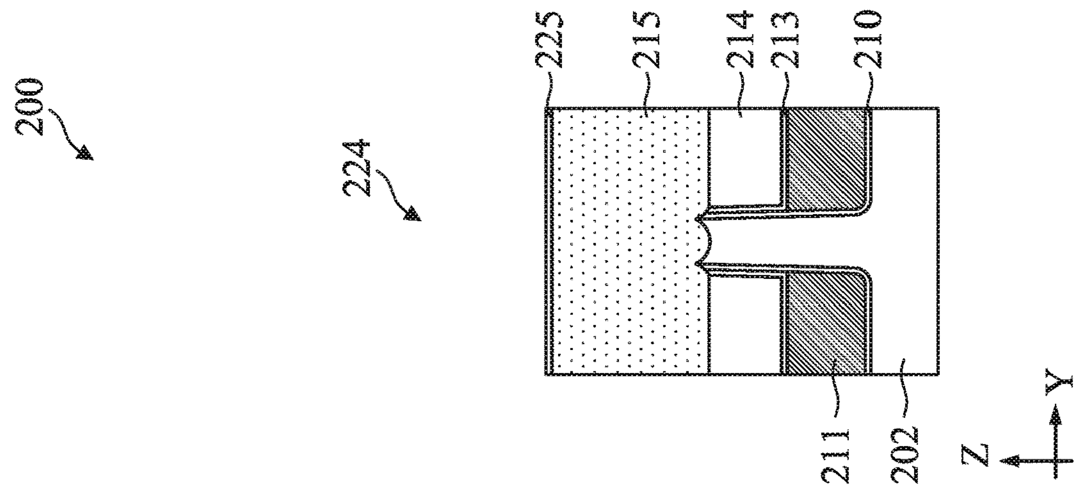
Figure 42A:
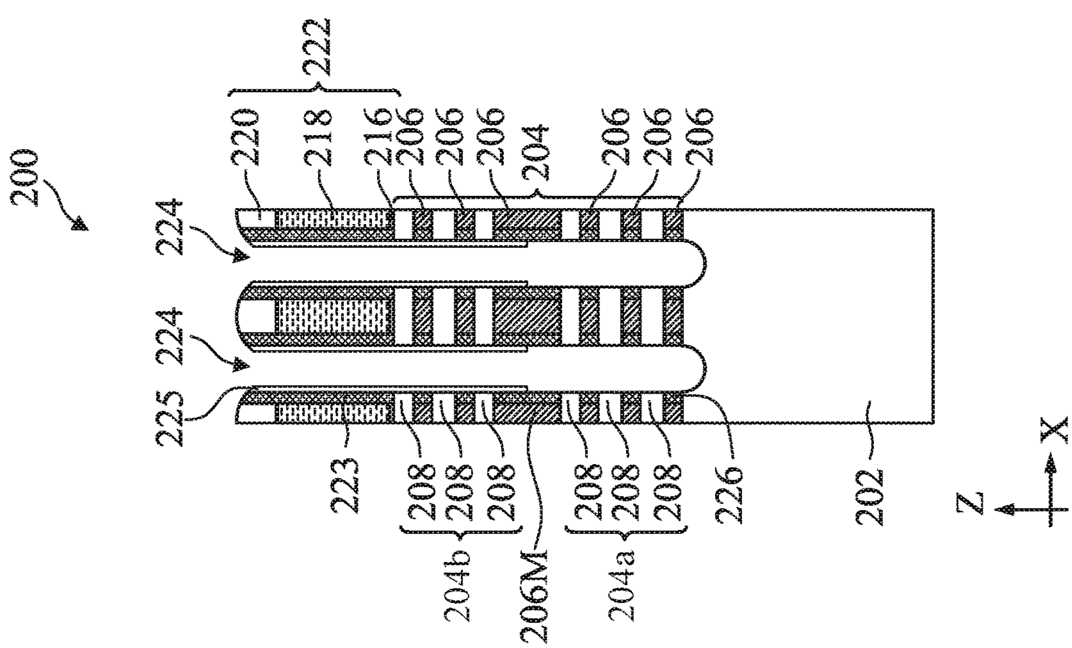
Figure 42B:
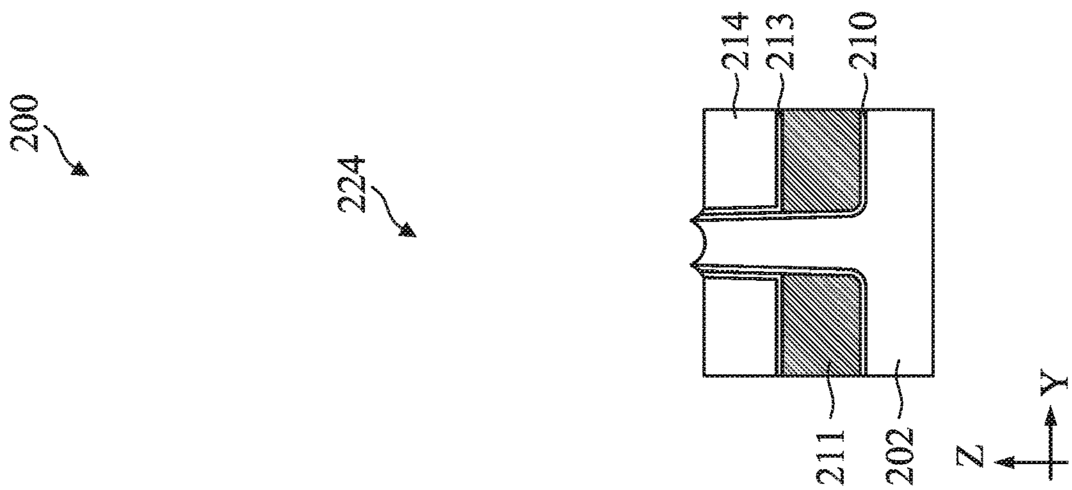
Figure 42C:
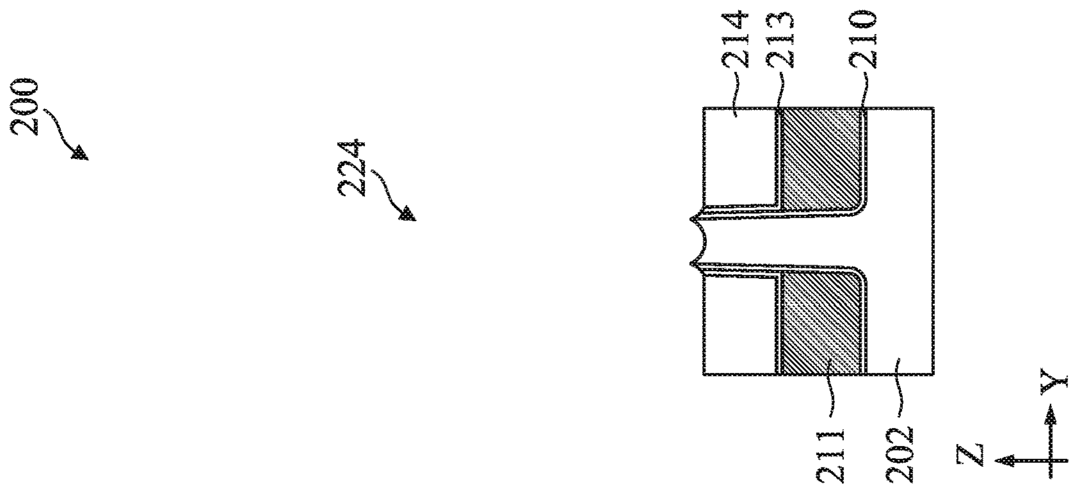
Figure 43C:
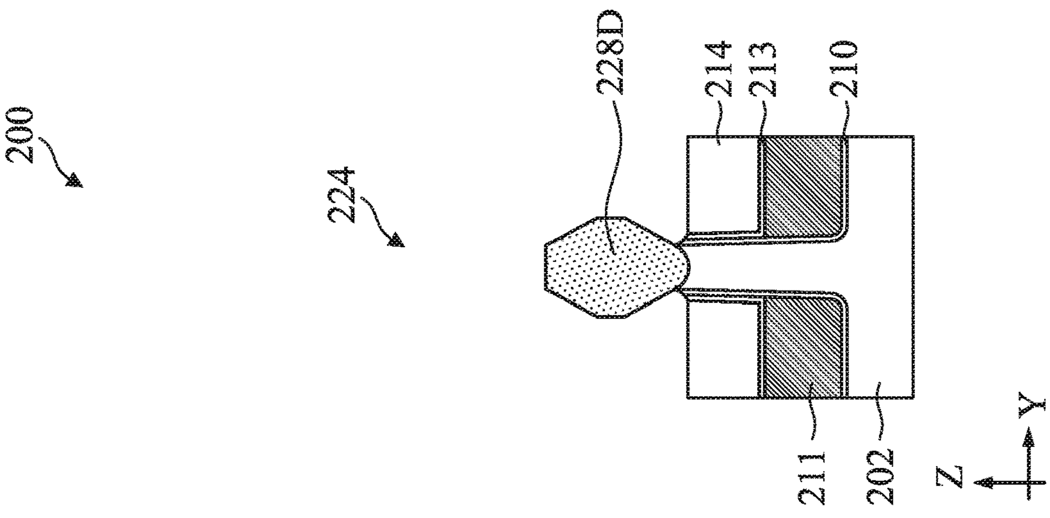
Figure 43B:
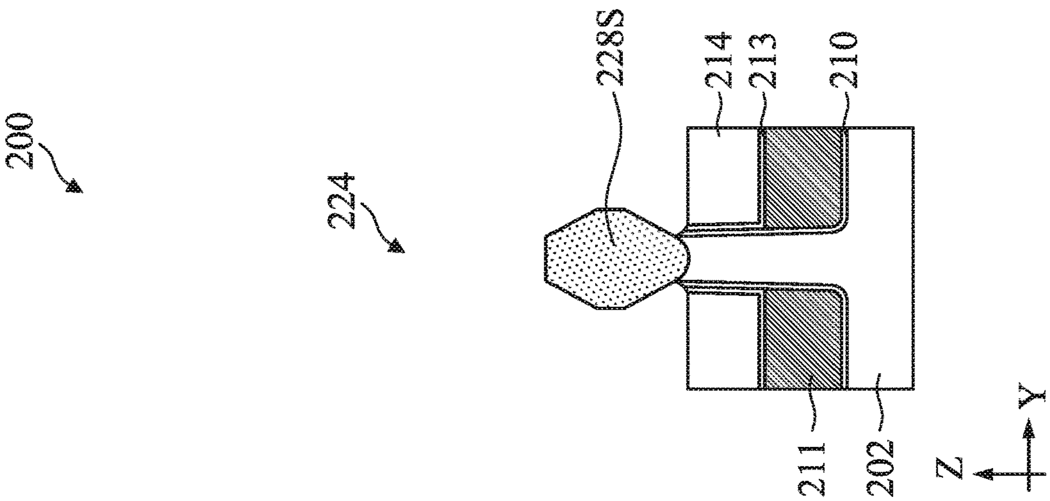
Figure 43A:
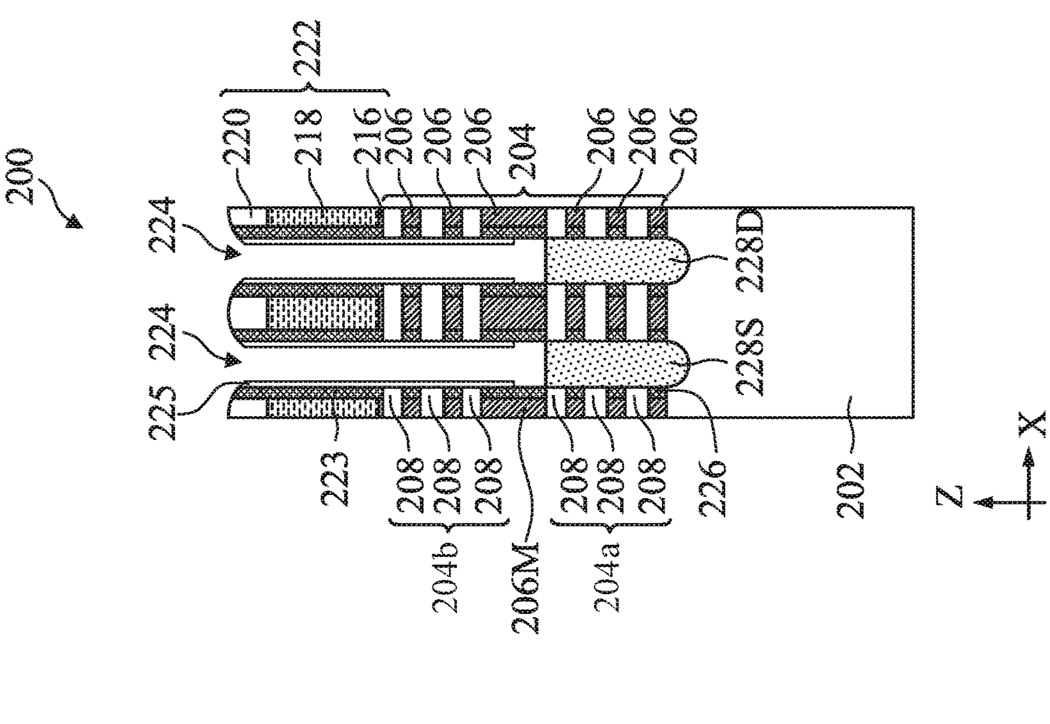
Figures 44A, 44B, 44C:
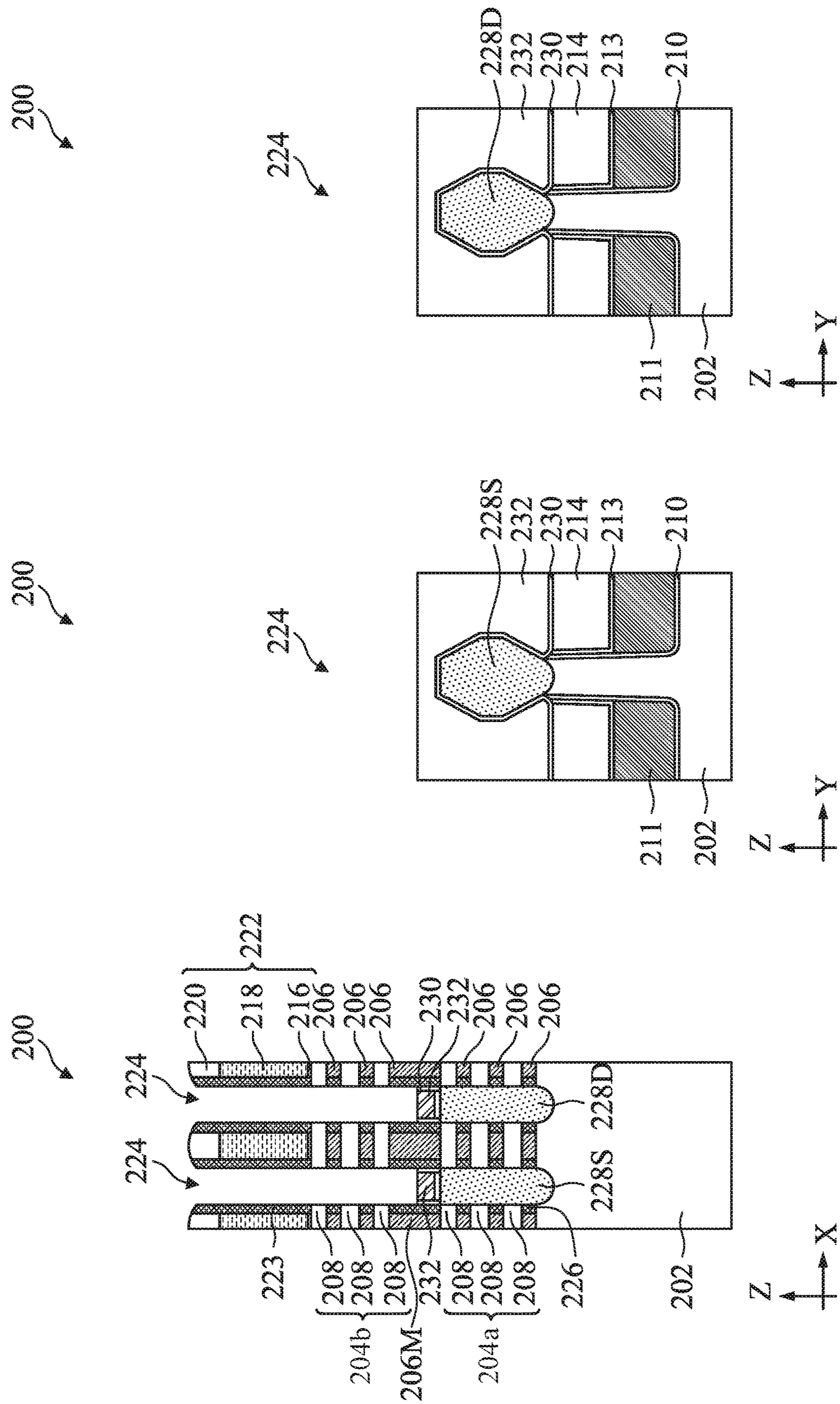

Attention is now turned to method 500. FIG. 34 illustrates a flow chart of method 500, according to various aspects of the present disclosure. Throughout the present disclosure, similar reference numerals denote similar features in terms composition and formation. Some details of operations in method 500 may be simplified or omitted if similar details have been described in conjunction with method 100.

Referring to FIGS. 34 and 35A-C, method 500 includes a block 502 where a workpiece 200 is provided. The workpiece 200 includes a substrate portion (also referred to as substrate) 202 and a stack portion 204 over the substrate 202. The stack portion 204 includes a first stack 204*a* and a second stack 204*b* over the first stack 204*a*. Because the substrate 202 and the stack portion 204 have been described above, detailed descriptions thereof are omitted here.

Referring to FIGS. 34 and 36A-C, method 500 includes a block 504 where a fin-shaped structure 209 is formed from the stack portion 204. Because operations at block 504 are similar to those at block 104, detailed descriptions thereof are omitted for brevity.

Still referring to FIGS. 34 and 36A-C, method 500 includes a block 506 where buried power rails 211 are formed. Because operations at block 506 are similar to those at block 106, detailed descriptions thereof are omitted for brevity.

Referring to FIGS. 34 and 37A-C, method 500 includes a block 508 where an isolation feature 214 is formed. Because operations at block 508 are similar to those at block 108, detailed descriptions thereof are omitted for brevity.

Referring to FIGS. 34 and 38A-C, method 500 includes a block 510 where a dummy gate stack 222 is formed over the stack portion 204. Because operations at block 510 are similar to those at block 110, detailed descriptions thereof are omitted for brevity.

Referring to FIGS. 34 and 39A-C, method 500 includes a block 512 where source/drain portions of the fin-shaped structure 209 are recessed to form source/drain recesses 224. Because operations at block 512 are similar to those at block 112, detailed descriptions thereof are omitted for brevity.

Referring to FIGS. 34 and 40A-C, method 500 includes a block 514 where inner spacer features 226 are formed. Because operations at block 514 are similar to those at block 114, detailed descriptions thereof are omitted for brevity.

Referring to FIGS. 34 and 41A-C, method 500 includes a block 518 where a sacrificial dielectric layer 215 is deposited in the source/drain trenches 224 to cover the sidewalls of the channel layer 208 of the first stack 204*a* and a third liner 225 is conformally deposited over the workpiece 200 to cover the sidewalls of the channel layer 208 of the second stack 204*b*. Because operations at block 518 are similar to those at block 118, detailed descriptions thereof are omitted for brevity.

Referring to FIGS. 34 and 42A-C, method 500 includes a block 520 where a lateral portion of the third liner 225 is removed to expose the sacrificial dielectric layer 215 and the sacrificial dielectric layer 215 is subsequently removed in a selective etch process to release the first stack 204*a*. Because operations at block 520 are similar to those at block 120, detailed descriptions thereof are omitted for brevity.

Referring to FIGS. 34 and 43A-C, method 500 includes a block 522 where first source feature 228S and a first drain feature 228D are formed in the source/drain trenches 224 adjoining the channel layers 208 of the first stack 204*a*. Since the channel layers 208 in the second stack 204*b* are covered by the third liner 225, epitaxial growth won't take place from the sidewalls thereof. Because operations at block 522 are similar to those at block 122, detailed descriptions thereof are omitted for brevity.

Referring to FIGS. 34 and 44A-C, method 500 includes a block 526 where the third liner 225 is removed to release the second stack 204*b* and a first CESL 230 and a first ILD layer 232 are deposited on the first source feature 228S and the first drain feature 228D. Because operations at block 526 are similar to those at block 126, detailed descriptions thereof are omitted for brevity.

Referring to FIGS. 34 and 45A-C, method 500 includes a block 528 where interconnection features, such as a first drain contact 234, a first source contact 236, a first source contact via 238 are formed. Because operations at block 528 are similar to those at block 128, detailed descriptions thereof are omitted for brevity.

Figure 45C:
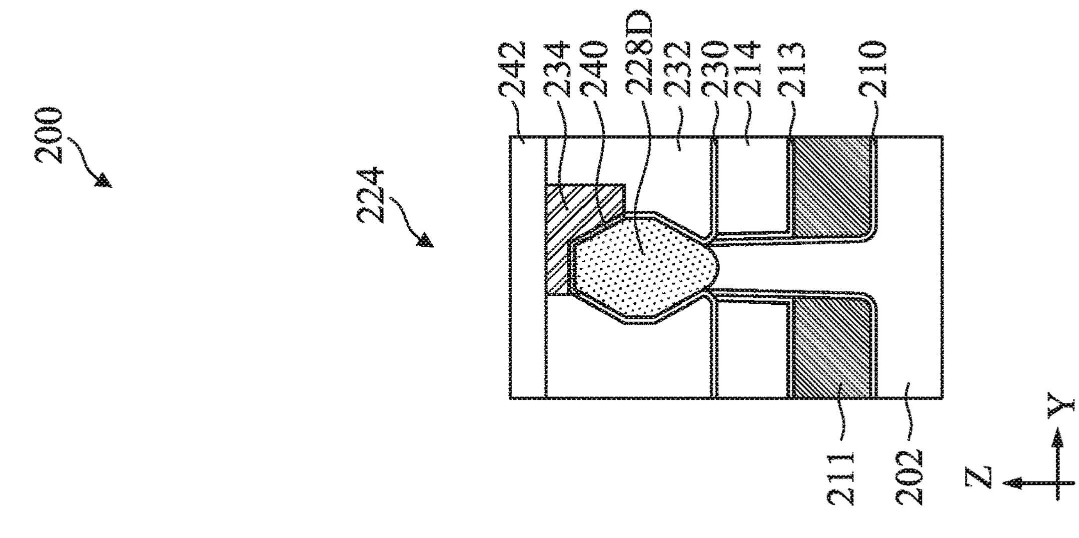
Figure 45B:
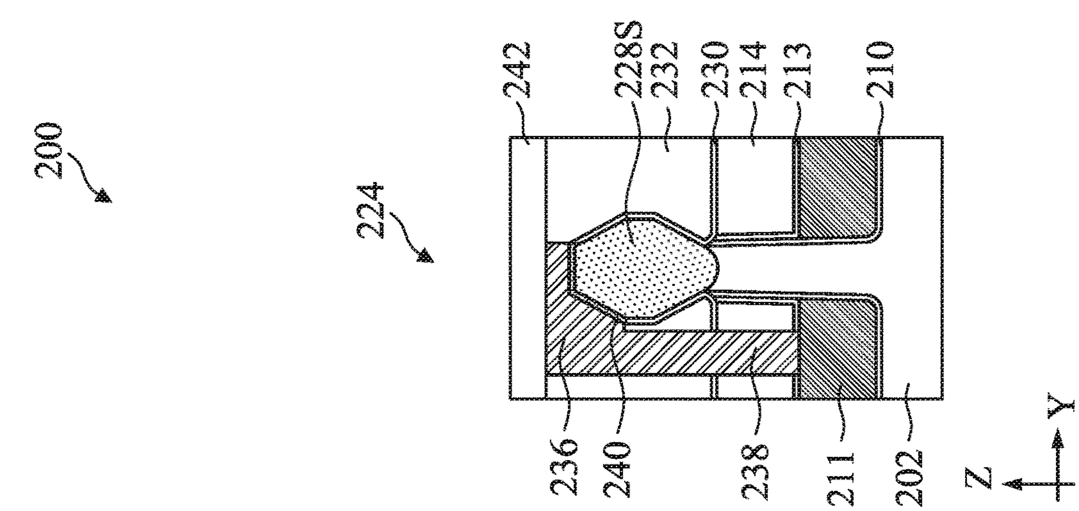
Figure 45A:
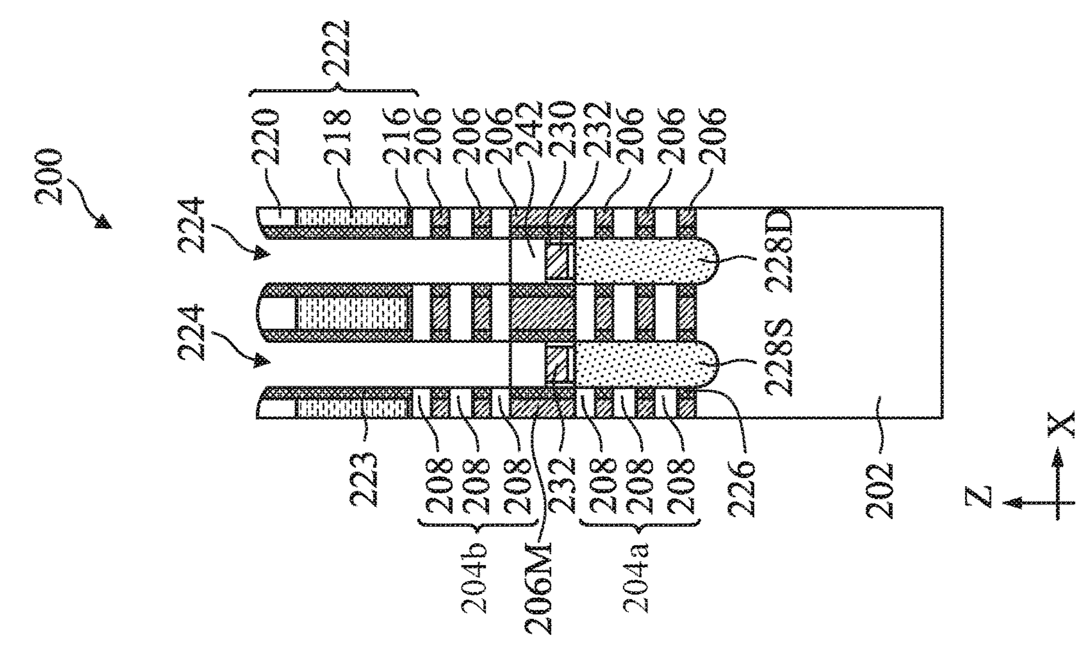

Still referring to FIGS. 34 and 45A-C, method 500 includes a block 530 where a dielectric isolation layer 242 is deposited over the first ILD layer 232 and covering interconnection features formed in earlier operations at block 528. The dielectric isolation layer 242 may include silicon nitride, silicon oxide, silicon oxynitride, hafnium oxide, aluminum oxide, zirconium oxide, or other suitable isolation material. In an embodiment, the dielectric isolation layer 242 may be formed by filling the source/drain trenches 224 with dielectric isolation material (e.g., by using a CVD process or a spin-on glass process), and etching back the dielectric isolation material in a selective etching process. As shown in FIG. 45A, the dielectric isolation layer 242 covers the inner spacer features 226 that are on sidewalls of the middle sacrificial layer 206M but not on sidewalls of the bottom channel layer 208 of the second stack 204*b*. State differently, the sidewalls of the bottom channel layers 208 of the second stack 204*b* remain exposed in the source/drain trenches 224.

Figures 46A, 46B, 46C:
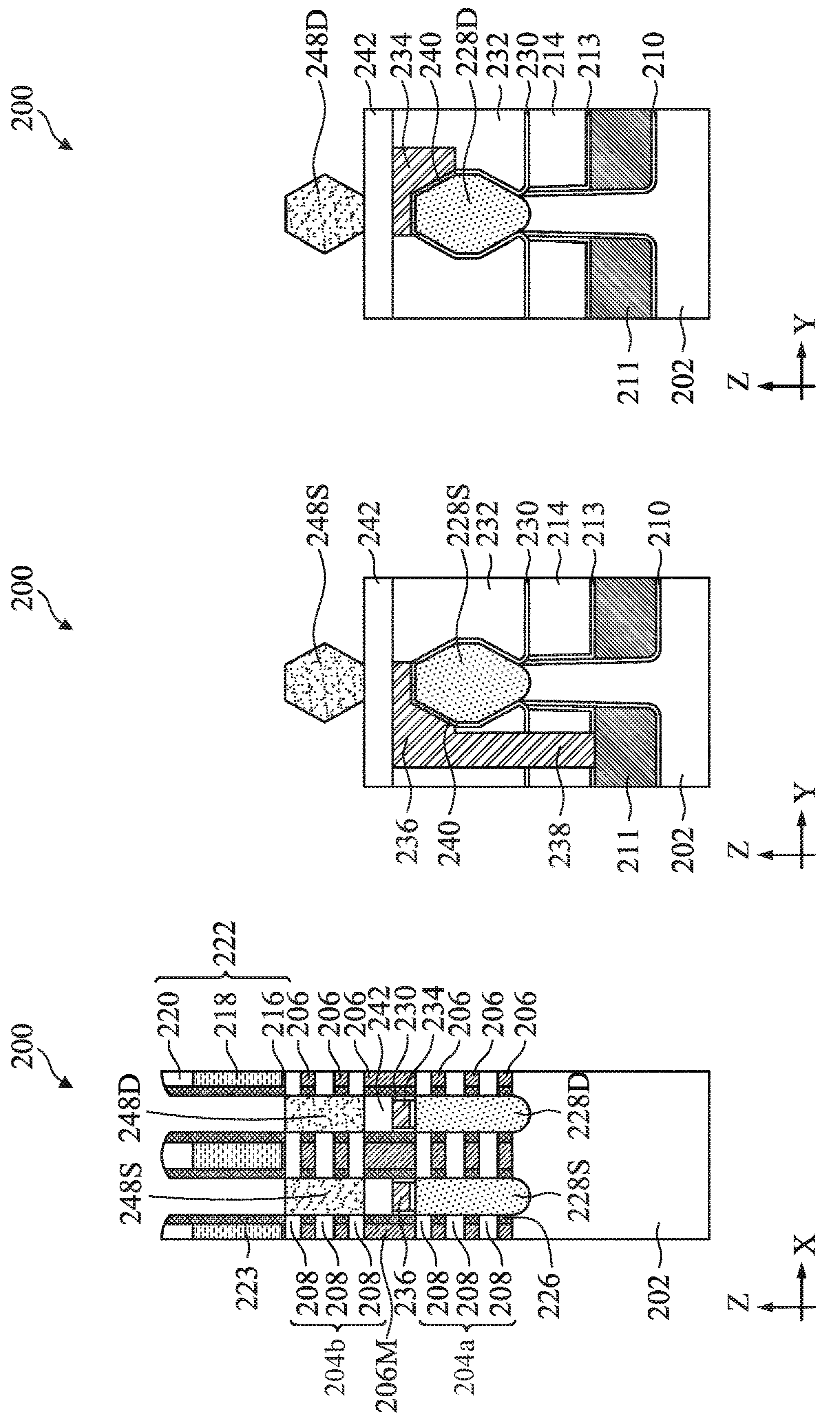

Referring to FIGS. 34 and 46A-C, method 500 includes a block 532 where a second source feature 248S and a second drain feature 248D are formed in the source/drain trenches 224. The second source feature 248S and the second drain feature 248D may be formed using an epitaxial process, such as VPE, UHV-CVD, MBE, and/or other suitable processes. The epitaxial growth process may use gaseous and/or liquid precursors, which interact with the channel layers 208. The exposed sidewalls of the channel layers 208 of the second stack 204*b* functionally serve as semiconductor seed layers. Since there are no channel layers 208 adjoined to the dielectric isolation layer 242, the epitaxial growth of the second source feature 248S and the second drain feature 248D may take place from the exposed sidewalls of all the channel layers 208 of the second stack 204*b*. As illustrated in FIG. 46A, the second source feature 248S and the second drain feature 248D are therefore in physical contact with (or adjoining) each channel layers 208 of the second stack 204*b*. Because the material compositions of the second source feature 248S and the second drain feature 248D have been described above, detailed descriptions thereof are omitted here.

Figures 47A, 47B, 47C:
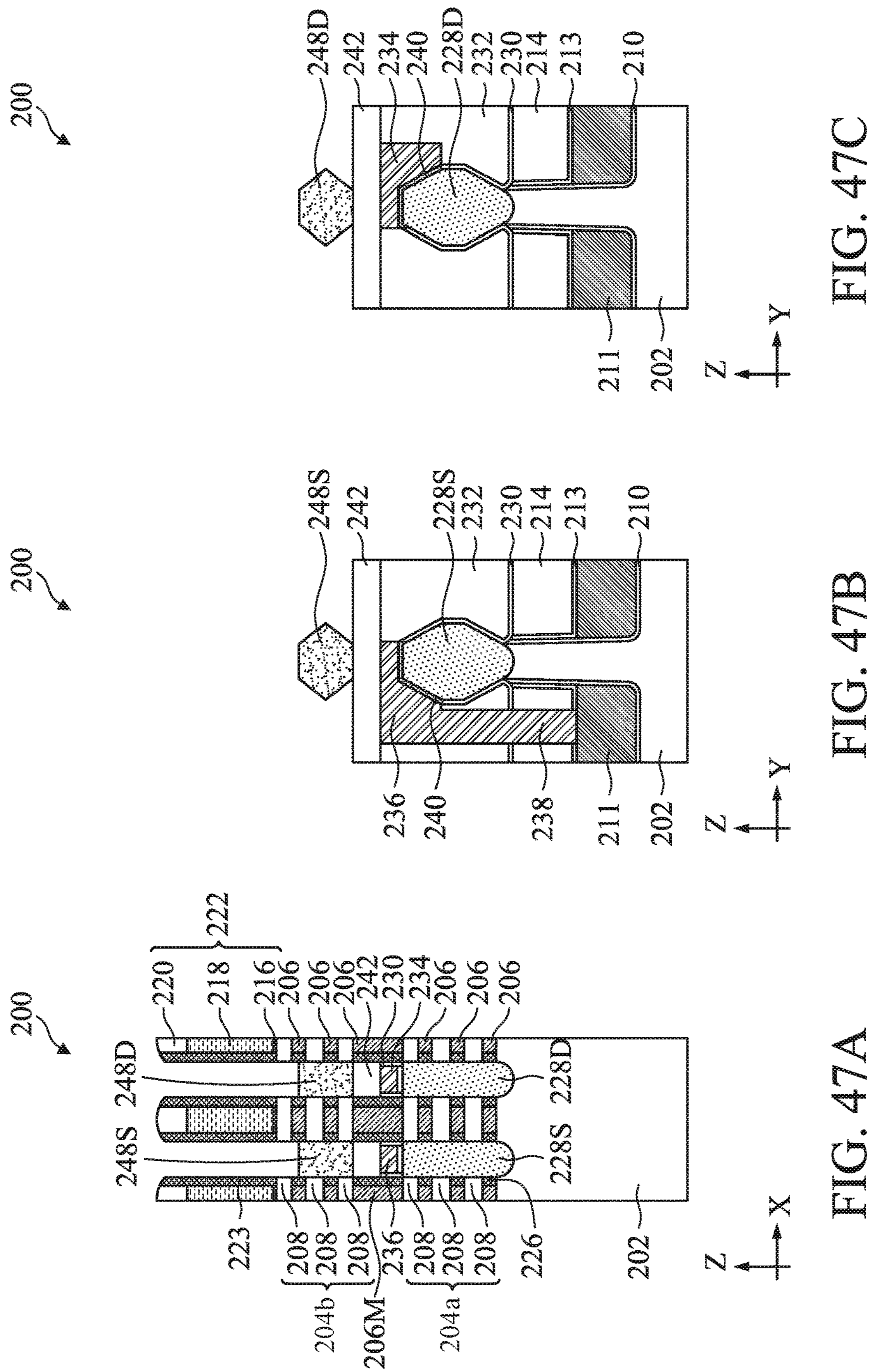
Figures 48A, 48B, 48C:
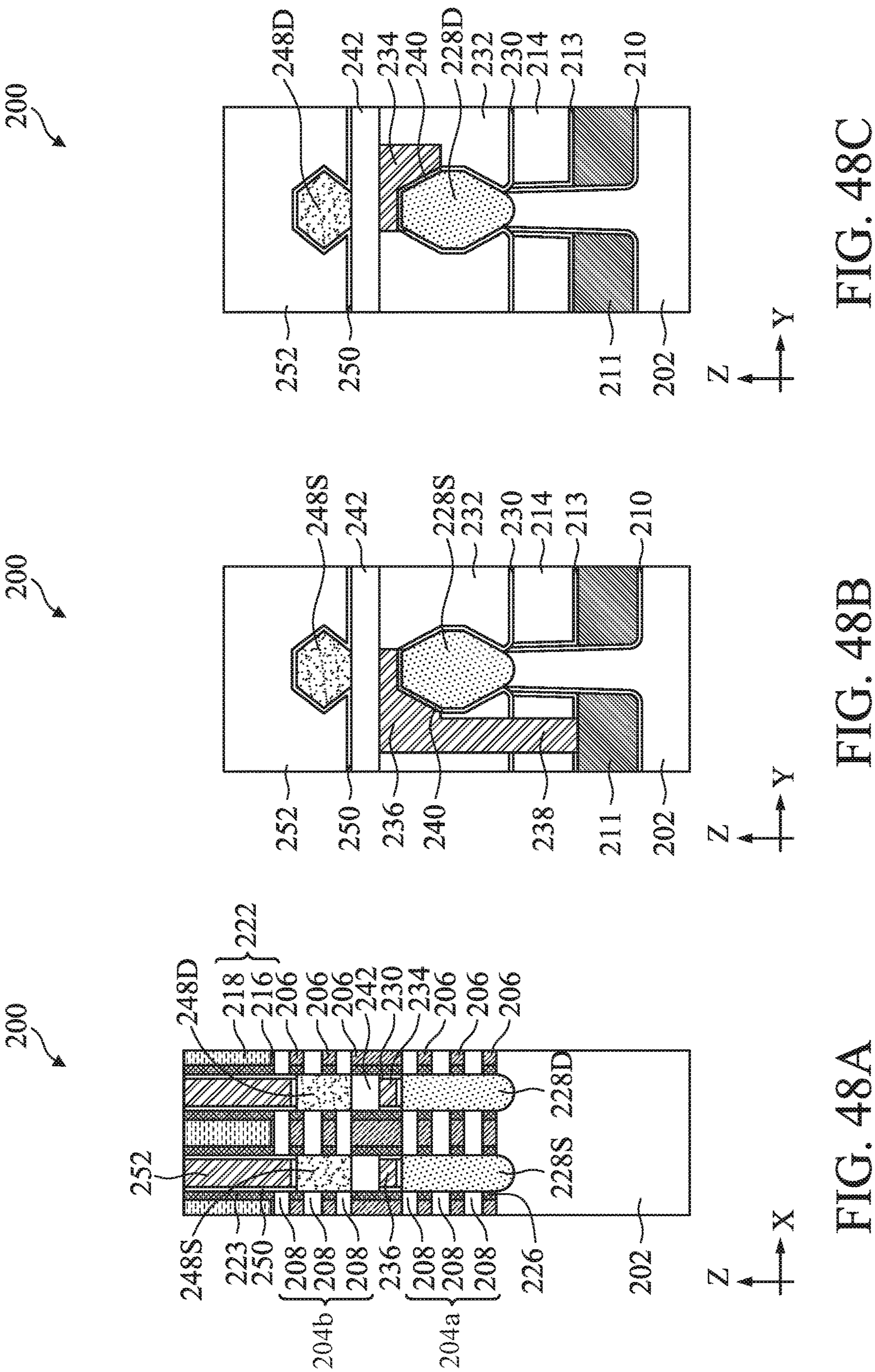
Figure 49C:
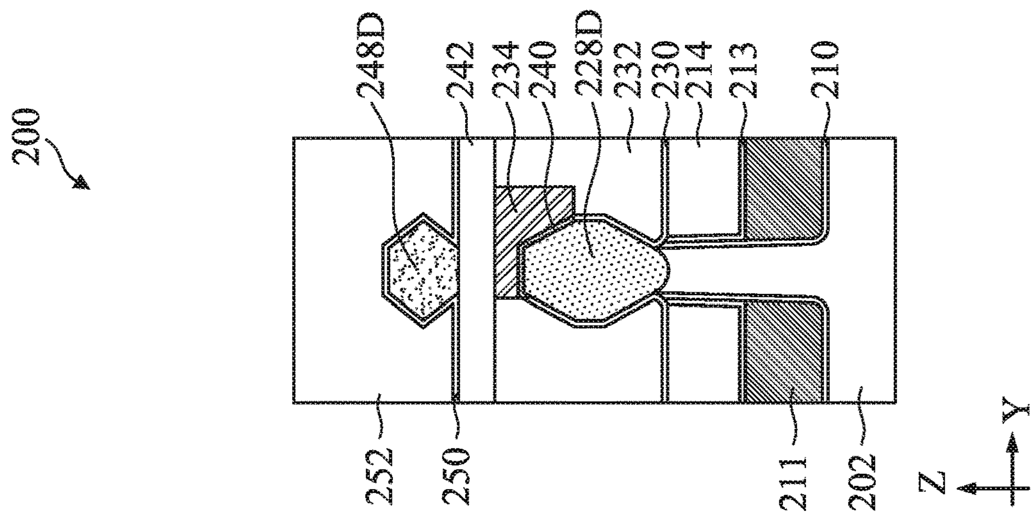
Figure 49B:
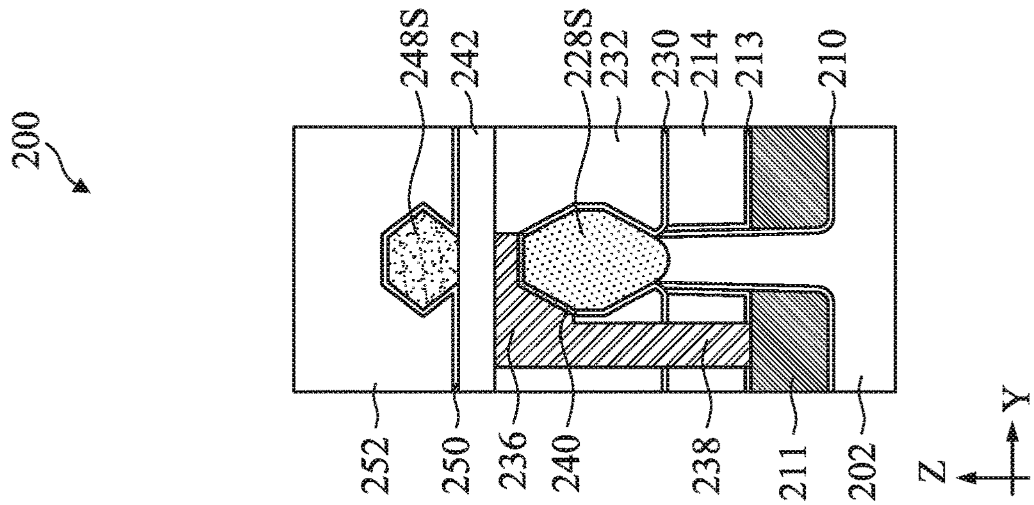
Figure 49A:
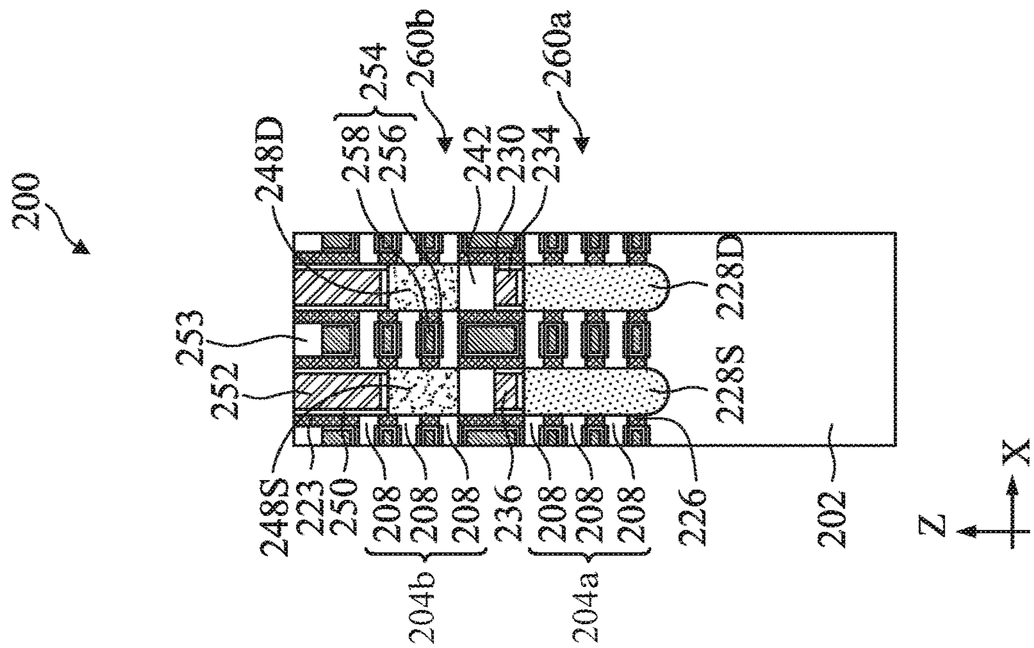

Referring to FIGS. 34 and 47A-C, method 500 includes a block 534 where the second source feature 248S and the second drain feature 248D are etched back to release at least the topmost channel layer 208 in the second stack 204*b*, exposing sidewalls thereof. The etching process may include dry etching, wet etching, reactive ion etching (RIE), and/or other suitable processes. As illustrated in FIG. 47A, top surfaces of the second source feature 248S and the second drain feature 248D are recessed below the topmost channel layer 208 but remain covering other channel layers 208 thereunder. In some embodiments, top surfaces of the second source feature 248S and the second drain feature 248D are recessed below two or more top channel layers 208 in the second stack 204*b*.

Referring to FIGS. 34 and 48A-C, method 500 includes a block 536 where a second CESL 250 and a second interlayer dielectric (ILD) layer 252 are deposited on the second source feature 248S and the second drain feature 248D. In some embodiments, the second CESL 250 is first conformally deposited on the workpiece 200 by ALD, plasma-enhanced chemical vapor deposition (PECVD) process and/or other suitable deposition or oxidation processes. The conformal second CESL 250 covers the recessed top surfaces of the second source feature 248S and the second drain feature 248D and also covers the exposed sidewalls of the topmost channel layer 208 in the second stack 204*b*. Isolated from the second source feature 248S and the second drain feature 248D by the second CESL 250, the topmost channel layer 208 in the second stack 204*b* becomes a "floating" (or inactive) channel layer. The second ILD layer 252 is deposited over the second CESL 250 by a PECVD process or other suitable deposition technique. Because the material compositions of the second CESL 250 and the second ILD layer 252 have been described above, detailed descriptions thereof are omitted here. To remove excess materials and to expose top surfaces of the dummy gate stacks 222, a planarization process, such as a chemical mechanical polishing (CMP) process may be performed. In some embodiments, the gate-top hard mask layer 220 is removed in the CMP process and the dummy gate electrode layer 218 is exposed.

Referring to FIGS. 34 and 49A-C, method 500 includes a block 538 where the dummy gate stack 222 is removed and replaced by a common gate structure 254. Because operations at block 538 are similar to those at block 138, detailed descriptions thereof are omitted for brevity.

Referring to FIGS. 34 and 50A-C, method 500 includes a block 540 where interconnection features, such as a second source contact 262, a second drain contact 264, a second source contact via 266, a second drain contact via 268, a first drain contact via 270, and a top interconnect layer 272 are formed. Because operations at block 540 are similar to those at block 140, detailed descriptions thereof are omitted for brevity.

Figure 50C:
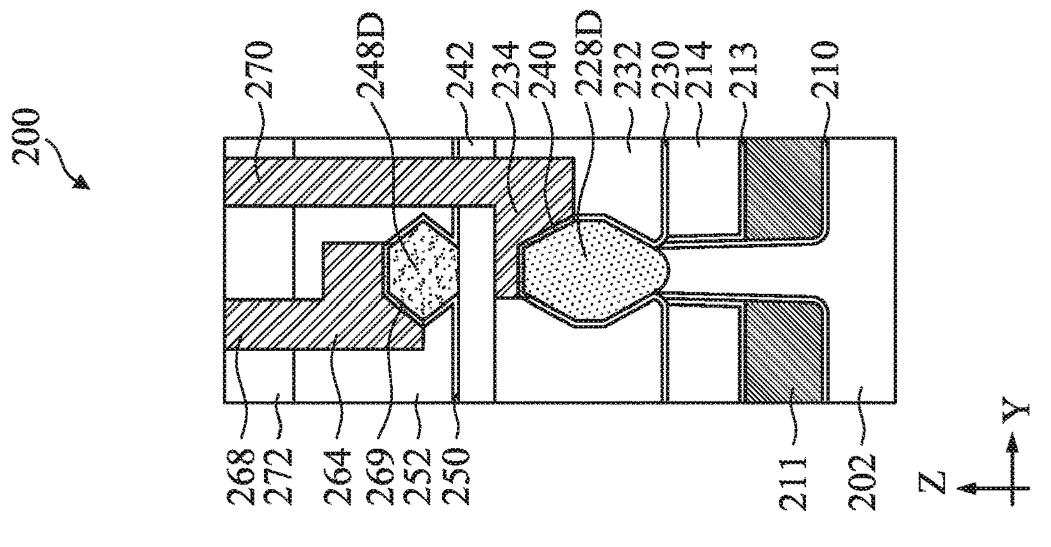
Figure 50B:
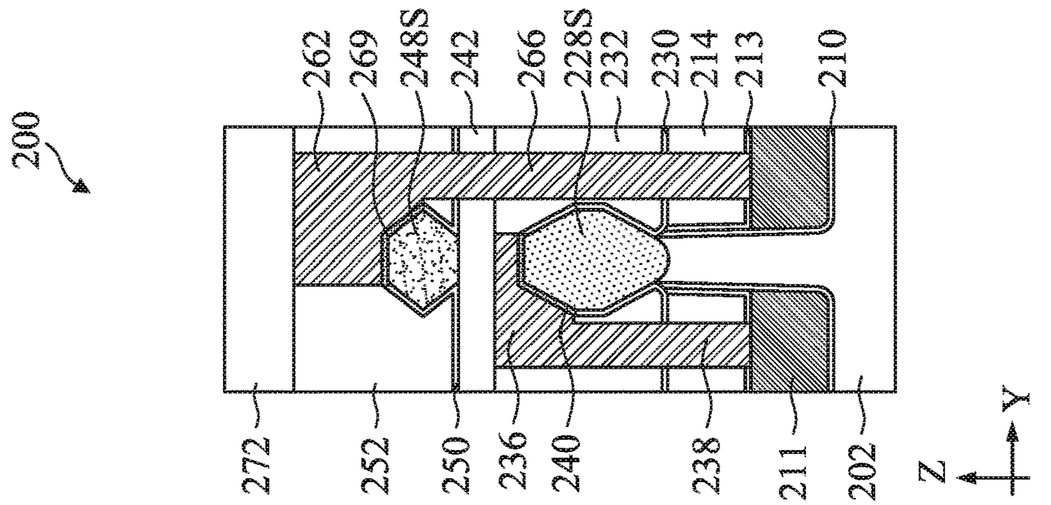
Figure 50A:
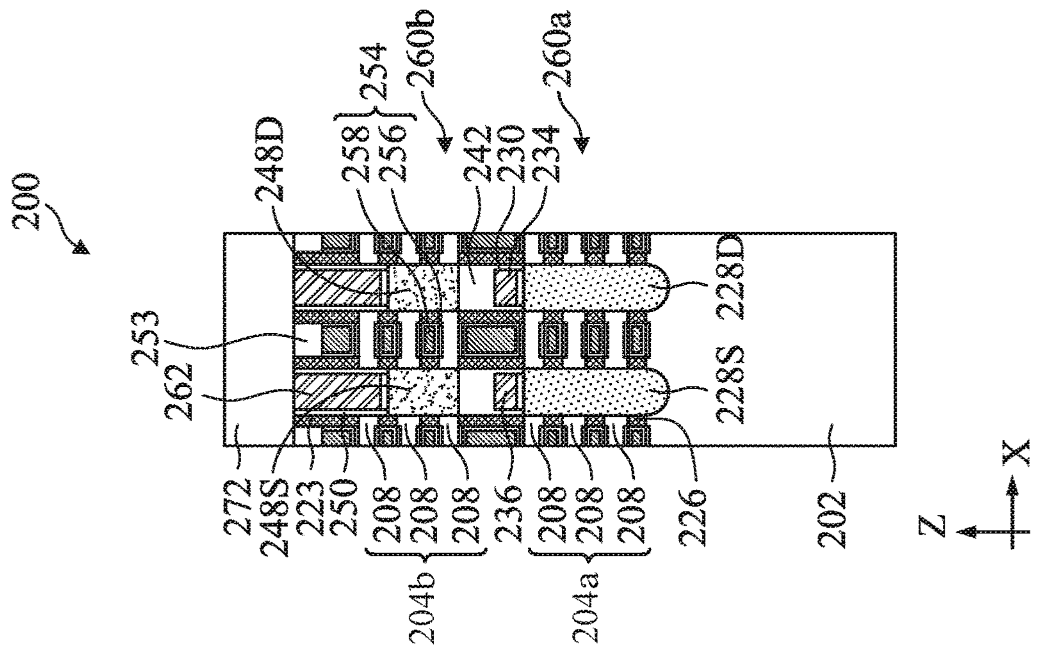

Reference is now made to FIGS. 50A-C. Upon conclusion of the operations in method 100, a bottom GAA transistor 260*a* and a top GAA transistor 260*b* stacked over the bottom GAA transistor 260*a* are formed. The bottom GAA transistor 260*a* includes channel layers (or referred to as channel members) sandwiched between the first source feature 228S and the first drain feature 228D. The top GAA transistor 260*b* includes a same number of channel layers as the bottom GAA transistor 260*a*. One difference is that not all channel layers of the top GAA transistor 260*b* are sandwiched between the second source feature 248S and the second drain feature 248D and function as active channel layers for carriers to flow through. At least a topmost channel layer is adjoined by the second CESL 250 and becomes a "floating" (inactive) channel layer. Accordingly, the top GAA transistor 260*b* has one less active channel layer than the bottom GAA transistor 260*a*. In various embodiments, two or more top channel layers of the top GAA transistor 260*b* may be adjoined by the second CESL 250, and thus the top GAA transistor 260*b* may have two or more active channel layers less than the bottom GAA transistor 260*a*. Less number of active channel layers weakens current driving capability of the top GAA transistor 260*b*, which however may balance the current output in the pair of stacked GAA transistors. For example, when the top GAA transistor is an nFET and the bottom GAA transistor is a pFET, an nFET often provides a stronger current driving capability due to higher carrier mobility. By reducing a total active channel layer number of the nFET, a balanced current output from the pair of nFET and pFET can be achieved.

A common gate structure 254 wraps around each channel layer of the top and bottom GAA transistors 260*a* and 260*b*, while the dielectric isolation layer 242 interposes the first source 228S and the second source 248S, and also interposes the first drain 228D and the second drain 248D. The first source feature 228S is coupled to a bottom power rail by way of the first source contact 236 and the first source contact via 238. The second source feature 248S is couple to the bottom power rail by way of the second source contact 262 and the second source contact via 266. The first source contact via 238 and the second source contact via 266 are disposed on two sides of the first contact 228S. The first drain feature 228D is coupled to a top power rail by way of the first drain contact 234 and the first drain contact via 270. The second drain feature 248D is coupled to the top power rail by way of the second drain contact 264 and the second drain contact via 268. The top power rail is disposed in the top interconnect layer 272.

Figure 51:
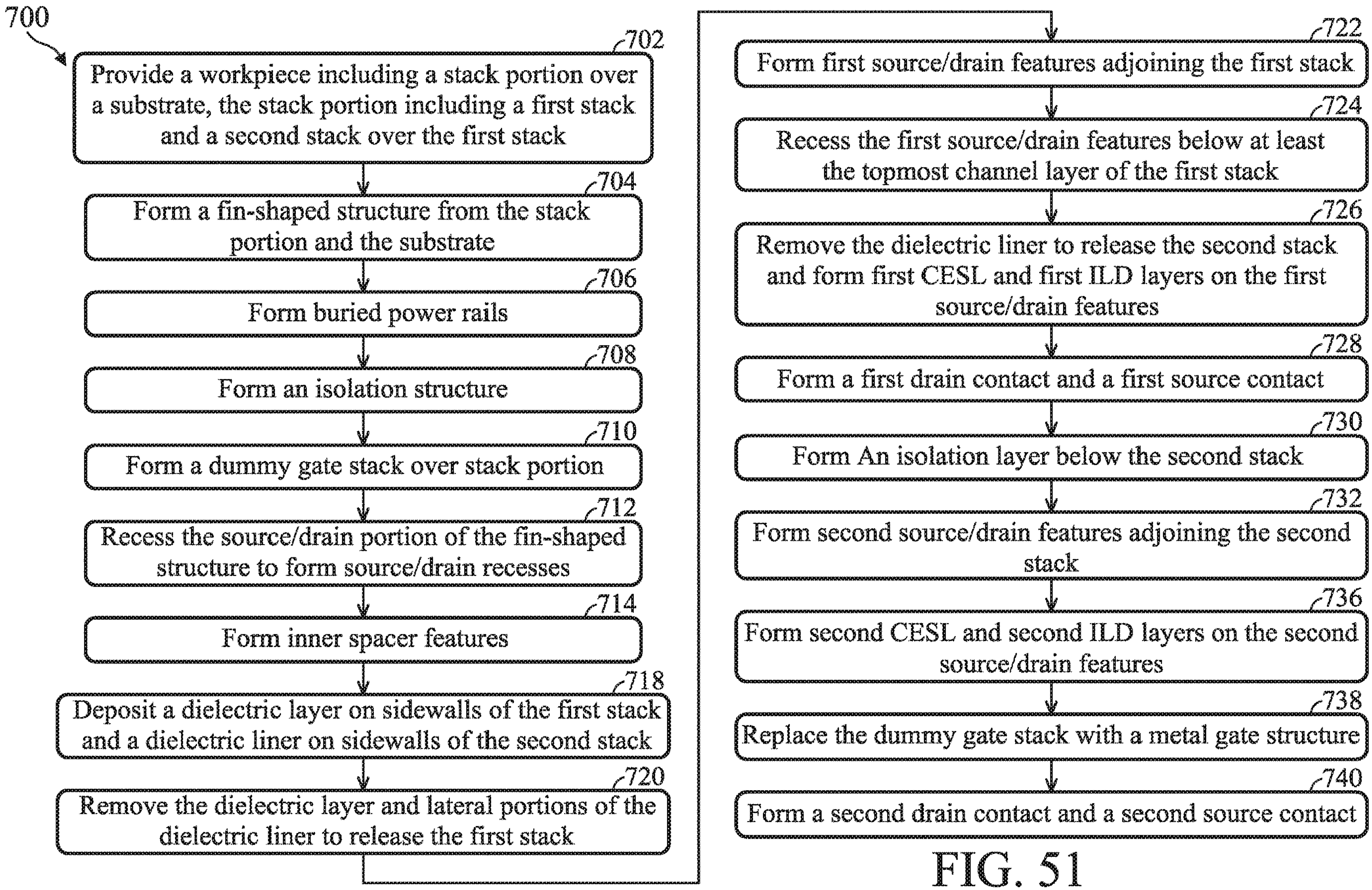
FIG. 51 illustrates a flow chart of a method for forming a semiconductor device having a backside power rail, according to one or more aspects of the present disclosure.
Figure 52A:
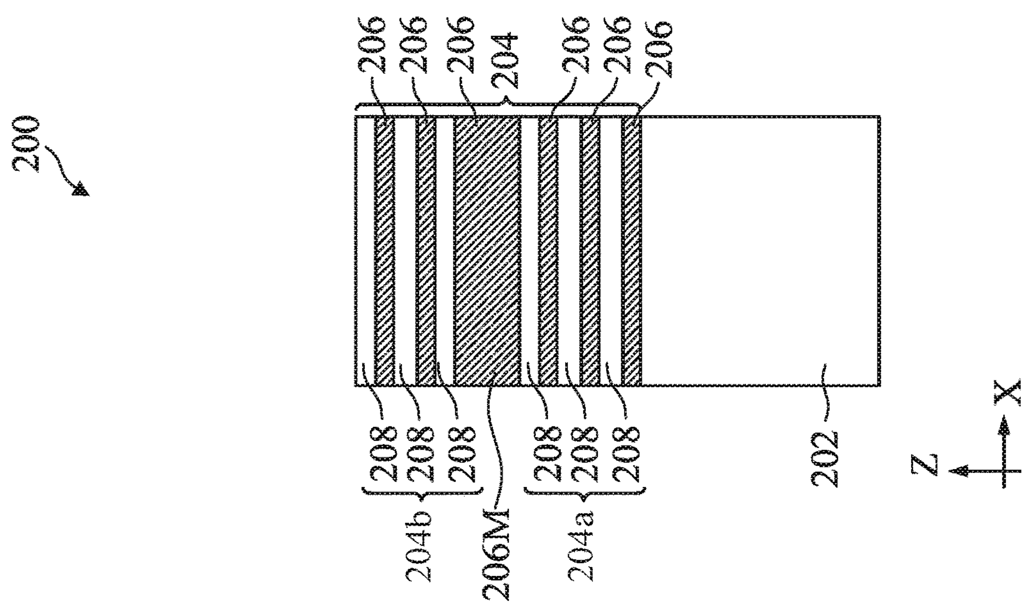
FIGS. 52A, 52B, 52C, 53A, 53B, 53C, 54A, 54B, 54C, 55A, 55B, 55C, 56A, 56B, 56C, 57A, 57B, 57C, 58A, 58B, 58C, 59A, 59B, 59C, 60A, 60B, 60C, 61A, 61B, 61C, 62A, 62B, 62C, 63A, 63B, 63C, 64A, 64B, 64C, 65A, 65B, 65C, 66A, 66B, 66C, 67A, 67B, and 67C illustrate fragmentary cross-sectional views of a workpiece during a fabrication process according to the method of FIG. 51, according to one or more aspects of the present disclosure.
Figure 52B:
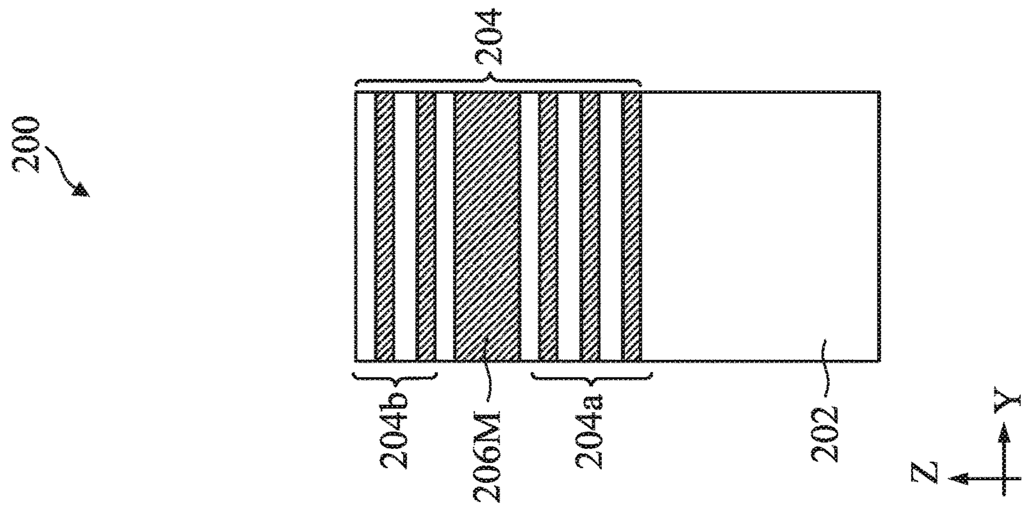
Figure 52C:
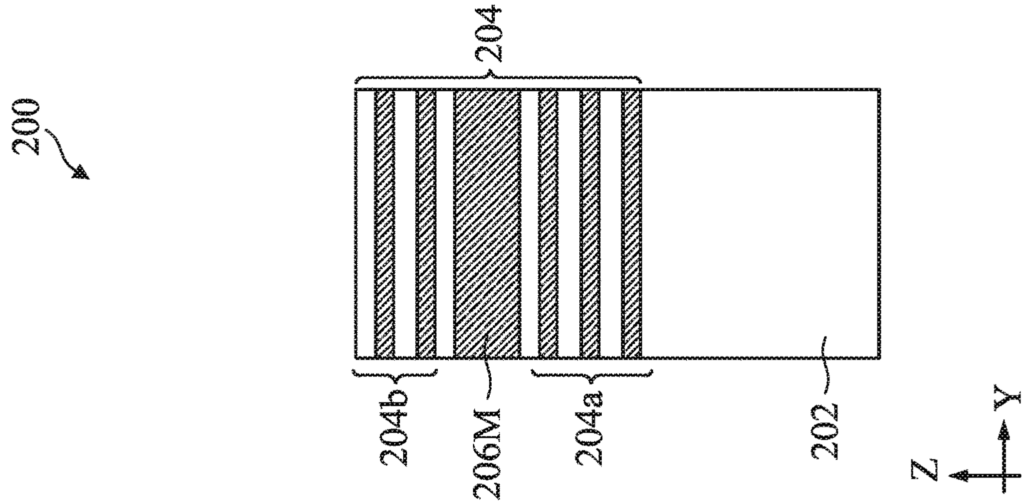
Figure 53C:
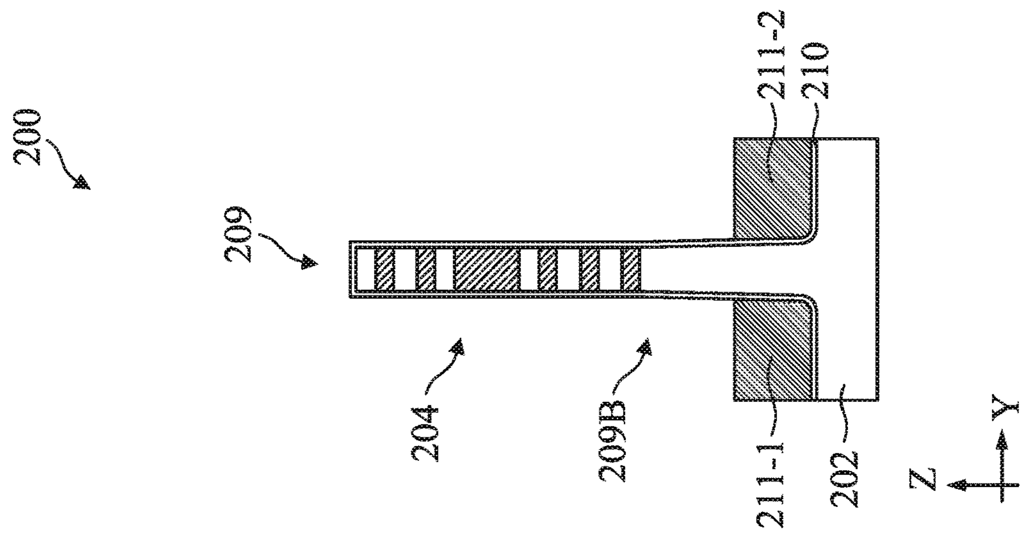
Figure 53B:
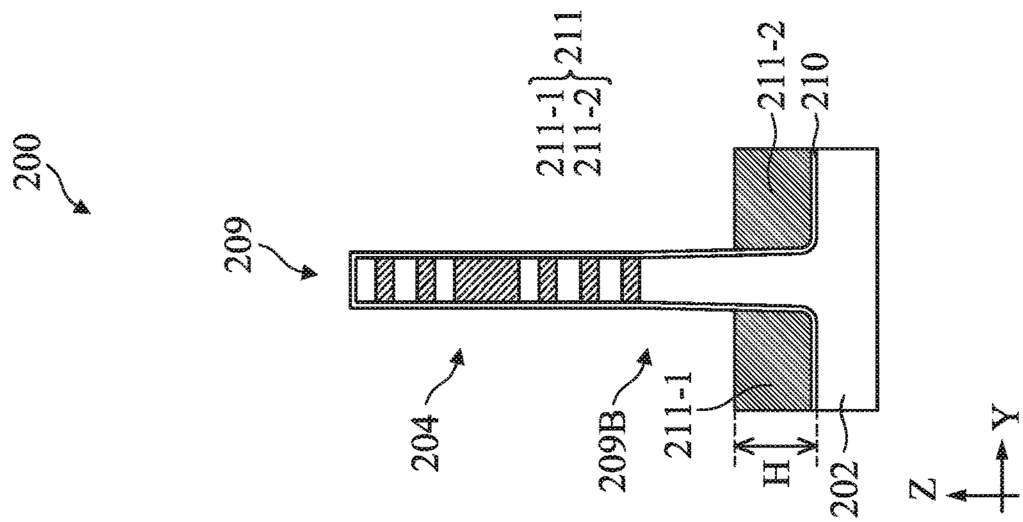
Figure 53A:
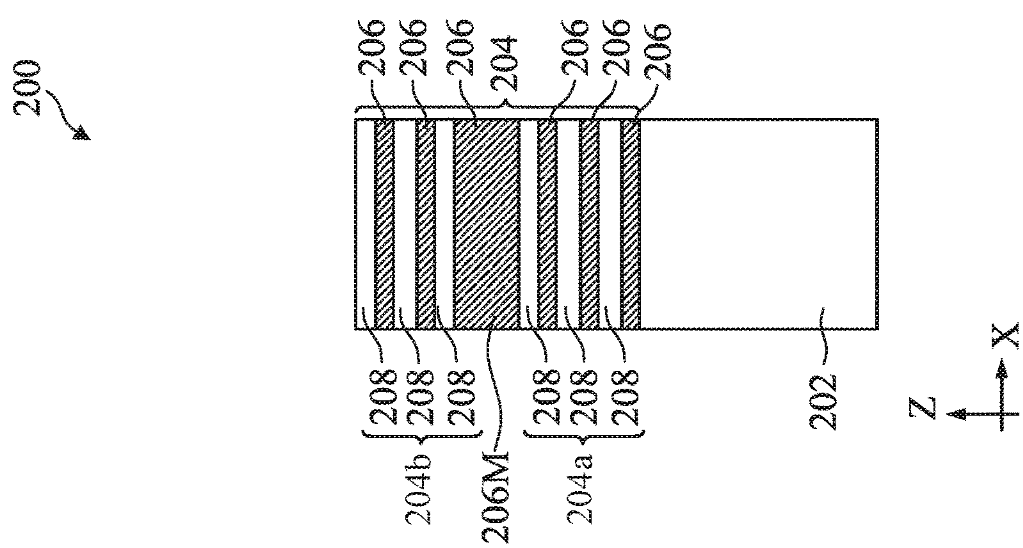
Figure 54A:
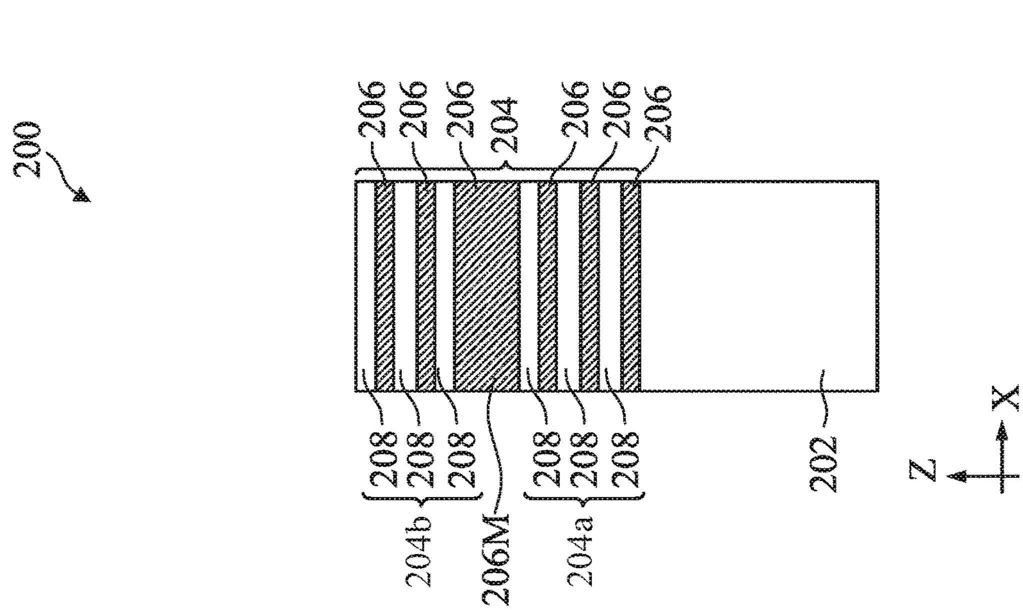
Figure 54B:
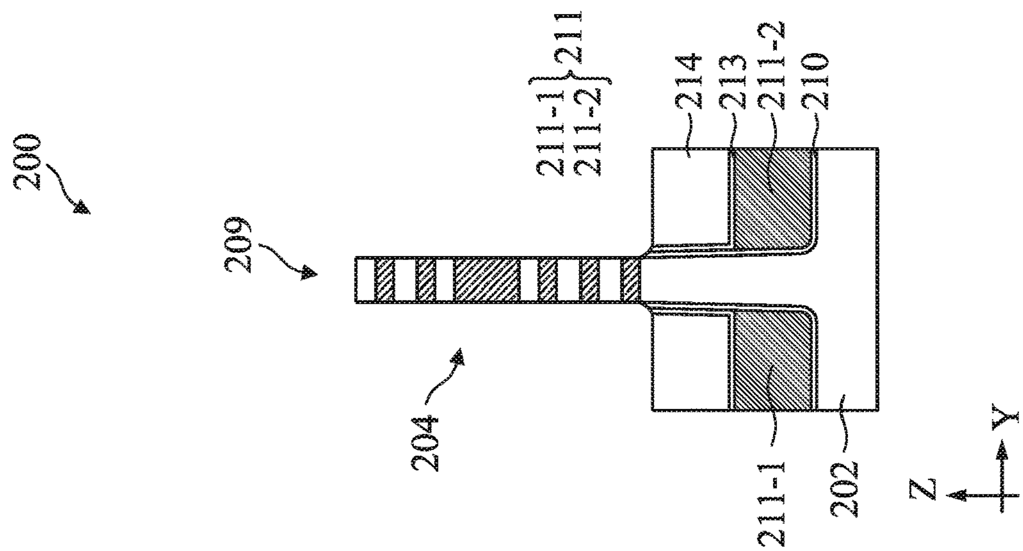
Figure 54C:
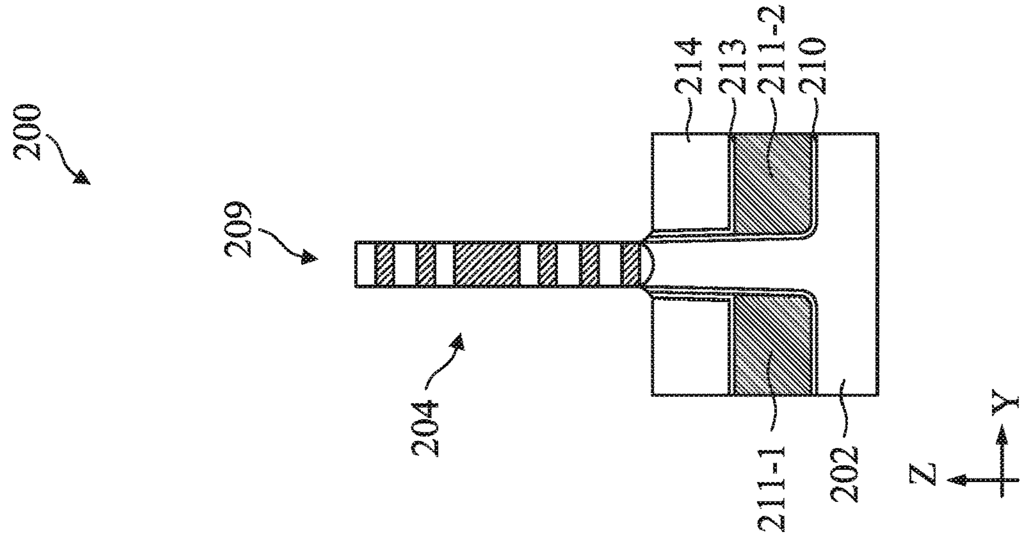
Figure 55C:
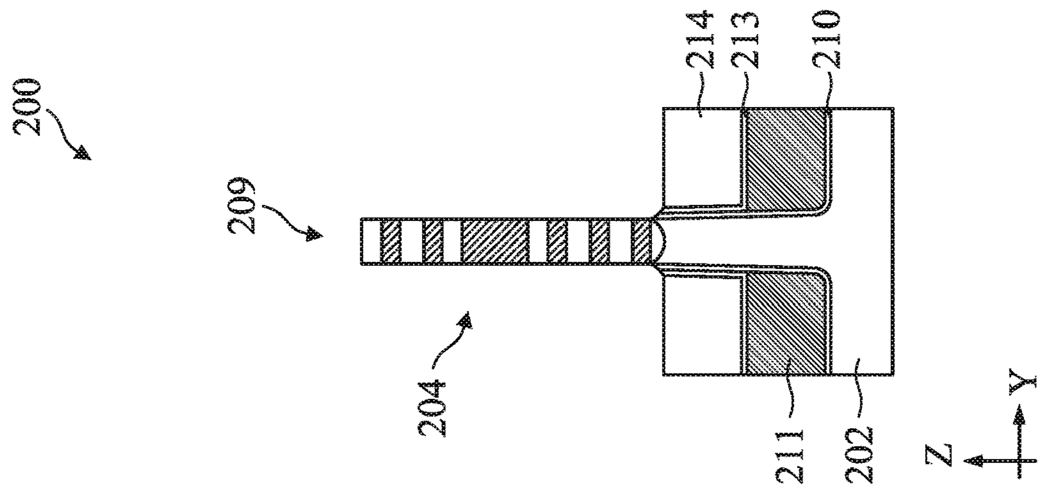
Figure 55B:
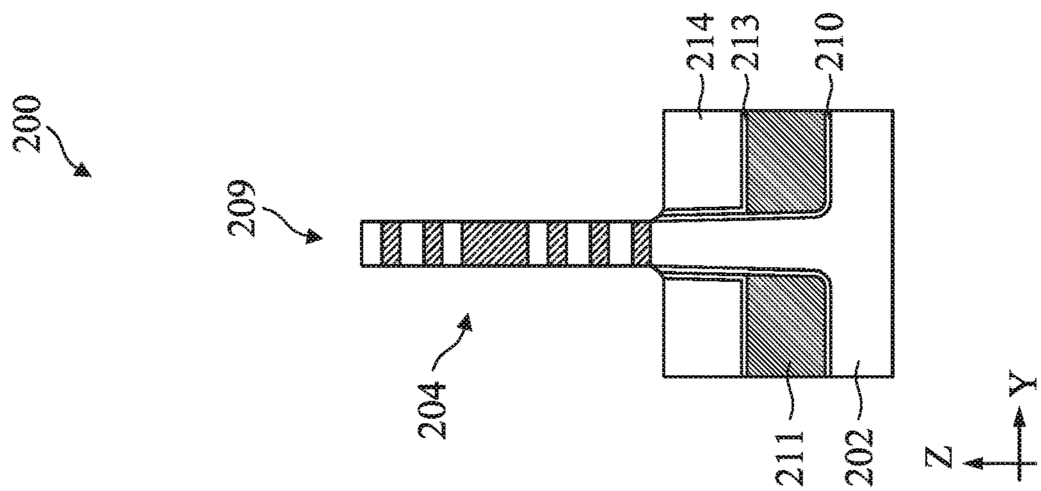
Figure 55A:
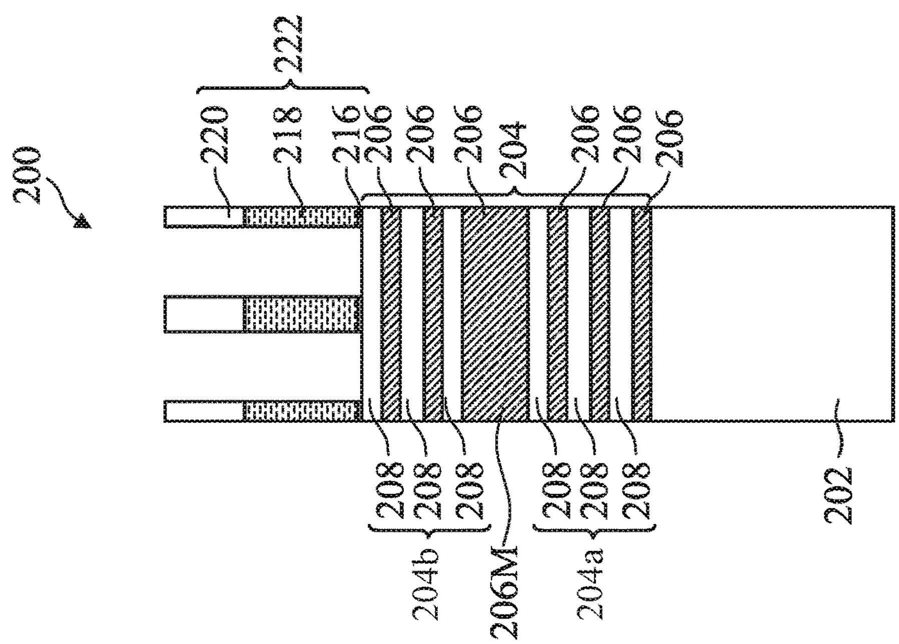
Figure 56C:
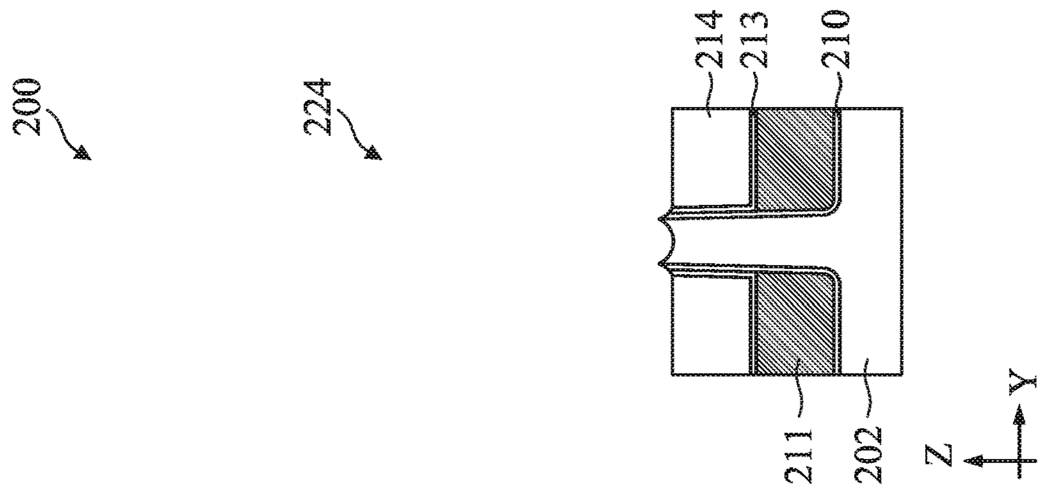
Figure 56B:
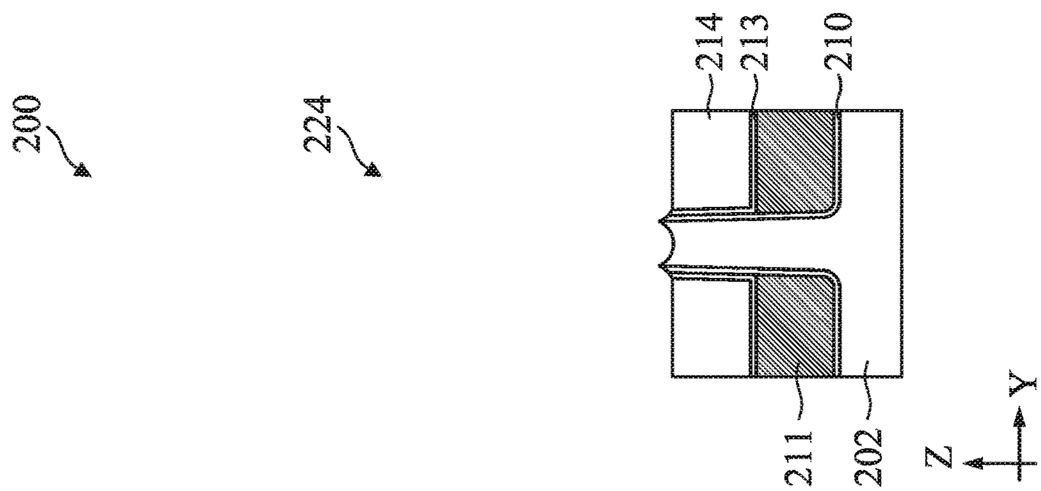
Figure 56A:
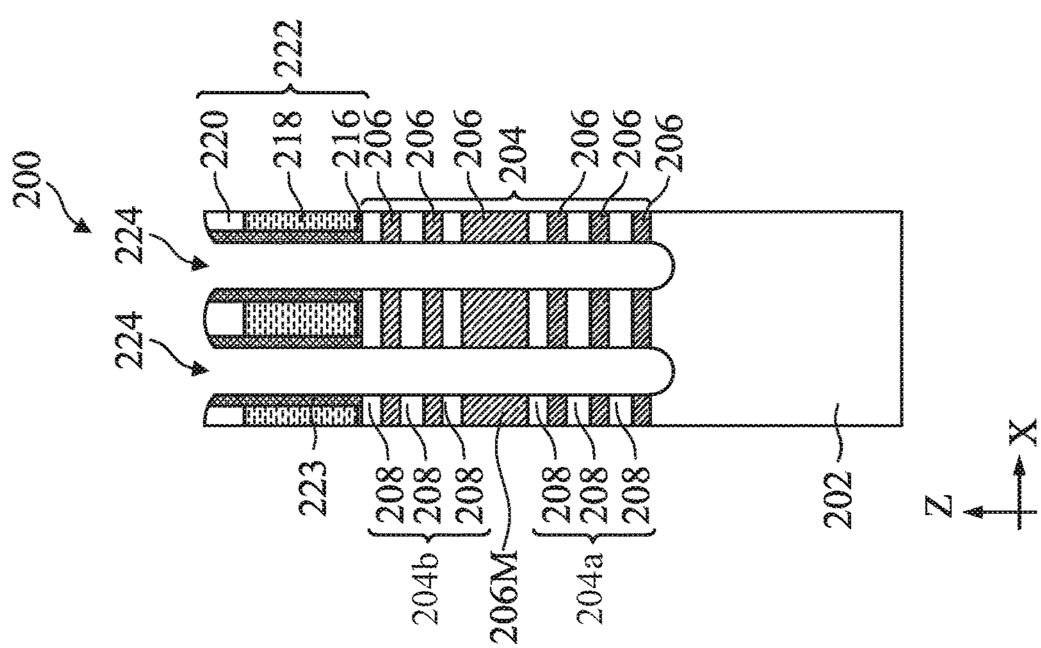
Figure 57C:
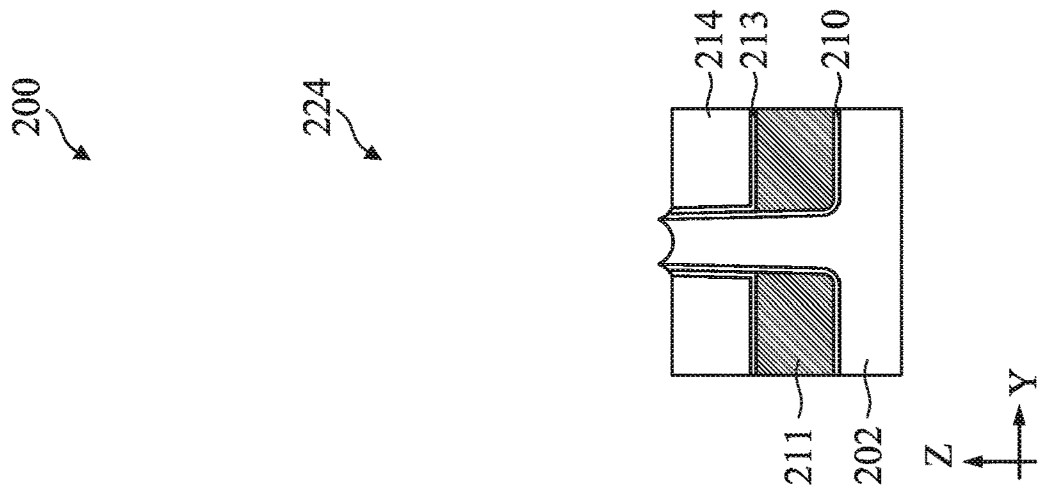
Figure 57B:
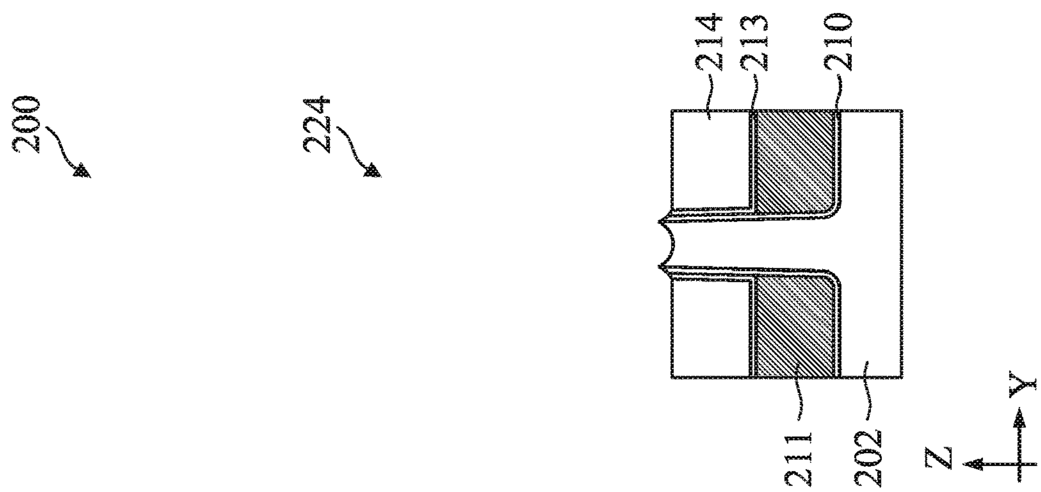
Figure 57A:
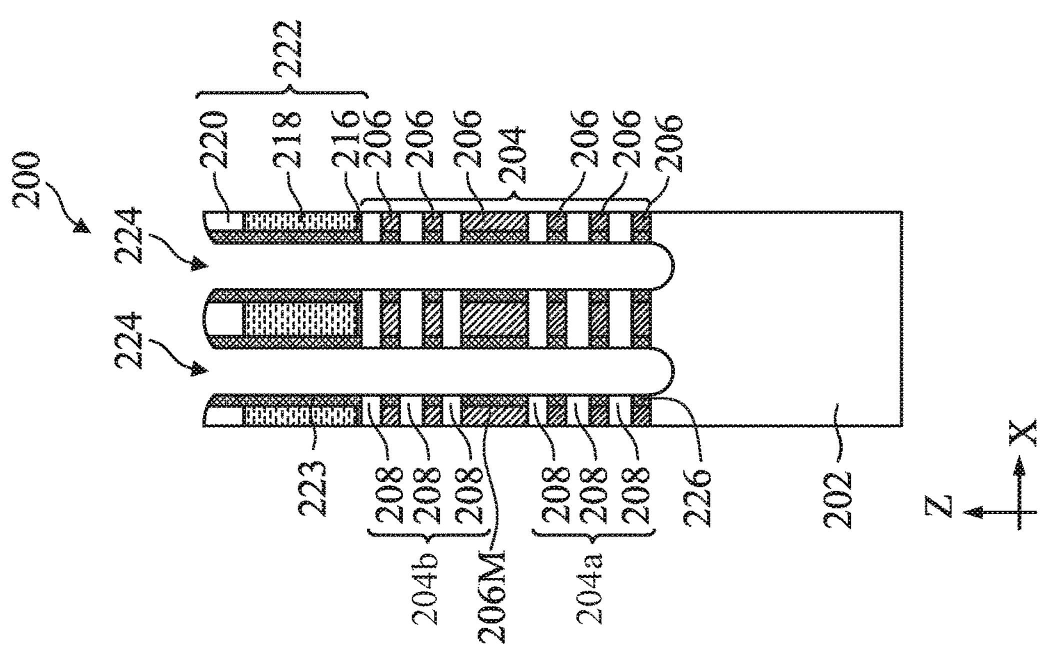
Figure 58C:
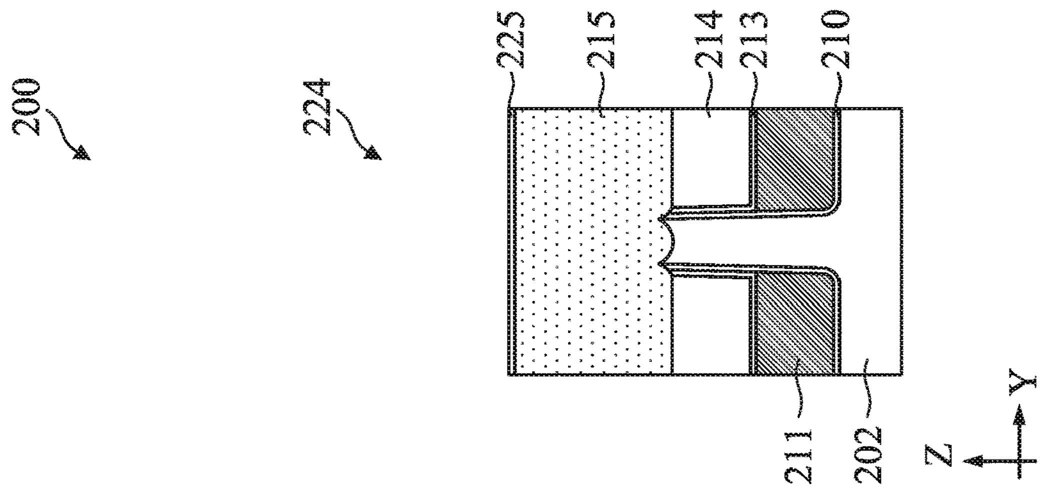
Figure 58B:
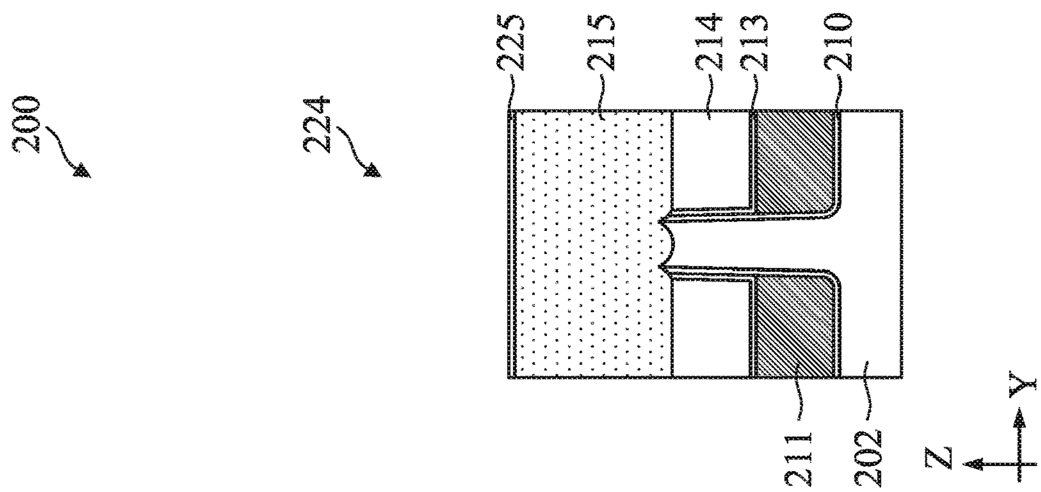
Figure 58A:
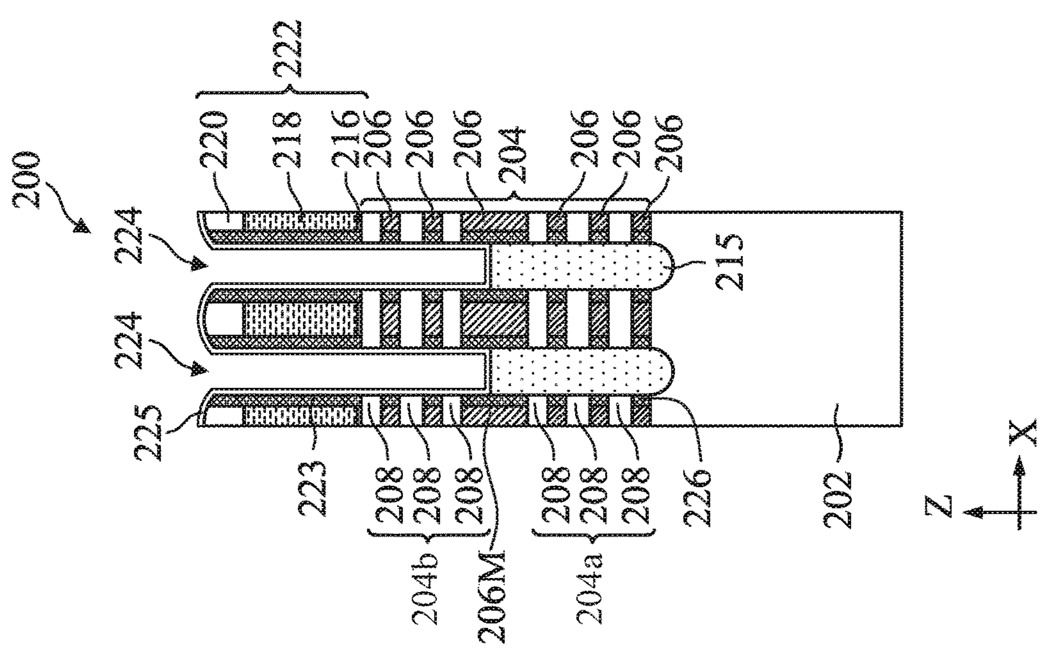
Figure 59A:
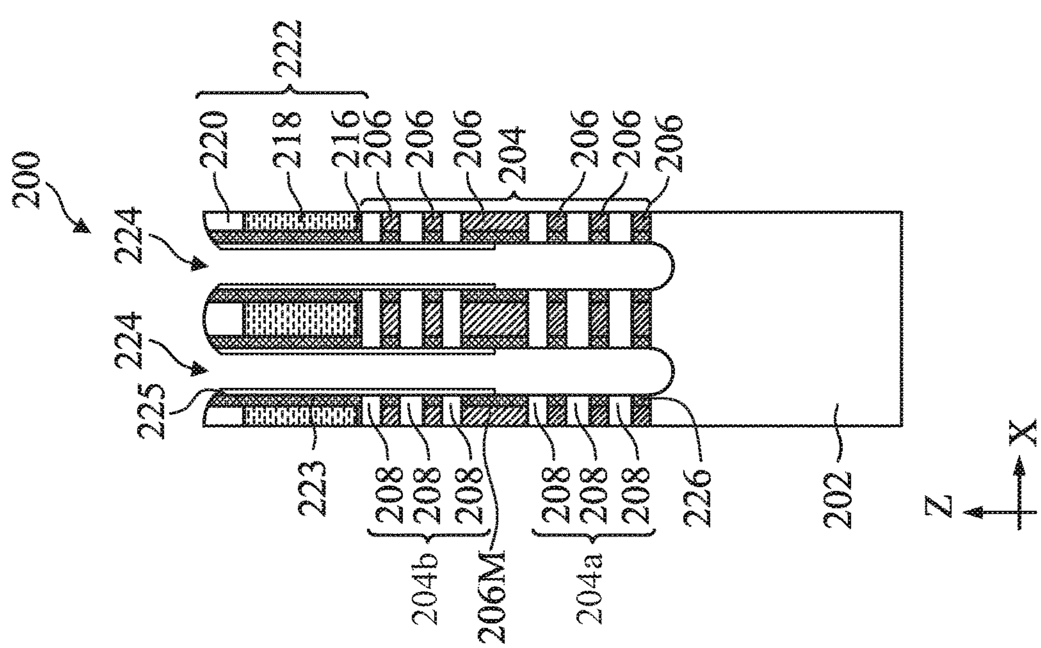
Figure 59B:
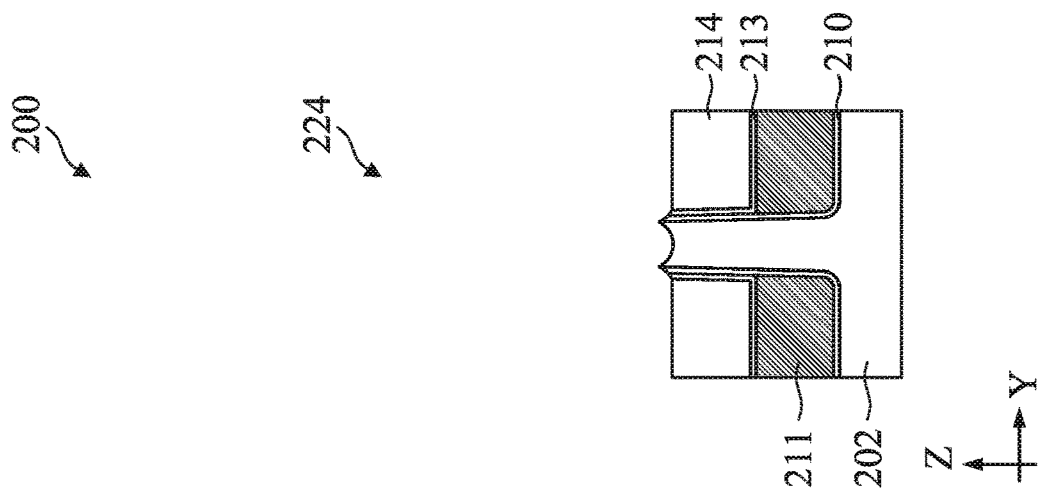
Figure 59C:
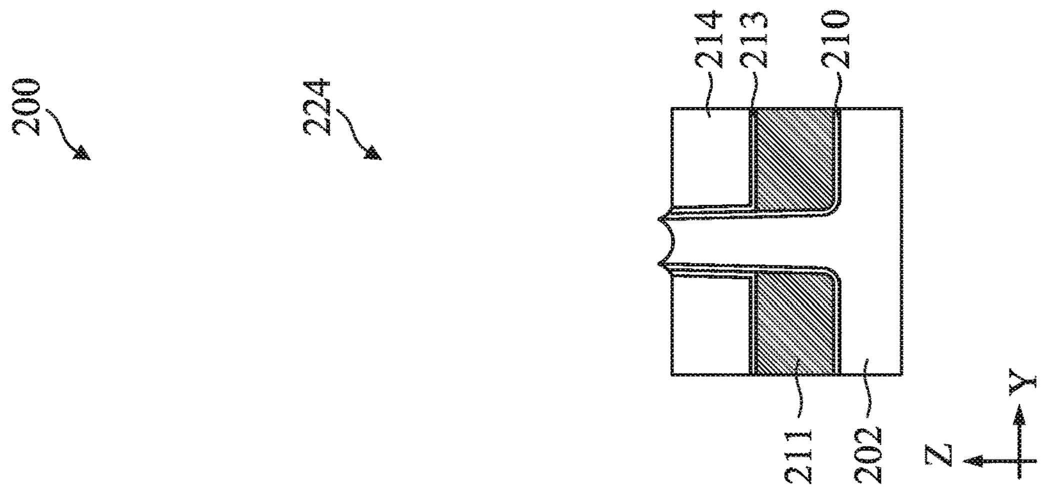
Figure 60C:
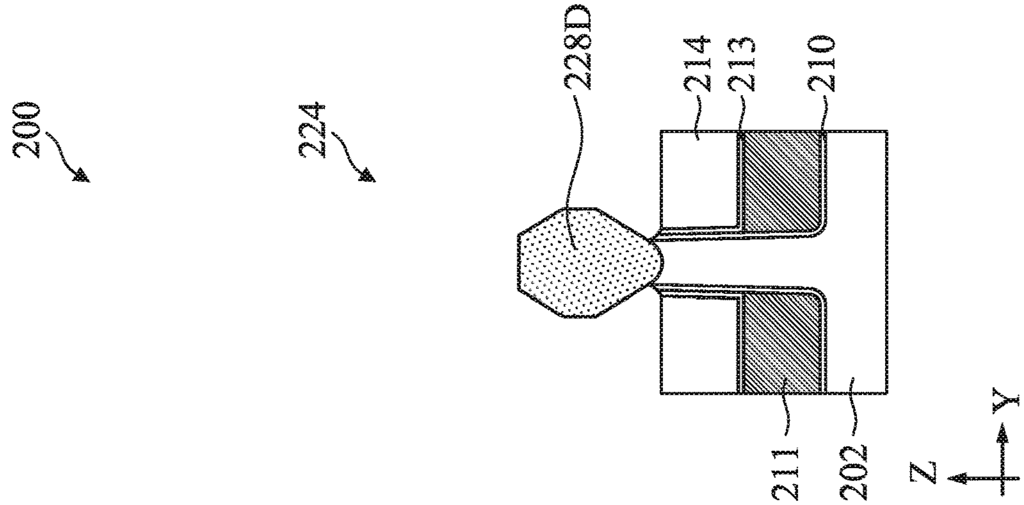
Figure 60B:
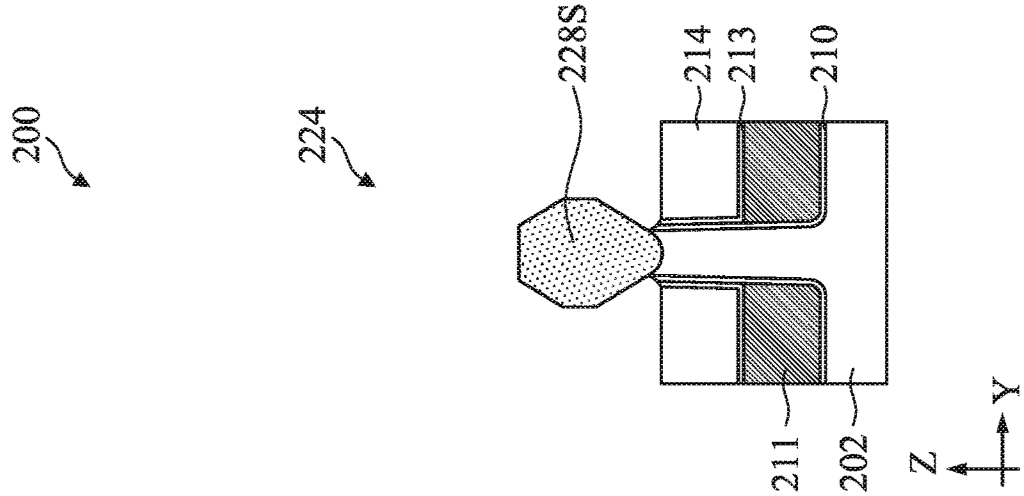
Figure 60A:
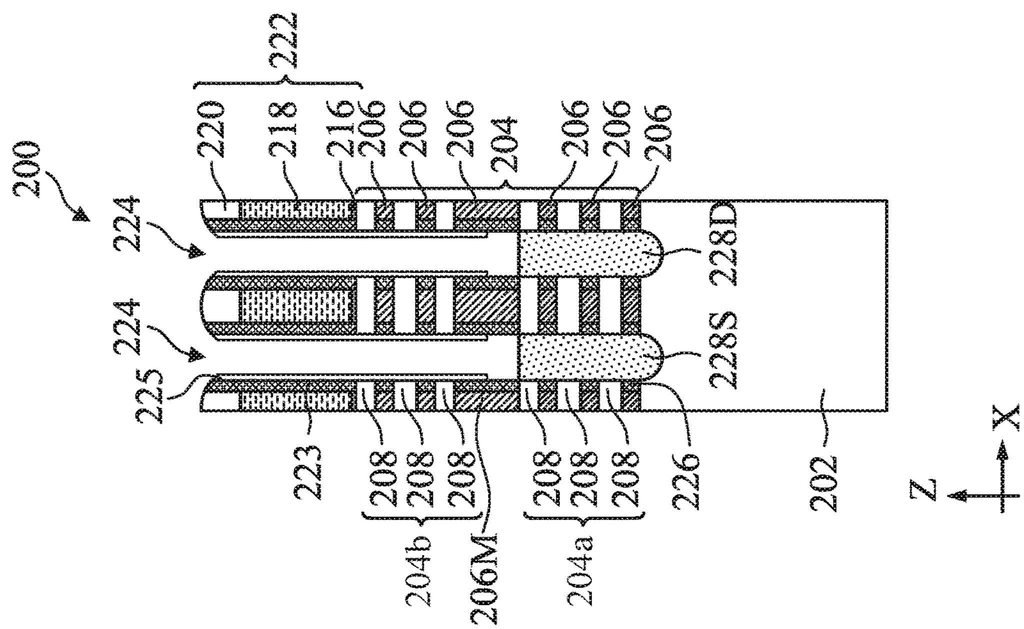

Attention is now turned to method 700. FIG. 51 illustrates a flow chart of method 700, according to various aspects of the present disclosure. Throughout the present disclosure, similar reference numerals denote similar features in terms composition and formation. Some details of operations in method 700 may be simplified or omitted if similar details have been described in conjunction with method 100.

Referring to FIGS. 51 and 52A-C, method 700 includes a block 702 where a workpiece 200 is provided. The workpiece 200 includes a substrate portion (also referred to as substrate) 202 and a stack portion 204 over the substrate 202. The stack portion 204 includes a first stack 204*a* and a second stack 204*b* over the first stack 204*a*. Because the substrate 202 and the stack portion 204 have been described above, detailed descriptions thereof are omitted here.

Referring to FIGS. 51 and 53A-C, method 700 includes a block 704 where a fin-shaped structure 209 is formed from the stack portion 204. Because operations at block 704 are similar to those at block 104, detailed descriptions thereof are omitted for brevity.

Still referring to FIGS. 51 and 53A-C, method 700 includes a block 706 where buried power rails 211 are formed. Because operations at block 706 are similar to those at block 106, detailed descriptions thereof are omitted for brevity.

Referring to FIGS. 51 and 54A-C, method 700 includes a block 708 where an isolation feature 214 is formed. Because operations at block 708 are similar to those at block 108, detailed descriptions thereof are omitted for brevity.

Referring to FIGS. 51 and 55A-C, method 700 includes a block 710 where a dummy gate stack 222 is formed over the stack portion 204. Because operations at block 710 are similar to those at block 110, detailed descriptions thereof are omitted for brevity.

Referring to FIGS. 51 and 56A-C, method 700 includes a block 712 where source/drain portions of the fin-shaped structure 209 are recessed to form source/drain recesses 224. Because operations at block 712 are similar to those at block 112, detailed descriptions thereof are omitted for brevity.

Referring to FIGS. 51 and 57A-C, method 700 includes a block 714 where inner spacer features 226 are formed. Because operations at block 714 are similar to those at block 114, detailed descriptions thereof are omitted for brevity.

Referring to FIGS. 51 and 58A-C, method 700 includes a block 718 where a sacrificial dielectric layer 215 is deposited in the source/drain trenches 224 to cover the sidewalls of the channel layer 208 of the first stack 204*a* and a third liner 225 is conformally deposited over the workpiece 200 to cover the sidewalls of the channel layer 208 of the second stack 204*b*. Because operations at block 718 are similar to those at block 118, detailed descriptions thereof are omitted for brevity.

Referring to FIGS. 51 and 59A-C, method 700 includes a block 720 where a lateral portion of the third liner 225 is removed to expose the sacrificial dielectric layer 215 and the sacrificial dielectric layer 215 is subsequently removed in a selective etch process to release the first stack 204*a*. Because operations at block 720 are similar to those at block 120, detailed descriptions thereof are omitted for brevity.

Referring to FIGS. 51 and 60A-C, method 700 includes a block 722 where first source feature 228S and a first drain feature 228D are formed in the source/drain trenches 224 adjoining the channel layers 208 of the first stack 204*a*. Since the channel layers 208 in the second stack 204*b* are covered by the third liner 225, epitaxial growth won't take place from the sidewalls thereof. Because operations at block 722 are similar to those at block 122, detailed descriptions thereof are omitted for brevity.

Figure 61A:
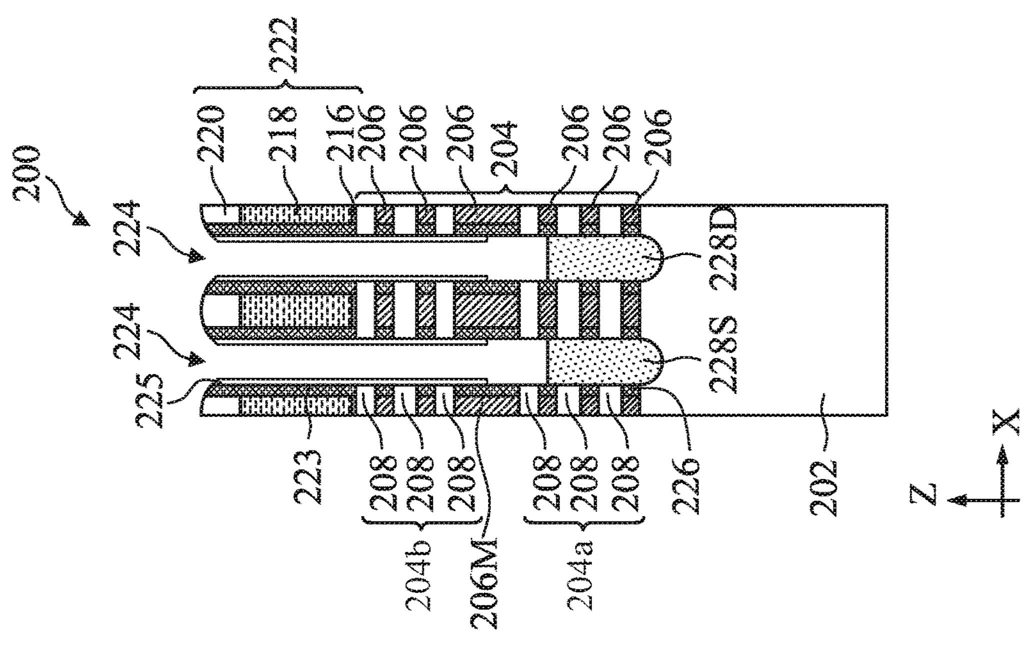
Figure 61B:
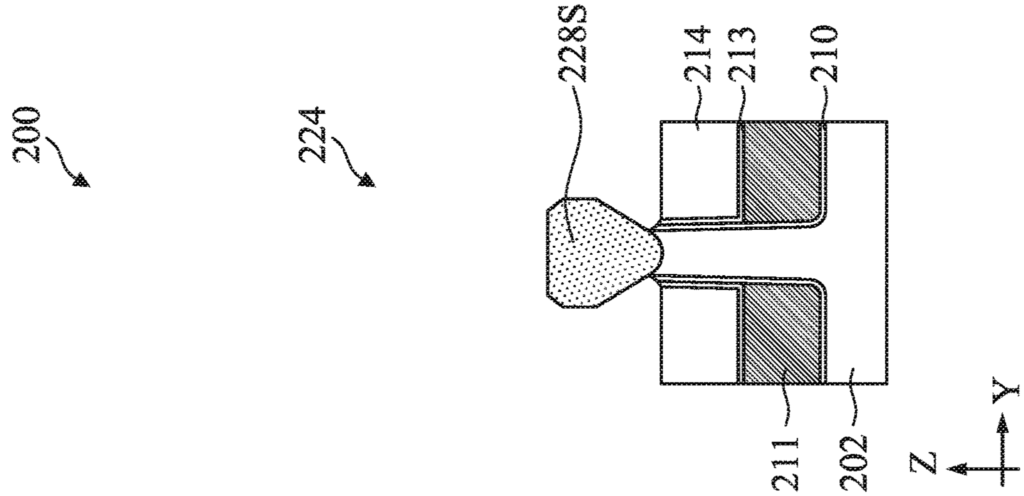
Figure 61C:
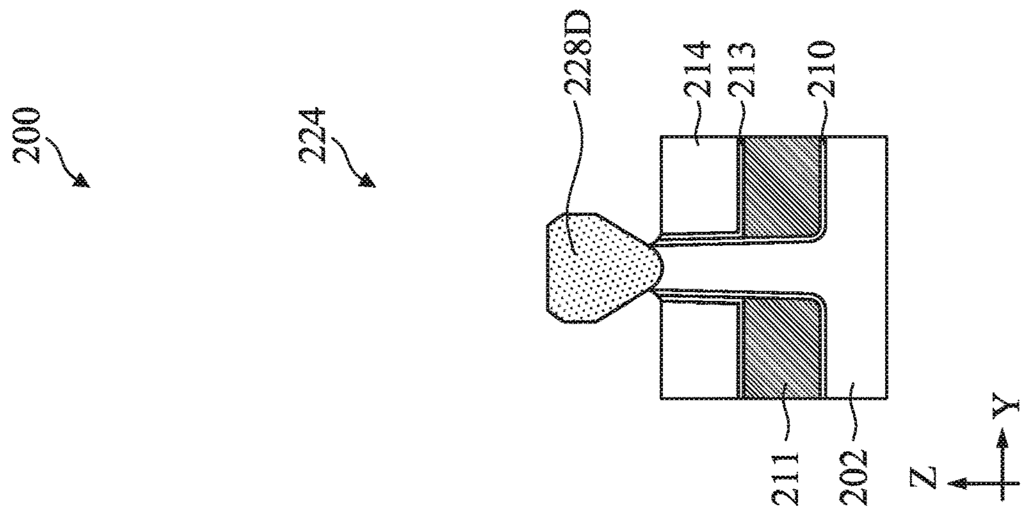
Figure 62C:
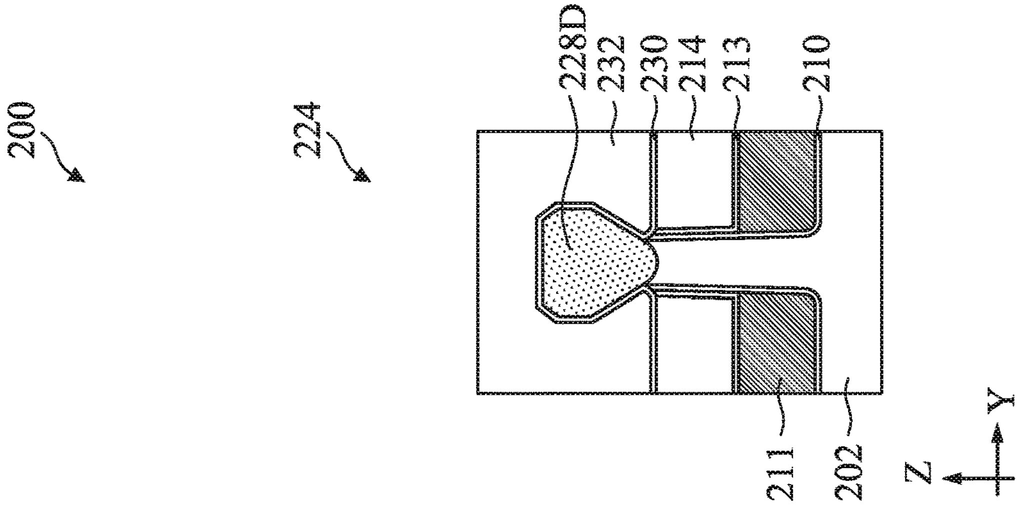
Figure 62B:
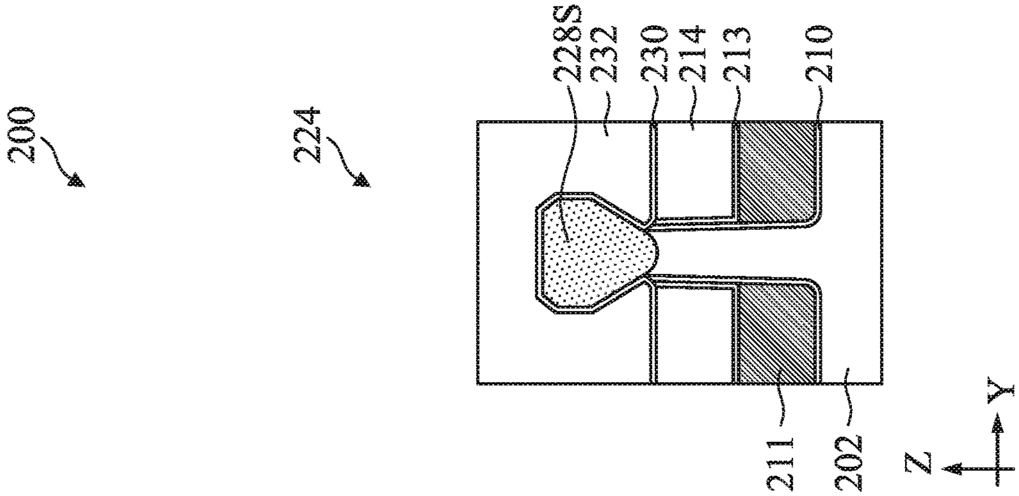
Figure 62A:
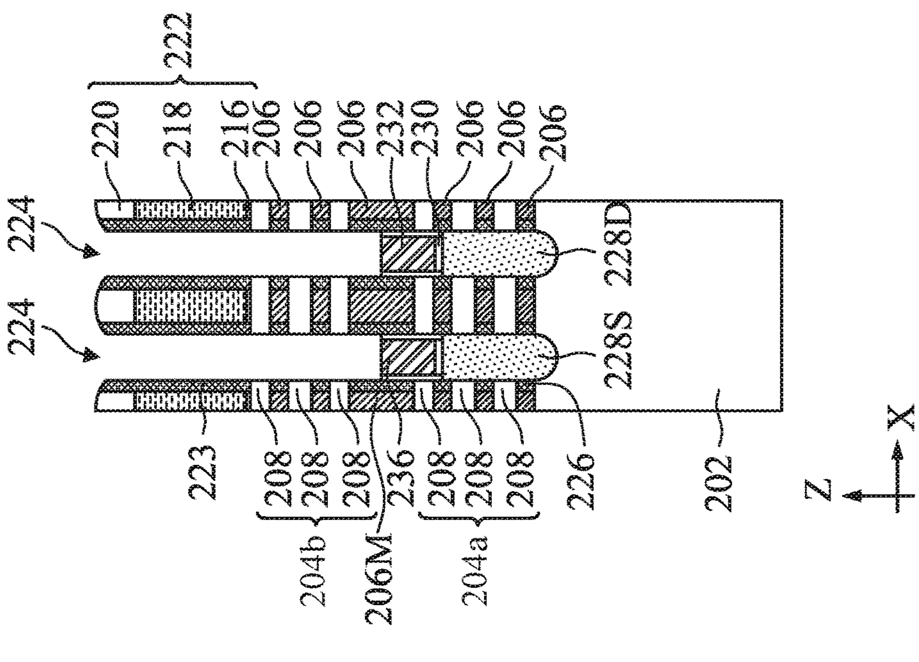

Referring to FIGS. 51 and 61A-C, method 700 includes a block 724 where the first source feature 228S and the first drain feature 228D are etched back to release at least the topmost channel layer 208 in the first stack 204*a*, exposing sidewalls thereof. The etching process may include dry etching, wet etching, reactive ion etching (RIE), and/or other suitable processes. As illustrated in FIG. 61A, top surfaces of the first source feature 228S and the first drain feature 228D are recessed below the topmost channel layer 208 in the first stack 204*a* but remain covering other channel layers 208 thereunder. In some embodiments, top surfaces of the first source feature 228S and the first drain feature 228D are recessed below two or more top channel layers 208 in the first stack 204*a*.

Referring to FIGS. 51 and 62A-C, method 700 includes a block 726 where the third liner 225 is removed to release the second stack 204*b* and a first CESL 230 and a first ILD layer 232 are deposited on the first source feature 228S and the first drain feature 228D. In some embodiments, the first CESL 230 is first conformally deposited on the workpiece 200 by ALD, plasma-enhanced chemical vapor deposition (PECVD) process and/or other suitable deposition or oxidation processes. The first ILD layer 232 is deposited over the first CESL 230 by a PECVD process or other suitable deposition technique. Subsequently, the first CESL 230 and the first ILD layer 232 are etched back to expose the second stack 204*b*. The conformal first CESL 230 still covers the recessed top surfaces of the first source feature 228S and the first drain feature 228D and also covers the exposed sidewalls of the topmost channel layer 208 in the first stack 204*a*. Isolated from the first source feature 228S and the first drain feature 228D by the first CESL 230, the topmost channel layer 208 in the first stack 204*a* becomes a "floating" (or inactive) channel layer. Because the material compositions of the first CESL 230 and the first ILD layer 232 have been described above, detailed descriptions thereof are omitted here.

Referring to FIGS. 51 and 63A-C, method 700 includes a block 728 where interconnection features, such as a first drain contact 234, a first source contact 236, a first source contact via 238 are formed. Because operations at block 728 are similar to those at block 128, detailed descriptions thereof are omitted for brevity.

Figures 63A, 63B, 63C:
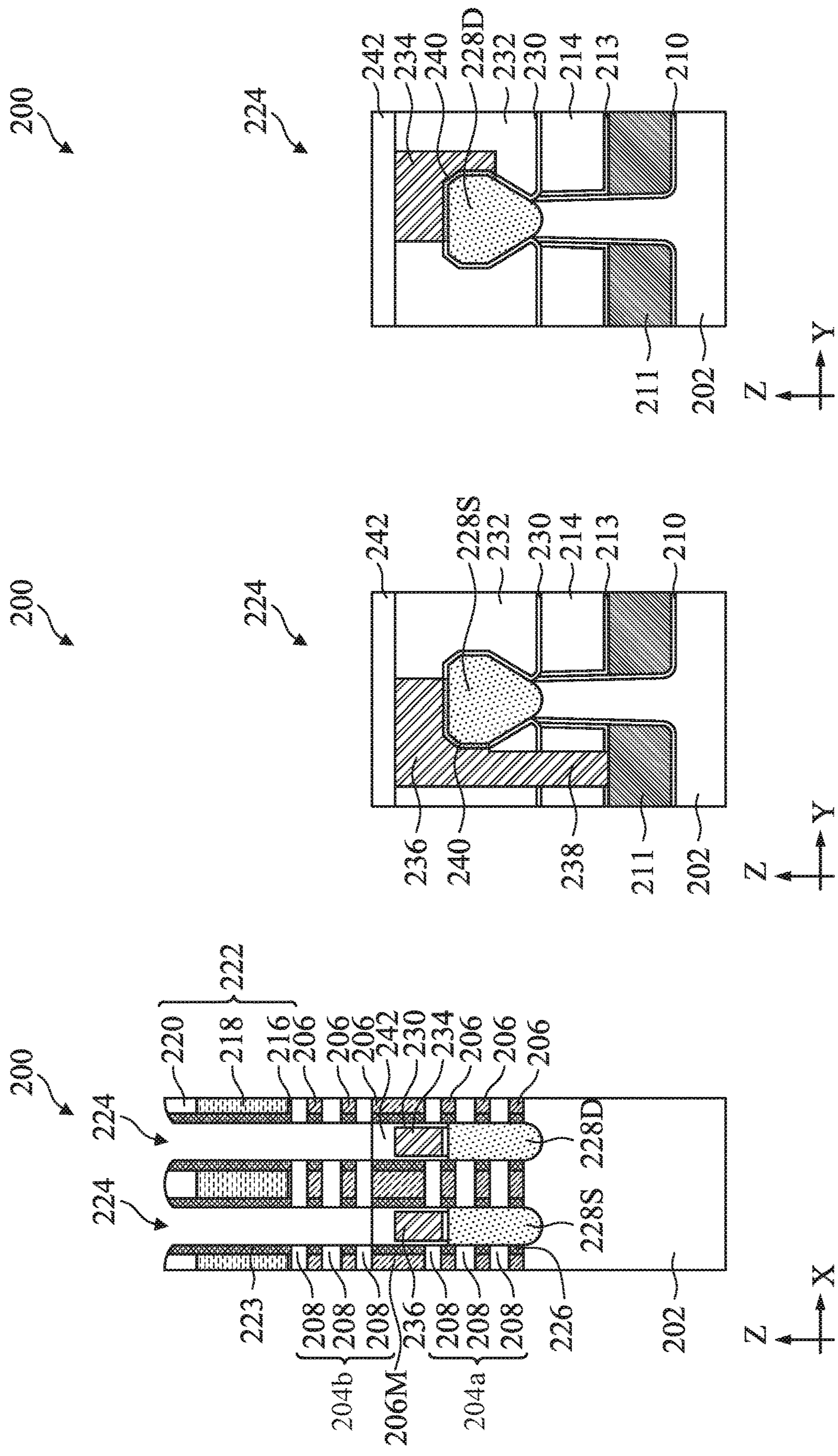

Still referring to FIGS. 51 and 63A-C, method 700 includes a block 730 where a dielectric isolation layer 242 is deposited over the first ILD layer 232 and covering interconnection features formed in earlier operations at block 728. The dielectric isolation layer 242 may include silicon nitride, silicon oxide, silicon oxynitride, hafnium oxide, aluminum oxide, zirconium oxide, or other suitable isolation material. In an embodiment, the dielectric isolation layer 242 may be formed by filling the source/drain trenches 224 with dielectric isolation material (e.g., by using a CVD process or a spin-on glass process), and etching back the dielectric isolation material in a selective etching process. As shown in FIG. 63A, the dielectric isolation layer 242 covers the inner spacer features 226 that are on sidewalls of the middle sacrificial layer 206M but not on sidewalls of the bottom channel layer 208 of the second stack 204*b*. State differently, the sidewalls of the bottom channel layers 208 in the second stack 204*b* remain exposed in the source/drain trenches 224.

Figure 64C:
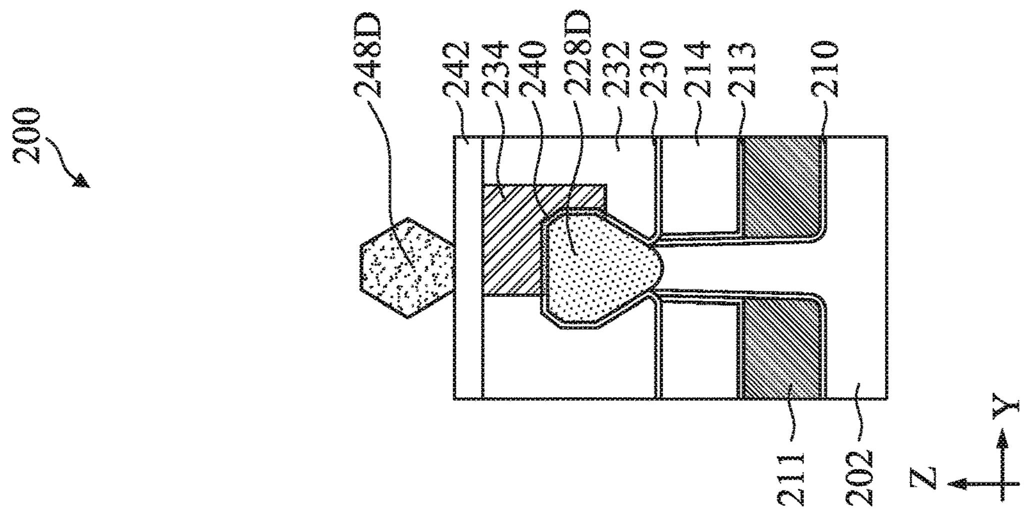
Figure 64B:
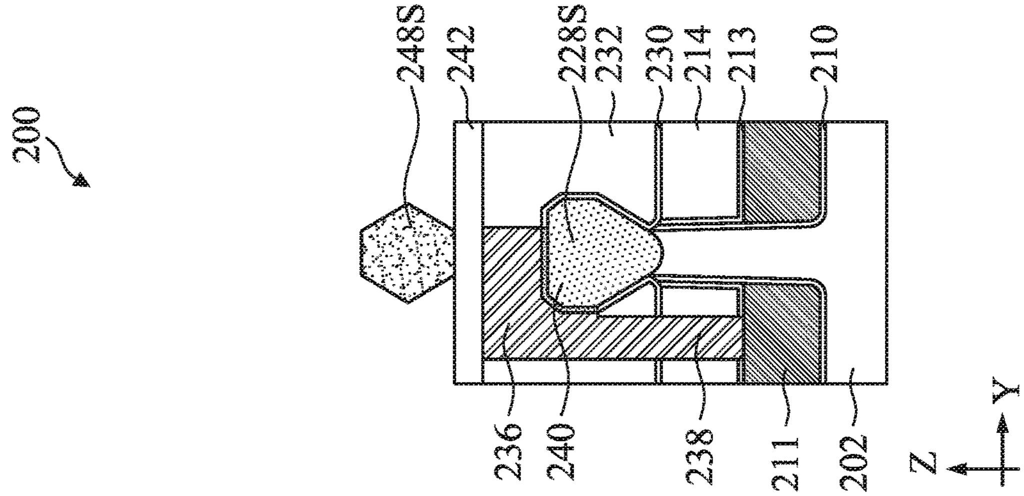
Figure 64A:
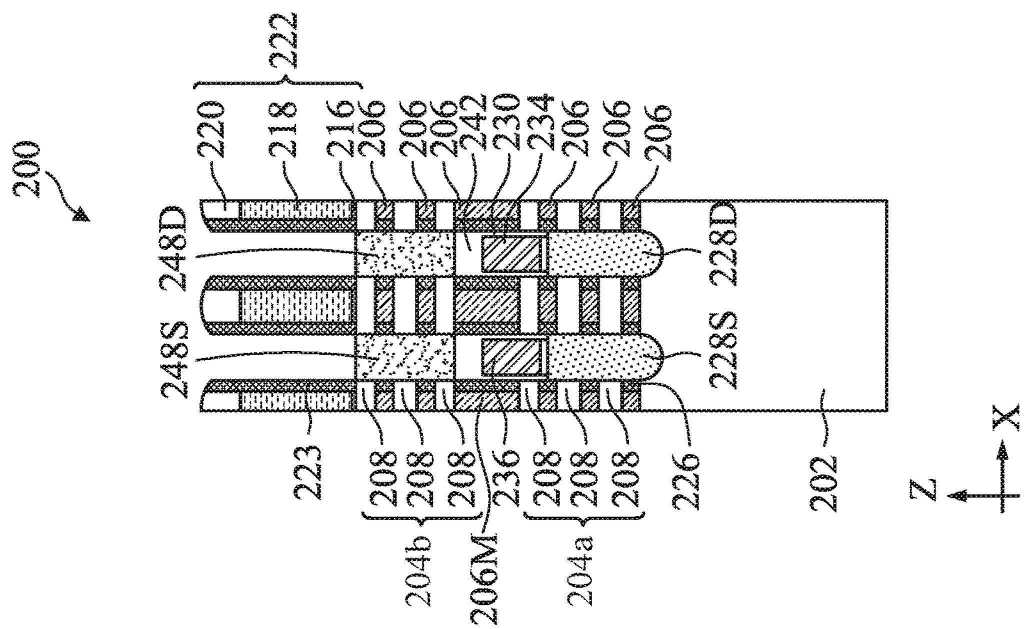
Figure 65C:
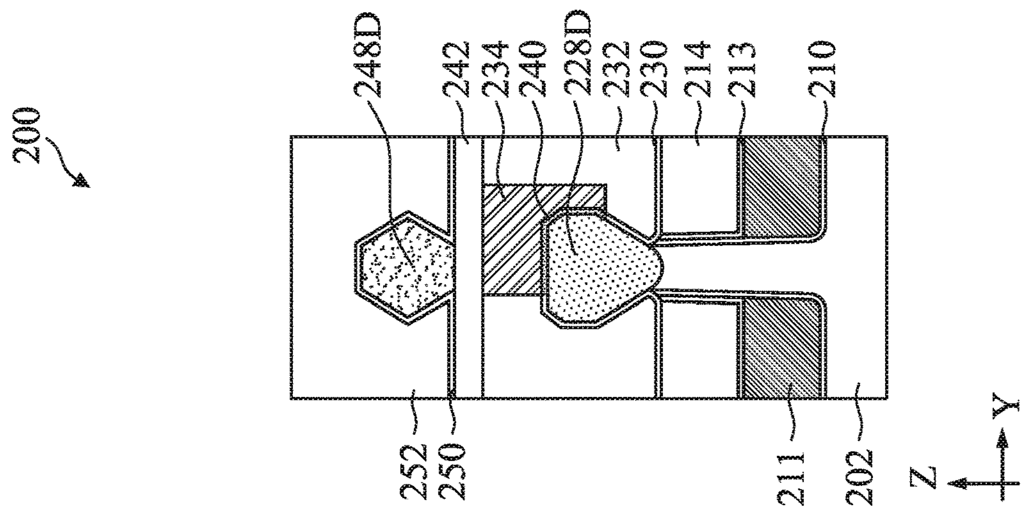
Figure 65B:
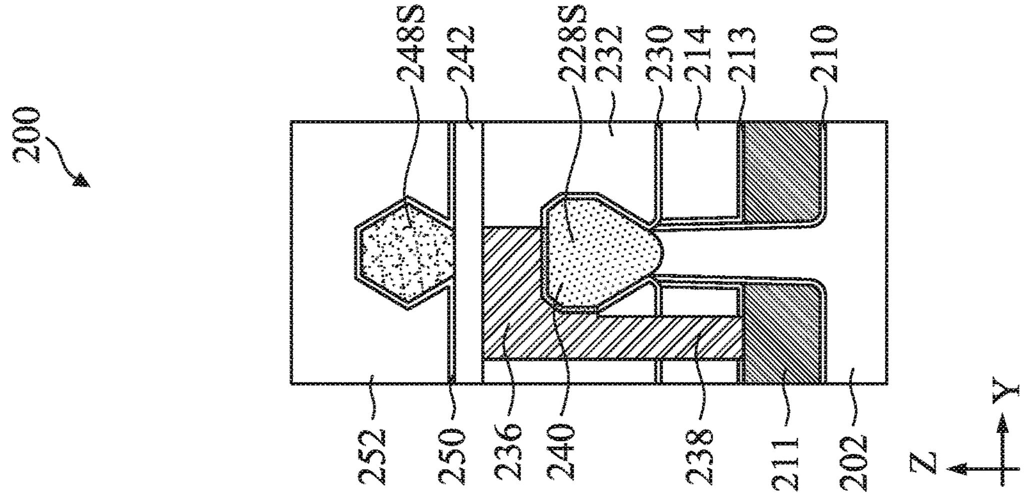
Figure 65A:
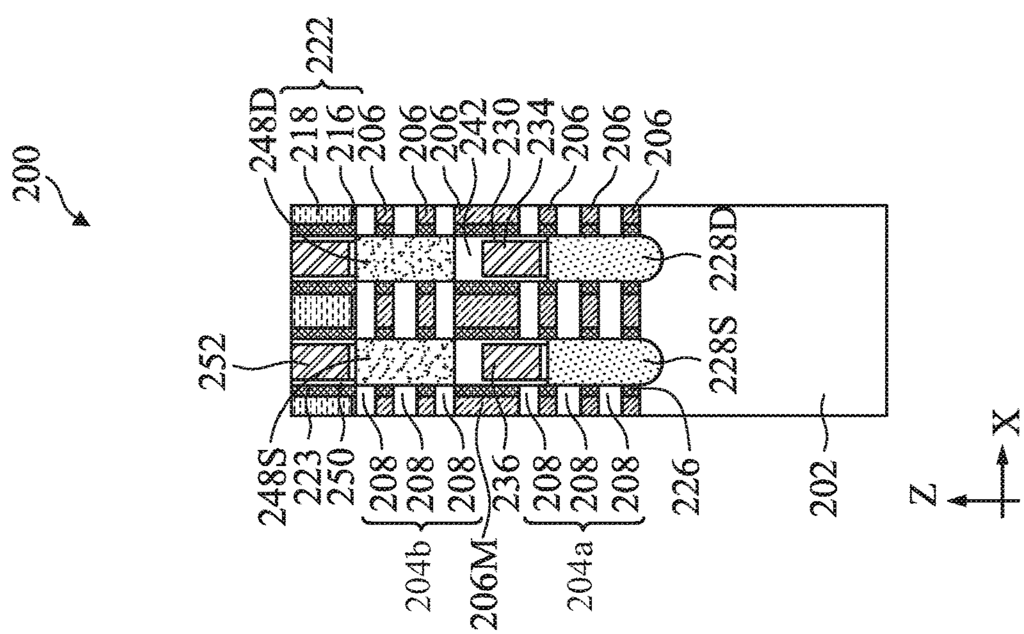
Figure 66C:
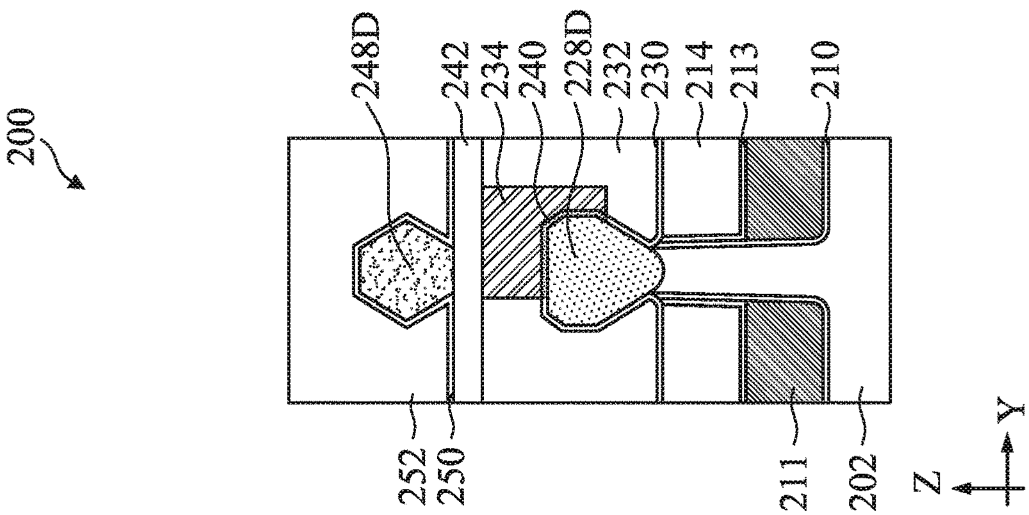
Figure 66B:
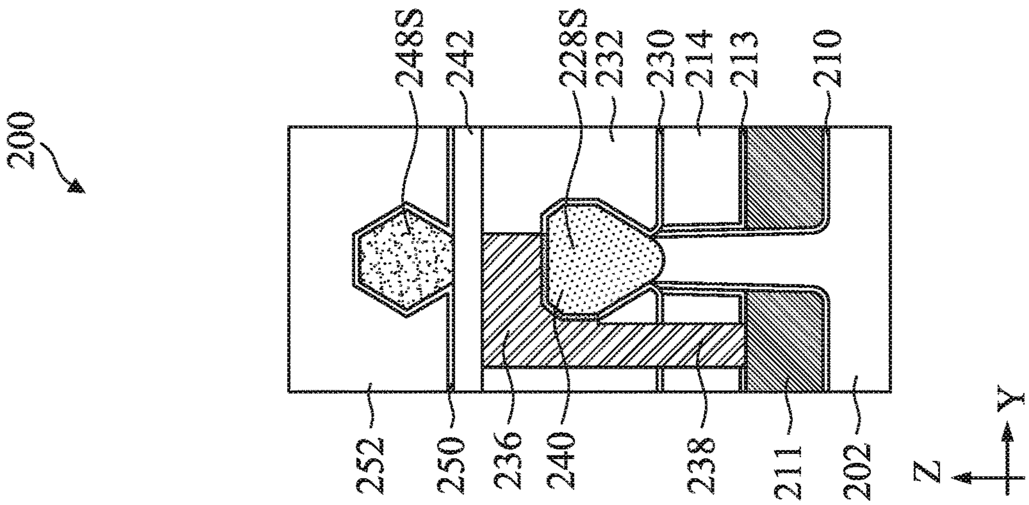
Figure 66A:
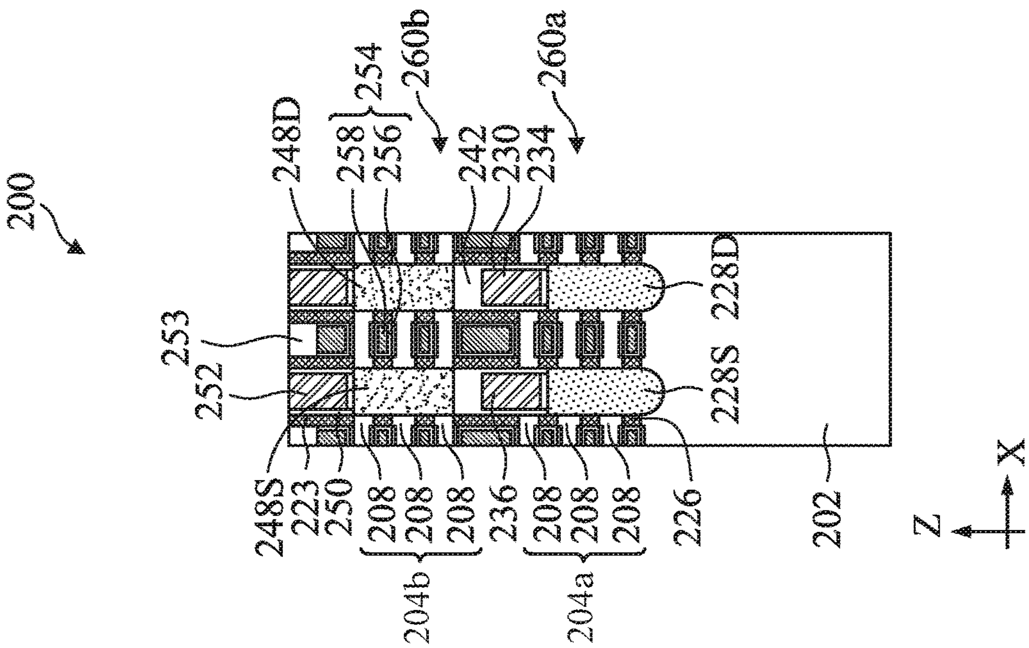

Referring to FIGS. 51 and 64A-C, method 700 includes a block 732 where a second source feature 248S and a second drain feature 248D are formed in the source/drain trenches 224. The second source feature 248S and the second drain feature 248D may be formed using an epitaxial process, such as VPE, UHV-CVD, MBE, and/or other suitable processes. The epitaxial growth process may use gaseous and/or liquid precursors, which interact with the channel layers 208. The exposed sidewalls of the channel layers 208 of the second stack 204*b* functionally serve as semiconductor seed layers. Since there are no channel layers 208 adjoined to the dielectric isolation layer 242, the epitaxial growth of the second source feature 248S and the second drain feature 248D may take place from the exposed sidewalls of all the channel layers 208 of the second stack 204*b*. As illustrated in FIG. 64A, the second source feature 248S and the second drain feature 248D are therefore in physical contact with (or adjoining) each channel layers 208 of the second stack 204*b*. Because the material compositions of the second source feature 248S and the second drain feature 248D have been described above, detailed descriptions thereof are omitted here.

Referring to FIGS. 51 and 65A-C, method 700 includes a block 736 where a second CESL 250 and a second interlayer dielectric (ILD) layer 252 are deposited on the second source feature 248S and the second drain feature 248D. Because operations at block 736 are similar to those at block 136, detailed descriptions thereof are omitted for brevity.

Referring to FIGS. 51 and 66A-C, method 700 includes a block 738 where the dummy gate stack 222 is removed and replaced by a common gate structure 254. Because operations at block 738 are similar to those at block 138, detailed descriptions thereof are omitted for brevity.

Referring to FIGS. 51 and 67A-C, method 700 includes a block 740 where interconnection features, such as a second source contact 262, a second drain contact 264, a second source contact via 266, a second drain contact via 268, a first drain contact via 270, and a top interconnect layer 272 are formed. Because operations at block 740 are similar to those at block 140, detailed descriptions thereof are omitted for brevity.

Figure 67A:
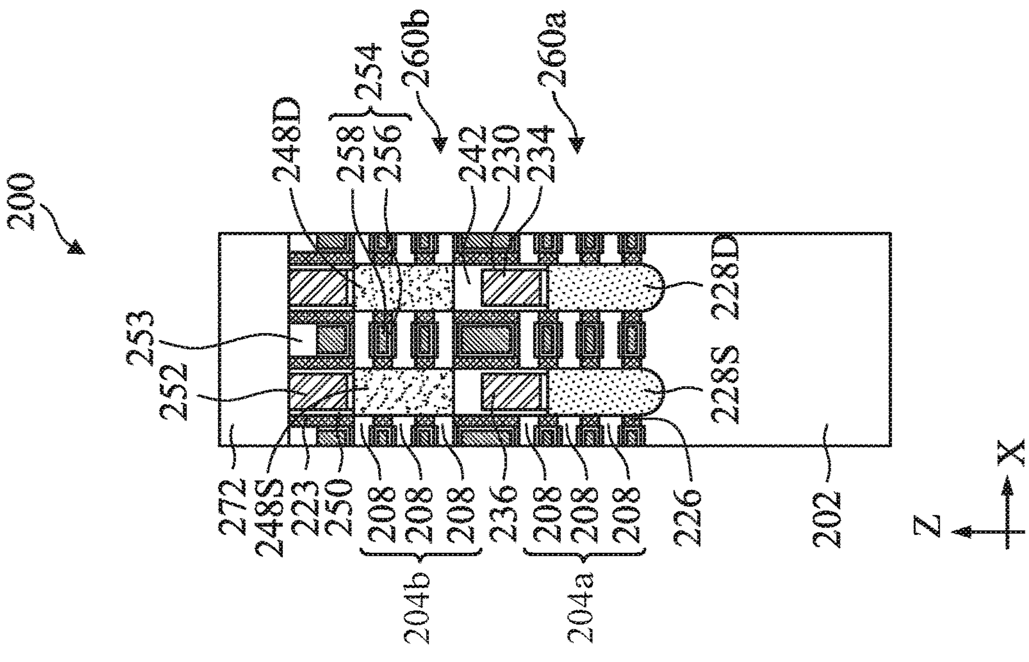
Figure 67B:
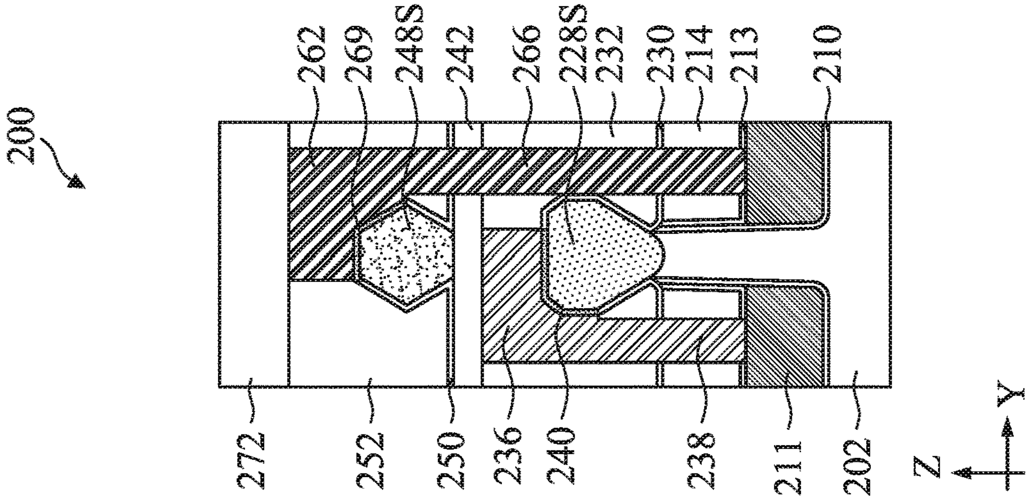
Figure 67C:
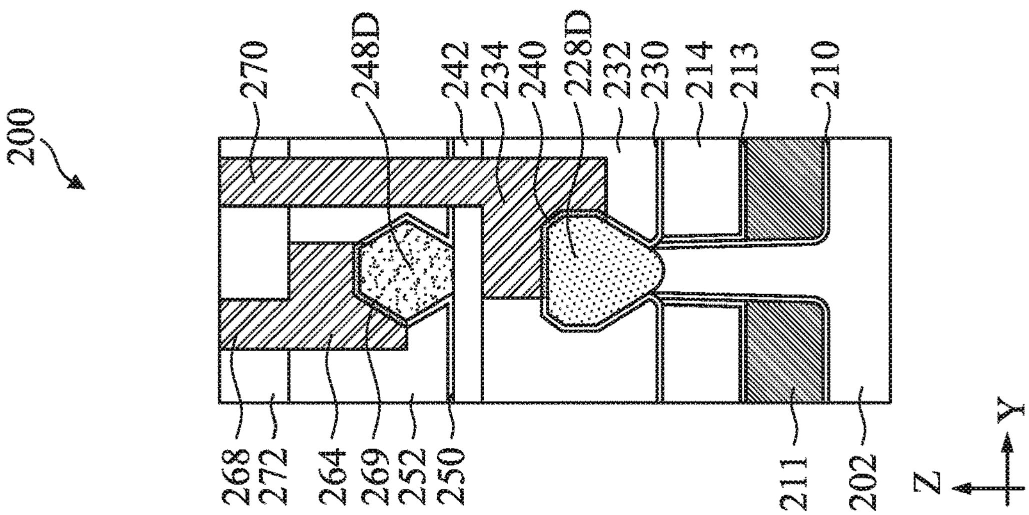

Reference is now made to FIGS. 67A-C. Upon conclusion of the operations in method 700, a bottom GAA transistor 260*a* and a top GAA transistor 260*b* stacked over the bottom GAA transistor 260*a* are formed. The top GAA transistor 260*b* includes channel layers (or referred to as channel members) sandwiched between the second source feature 248S and the second drain feature 248D. The bottom GAA transistor 260*a* includes a same number of channel layers as the top GAA transistor 260*b*. One difference is that not all channel layers of the bottom GAA transistor 260*a* are sandwiched between the first source feature 228S and the first drain feature 228D and function as active channel layers for carriers to flow through. At least a topmost channel layer is adjoined by the first CESL 230 and becomes a "floating" (inactive) channel layer. Accordingly, the bottom GAA transistor 260*a* has one less active channel layer than the top GAA transistor 260*b*. In various embodiments, two or more top channel layers of the bottom GAA transistor 260*a* may be adjoined by the first CESL 230, and thus the bottom GAA transistor 260*a* may have two or more active channel layers less than the top GAA transistor 260*b*. Less number of active channel layers weakens current driving capability of the bottom GAA transistor 260*a*, which however may balance the current output in the pair of stacked GAA transistors. For example, when the top GAA transistor is a pFET and the bottom GAA transistor is an nFET, an nFET often provides a stronger current driving capability due to higher carrier mobility. By reducing a total active channel layer number of the nFET, a balanced current output from the pair of nFET and pFET can be achieved.

A common gate structure 254 wraps around each channel layer of the top and bottom GAA transistors 260*a* and 260*b*, while the dielectric isolation layer 242 interposes the first source 228S and the second source 248S, and also interposes the first drain 228D and the second drain 248D. The first source feature 228S is coupled to a bottom power rail by way of the first source contact 236 and the first source contact via 238. The second source feature 248S is couple to the bottom power rail by way of the second source contact 262 and the second source contact via 266. The first source contact via 238 and the second source contact via 266 are disposed on two sides of the first contact 228S. The first drain feature 228D is coupled to a top power rail by way of the first drain contact 234 and the first drain contact via 270. The second drain feature 248D is coupled to the top power rail by way of the second drain contact 264 and the second drain contact via 268. The top power rail is disposed in the top interconnect layer 272.

Figure 68:
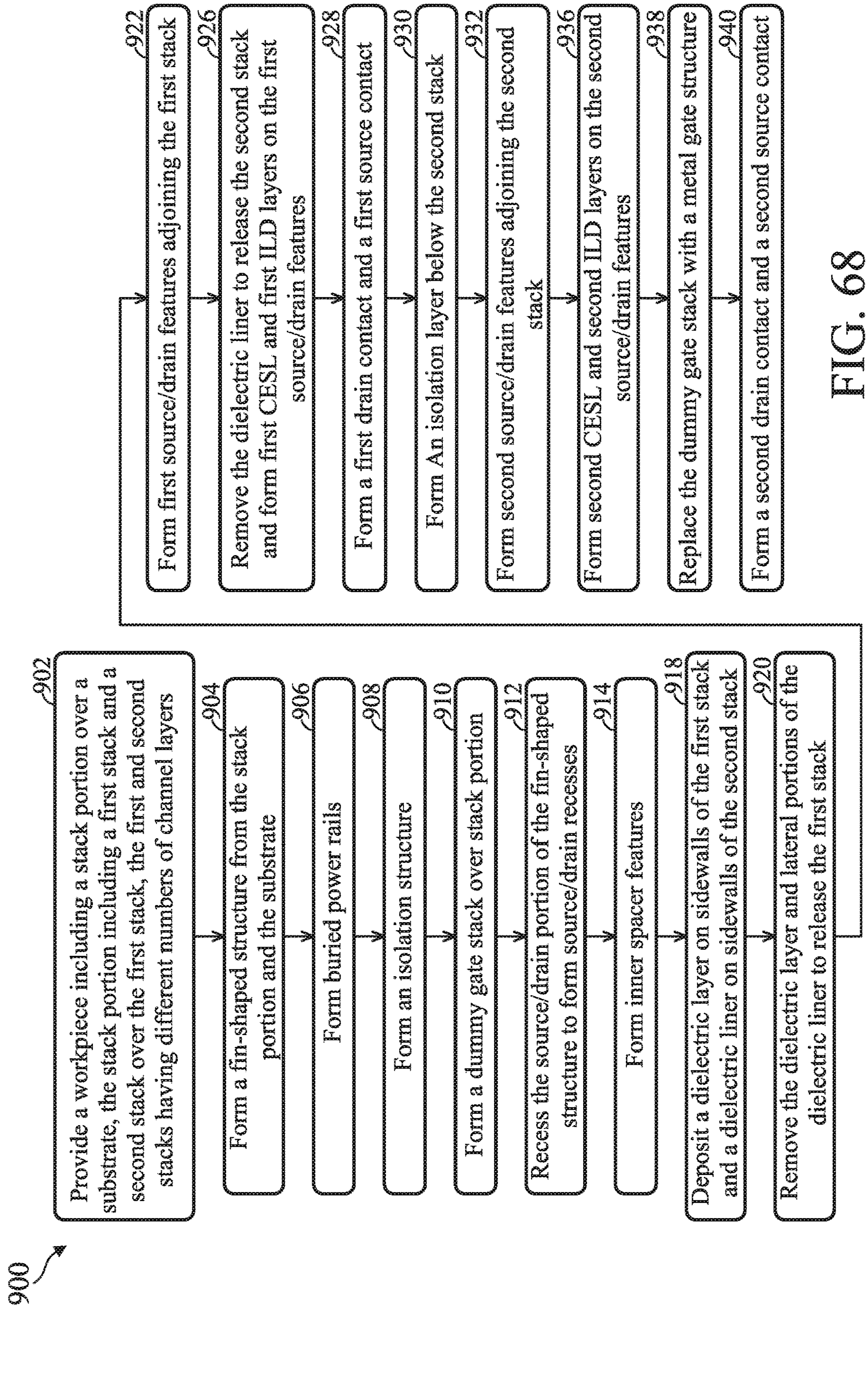
FIG. 68 illustrates a flow chart of a method for forming a semiconductor device having a backside power rail, according to one or more aspects of the present disclosure.
Figure 69A:
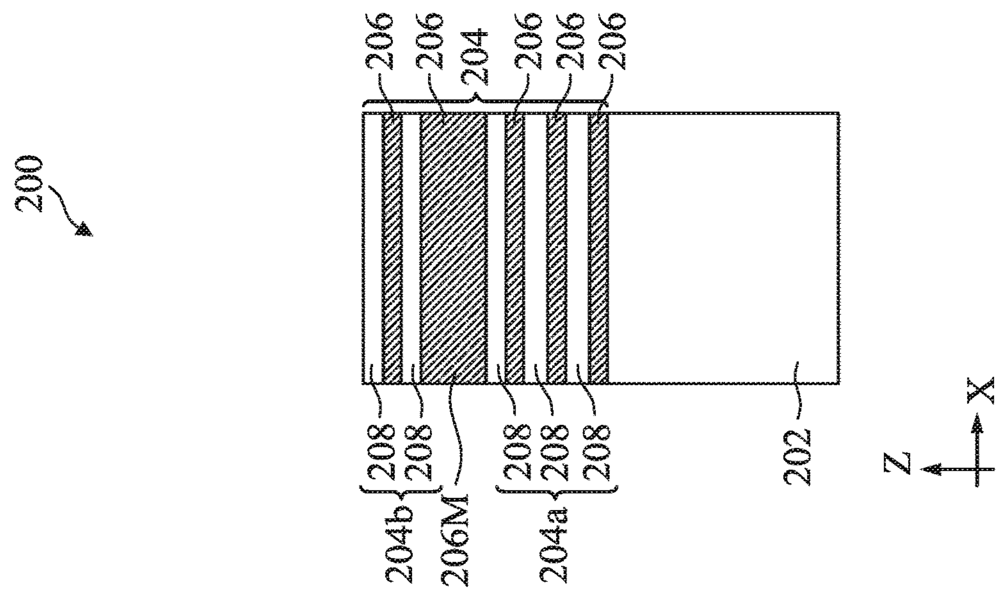
FIGS. 69A, 69B, 69C, 70A, 70B, 70C, 71A, 71B, 71C, 72A, 72B, 72C, 73A, 73B, 73C, 74A, 74B, 74C, 75A, 75B, 75C, 76A, 76B, 76C, 77A, 77B, 77C, 78A, 78B, 78C, 79A, 79B, 79C, 80A, 80B, 80C, 81A, 81B, 81C, 82A, 82B, 82C, 83A, 83B, 83C, 84A, 84B, and 84C illustrate fragmentary cross-sectional views of a workpiece during a fabrication process according to the method of FIG. 68, according to one or more aspects of the present disclosure.
Figure 69B:
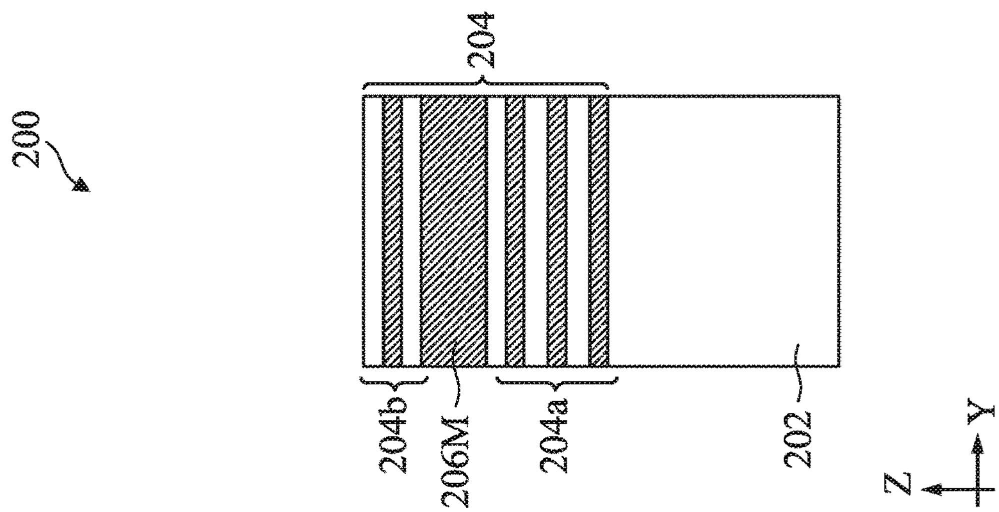
Figure 69C:
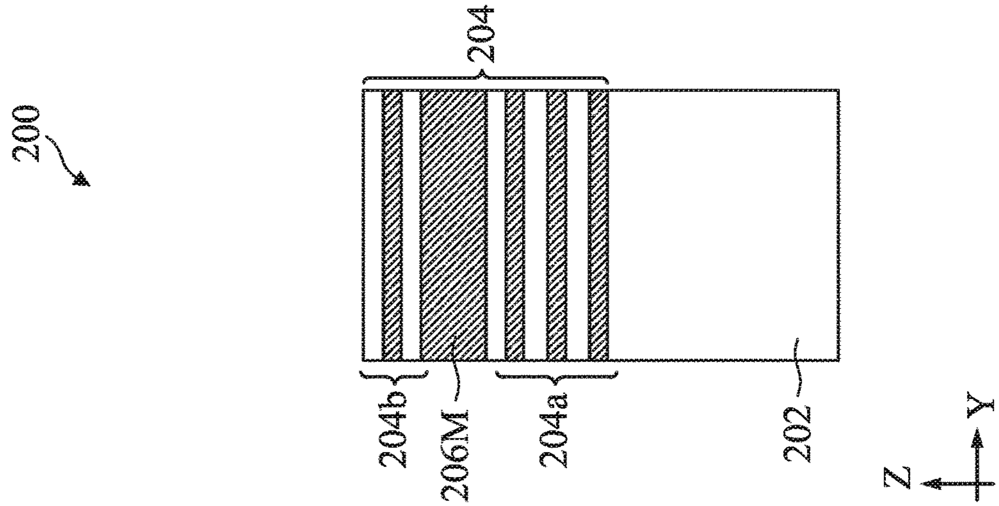
Figure 70C:
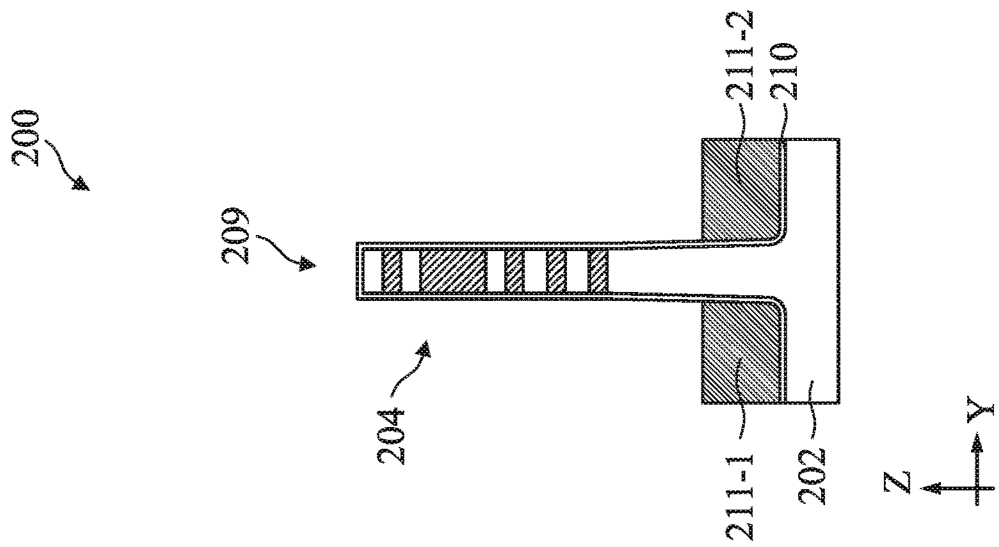
Figure 70B:
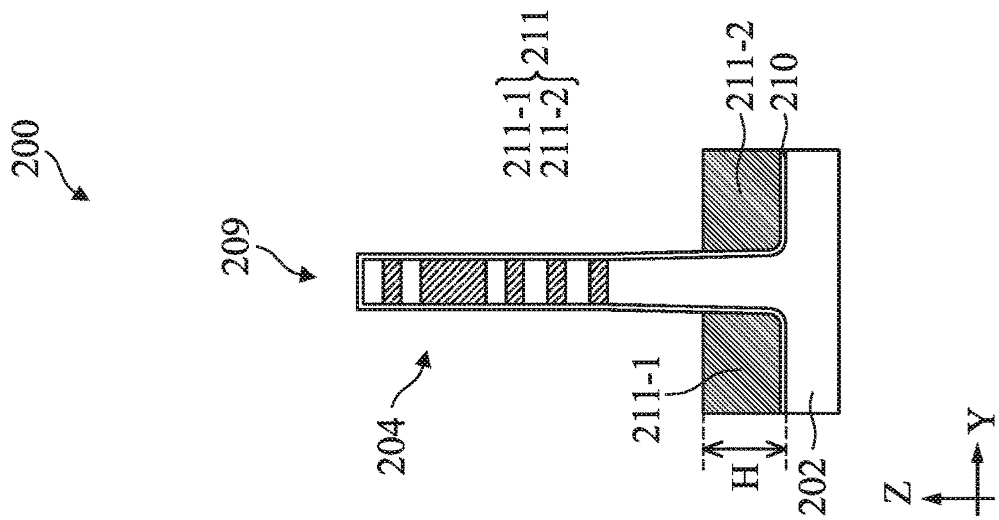
Figure 70A:
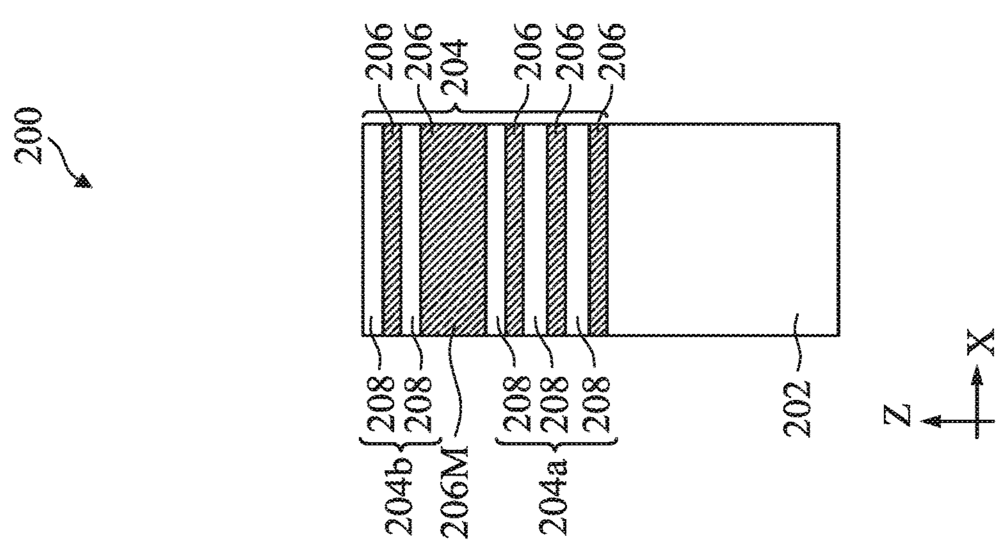
Figure 71C:
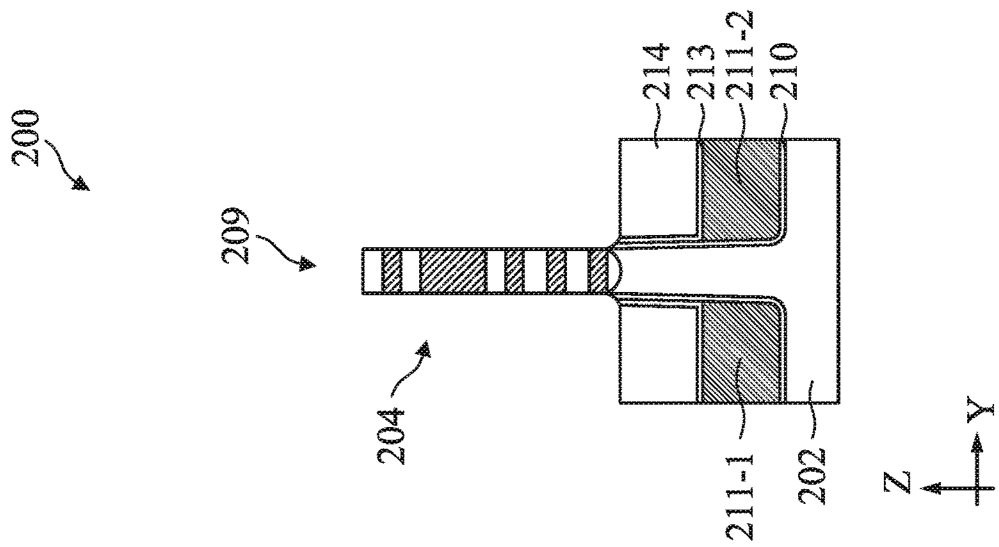
Figure 71B:
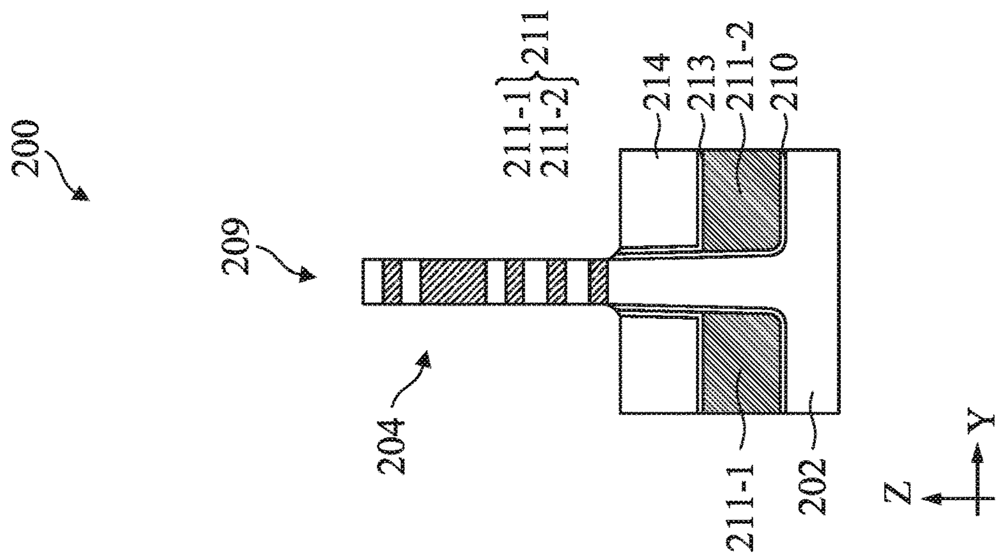
Figure 71A:
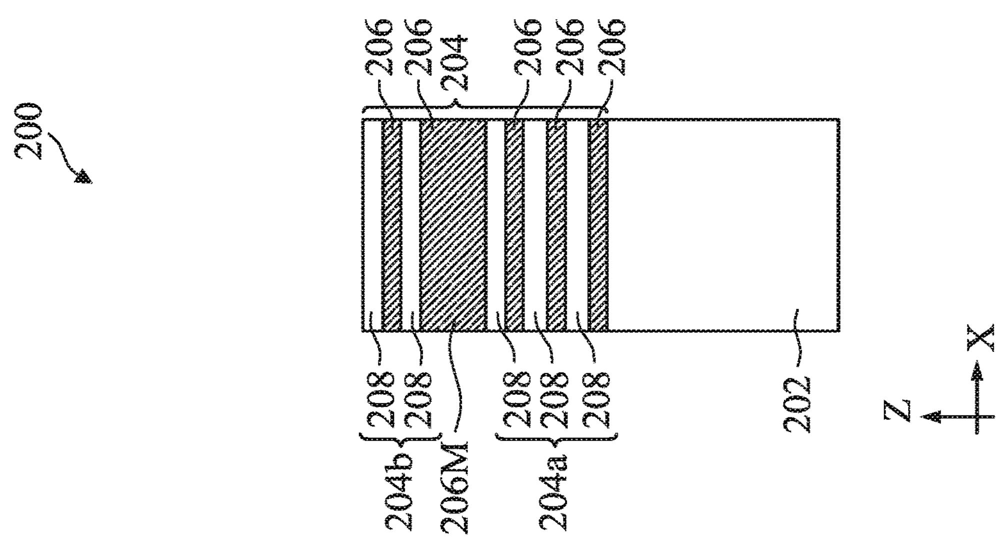
Figure 72C:
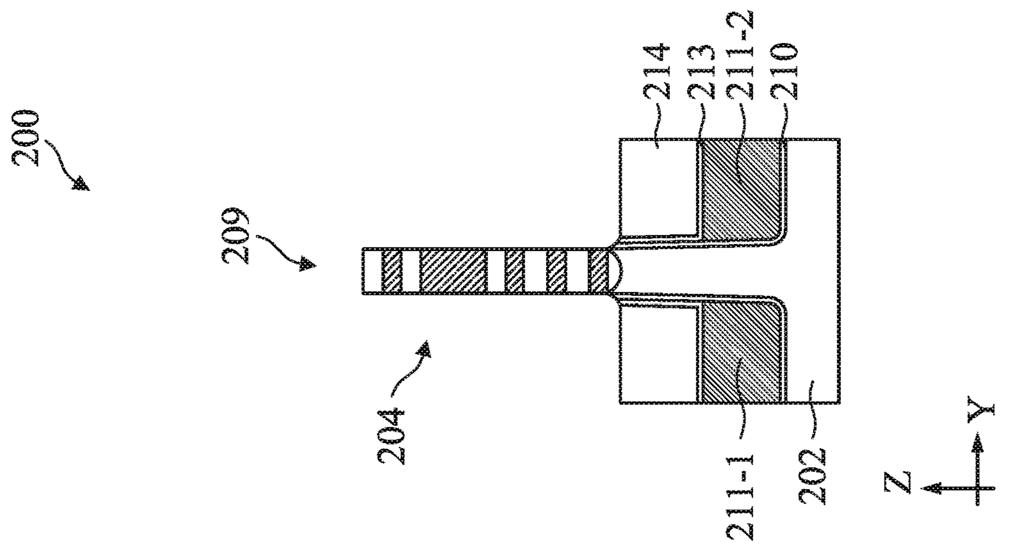
Figure 72B:
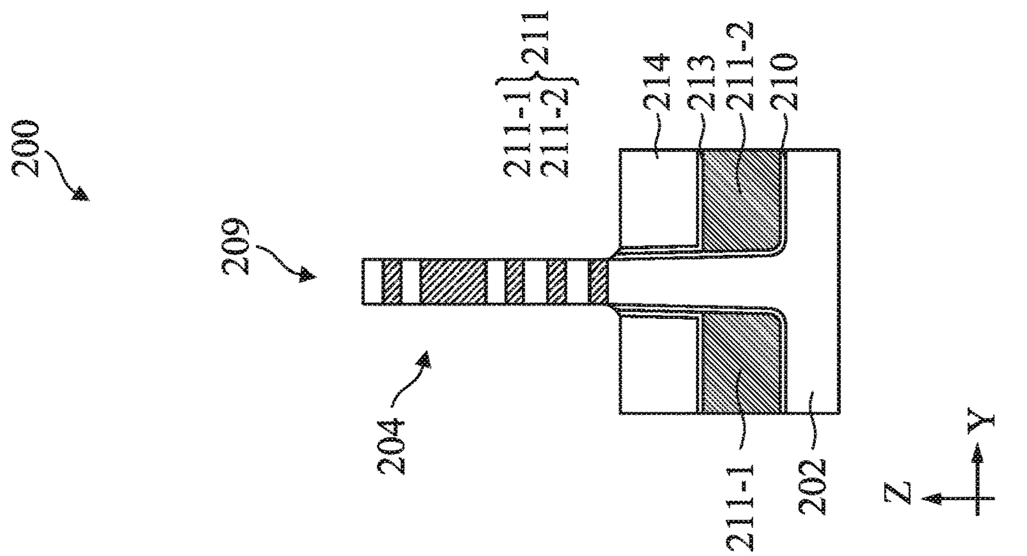
Figure 72A:
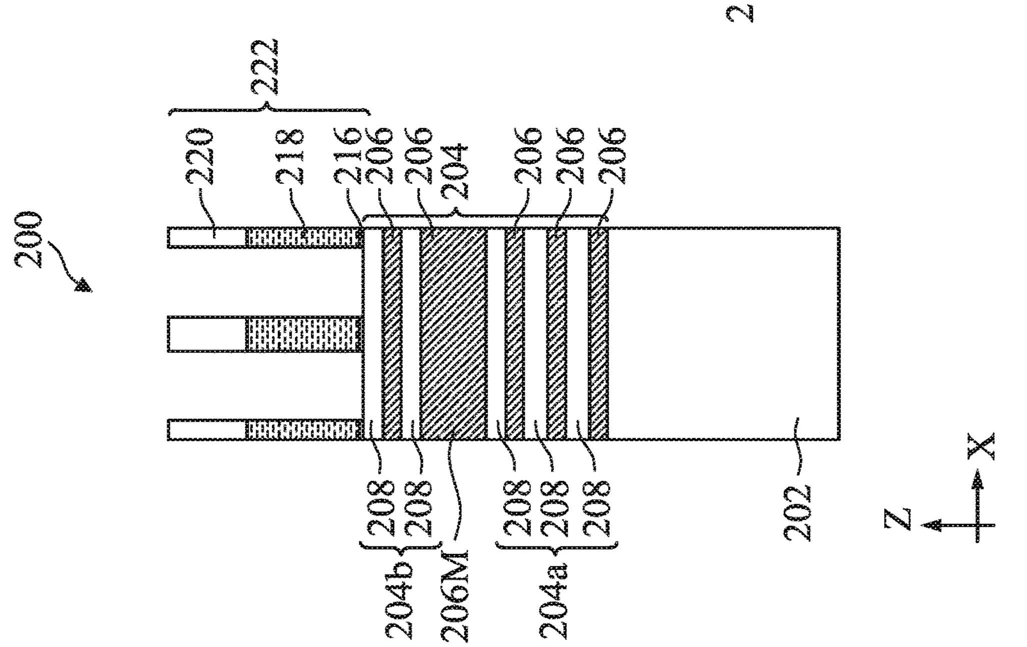
Figure 73C:
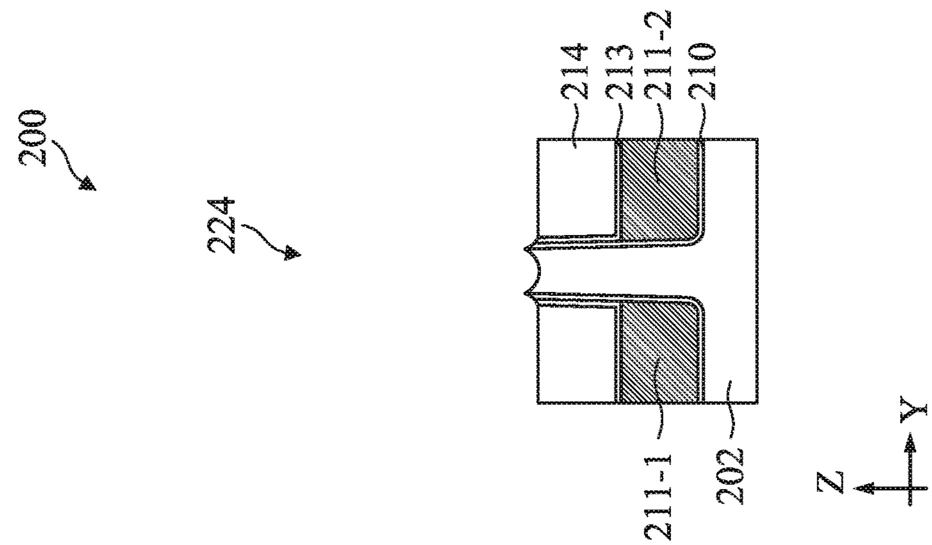
Figure 73B:
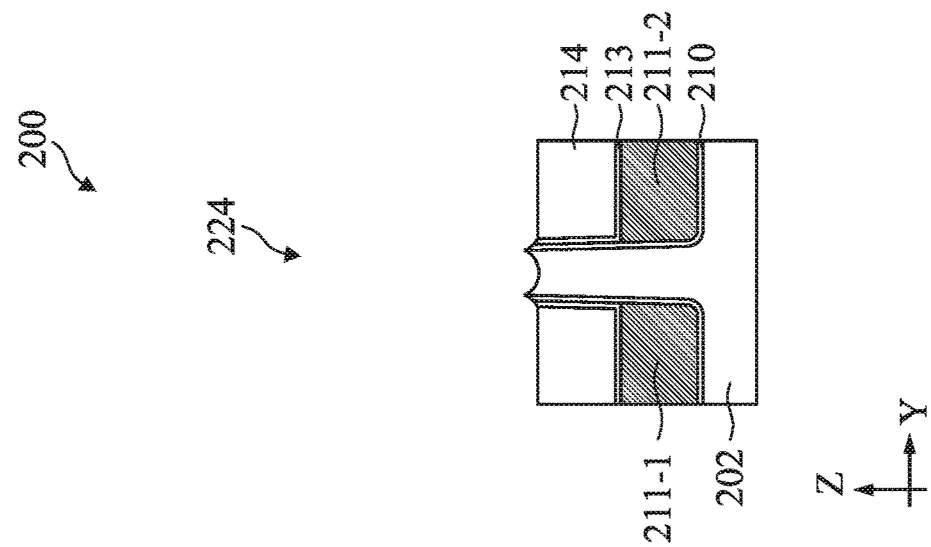
Figure 73A:
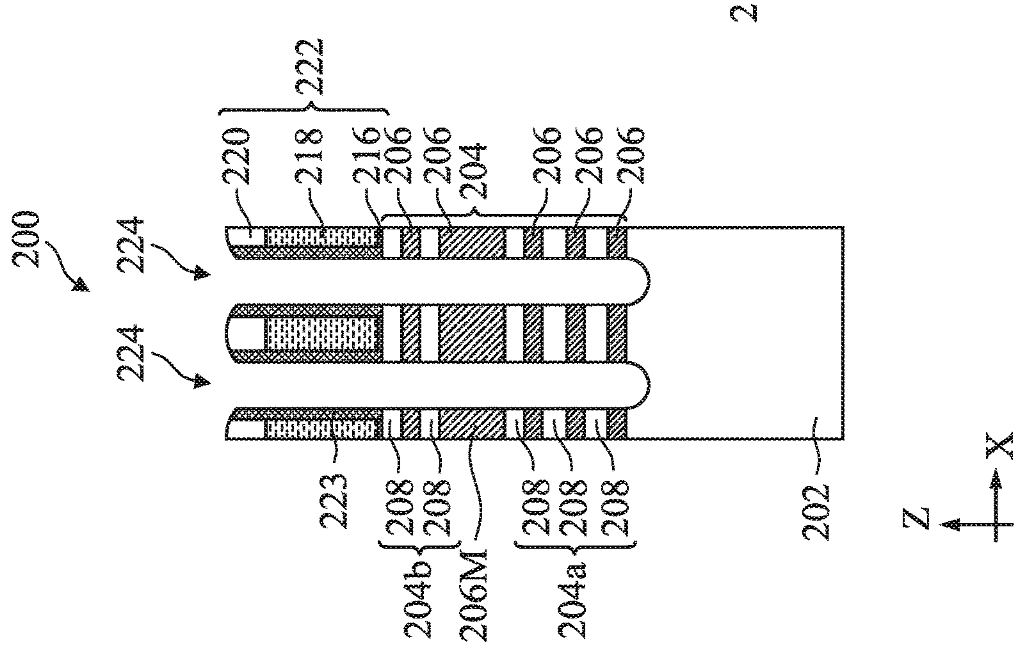
Figure 74C:
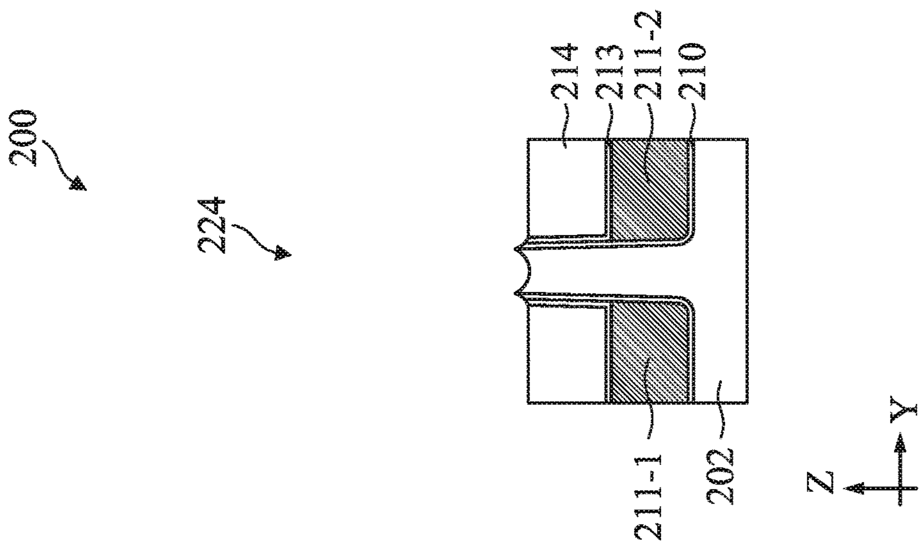
Figure 74B:
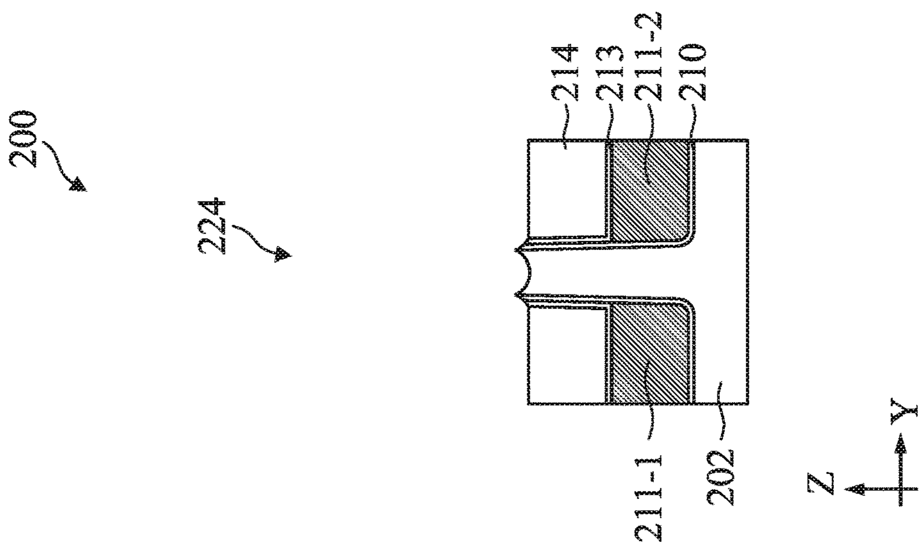
Figure 74A:
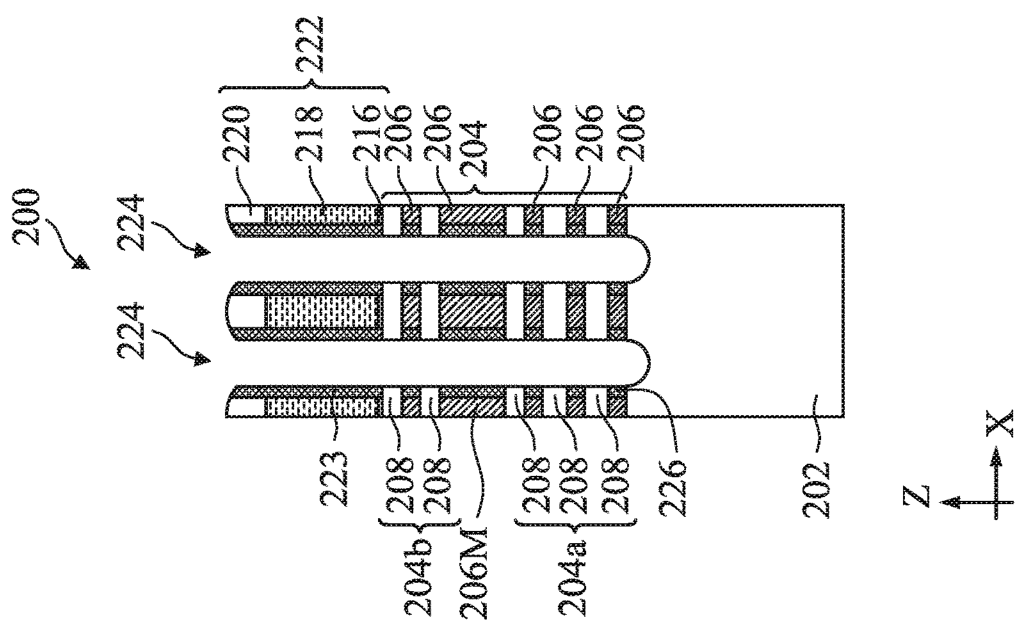
Figure 75C:
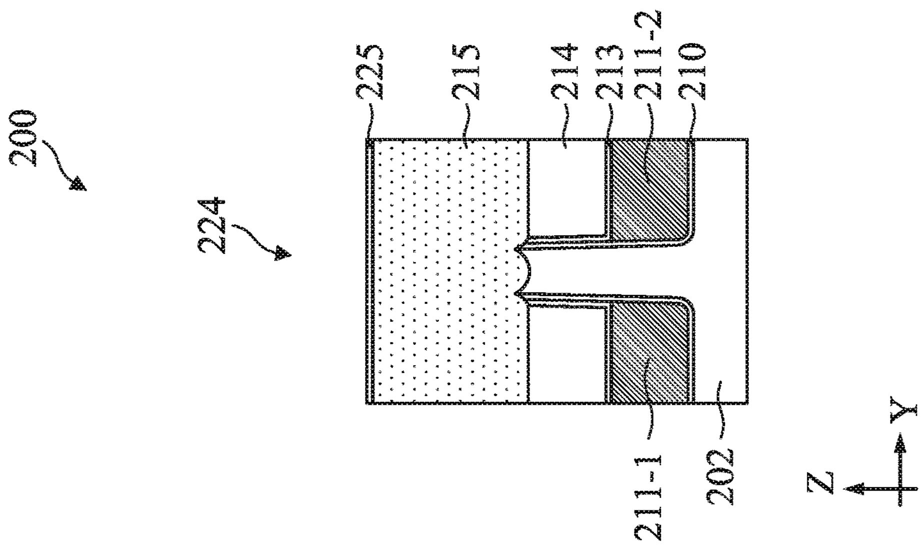
Figure 75B:
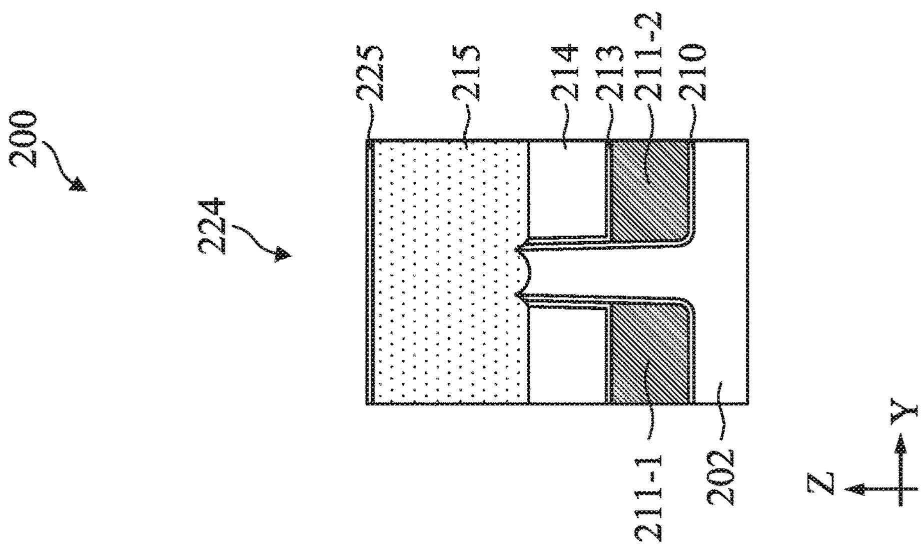
Figure 75A:
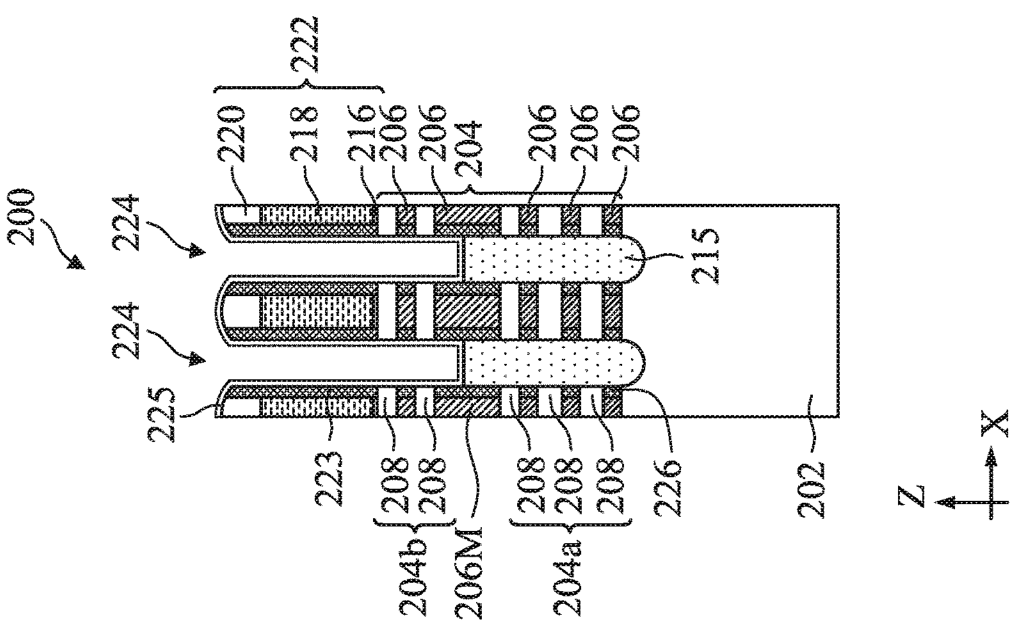
Figure 76C:
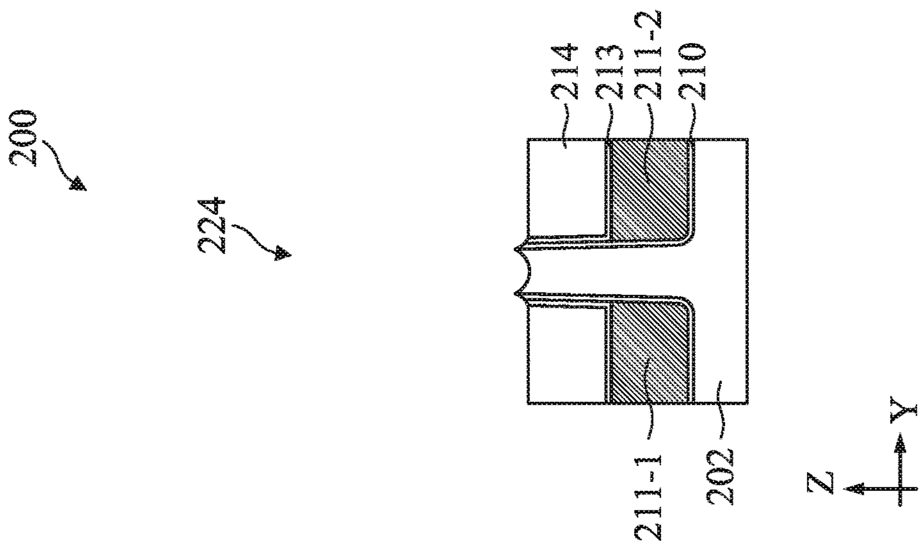
Figure 76B:
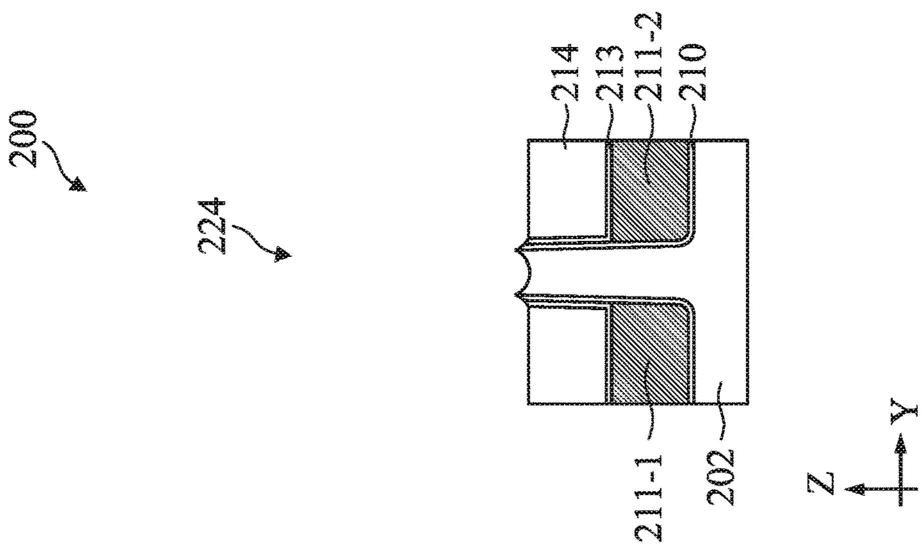
Figure 76A:
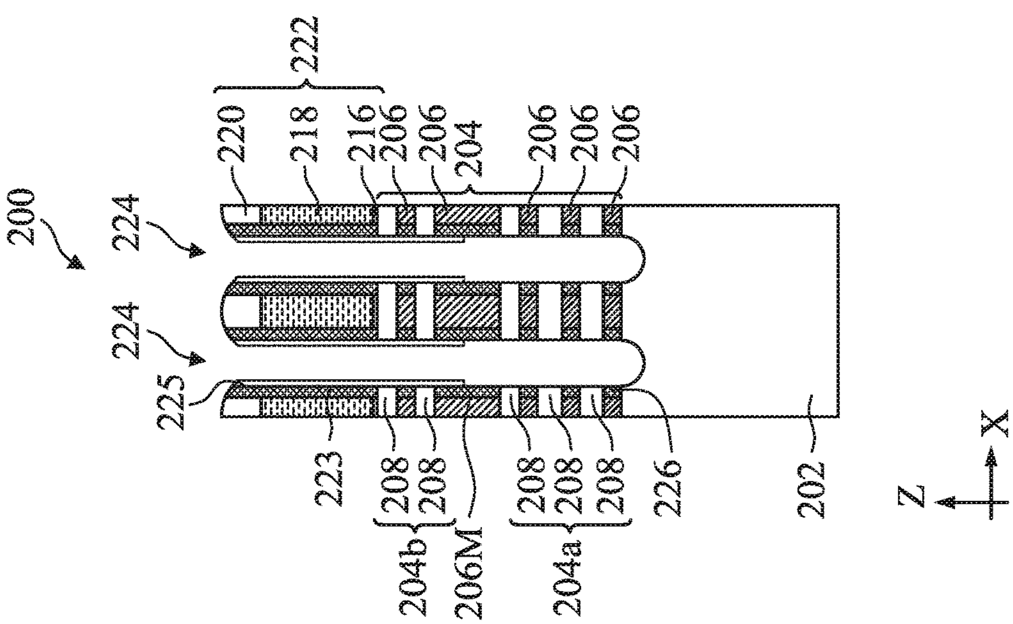
Figure 77C:
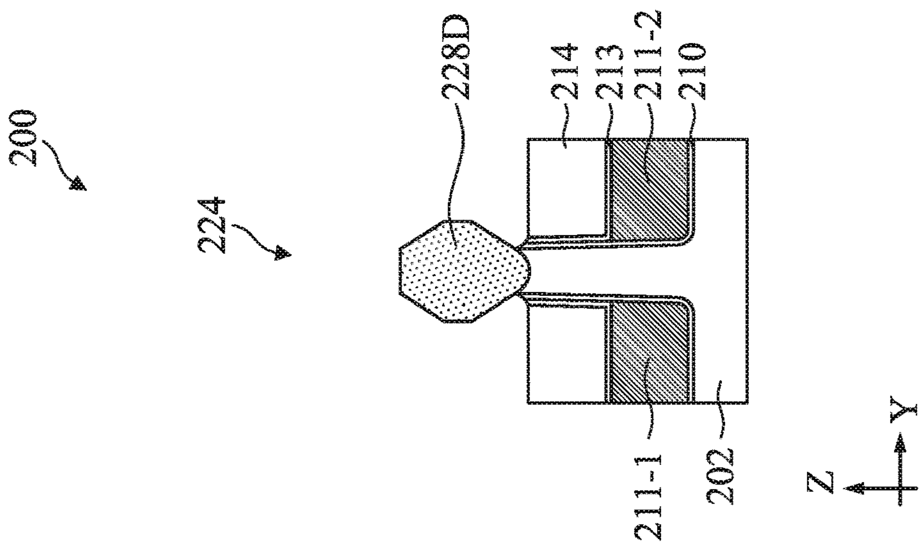
Figure 77B:
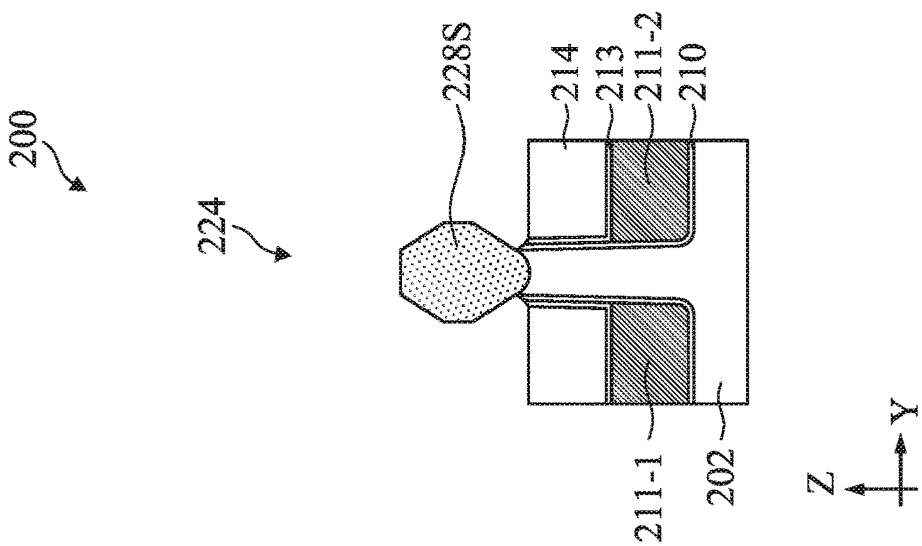
Figure 77A:
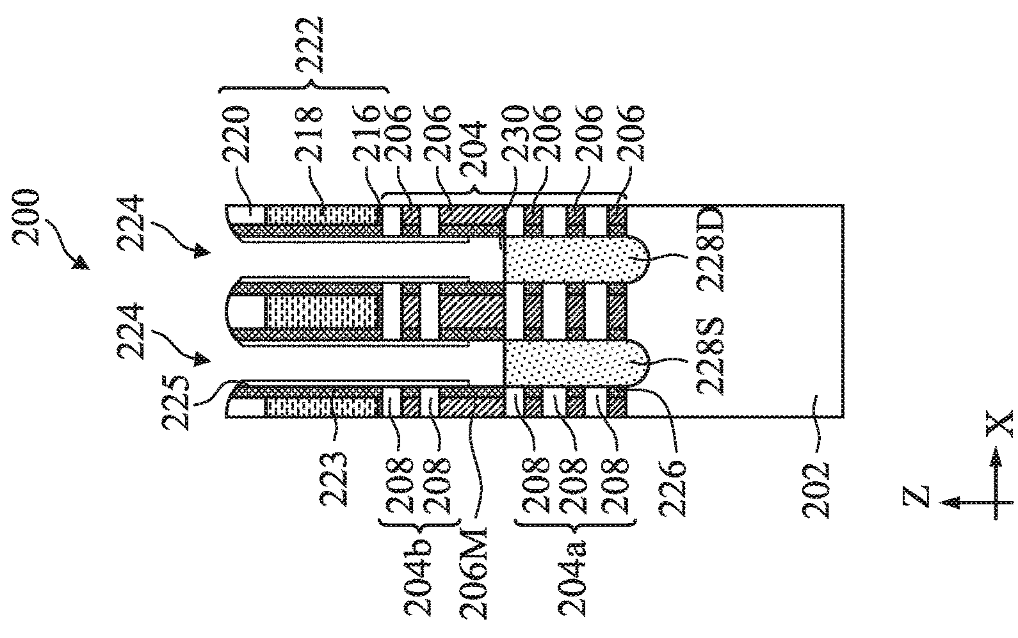
Figure 78A:
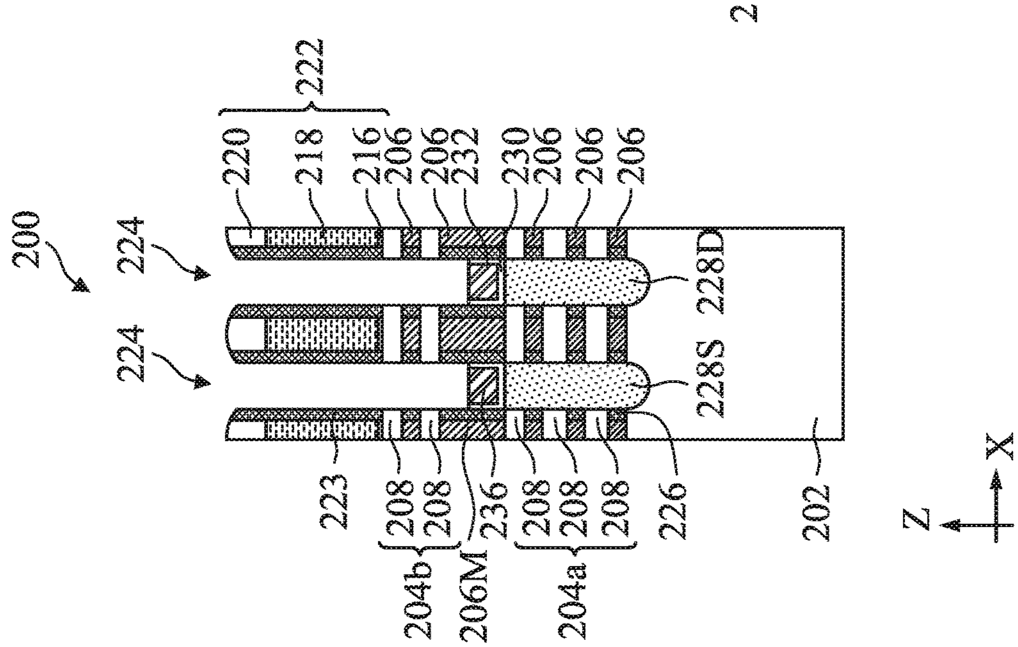
Figure 78B:
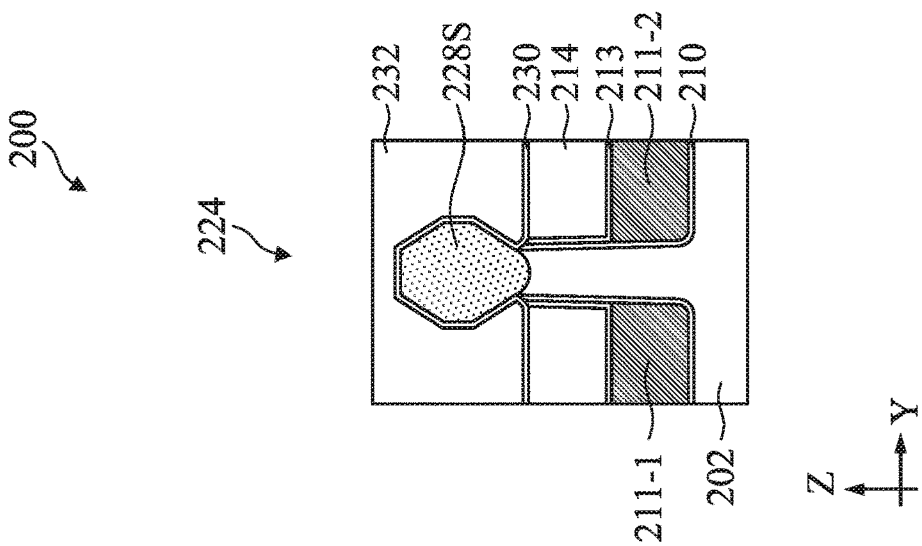
Figure 78C:
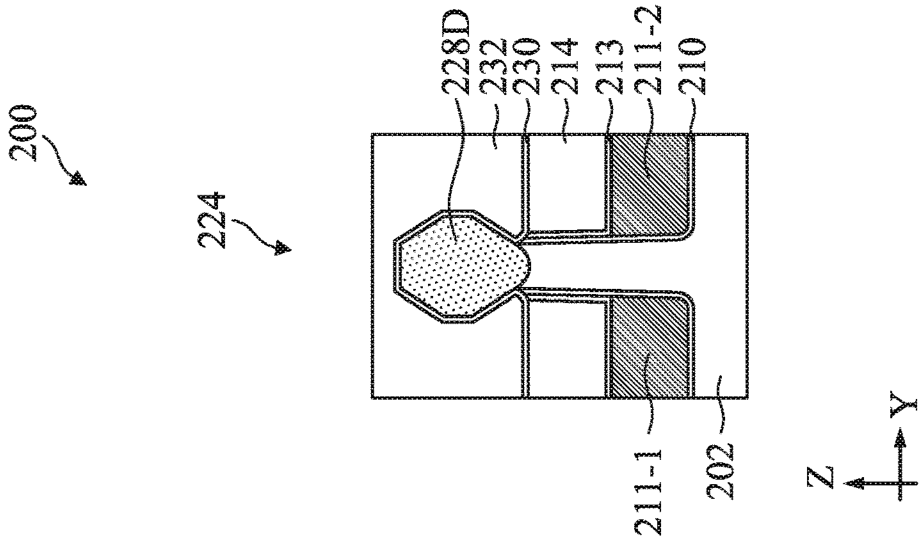

Attention is now turned to method 900. FIG. 68 illustrates a flow chart of method 900, according to various aspects of the present disclosure. Throughout the present disclosure, similar reference numerals denote similar features in terms composition and formation. Some details of operations in method 900 may be simplified or omitted if similar details have been described in conjunction with method 100.

Referring to FIGS. 68 and 69A-C, method 900 includes a block 902 where a workpiece 200 is provided. The workpiece 200 includes a substrate portion (also referred to as substrate) 202 and a stack portion 204 over the substrate 202. The stack portion 204 includes a first stack 204*a* and a second stack 204*b* over the first stack 204*a*, where the first stack 204*a* has one or more channel layers 208 than the second stack 204*b*. Because material compositions of the substrate 202 and the stack portion 204 have been described above, detailed descriptions thereof are omitted here.

Referring to FIGS. 68 and 70A-C, method 900 includes a block 904 where a fin-shaped structure 209 is formed from the stack portion 204. Because operations at block 904 are similar to those at block 104, detailed descriptions thereof are omitted for brevity.

Still referring to FIGS. 68 and 70A-C, method 900 includes a block 906 where buried power rails 211 are formed. Because operations at block 906 are similar to those at block 106, detailed descriptions thereof are omitted for brevity.

Referring to FIGS. 68 and 71A-C, method 900 includes a block 908 where an isolation feature 214 is formed. Because operations at block 908 are similar to those at block 108, detailed descriptions thereof are omitted for brevity.

Referring to FIGS. 68 and 72A-C, method 900 includes a block 910 where a dummy gate stack 222 is formed over the stack portion 204. Because operations at block 910 are similar to those at block 110, detailed descriptions thereof are omitted for brevity.

Referring to FIGS. 68 and 73A-C, method 900 includes a block 912 where source/drain portions of the fin-shaped structure 209 are recessed to form source/drain recesses 224. Because operations at block 912 are similar to those at block 112, detailed descriptions thereof are omitted for brevity.

Referring to FIGS. 68 and 74A-C, method 900 includes a block 914 where inner spacer features 226 are formed. Because operations at block 914 are similar to those at block 114, detailed descriptions thereof are omitted for brevity.

Referring to FIGS. 68 and 75A-C, method 900 includes a block 918 where a sacrificial dielectric layer 215 is deposited in the source/drain trenches 224 to cover the sidewalls of the channel layer 208 in the first stack 204*a* and a third liner 225 is conformally deposited over the workpiece 200 to cover the sidewalls of the channel layer 208 in the second stack 204*b*. Because operations at block 918 are similar to those at block 118, detailed descriptions thereof are omitted for brevity.

Referring to FIGS. 68 and 76A-C, method 900 includes a block 920 where a lateral portion of the third liner 225 is removed to expose the sacrificial dielectric layer 215 and the sacrificial dielectric layer 215 is subsequently removed in a selective etch process to release the first stack 204*a*. Because operations at block 920 are similar to those at block 120, detailed descriptions thereof are omitted for brevity.

Referring to FIGS. 68 and 77A-C, method 900 includes a block 922 where first source feature 228S and a first drain feature 228D are formed in the source/drain trenches 224 adjoining the channel layers 208 of the first stack 204*a*. Since the channel layers 208 in the second stack 204*b* are covered by the third liner 225, epitaxial growth won't take place from the sidewalls thereof. Because operations at block 922 are similar to those at block 122, detailed descriptions thereof are omitted for brevity.

Referring to FIGS. 68 and 78A-C, method 900 includes a block 926 where the third liner 225 is removed to release the second stack 204*b* and a first CESL 230 and a first ILD layer 232 are deposited on the first source feature 228S and the first drain feature 228D. Because operations at block 926 are similar to those at block 126, detailed descriptions thereof are omitted for brevity.

Referring to FIGS. 68 and 79A-C, method 900 includes a block 928 where interconnection features, such as a first drain contact 234, a first source contact 236, a first source contact via 238 are formed. Because operations at block 928 are similar to those at block 128, detailed descriptions thereof are omitted for brevity.

Figure 79A:
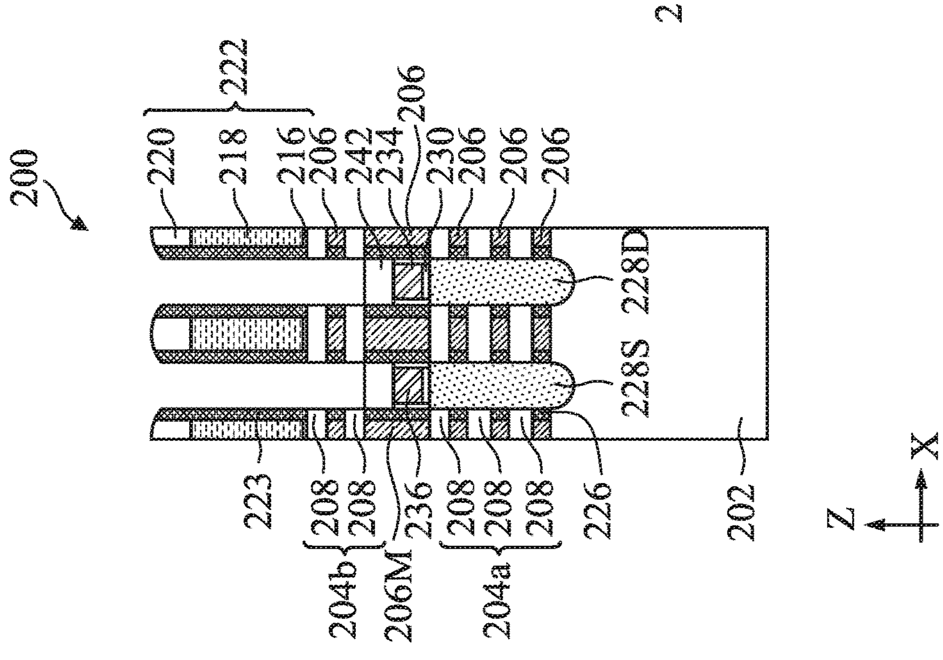
Figure 79B:
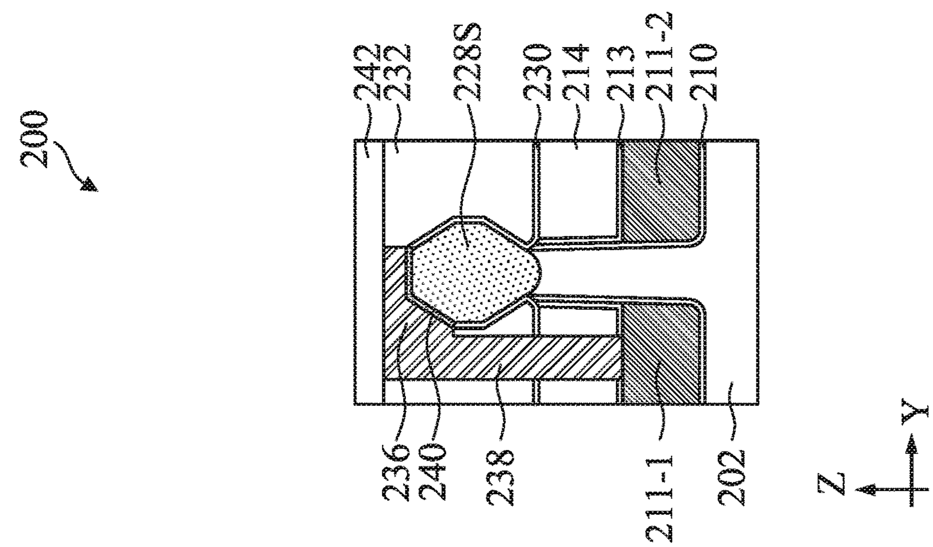
Figure 79C:
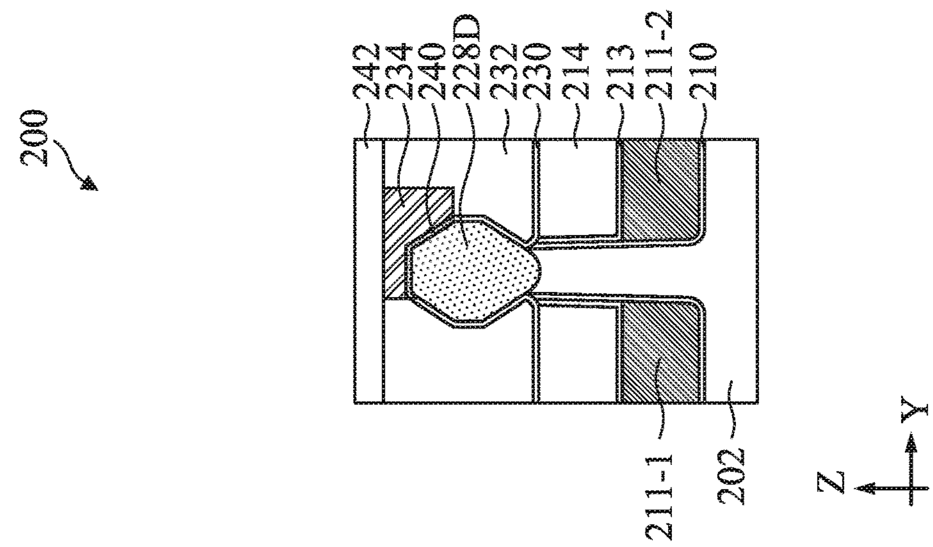

Still referring to FIGS. 68 and 79A-C, method 900 includes a block 930 where a dielectric isolation layer 242 is deposited over the first ILD layer 232 and covering interconnection features formed in earlier operations at block 928. The dielectric isolation layer 242 may include silicon nitride, silicon oxide, silicon oxynitride, hafnium oxide, aluminum oxide, zirconium oxide, or other suitable isolation material. In an embodiment, the dielectric isolation layer 242 may be formed by filling the source/drain trenches 224 with dielectric isolation material (e.g., by using a CVD process or a spin-on glass process), and etching back the dielectric isolation material in a selective etching process. As shown in FIG. 79A, the dielectric isolation layer 242 covers the inner spacer features 226 that are on sidewalls of the middle sacrificial layer 206M but not on sidewalls of the bottom channel layer 208 of the second stack 204*b*. State differently, the sidewalls of the bottom channel layers 208 of the second stack 204*b* remain exposed in the source/drain trenches 224.

Referring to FIGS. 68 and 80A-C, method 900 includes a block 932 where a second source feature 248S and a second drain feature 248D are formed in the source/drain trenches 224. The second source feature 248S and the second drain feature 248D may be formed using an epitaxial process, such as VPE, UHV-CVD, MBE, and/or other suitable processes.

Figures 80A, 80B, 80C:
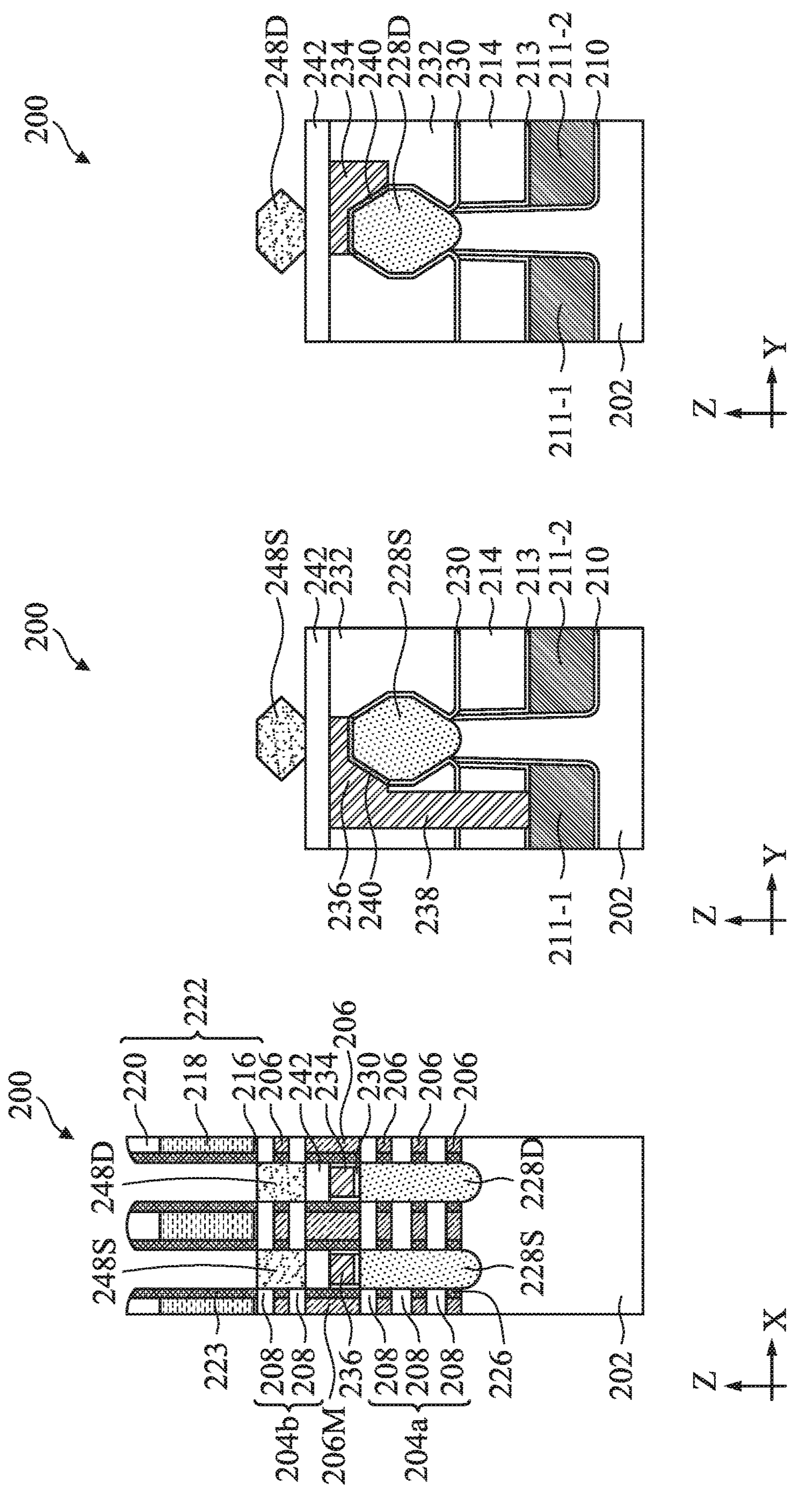
Figure 81A:
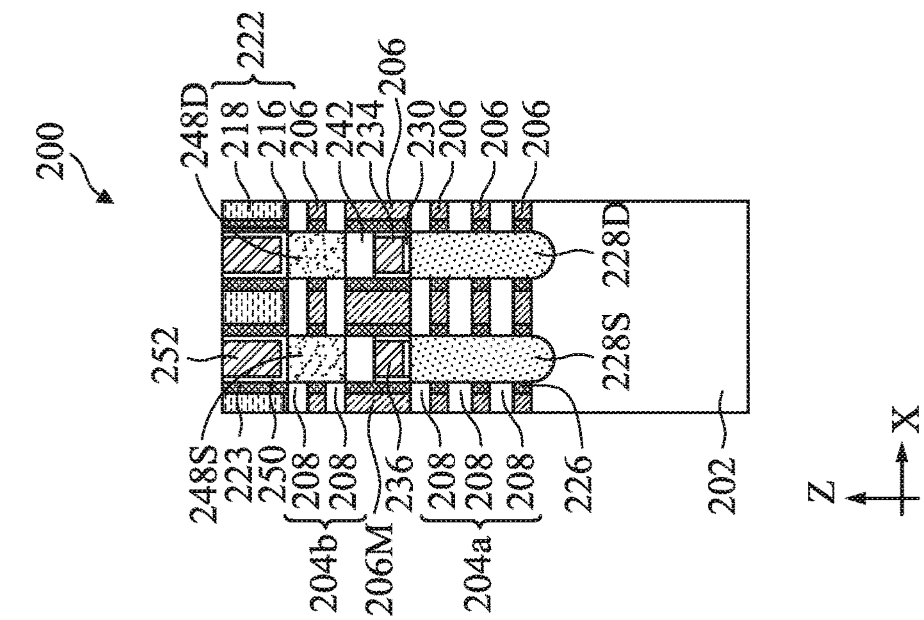
Figure 81B:
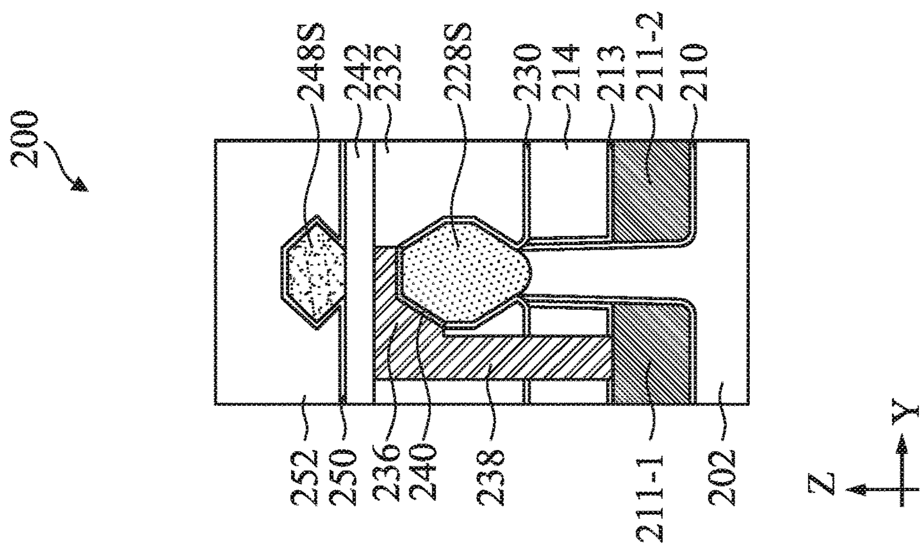
Figure 81C:
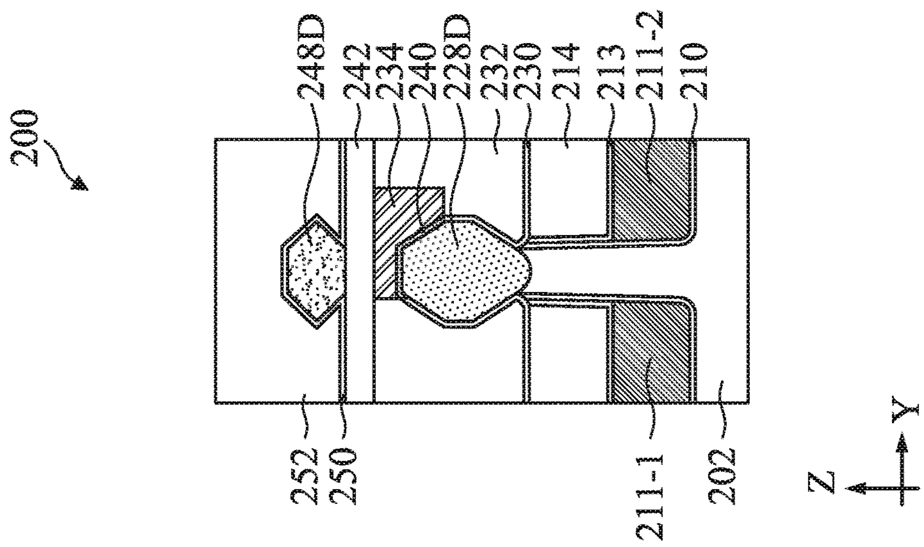
Figures 82A, 82B, 82C:
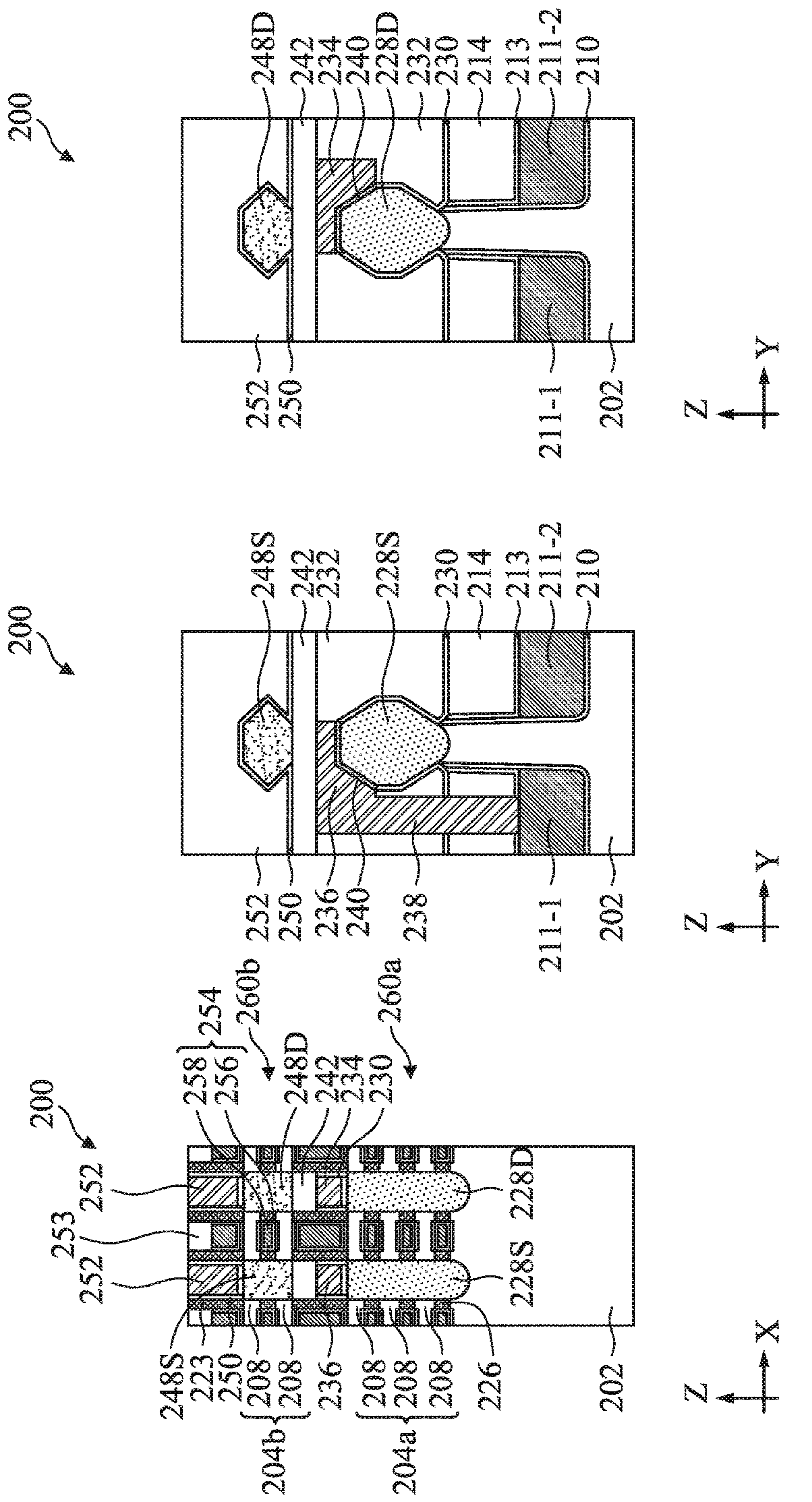

The epitaxial growth process may use gaseous and/or liquid precursors, which interact with the channel layers 208. The exposed sidewalls of the channel layers 208 of the second stack 204*b* functionally serve as semiconductor seed layers. Since there are no channel layers 208 adjoined to the dielectric isolation layer 242, the epitaxial growth of the second source feature 248S and the second drain feature 248D may take place from the exposed sidewalls of all the channel layers 208 of the second stack 204*b*. As illustrated in FIG. 80A, the second source feature 248S and the second drain feature 248D are therefore in physical contact with (or adjoining) each channel layers 208 in the second stack 204*b*. Because the material compositions of the second source feature 248S and the second drain feature 248D have been described above, detailed descriptions thereof are omitted here.

Referring to FIGS. 68 and 81A-C, method 900 includes a block 936 where a second CESL 250 and a second interlayer dielectric (ILD) layer 252 are deposited on the second source feature 248S and the second drain feature 248D. Because operations at block 936 are similar to those at block 136, detailed descriptions thereof are omitted for brevity.

Referring to FIGS. 68 and 82A-C, method 900 includes a block 938 where the dummy gate stack 222 is removed and replaced by a common gate structure 254. Because operations at block 938 are similar to those at block 138, detailed descriptions thereof are omitted for brevity.

Referring to FIGS. 68 and 83A-C, method 900 includes a block 940 where interconnection features, such as a second source contact 262, a second drain contact 264, a second source contact via 266, a second drain contact via 268, a first drain contact via 270, and a top interconnect layer 272 are formed. Because operations at block 940 are similar to those at block 140, detailed descriptions thereof are omitted for brevity.

Figure 83C:
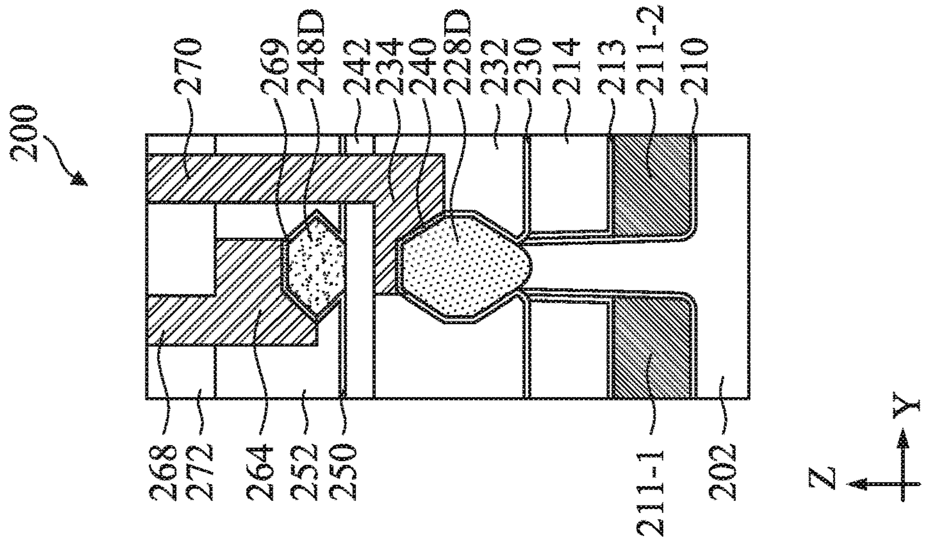
Figure 83B:
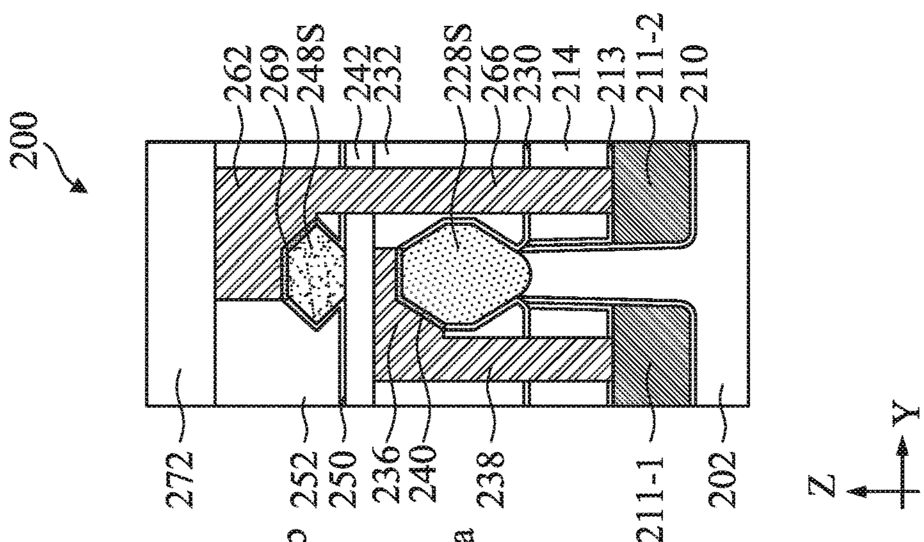
Figure 83A:
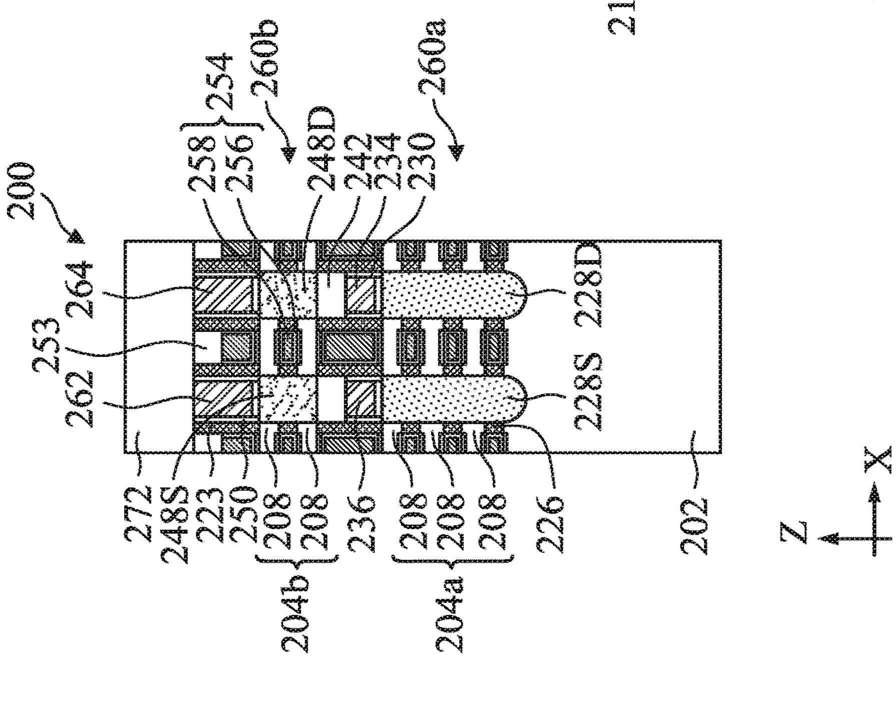
Figure 84C:
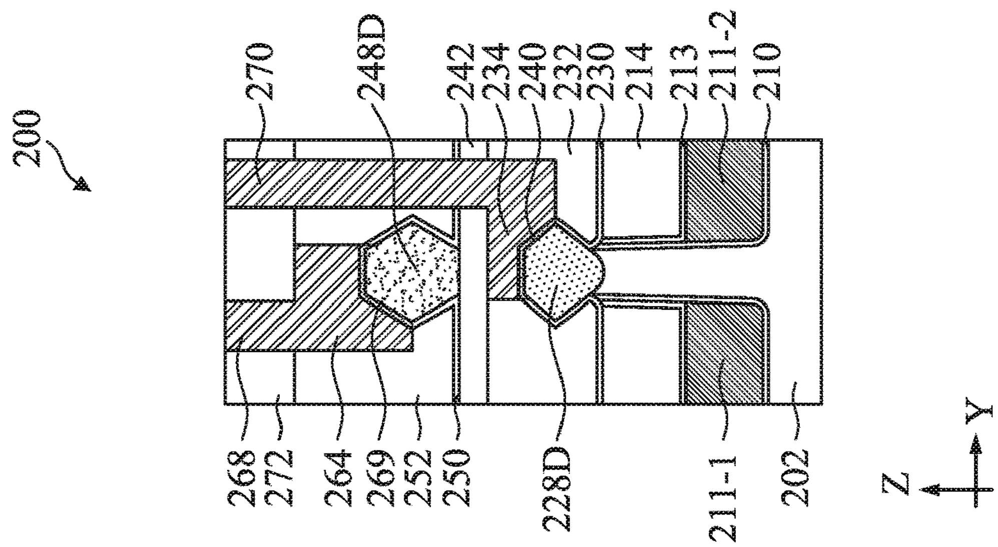
Figure 84B:
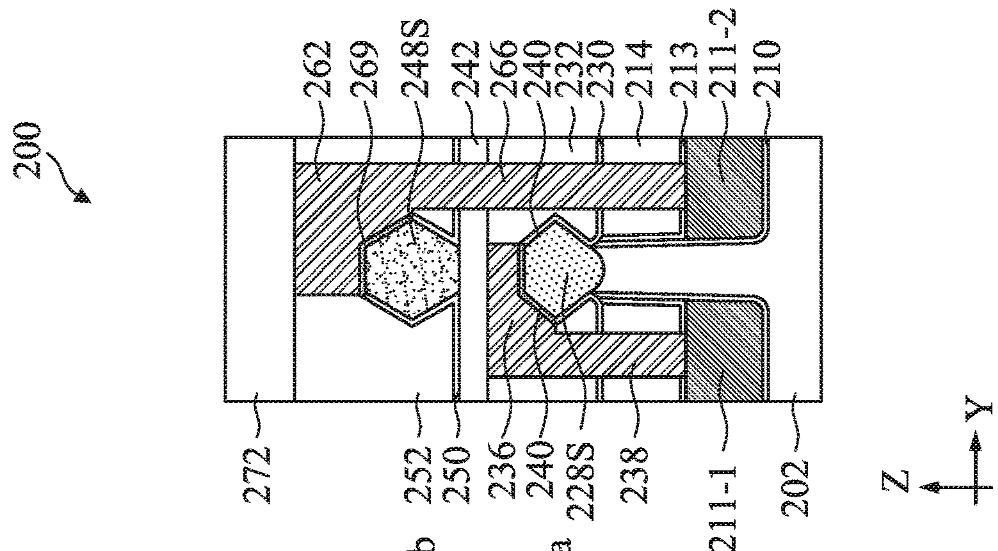
Figure 84A:
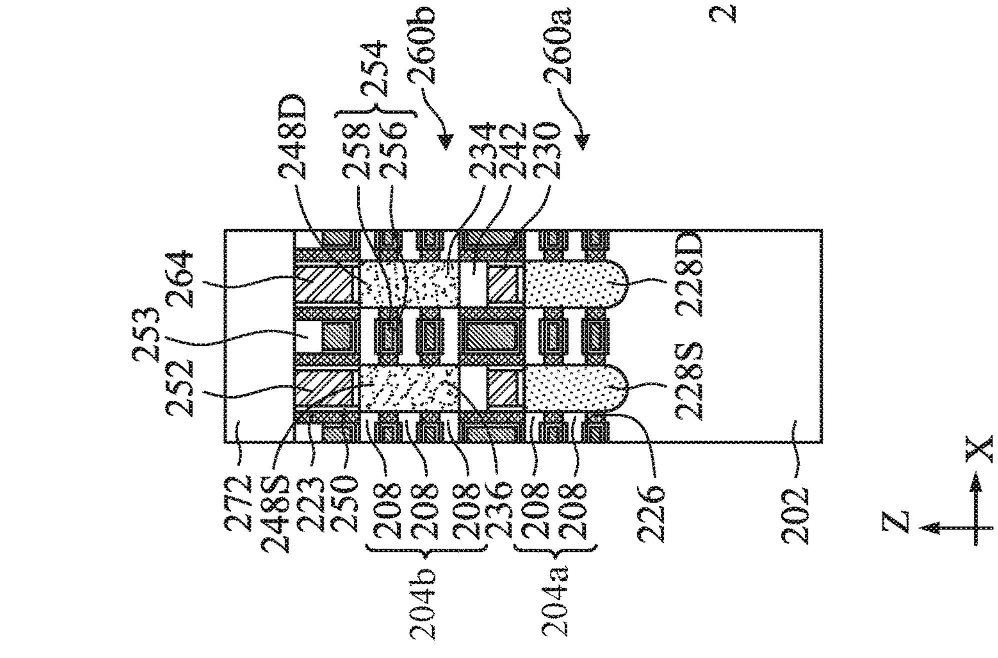

Reference is now made to FIGS. 83A-C. Upon conclusion of the operations in method 900, a bottom GAA transistor 260*a* and a top GAA transistor 260*b* stacked over the bottom GAA transistor 260*a* are formed. The top GAA transistor 260*b* includes channel layers (or referred to as channel members) sandwiched between the second source feature 248S and the second drain feature 248D. The bottom GAA transistor 260*a* includes channel layers sandwiched between the first source feature 228S and the first drain feature 228D. Each channel layer 208 in the first stack 204*a* and the second stack 204*b* is an active channel layer. One difference is that since the first stack 204*a* has at least one more channel layer 208 than the second stack 204*b*, the bottom GAA transistor 260*a* has at least one more channel layer 208 than the top GAA transistor 260*b*. Accordingly, the bottom GAA transistor 260*a* has at least one more active channel layer than the top GAA transistor 260*b*. In various embodiments, the bottom GAA transistor 260*a* may have two or more active channel layers than the top GAA transistor 260*b*. Alternatively, if method 900 at block 902 starts with a second stack 204*b* that has at least one more channel layer 208 than the first stack 204*b*, upon conclusion of the operations in method 900, the top GAA transistor 260*b* would thus have at least one more active channel layer than the bottom GAA transistor 260*a*. Such alternative embodiment of method 900 is illustrated in FIGS. 84A-C. In furtherance of the alternative embodiment, the top GAA transistor 260*b* may have two or more active channel layers than the bottom GAA transistor 260*a*.

In both embodiments illustrated in FIGS. 83A-C and 84A-C, a common gate structure 254 wraps around each channel layer of the top and bottom GAA transistors 260*a* and 260*b*, while the second dielectric isolation layer 242 interposes the first source 228S and the second source 248S, and also interposes the first drain 228D and the second drain 248D. The first source feature 228S is coupled to a bottom power rail by way of the first source contact 236 and the first source contact via 238. The second source feature 248S is couple to the bottom power rail by way of the second source contact 262 and the second source contact via 266. The first source contact via 238 and the second source contact via 266 are disposed on two sides of the first contact 228S. The first drain feature 228D is coupled to a top power rail by way of the first drain contact 234 and the first drain contact via 270. The second drain feature 248D is coupled to the top power rail by way of the second drain contact 264 and the second drain contact via 268. The top power rail is disposed in the top interconnect layer 272.

Figure 85:
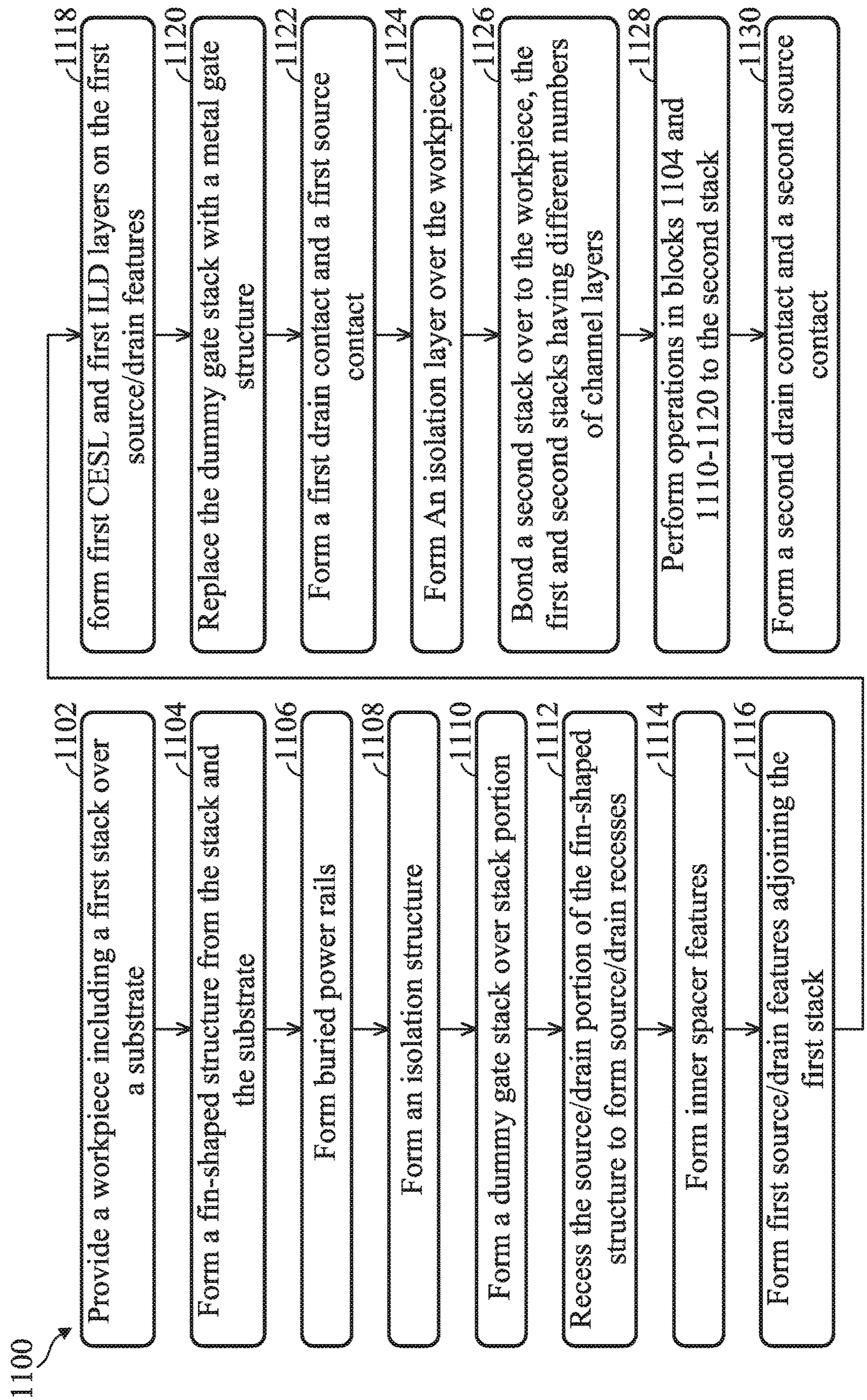
FIG. 85 illustrates a flow chart of a method for forming a semiconductor device having a backside power rail, according to one or more aspects of the present disclosure.

Attention is now turned to method 1100. FIG. 85 illustrates a flow chart of method 1100, according to various aspects of the present disclosure. Throughout the present disclosure, similar reference numerals denote similar features in terms composition and formation. Some details of operations in method 1100 may be simplified or omitted if similar details have been described in conjunction with method 100.

Figure 86C:
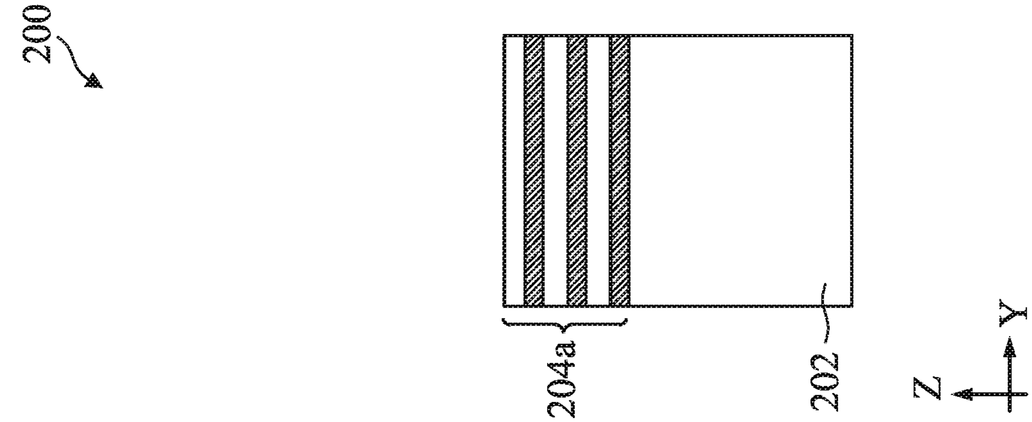
FIGS. 86A, 86B, 86C, 87A, 87B, 87C, 88A, 88B, 88C, 89A, 89B, 89C, 90A, 90B, 90C, 91A, 91B, 91C, 92A, 92B, 92C, 93A, 93B, 93C, 94A, 94B, 94C, 95A, 95B, 95C, 96A, 96B, 96C, 97A, 97B, 97C, 98A, 98B, and 98C illustrate fragmentary cross-sectional views of a workpiece during a fabrication process according to the method of FIG. 85, according to one or more aspects of the present disclosure.
Figure 86B:
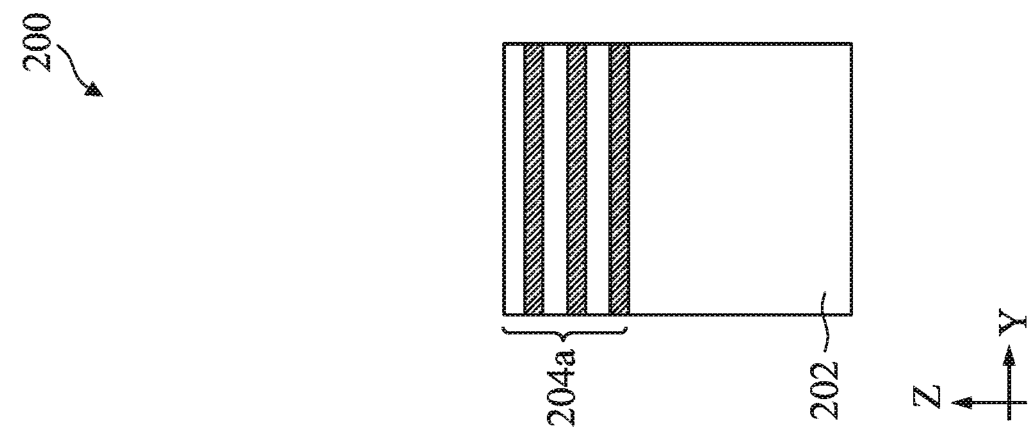
Figure 86A:
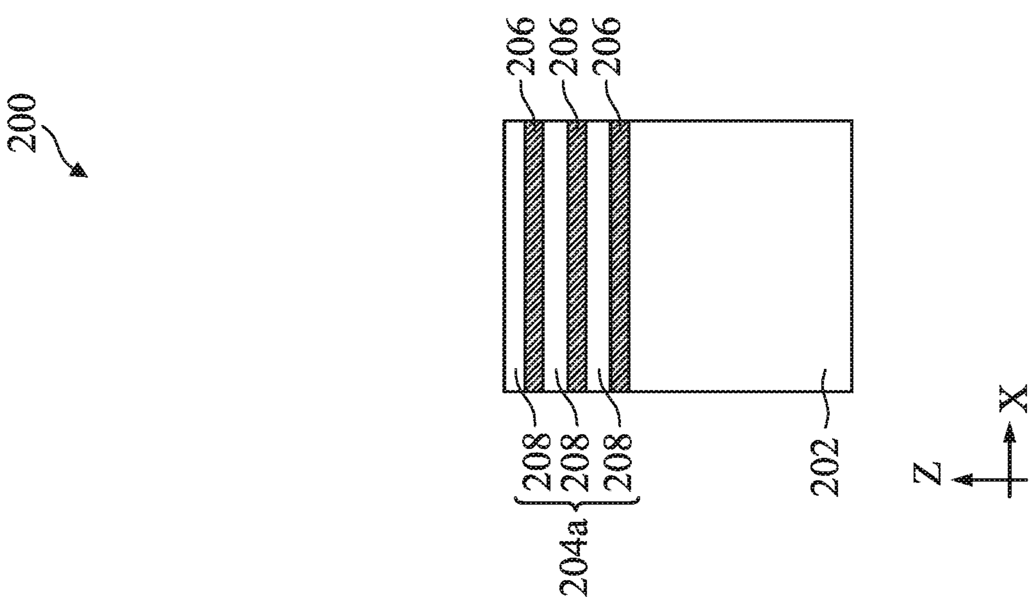
Figure 87A:
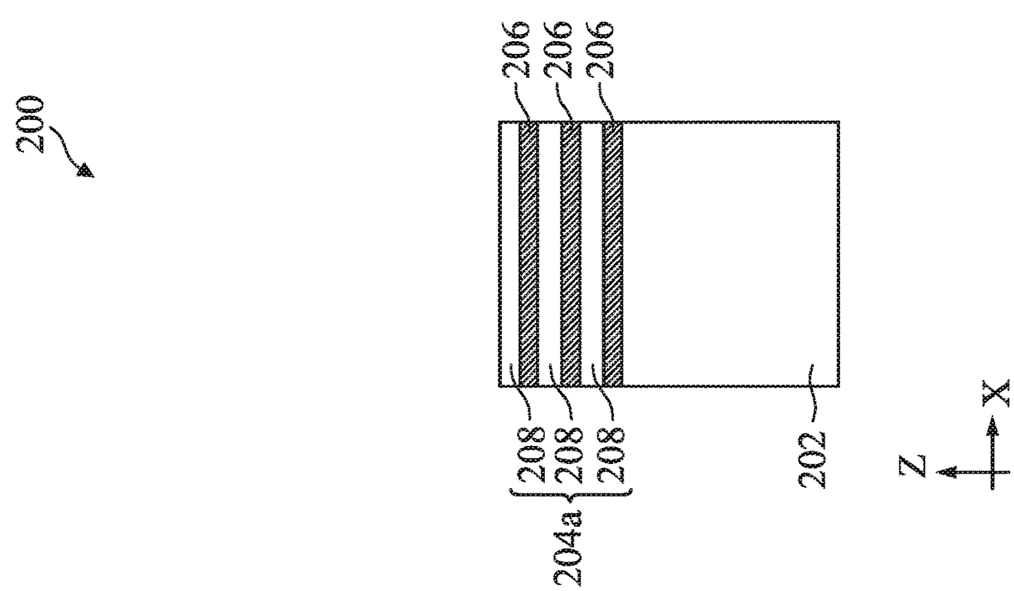
Figure 87B:
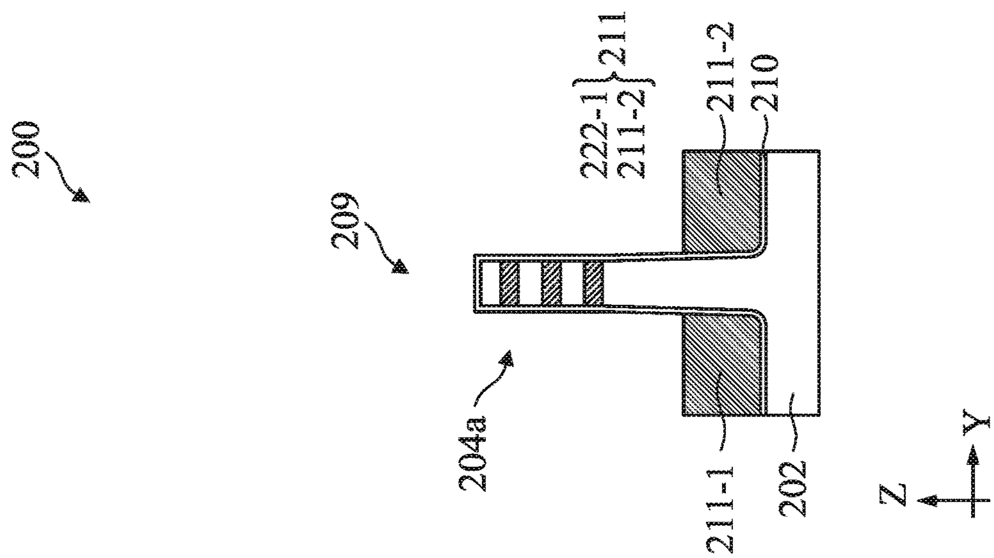
Figure 87C:
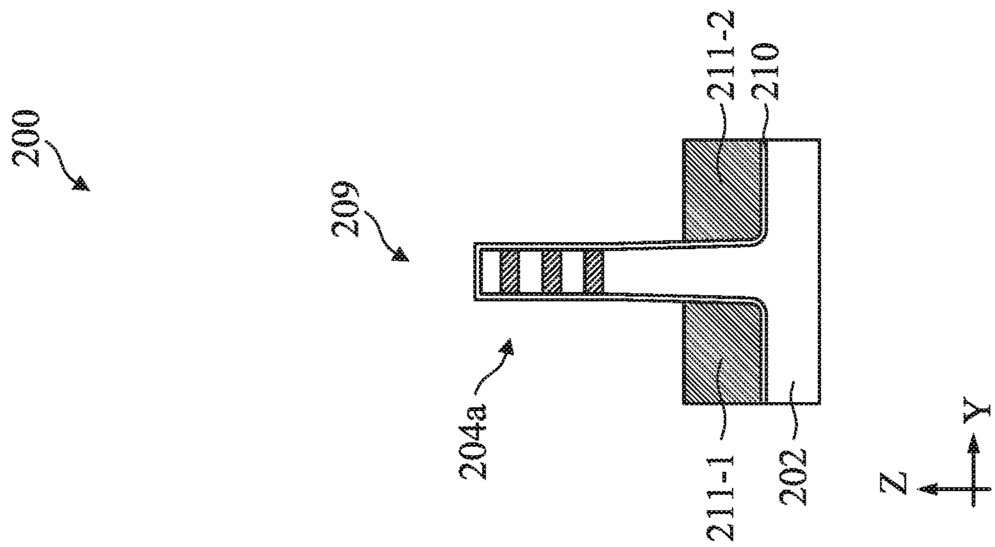
Figure 88A:
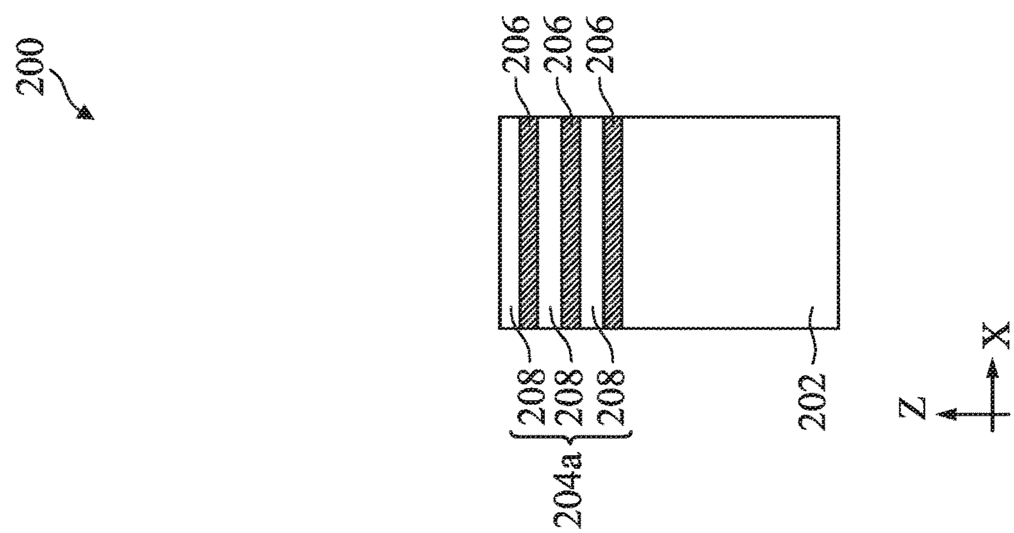
Figure 88B:
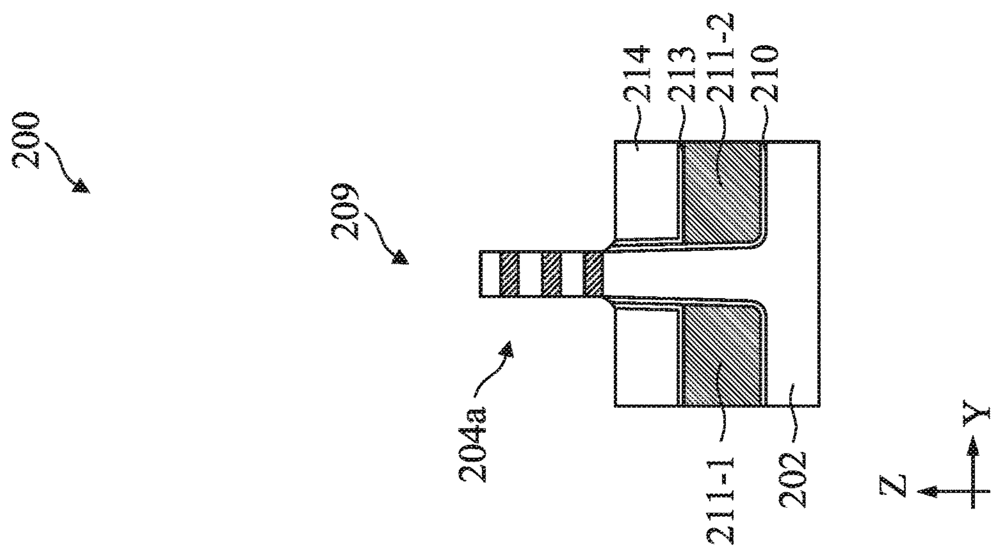
Figure 88C:
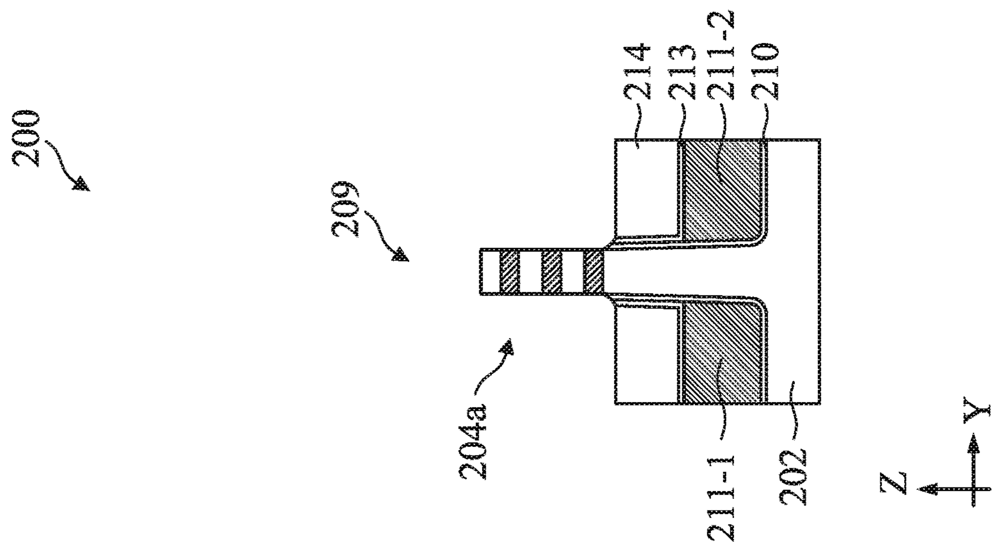
Figure 89C:
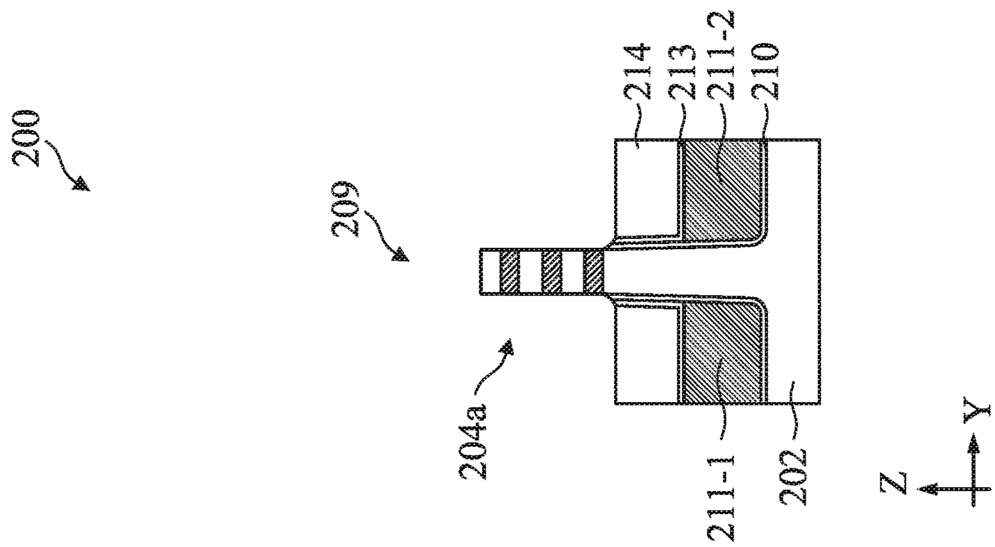
Figure 89B:
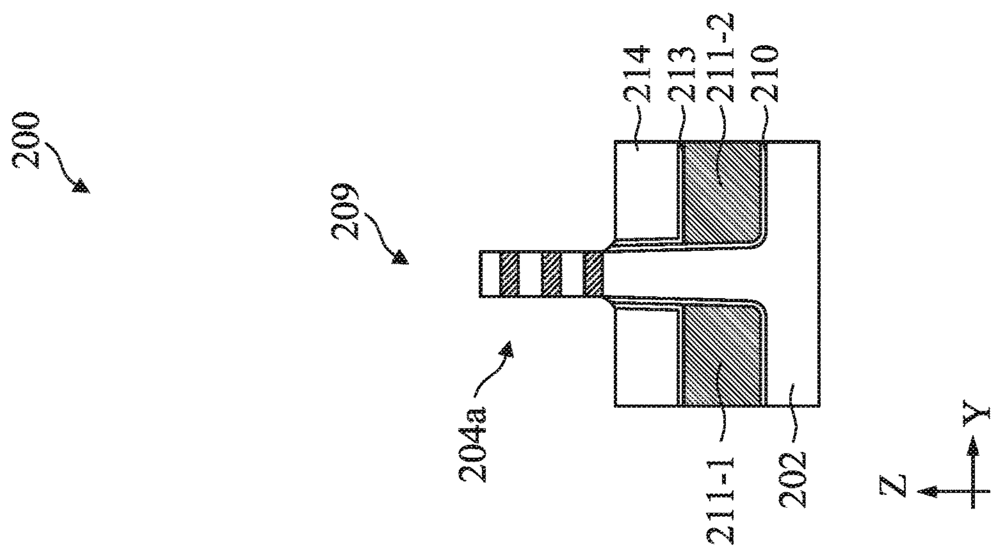
Figure 89A:
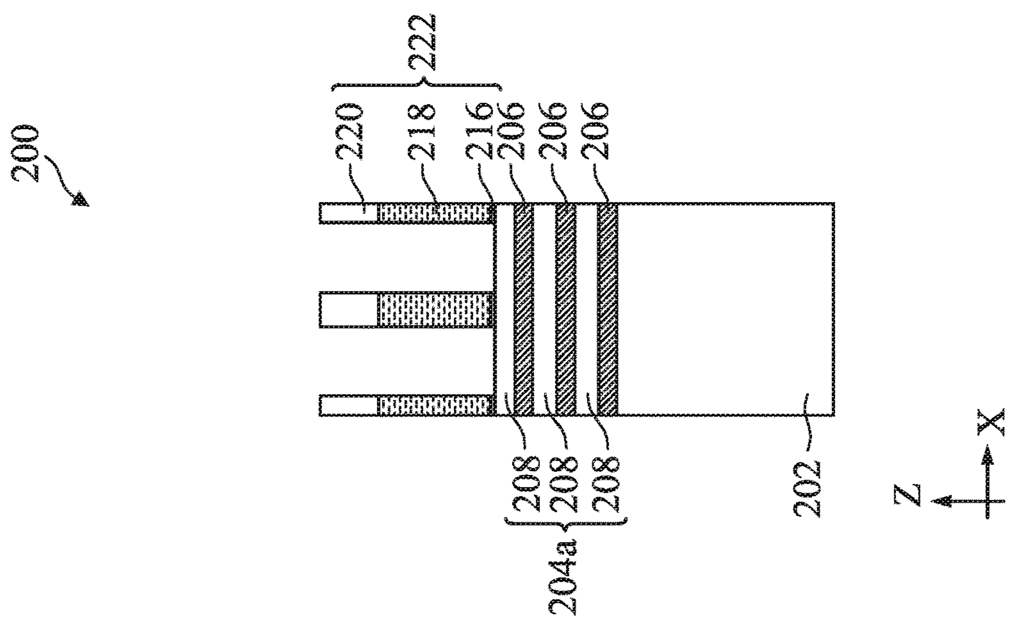
Figure 90C:
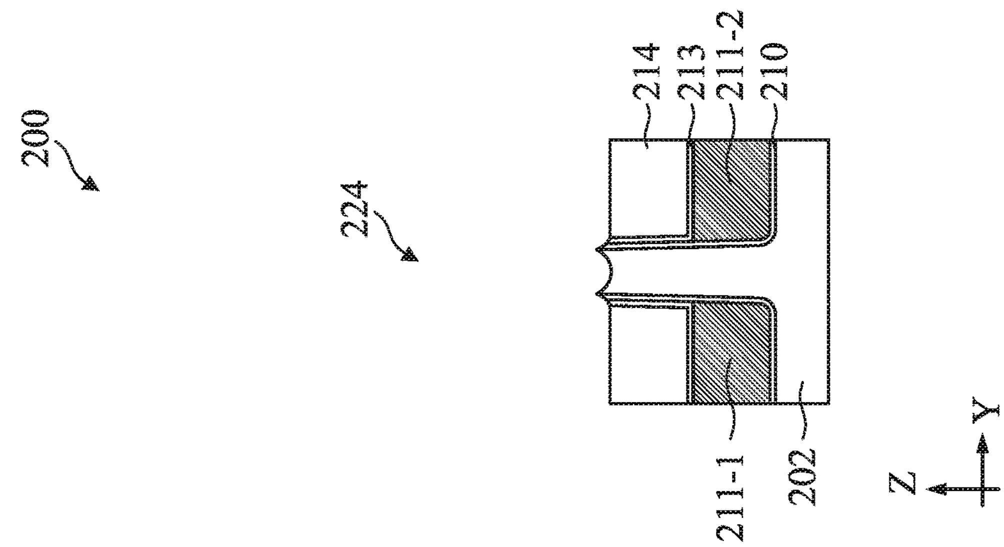
Figure 90B:
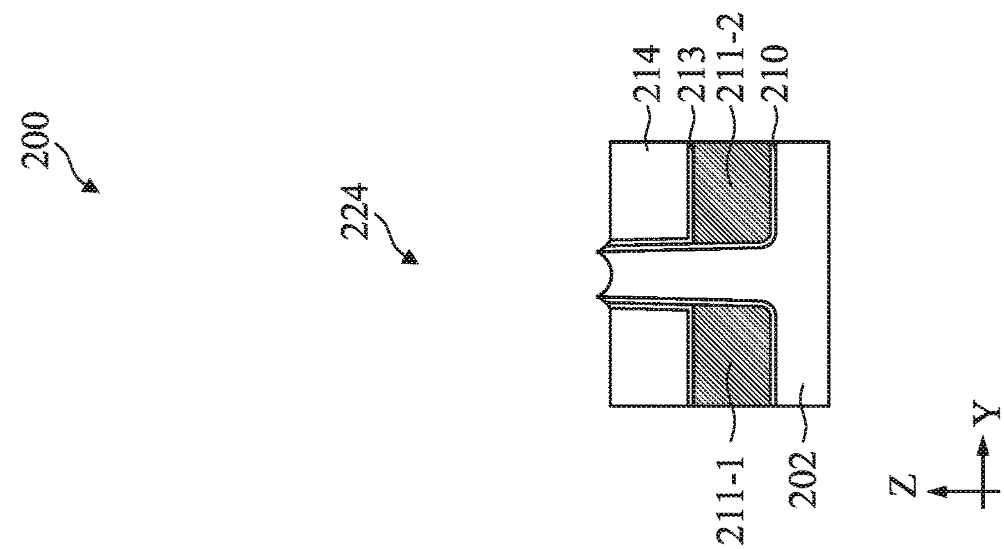
Figure 90A:
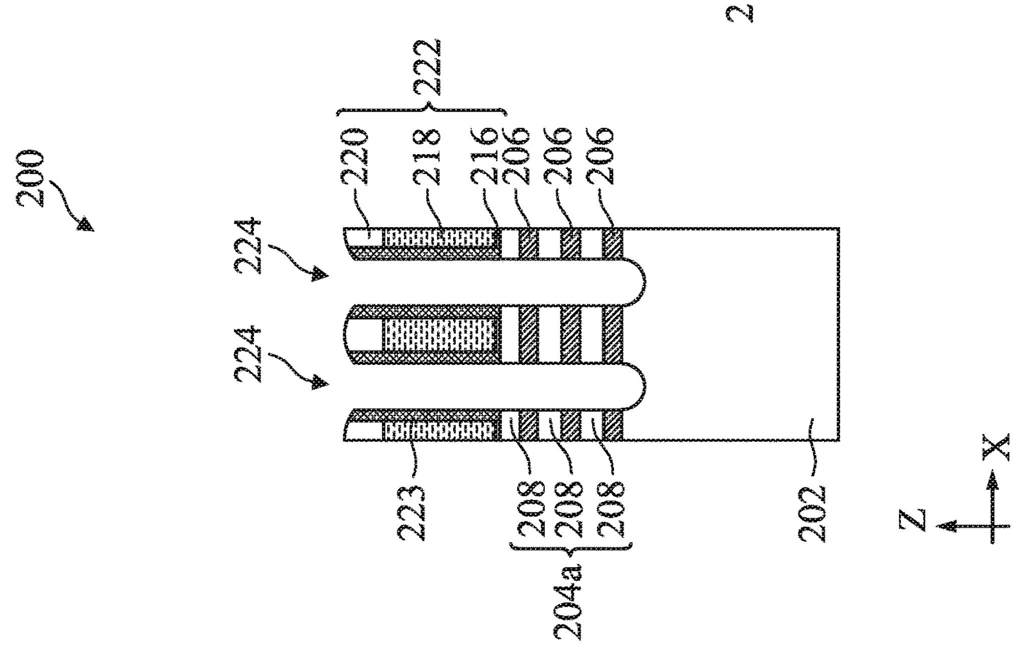
Figure 91A:
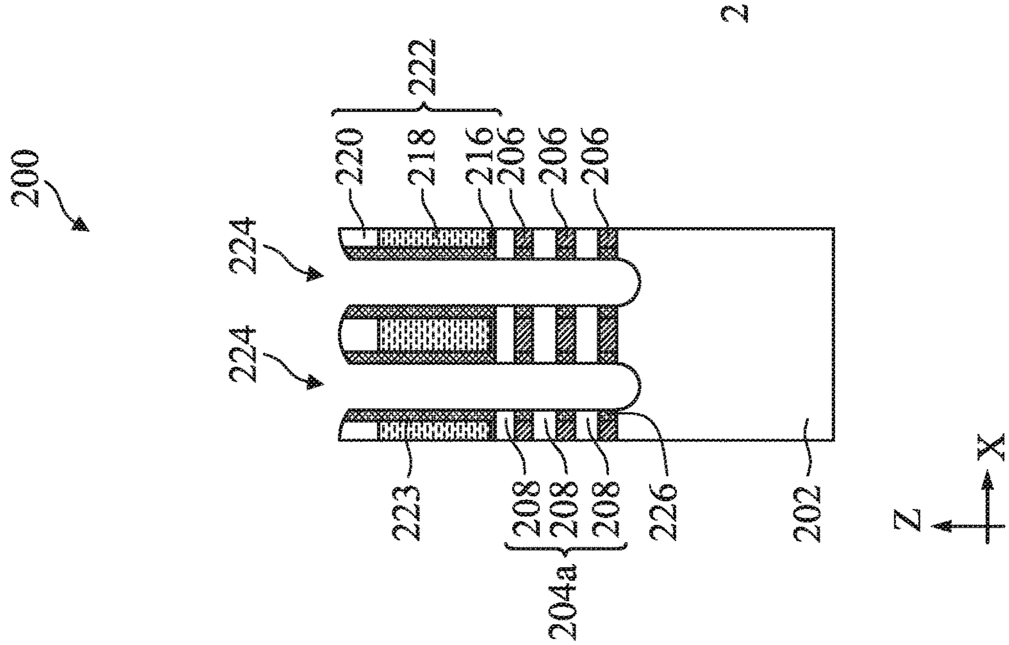
Figure 91B:
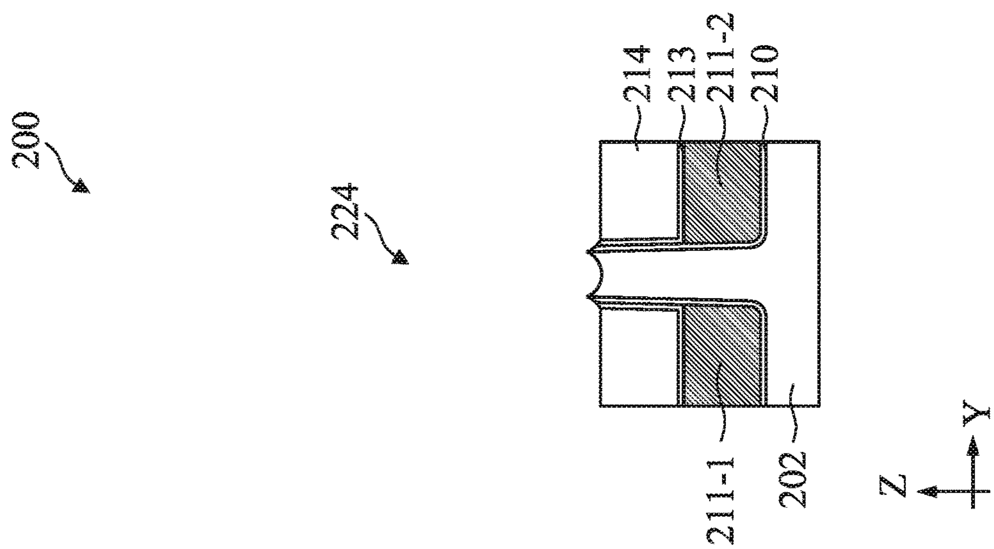
Figure 91C:
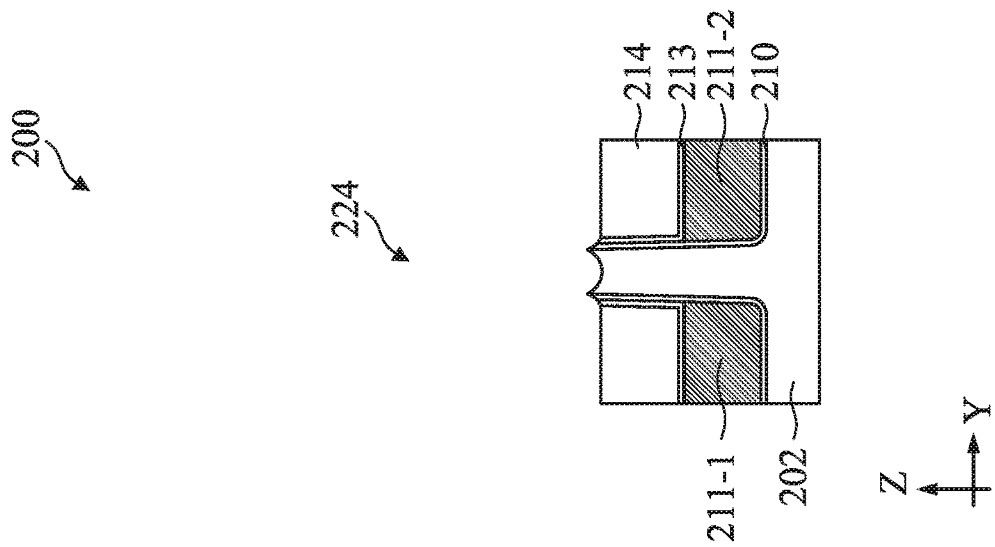
Figure 92C:
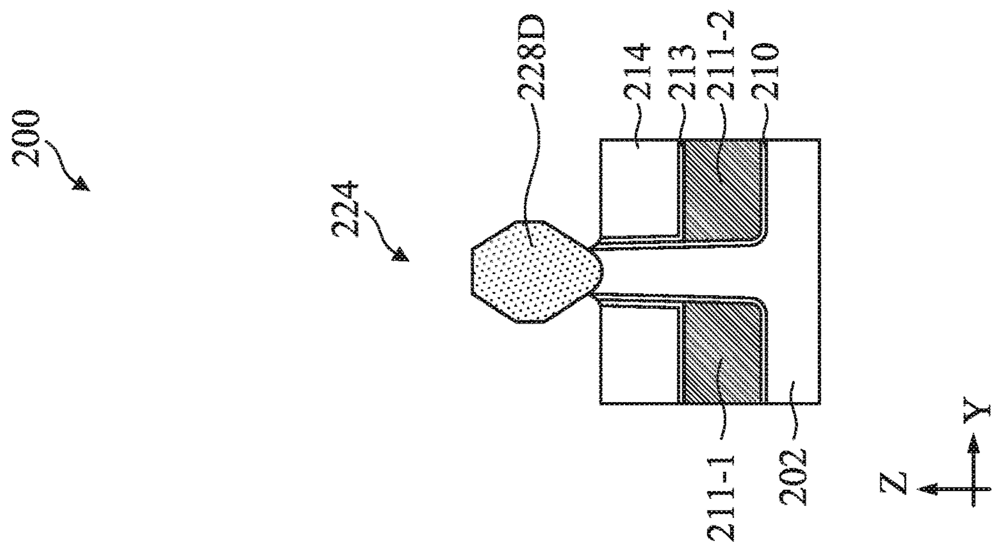
Figure 92B:
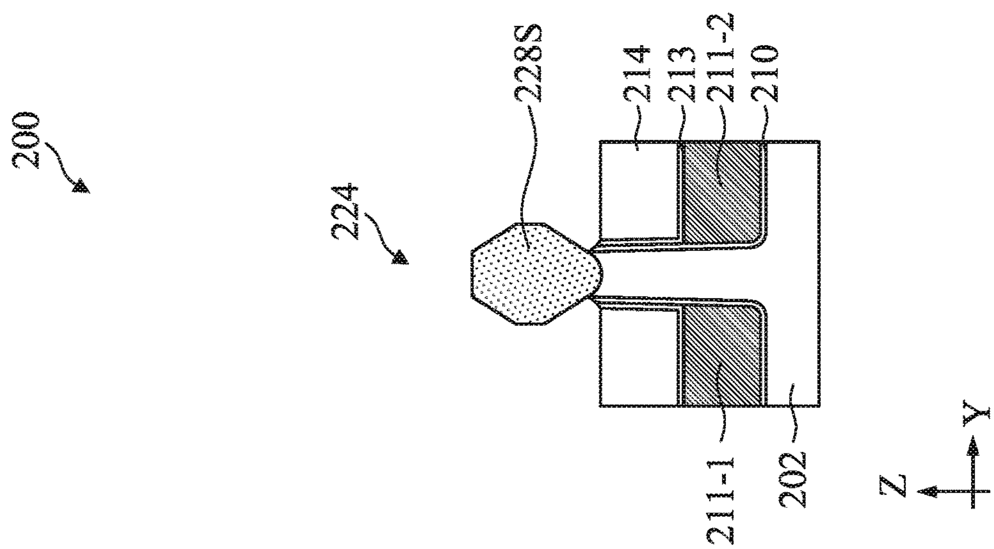
Figure 92A:
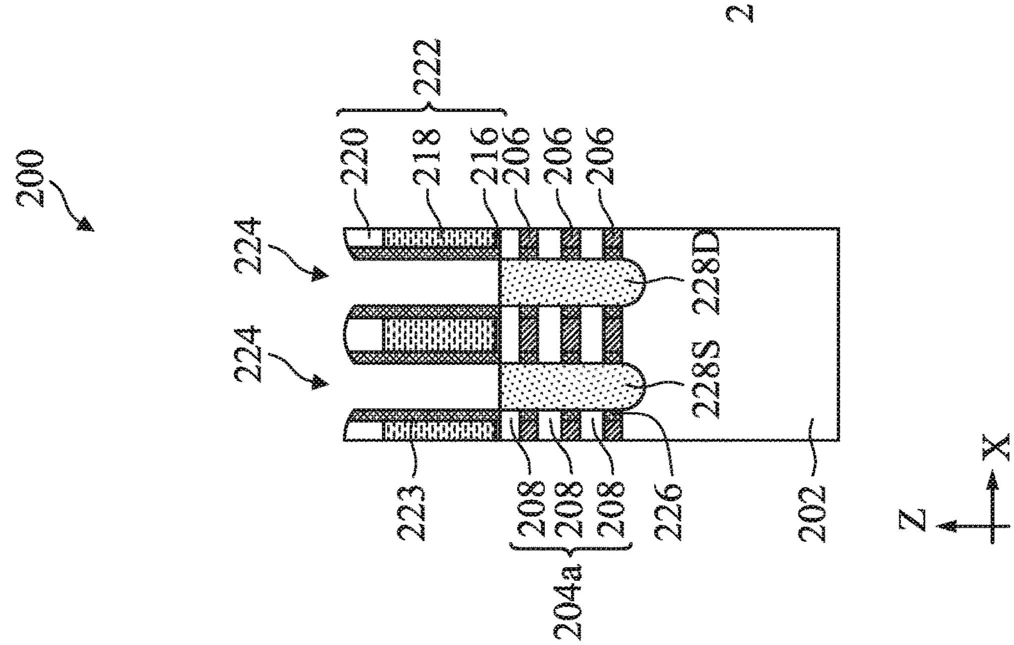
Figure 93C:
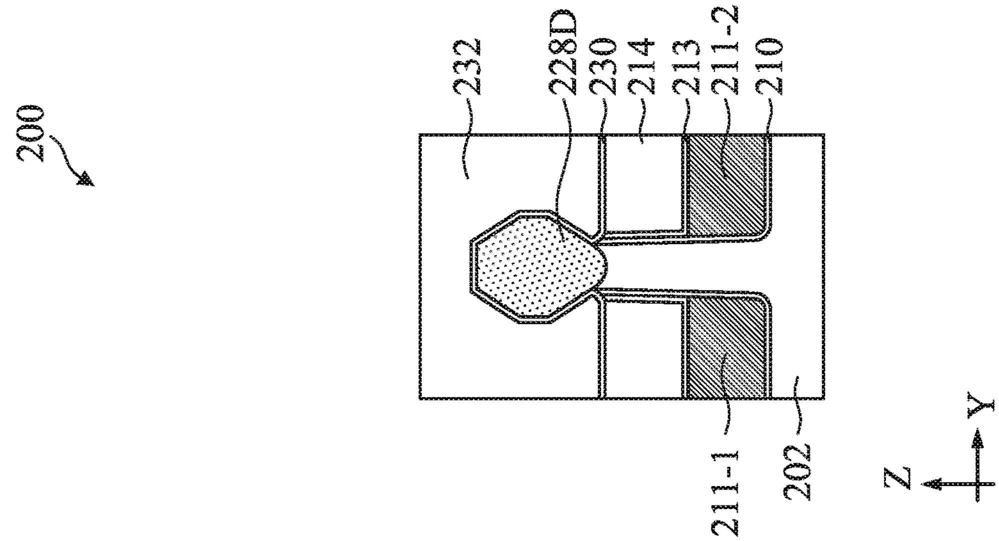
Figure 93B:
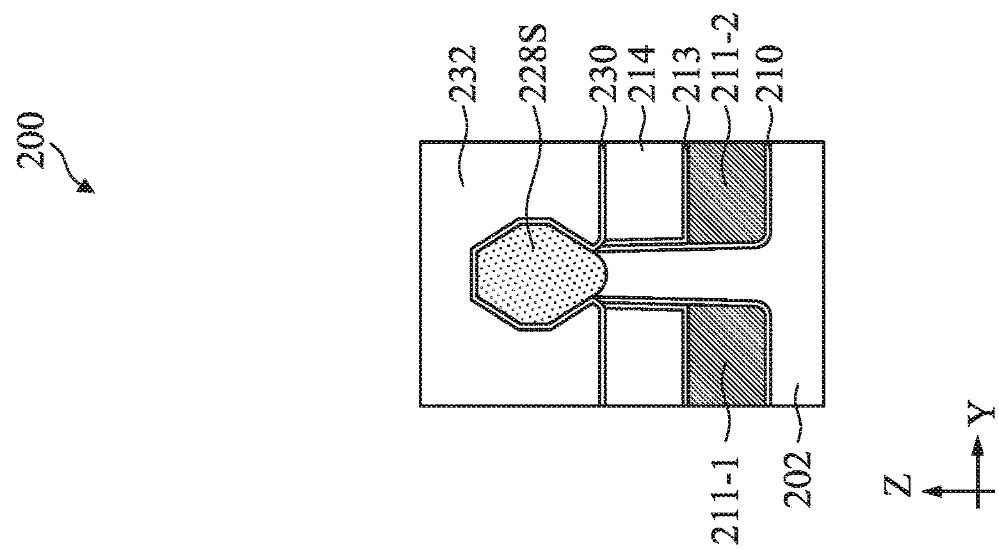
Figure 93A:
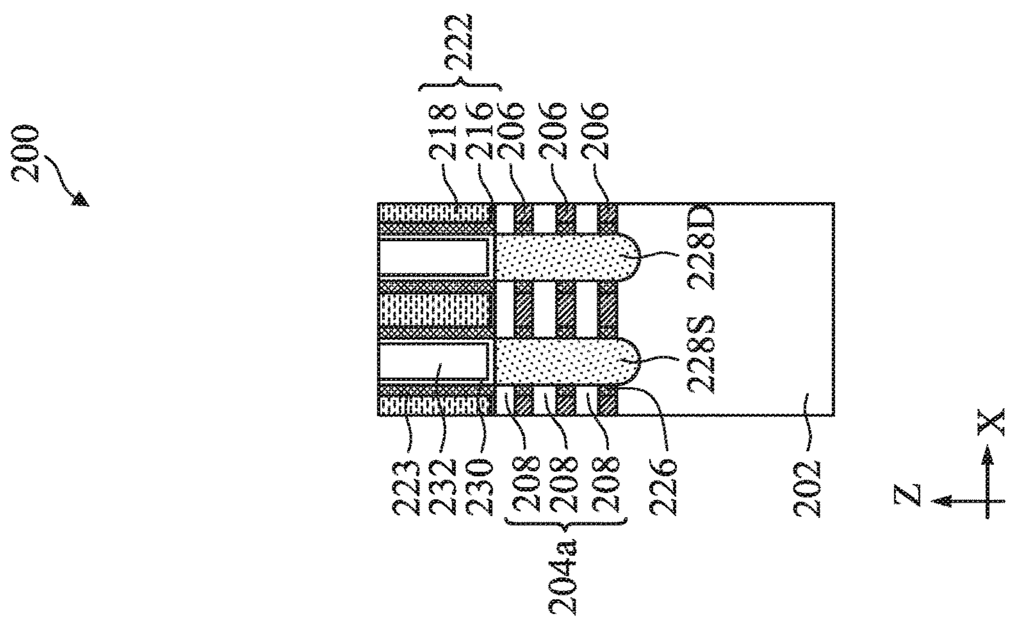
Figure 94C:
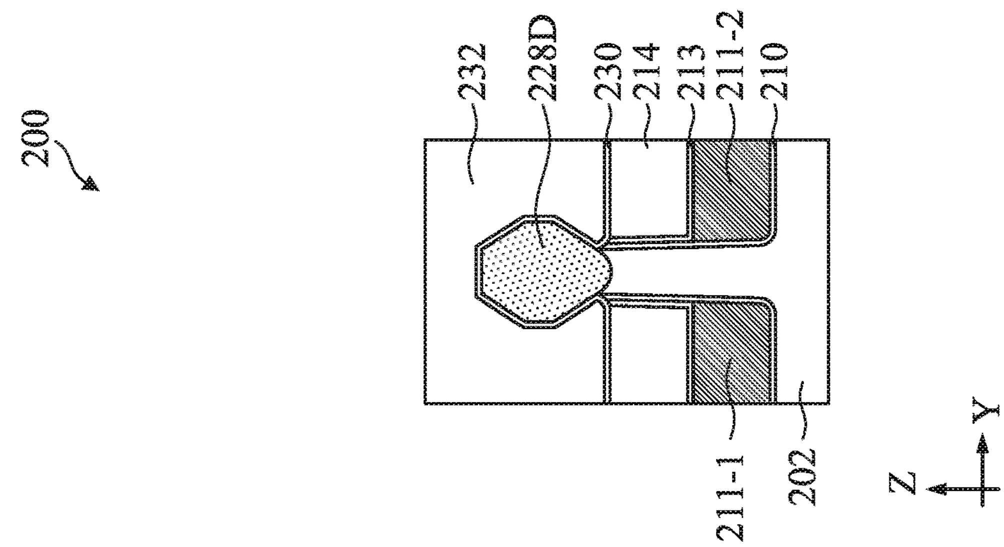
Figure 94B:
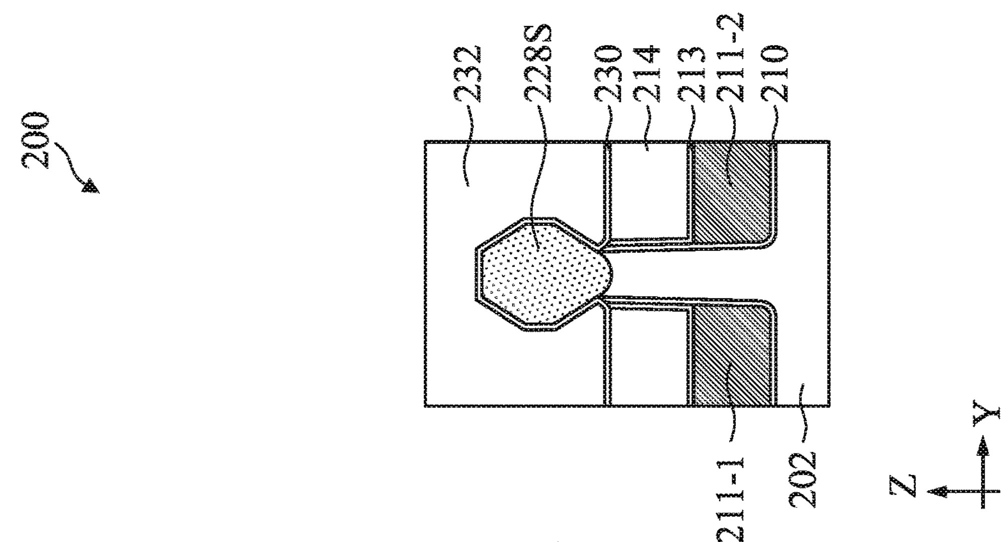
Figure 94A:
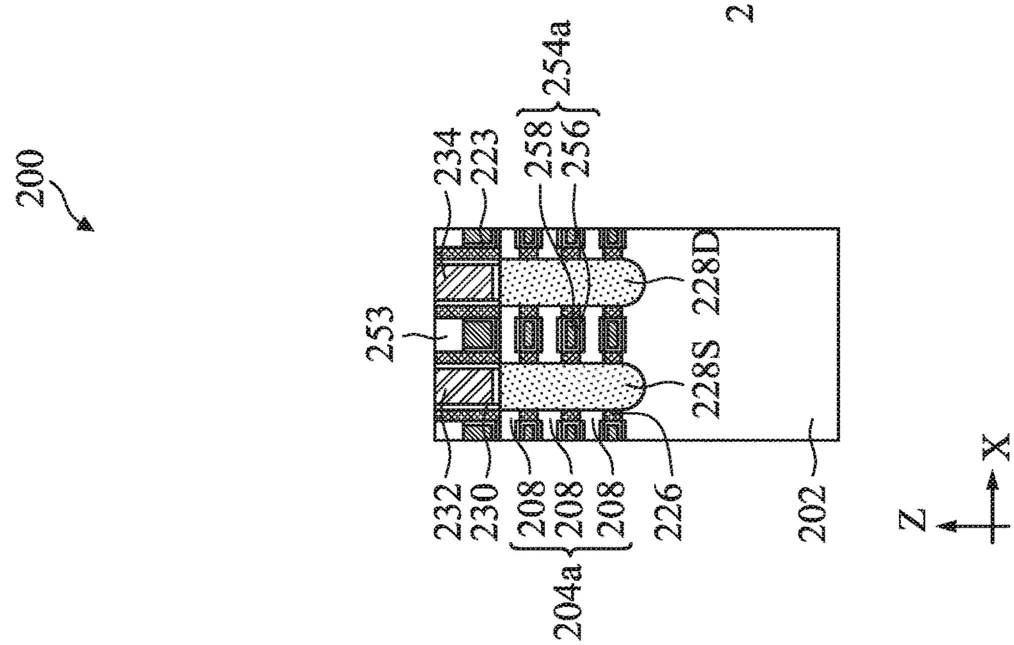
Figures 95A, 95B, 95C:
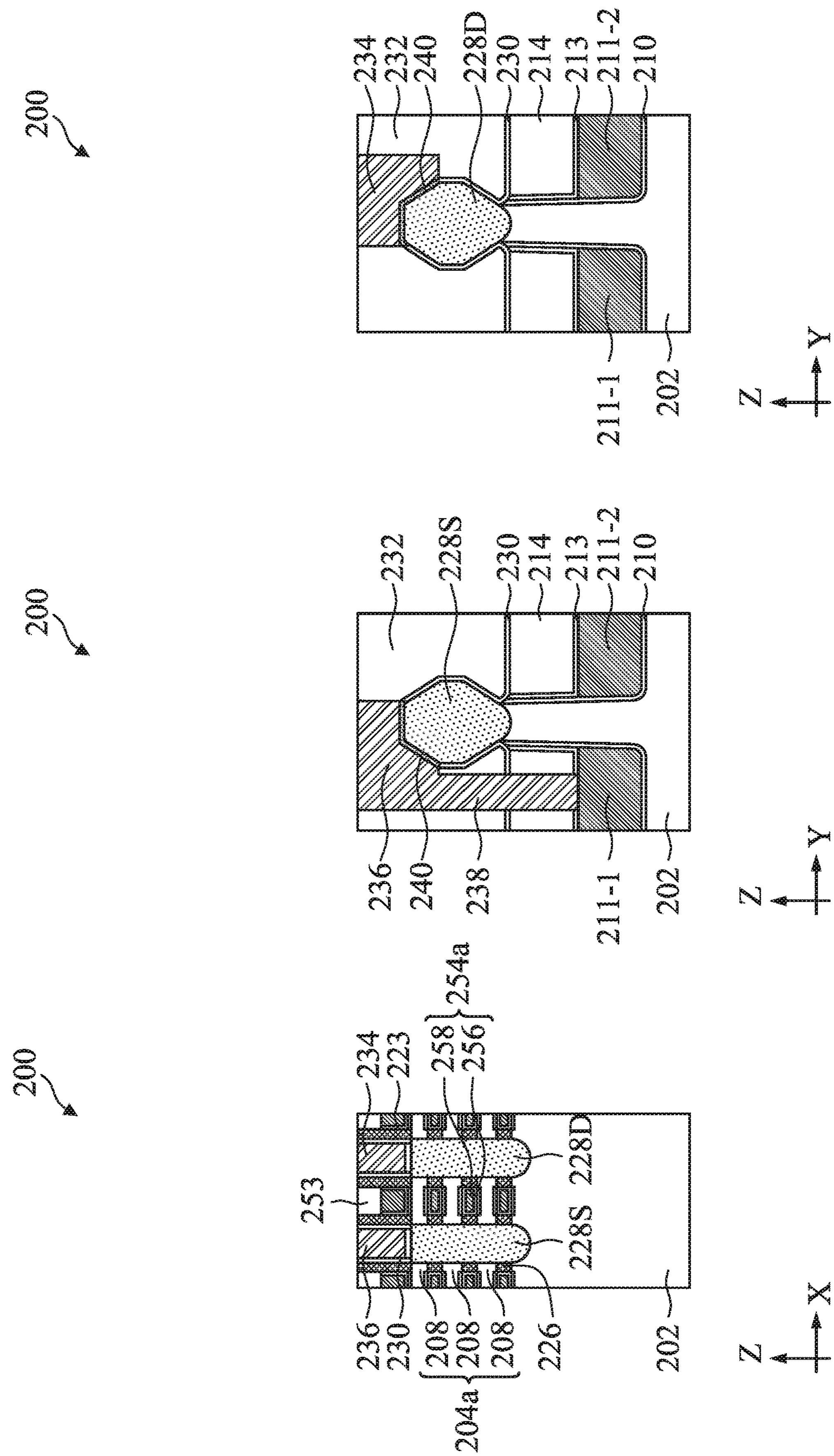
Figure 96C:
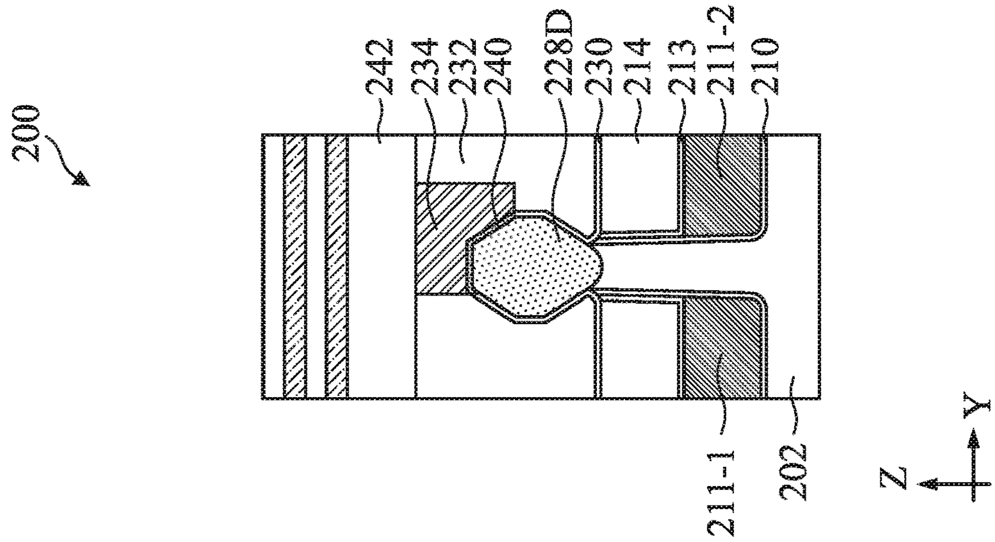
Figure 96B:
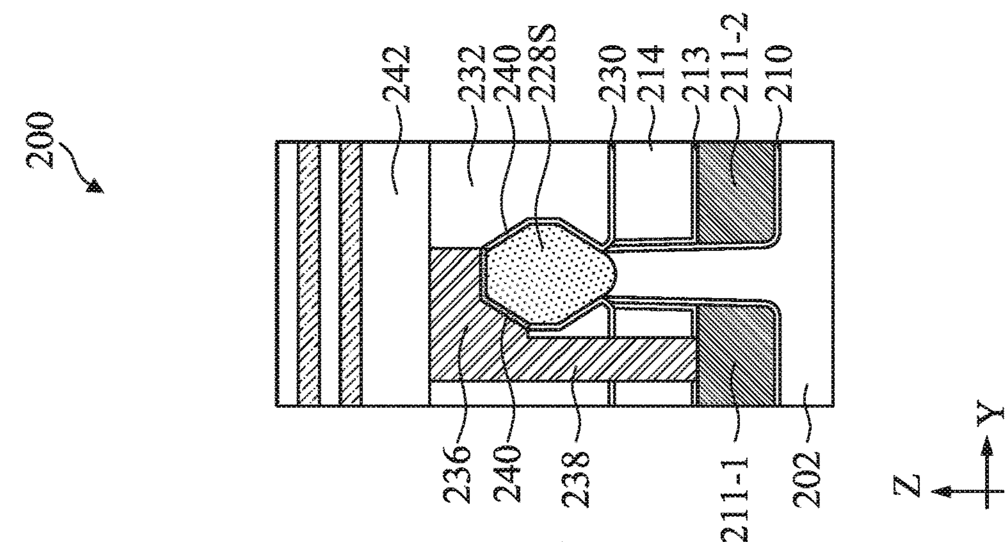
Figure 96A:
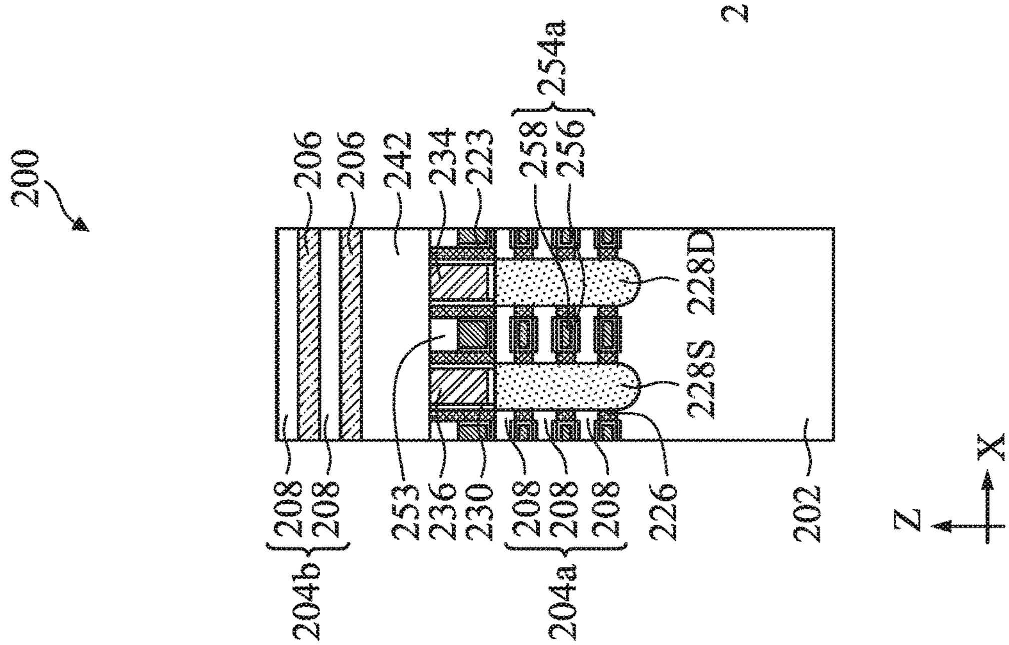
Figures 97A, 97B, 97C:
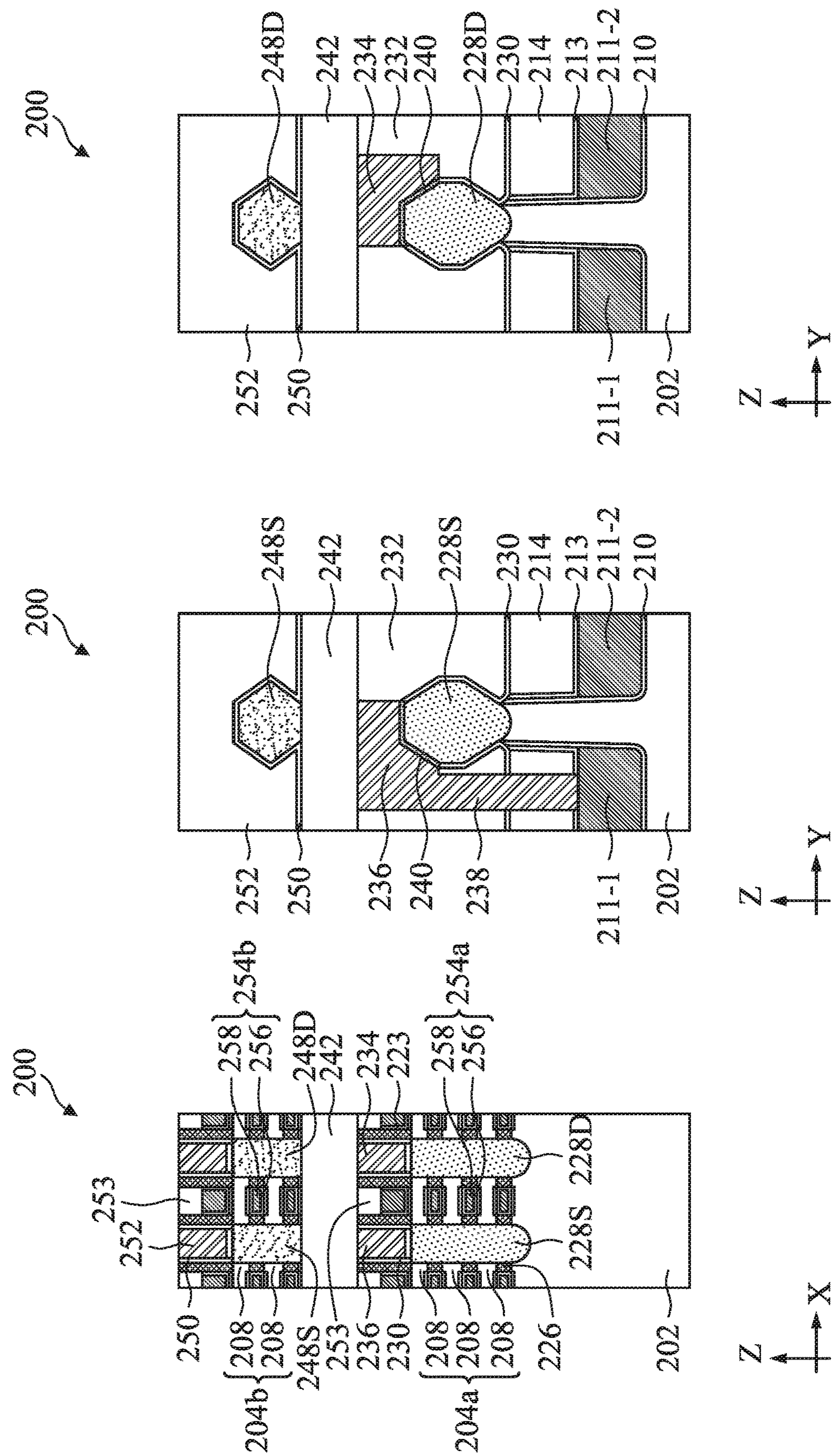

Referring to FIGS. 85 and 86A-C, method 1100 includes a block 1102 where a workpiece 200 is provided. The workpiece 200 includes a substrate 202 and a first stack 204 over the substrate 202. The first stack 204 includes a plurality of channel layers 208 interleaved by a plurality of sacrificial layers 206. It is noted that three (3) layers of the channel layers 208 in the first stack 204*a* are illustrated in FIGS. 86A-C, which is for illustrative purposes only and not intended to be limiting beyond what is specifically recited in the claims. It can be appreciated that any number of the channel layers 208 can be formed in the first stack 204*a*. The number of layers depends on the desired number of channels members for the device 200. In some embodiments, the number of the channel layers 208 in the first stack 204*a* is between 2 and 10. Because material compositions of the substrate 202 and the first stack 204*a* have been described above, detailed descriptions thereof are omitted here.

Referring to FIGS. 85 and 87A-C, method 1100 includes a block 1104 where a fin-shaped structure 209 is formed from the first stack 204*a*. Because operations at block 1104 are similar to those at block 104, detailed descriptions thereof are omitted for brevity.

Still referring to FIGS. 85 and 87A-C, method 1100 includes a block 1106 where buried power rails 211 are formed. Because operations at block 1106 are similar to those at block 106, detailed descriptions thereof are omitted for brevity.

Referring to FIGS. 85 and 88A-C, method 1100 includes a block 1108 where an isolation feature 214 is formed. Because operations at block 1108 are similar to those at block 108, detailed descriptions thereof are omitted for brevity.

Referring to FIGS. 85 and 89A-C, method 1100 includes a block 1110 where a dummy gate stack 222 is formed over the stack portion 204. Because operations at block 1110 are similar to those at block 110, detailed descriptions thereof are omitted for brevity.

Referring to FIGS. 85 and 90A-C, method 1100 includes a block 1112 where source/drain portions of the fin-shaped structure 209 are recessed to form source/drain recesses 224. Because operations at block 1112 are similar to those at block 112, detailed descriptions thereof are omitted for brevity.

Referring to FIGS. 85 and 91A-C, method 1100 includes a block 1114 where inner spacer features 226 are formed. Because operations at block 1114 are similar to those at block 114, detailed descriptions thereof are omitted for brevity.

Referring to FIGS. 85 and 92A-C, method 1100 includes a block 1116 where first source feature 228S and a first drain feature 228D are formed in the source/drain trenches 224 adjoining the channel layers 208 of the first stack 204*a*. Because operations at block 1116 are similar to those at block 122, detailed descriptions thereof are omitted for brevity.

Referring to FIGS. 85 and 93A-C, method 1100 includes a block 1118 where a first CESL 230 and a first ILD layer 232 are deposited on the first source feature 228S and the first drain feature 228D. Because operations at block 1118 are similar to those at block 126, detailed descriptions thereof are omitted for brevity. To remove excess materials and to expose top surfaces of the dummy gate stacks 222, a planarization process, such as a chemical mechanical polishing (CMP) process may be performed. In some embodiments, the gate-top hard mask layer 220 is removed in the CMP process and the dummy gate electrode layer 218 is exposed.

Referring to FIGS. 85 and 94A-C, method 1100 includes a block 1120 where the dummy gate stack 222 is removed and replaced by a first gate structure 254*a*. Because operations at block 1120 are similar to those at block 138, detailed descriptions thereof are omitted for brevity.

Referring to FIGS. 85 and 95A-C, method 1100 includes a block 1122 where interconnection features, such as a first drain contact 234, a first source contact 236, a first source contact via 238 are formed. Because operations at block 1122 are similar to those at block 128, detailed descriptions thereof are omitted for brevity.

Referring to FIGS. 85 and 96A-C, method 1100 includes a block 1124 where a dielectric isolation layer 242 is deposited over the first ILD layer 232 and covering interconnection features formed in earlier operations at block 1122. The dielectric isolation layer 242 may include silicon nitride, silicon oxide, silicon oxynitride, hafnium oxide, aluminum oxide, zirconium oxide, or other suitable isolation material. In an embodiment, the dielectric isolation layer 242 may be formed by CVD, PECVD, or other suitable process.

Still referring to FIGS. 85 and 96A-C, method 1100 includes a block 1126 where a second stack 204*b* is bonded over to the workpiece 200. Like the first stack 204*a*, the second stack 204*b* also include a plurality of channel layers 208 interleaved by a plurality of sacrificial layers 206. In the embodiments shown in FIGS. 96A, the first stack 204*a* and the second stack 204*b* have different number of channel layers 208. Particularly in the illustrated embodiment, the first stack 204*a* has more channel layers 208 than the second stack 204*b*. However, the present disclosure is not so limited that the first stack 204*a* may have less channel layers 208 than the second stack 204*b*, or have different configurations, such as different thicknesses of layers. To facilitate bonding, a gluing layer (not explicitly shown) may be formed on a bottom surface of the second stack 204*b*. The second stack 204*b* and the gluing layer may be regarded as another substrate, as opposed to the substrate 202. In some implementations, the gluing layer includes silicon oxide and may also be referred to as a gluing oxide layer. In some embodiments, the second stack 204*b* may be directly bonded to the workpiece 200 by utilizing the interface between the dielectric isolation layer 242 and the gluing layer. In an example direct bonding process, both the dielectric isolation layer 242 and the gluing layer are cleaned using RCA SC-1 (ammonia, hydrogen peroxide and water) and/or RCA SC-2 (hydrochloric acid, hydrogen peroxide and water). The cleaned dielectric isolation layer 242 and gluing layer are then mated and pressed together. The direct bonding may be strength by an anneal process. In some alternative embodiments, the sacrificial layers 206 and channel layers 208 in the second stack 204*b* are epitaxy layers and may be deposited on the workpiece 200 using an epitaxy process. Suitable epitaxy processes include vapor-phase epitaxy (VPE), ultra-high vacuum chemical vapor deposition (UHV-CVD), molecular beam epitaxy (MBE), and/or other suitable processes.

Referring to FIGS. 85 and 97A-C, method 1100 includes a block 1128 where operations in blocks 1104, 1110-1120 are performed to the second stack 204*b*. Due to the similarity in process steps, operations at block 1128 are only summarized for simplicity. At block 1104, the second stack 204*b* is patterned to form a second fin-shaped structure. At block 1110, a second dummy gate stack is formed over the channel region of the second fin-shaped structure to serve as a placeholder for a functional second gate structure. At block 1112, the source/drain portion of the second fin-shaped structure are recessed to form source/drain recesses, similar to the source/drain trenches 224. At block 1114, the sacrificial layers 206 in the channel region are selectively and partially etched to form inner spacer recesses and inner spacer features are formed in such inner spacer recesses. At block 1116, a second source feature 248S and a second drain feature 248D are formed in the source/drain recesses. At block 1118, a second CESL 250 and a second ILD layer 252 are deposited on the second source feature 248S and the second drain feature 248D. At block 1120, the dummy gate stack over the second fin-shaped structure is replaced by a second gate structure 254*b*. The sacrificial layers 206 in the channel region are selectively removed to release the channel layers 208 as channel members and the second gate structure 254*b* wraps around each of the channel members in the second stack 204*b*.

Referring to FIGS. 85 and 98A-C, method 1100 includes a block 1130 where interconnection features, such as a second source contact 262, a second drain contact 264, a second source contact via 266, a second drain contact via 268, a first drain contact via 270, and a top interconnect layer 272 are formed. Because operations at block 1130 are similar to those at block 140, detailed descriptions thereof are omitted for brevity.

Figure 98C:
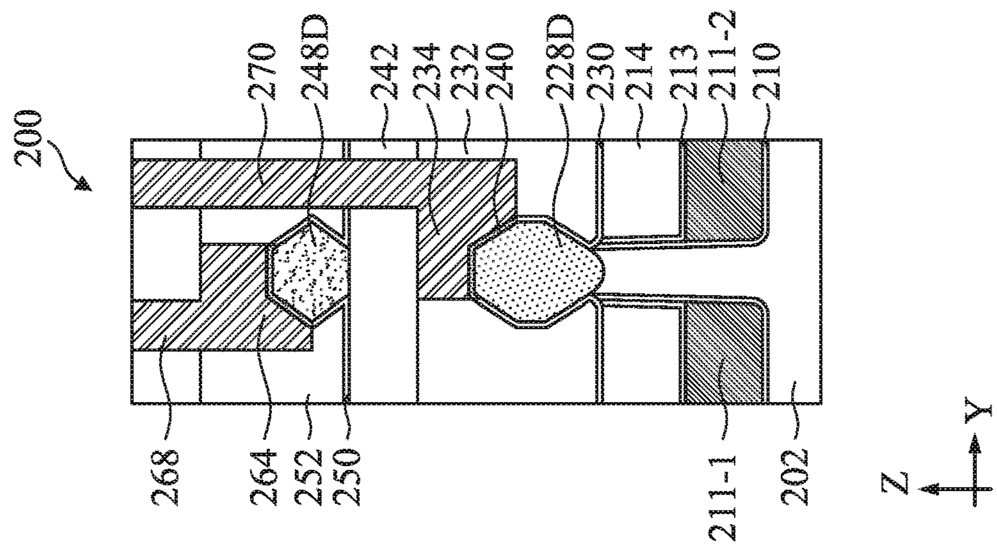
Figure 98B:
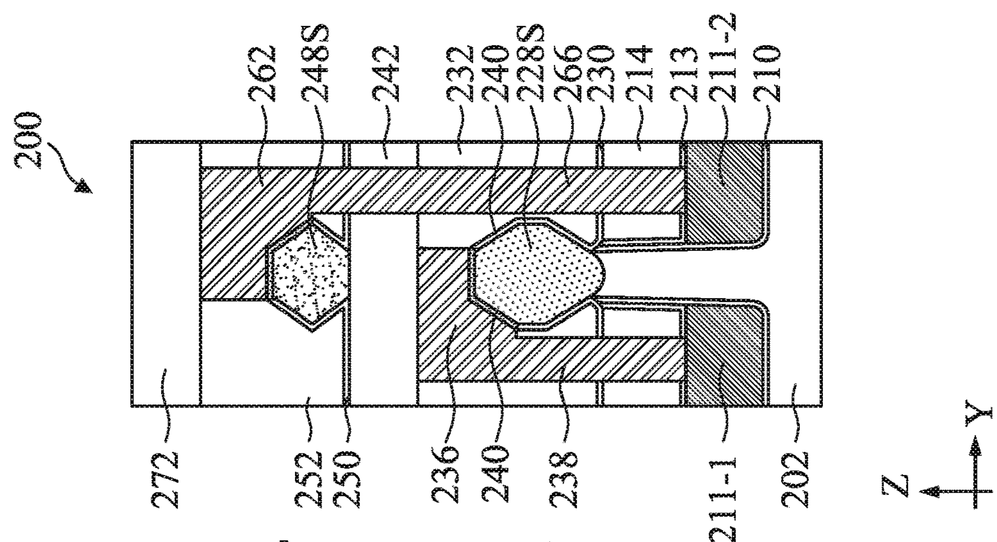
Figure 98A:
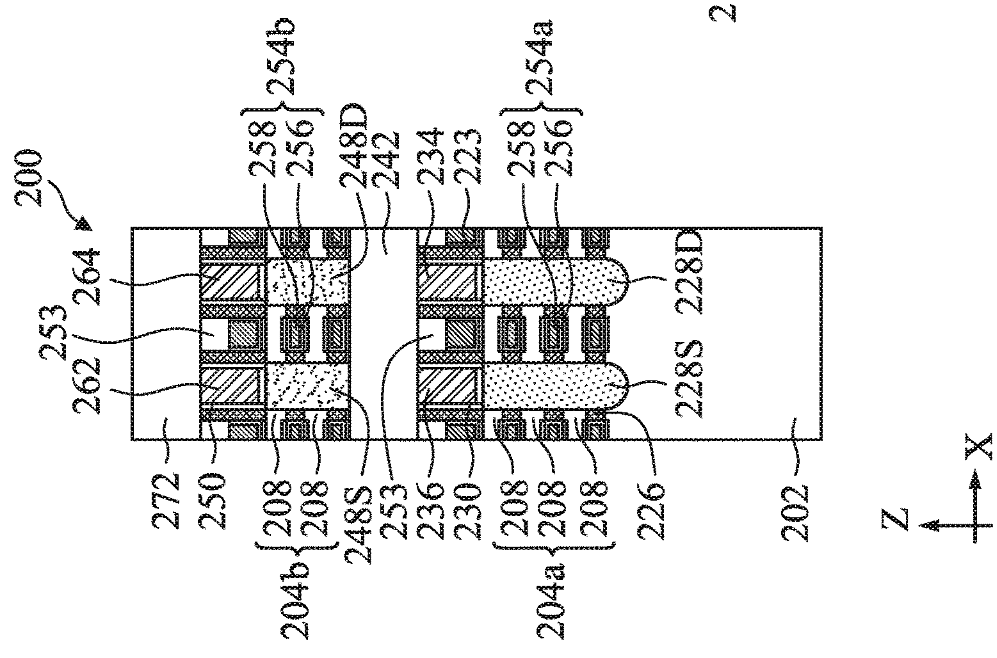

Reference is now made to FIGS. 98A-C. Upon conclusion of the operations in method 1100, a bottom GAA transistor 260*a* and a top GAA transistor 260*b* stacked over the bottom GAA transistor 260*a* are formed. The top and bottom GAA transistors are separated by a dielectric isolation layer 242. The top GAA transistor 260*b* includes channel layers (or referred to as channel members) sandwiched between the second source feature 248S and the second drain feature 248D. The bottom GAA transistor 260*a* includes channel layers sandwiched between the first source feature 228S and the first drain feature 228D. Each channel layer 208 in the first stack 204*a* and the second stack 204*b* is an active channel layer. One difference is that since the first stack 204*a* has at least one more channel layer 208 than the second stack 204*b*, the bottom GAA transistor 260*a* has at least one more channel layer 208 than the top GAA transistor 260*b*. Accordingly, the bottom GAA transistor 260*a* has at least one more active channel layer than the top GAA transistor 260*b*. In various embodiments, the bottom GAA transistor 260*a* may have two or more active channel layers than the top GAA transistor 260*b*. Alternatively, if method 1100 at block 1102 starts with a second stack 204*b* that has at least one more channel layer 208 than the first stack 204*a*, upon conclusion of the operations in method 1100, the top GAA transistor 260*b* would thus have at least one more active channel layer than the bottom GAA transistor 260*a*. In furtherance of the alternative embodiment, the top GAA transistor 260*b* may have two or more active channel layers than the bottom GAA transistor 260*a*.

A first gate structure 254*a* wraps around each channel layer of the bottom GAA transistors 260*a*. A second gate structure 254*b* wraps around each channel layer of the top GAA transistor 260*b*. The dielectric isolation layer 242 interposes the first gate structure 254*a* and the second gate structure 254*b*, interposes the first source 228S and the second source 248S, and also interposes the first drain 228D and the second drain 248D. The first source feature 228S is coupled to a bottom power rail by way of the first source contact 236 and the first source contact via 238. The second source feature 248S is couple to the bottom power rail by way of the second source contact 262 and the second source contact via 266. The first source contact via 238 and the second source contact via 266 are disposed on two sides of the first contact 228S. The first drain feature 228D is coupled to a top power rail by way of the first drain contact 234 and the first drain contact via 270. The second drain feature 248D is coupled to the top power rail by way of the second drain contact 264 and the second drain contact via 268. The top power rail is disposed in the top interconnect layer 272.

FIGS. 99 and 100 illustrate some embodiments of a workpiece with a bottom GAA transistor 260*a* and a top GAA transistor 260*b* stacked over the bottom GAA transistor 260*a* by using methods 100, 300, 500, 700, 900, 1100, or combinations thereof. Examples I-XV in FIGS. 99 and 100 are for the sake of example and are non-limiting. For example, a difference of number of active channel layers may be two or three or even more between stacked GAA transistors so formed by the illustrative processes.

Example I illustrates an embodiment where a workpiece is formed by method 100. The bottom GAA transistor 260*a* includes channel layers sandwiched between the first source/drain features. The top GAA transistor 260*b* includes a same number of channel layers as the bottom GAA transistor 260*a*. One difference is that not all channel layers of the top GAA transistor 260*b* are sandwiched between the second source/drain features and able to function as active channel layers. At least a bottommost channel layer is adjoined by a dielectric isolation layer 242 and becomes a "floating" (inactive) channel layer. Accordingly, the top GAA transistor 260*b* has one less active channel layer than the bottom GAA transistor 260*a*. In an alternative embodiment, two or more bottom channel layers of the top GAA transistor 260*b* may be adjoined by the dielectric isolation layer 242, and thus the top GAA transistor 260*b* may have two or more active channel layers less than the bottom GAA transistor 260*a*. A common gate structure wraps around each channel layer of the top and bottom GAA transistors. Due to the fewer total number of active channel layers of the second stack for epitaxial source/drain feature growth, the second source/drain features of the top GAA transistor 260*b* are less in height and volume than the first source/drain features of the bottom GAA transistor 260*a*. For avoidance of doubts, both the first and second source/drain features in Example I, as well as in Examples II-XV below or other alternative embodiments, can have the various source/drain feature profiles illustrated in FIGS. 102A-103D.

Example II illustrates an embodiment where a workpiece is formed by method 300. The top GAA transistor 260*b* includes channel layers sandwiched between the first source/drain features. The bottom GAA transistor 260*a* includes a same number of channel layers as the top GAA transistor 260*b*. One difference is that not all channel layers of the bottom GAA transistor 260*a* are sandwiched between the first source/drain features and able to function as active channel layers. At least a bottommost channel layer is adjoined by a dielectric isolation layer 241 and becomes a "floating" channel layer. Accordingly, the bottom GAA transistor 260*a* has one less active channel layer than the top GAA transistor 260*b*. In an alternative embodiment, two or more bottom channel layers of the bottom GAA transistor 260*a* may be adjoined by the dielectric isolation layer 241, and thus the bottom GAA transistor 260*a* may have two or more active channel layers less than the top GAA transistor 260*b*. A common gate structure wraps around each channel layer of the top and bottom GAA transistors. Due to the fewer total number of active channel layers of the first stack for epitaxial source/drain feature growth, the first source/drain features of the bottom GAA transistor 260*a* are less in height and volume than the second source/drain features of the top GAA transistor 260*b*.

Example III illustrates an embodiment where a workpiece is formed by method 500. The bottom GAA transistor 260*a* includes channel layers sandwiched between the first source/drain features. The top GAA transistor 260*b* includes a same number of channel layers as the bottom GAA transistor 260*a*. One difference is that not all channel layers of the top GAA transistor 260*b* are sandwiched between the second source/drain features and able to function as active channel layers. At least a topmost channel layer is adjoined by a CESL 250 and becomes a "floating" channel layer. Accordingly, the top GAA transistor 260*b* has one less active channel layer than the bottom GAA transistor 260*a*. In an alternative embodiment, two or more top channel layers of the top GAA transistor 260*b* may be adjoined by the CESL 250, and thus the top GAA transistor 260*b* may have two or more active channel layers less than the bottom GAA transistor 260*a*. A common gate structure wraps around each channel layer of the top and bottom GAA transistors. Due to the recessed top surfaces, the second source/drain features of the top GAA transistor 260*b* are less in height and volume than the first source/drain features of the bottom GAA transistor 260*a*.

Example IV illustrates an embodiment where a workpiece is formed by method 700. The top GAA transistor 260*b* includes channel layers sandwiched between the second source/drain features. The bottom GAA transistor 260*a* includes a same number of channel layers as the top GAA transistor 260*b*. One difference is that not all channel layers of the bottom GAA transistor 260*a* are sandwiched between the first source/drain features and able to function as active channel layers. At least a topmost channel layer is adjoined by a CESL 230 and becomes a "floating" channel layer. Accordingly, the bottom GAA transistor 260*a* has one less active channel layer than the top GAA transistor 260*b*. In an alternative embodiment, two or more top channel layers of the bottom GAA transistor 260*a* may be adjoined by the CESL 230, and thus the bottom GAA transistor 260*a* may have two or more active channel layers less than the top GAA transistor 260*b*. A common gate structure wraps around each channel layer of the top and bottom GAA transistors. Due to the recessed top surfaces, the first source/ drain features of the bottom GAA transistor 260*a* are less in height and volume than the second source/drain features of the top GAA transistor 260*b*.

Example V illustrates an embodiment where a workpiece is formed by method 900. The bottom GAA transistor 260*a* includes channel layers sandwiched between the first source/drain features. The top GAA transistor 260*b* includes channel layers sandwiched between the second source/drain features. Each channel layer is an active channel layer. One difference is that the bottom GAA transistor 260*a* has at least one more channel layer 208 than the top GAA transistor 260*b*. Accordingly, the bottom GAA transistor 260*a* has at least one more active channel layer than the top GAA transistor 260*b*. In various embodiments, the bottom GAA transistor 260*a* may have two or more active channel layers than the top GAA transistor 260*b*. A common gate structure wraps around each channel layer of the top and bottom GAA transistors. Due to the less channel layers for epitaxial source/drain feature growth, the second source/drain features of the top GAA transistor 260*b* are less in height and volume than the first source/drain features of the bottom GAA transistor 260*a*. Example VI illustrates an alternative embodiment of method 900, where the top GAA transistor 260*b* has at least one more channel layer and thus one more active channel layer than the bottom GAA transistor 260*a*. Due to the less channel layers for epitaxial source/drain feature growth, the first source/drain features of the bottom GAA transistor 260*a* are less in height and volume than the second source/drain features of the top GAA transistor 260*b*. Other features of the alternative embodiment of Example VI are structurally similar to Example V.

Example VII illustrates an embodiment where structures formed using method 100 and structures formed using method 500 are combined. The bottom GAA transistor 260*a* includes channel layers sandwiched between the first source/drain features. The top GAA transistor 260*b* includes a same number of channel layers as the bottom GAA transistor 260*a*. One difference is that not all channel layers of the top GAA transistor 260*b* are sandwiched between the second source/drain features and able to function as active channel layers. At least a bottommost channel layer is adjoined by a dielectric isolation layer 242 and becomes a "floating" channel layer. Also, at least a topmost channel layer is adjoined by a CESL 250 and becomes a "floating" channel layer. Accordingly, the top GAA transistor 260*b* has at least two active channel layers less than the bottom GAA transistor 260*a*. In an alternative embodiment, the top GAA transistor 260*b* may have three or more active channel layers less than the bottom GAA transistor 260*a*. A common gate structure wraps around each channel layer of the top and bottom GAA transistors. Due to the less total number of active channel layers of the second stack for epitaxial source/drain feature growth and recessed top surfaces, the second source/drain features of the top GAA transistor 260*b* are less in height and volume than the first source/drain features of the bottom GAA transistor 260*a*.

Example VIII illustrates an embodiment where structures formed using method 300 and structures formed using method 700 are combined. The bottom GAA transistor 260*a* includes channel layers sandwiched between the first source/drain features. The top GAA transistor 260*b* includes a same number of channel layers as the bottom GAA transistor 260*a*. One difference is that not all channel layers of the bottom GAA transistor 260*a* are sandwiched between the first source/drain features and able to function as active channel layers. At least a bottommost channel layer is adjoined by a dielectric isolation layer 241 and becomes a "floating" channel layer. Also, at least a topmost channel layer is adjoined by a CESL 230 and becomes a "floating" channel layer. Accordingly, the bottom GAA transistor 260*a* has at least two active channel layers less than the top GAA transistor 260*b*. In an alternative embodiment, the bottom GAA transistor 260*a* may have three or more active channel layers less than the top GAA transistor 260*b*. A common gate structure wraps around each channel layer of the top and bottom GAA transistors. Due to the fewer total number of active channel layers of the first stack for epitaxial source/drain feature growth and recessed top surfaces, the first source/drain features of the bottom GAA transistor 260*a* are less in height and volume than the second source/drain features of the top GAA transistor 260*b*.

Example IX illustrates an embodiment where structures formed using method 100, structures formed using method 500, and structures formed using method 900 are combined. The bottom GAA transistor 260*a* includes channel layers sandwiched between the first source/drain features. The top GAA transistor 260*b* includes a less number of channel layers than the bottom GAA transistor 260*a*. Further, not all channel layers of the top GAA transistor 260*b* are sandwiched between the second source/drain features and able to function as active channel layers. At least a bottommost channel layer is adjoined by a dielectric isolation layer 242 and becomes a "floating" channel layer. Also, at least a topmost channel layer is adjoined by a CESL 250 and becomes a "floating" channel layer. Accordingly, the top GAA transistor 260*b* has only a single active channel layer in the illustrated embodiment. State differently, the top GAA transistor 260*b* has at least three active channel layers less than the bottom GAA transistor 260*a*. In an alternative embodiment, the top GAA transistor 260*b* may have four or more active channel layers less than the bottom GAA transistor 260*a*. A common gate structure wraps around each channel layer of the top and bottom GAA transistors. Due to the less total number of active channel layers of the second stack for epitaxial source/drain feature growth and recessed top surfaces, the second source/drain features of the top GAA transistor 260*b* are less in height and volume than the first source/drain features of the bottom GAA transistor 260*a*.

Example X illustrates an embodiment where structures formed using method 300, structures formed using method 700, and structures formed using method 900 are combined. The top GAA transistor 260*b* includes channel layers sandwiched between the second source/drain features. The bottom GAA transistor 260*a* includes a fewer number of channel layers than the top GAA transistor 260*b*. Further, not all channel layers of the bottom GAA transistor 260*a* are sandwiched between the first source/drain features and able to function as active channel layers. At least a bottommost channel layer is adjoined by a dielectric isolation layer 241 and becomes a "floating" channel layer. Also, at least a topmost channel layer is adjoined by a CESL 230 and becomes a "floating" channel layer. Accordingly, the bottom GAA transistor 260*a* has only a single active channel layer in the illustrated embodiment. State differently, the bottom GAA transistor 260*a* has at least three less active channel layers than the top GAA transistor 260*b*. In an alternative embodiment, the bottom GAA transistor 260*a* may have four or more active channel layers less than the top GAA transistor 260*b*. A common gate structure wraps around each channel layer of the top and bottom GAA transistors. Due to the fewer total number of active channel layers of the first stack for epitaxial source/drain feature growth and recessed top surfaces, the first source/drain features of the bottom GAA transistor 260*a* are less in height and volume than the second source/drain features of the top GAA transistor 260*b*.

Example XI illustrates an embodiment where structures formed using method 100 and structures formed using method 900 are combined. The bottom GAA transistor 260*a* includes channel layers sandwiched between the first source/drain features. The top GAA transistor 260*b* includes a less number of channel layers than the bottom GAA transistor 260*a*. Further, not all channel layers of the top GAA transistor 260*b* are sandwiched between the second source/drain features and able to function as active channel layers. At least a bottommost channel layer is adjoined by a dielectric isolation layer 242 and becomes a "floating" channel layer. Accordingly, the top GAA transistor 260*b* has at least two less active channel layers than the bottom GAA transistor 260*a*. In an alternative embodiment, the top GAA transistor 260*b* may have three or more active channel layers less than the bottom GAA transistor 260*a*. A common gate structure wraps around each channel layer of the top and bottom GAA transistors. Due to the less total number of active channel layers of the second stack for epitaxial source/drain feature growth, the second source/drain features of the top GAA transistor 260*b* are less in height and volume than the first source/drain features of the bottom GAA transistor 260*a*.

Example XII illustrates an embodiment where structures formed using method 300 and structures formed using method 900 are combined. The top GAA transistor 260*b* includes channel layers sandwiched between the second source/drain features. The bottom GAA transistor 260*a* includes a less number of channel layers than the top GAA transistor 260*b*. Further, not all channel layers of the bottom GAA transistor 260*a* are sandwiched between the first source/drain features and able to function as active channel layers. At least a bottommost channel layer is adjoined by a dielectric isolation layer 241 and becomes a "floating" channel layer. Accordingly, the bottom GAA transistor 260*a* has at least two active channel layers less than the top GAA transistor 260*b*. In an alternative embodiment, the bottom GAA transistor 260*a* may have three or more active channel layers less than the top GAA transistor 260*b*. A common gate structure wraps around each channel layer of the top and bottom GAA transistors. Due to the less total number of active channel layers of the first stack for epitaxial source/drain feature growth, the first source/drain features of the bottom GAA transistor 260*a* are less in height and volume than the second source/drain features of the top GAA transistor 260*b*.

Example XIII illustrates an embodiment where structures formed using method 500 and structures formed using method 900 are combined. The bottom GAA transistor 260*a* includes channel layers sandwiched between the first source/drain features. The top GAA transistor 260*b* includes a less number of channel layers than the bottom GAA transistor 260*a*. Further, not all channel layers of the top GAA transistor 260*b* are sandwiched between the second source/drain features and able to function as active channel layers. At least a bottommost channel layer is adjoined by a CESL 250 and becomes a "floating" channel layer. Accordingly, the top GAA transistor 260*b* has at least two less active channel layers than the bottom GAA transistor 260*a*. In an alternative embodiment, the top GAA transistor 260*b* may have three or more active channel layers less than the bottom GAA transistor 260*a*. A common gate structure wraps around each channel layer of the top and bottom GAA transistors. Due to the less total number of active channel layers of the second stack for epitaxial source/drain feature growth and recessed top surfaces, the second source/drain features of the top GAA transistor 260*b* are less in height and volume than the first source/drain features of the bottom GAA transistor 260*a*.

Example XIV illustrates an embodiment where structures formed using method 700 and structures formed using method 900 are combined. The top GAA transistor 260*b* includes channel layers sandwiched between the second source/drain features. The bottom GAA transistor 260*a* includes a less number of channel layers than the top GAA transistor 260*b*. Further, not all channel layers of the bottom GAA transistor 260*a* are sandwiched between the first source/drain features and able to function as active channel layers. At least a topmost channel layer is adjoined by a CESL 230 and becomes a "floating" channel layer. Accordingly, the bottom GAA transistor 260*a* has at least two less active channel layers than the top GAA transistor 260*b*. In an alternative embodiment, the bottom GAA transistor 260*a* may have three or more active channel layers less than the top GAA transistor 260*b*. A common gate structure wraps around each channel layer of the top and bottom GAA transistors. Due to the less total number of active channel layers of the first stack for epitaxial source/drain feature growth and recessed top surfaces, the first source/drain features of the bottom GAA transistor 260*a* are less in height and volume than the second source/drain features of the top GAA transistor 260*b*.

Example XV illustrates an embodiment where a workpiece is formed by method 1100. The top and bottom GAA transistors are separated by a dielectric isolation layer 242. Each of the top and bottom GAA transistors has its own gate structure. The bottom GAA transistor 260*a* includes channel layers sandwiched between the first source/drain features. The top GAA transistor 260*b* includes channel layers sandwiched between the second source/drain features. Each channel layer is an active channel layer. One difference is that the bottom GAA transistor 260*a* has at least one more channel layer 208 than the top GAA transistor 260*b*. Accordingly, the bottom GAA transistor 260*a* has at least one more active channel layer than the top GAA transistor 260*b*. In various embodiments, the bottom GAA transistor 260*a* may have two or more active channel layers than the top GAA transistor 260*b*. Due to the less channel layers for epitaxial source/drain feature growth, the second source/drain features of the top GAA transistor 260*b* are less in height and volume than the first source/drain features of the bottom GAA transistor 260*a*. Alternatively, the top GAA transistor 260*b* may have at least one more active channel layer than the bottom GAA transistor 260*a* in some other embodiments.

Figure 101A:
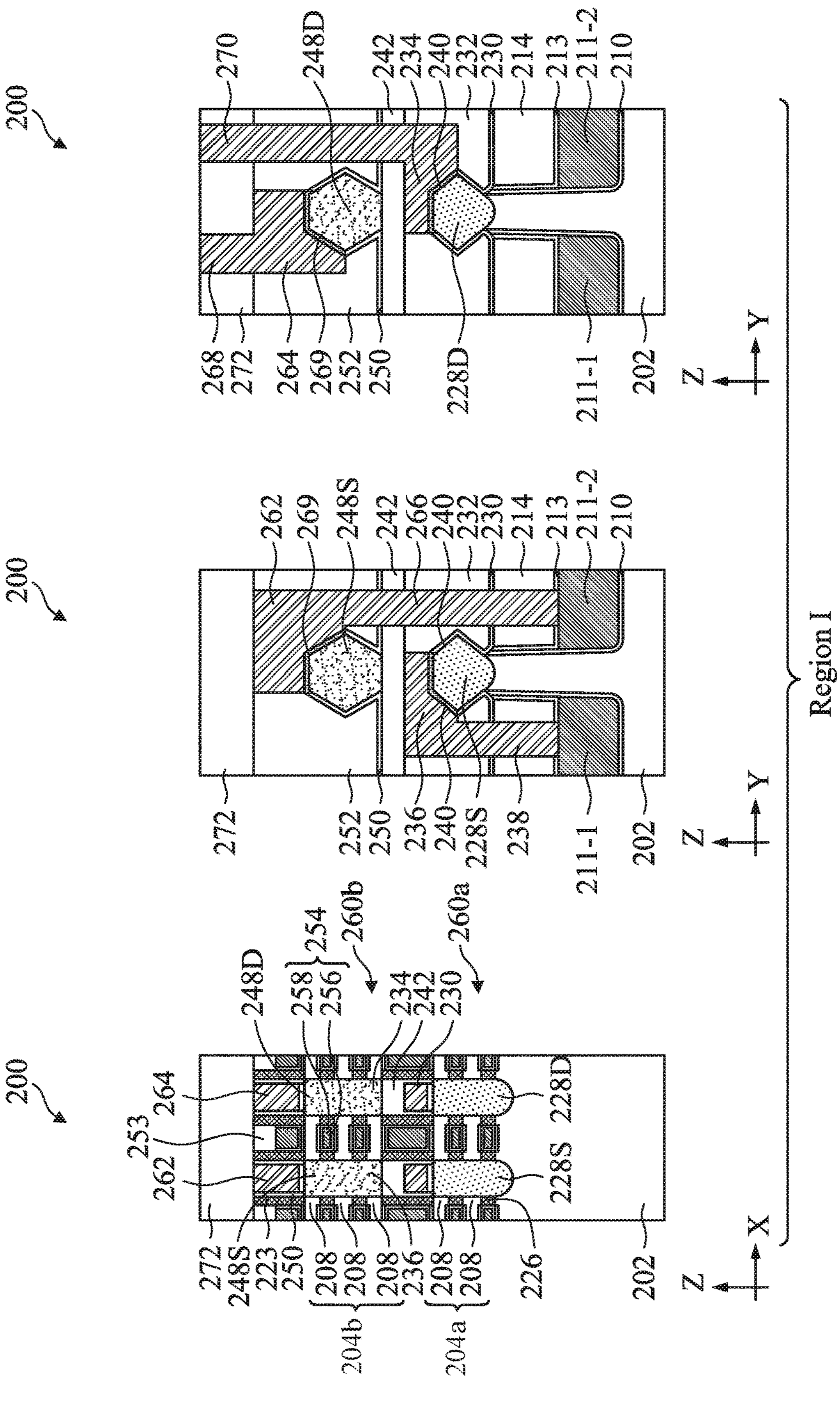
FIGS. 101A and 101B illustrate a fragmentary cross-sectional view of a semiconductor device having two regions with different configurations, according to one or more aspects of the present disclosure.
Figure 101B:
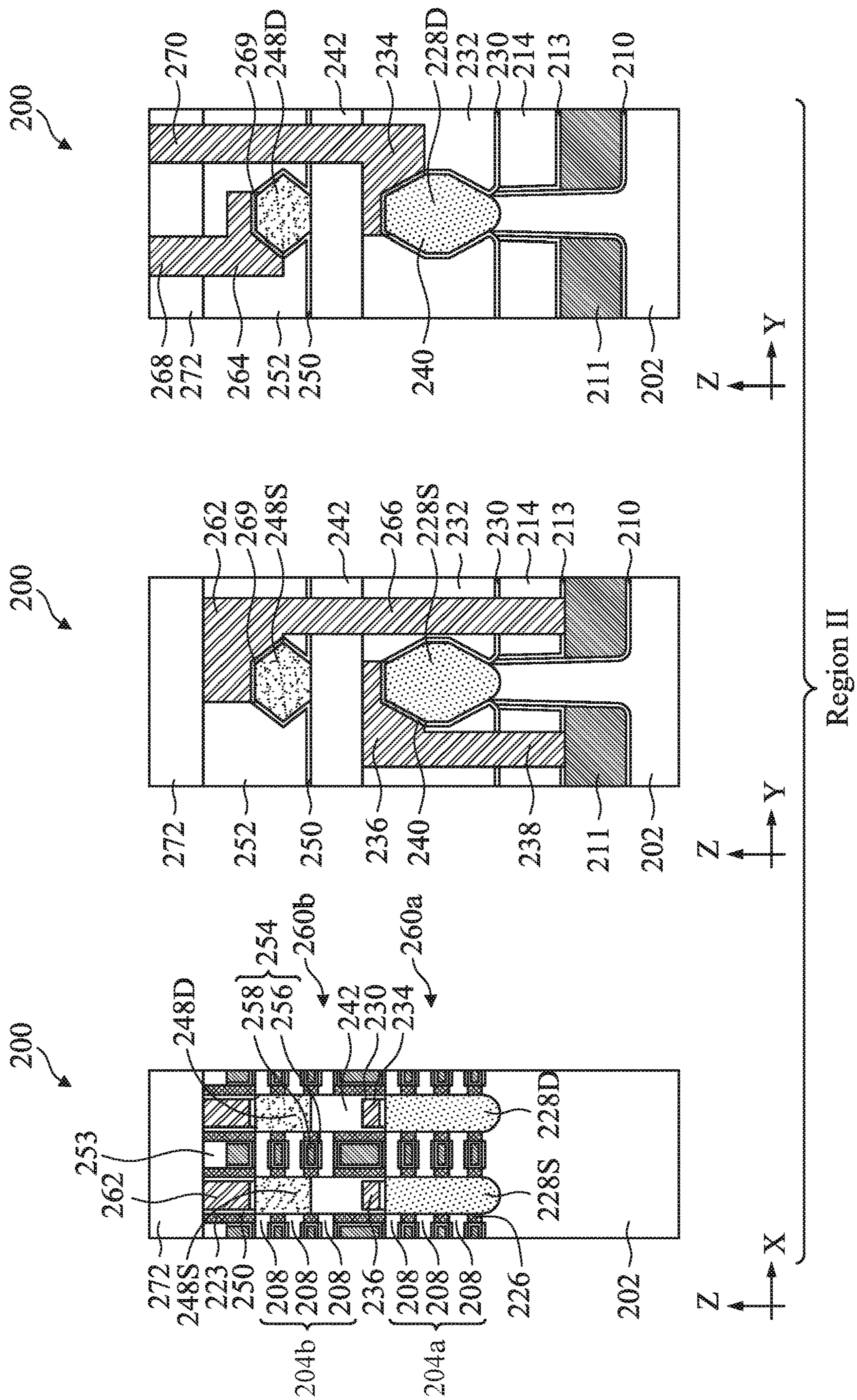

Reference is now made to FIG. 101. Depending on performance needs of a device, the workpiece 200 may have different regions having equal or different active channel members in the pair of stacked GAA transistors, respectively. In the illustrated embodiment, Region I has a pair of stacked GAA transistors that each has equal number of active channel layers, while Region II has a pair of stacked GAA transistor that have different numbers of active channel layers. Structures similar to Example I is shown in Region II, which is for the sake of example and are non-limiting. For example, Examples II-XV in FIGS. 99 and 100 may be formed in Region II by applying processes described in methods 100, 300, 500, 700, 900, 1100, or combinations thereof to Region II.

Embodiments of the present disclosure provide advantages. The present disclosure provides different number of active channel layers for transistors in a stacked configuration in different embodiments. By having different number of active channel layers in the stacked configuration, output currents from the pair of stacked transistors can be balanced. Further, one IC chip may include two regions, one having stacked GAA transistors with the same number of active channel layers, and another having stacked GAA transistors with different numbers of active channel layers, providing flexibility to fit different application needs on one chip and improving device performance. Furthermore, the stacked transistors formation method can be easily integrated into existing semiconductor fabrication processes.

In one exemplary aspect, the present disclosure is directed to a semiconductor device. The semiconductor device includes a stack of first channel layers; first and second source/drain (S/D) epitaxial features adjacent to opposite sides of at least a portion of the first channel layers, respectively, wherein the first and second S/D epitaxial features have a first conductivity type; a stack of second channel layers stacked over the first channel layers; and third and fourth source/drain (S/D) epitaxial features adjacent to opposite sides of at least a portion of the second channel layers, respectively, wherein the third and fourth S/D epitaxial features have a second conductivity type, wherein a total active channel layer number of the first channel layers is different from that of the second channel layers. In some embodiments, a difference between the total active channel layer numbers of the first channel layers and the second channel layers is equal to or larger than two. In some embodiments, the semiconductor device further includes a dielectric isolation layer that isolates at least one of the first, second, third, and fourth S/D epitaxial features from adjoining one of the first and second channel layers. In some embodiments, the dielectric isolation layer is disposed between the first channel layers and the second channel layers, wherein the dielectric isolation layer isolates both the third and fourth S/D epitaxial features from adjoining a bottommost channel layer of the second channel layers. In some embodiments, the dielectric isolation layer is disposed below a topmost channel layer of the first channel layers, wherein the dielectric isolation layer isolates both the first and second S/D epitaxial features from adjoining a bottommost channel layer of the first channel layers. In some embodiments, at least one of the first and second S/D epitaxial features has a top surface below a topmost channel layer of the first channel layers. In some embodiments, at least one of the third and fourth S/D epitaxial features has a top surface below a topmost channel layer of the second channel layers. In some embodiments, the semiconductor device further includes a first power rail under the first channel layers and a second power rail above the second channel layers, wherein the first and third S/D epitaxial features are electrically coupled to the first power rail, and the second and fourth S/D epitaxial features are electrically coupled to the second power rail. In some embodiments, the third S/D epitaxial feature is directly above the first S/D epitaxial feature, and the fourth S/D epitaxial feature is directly above the second S/D epitaxial feature. In some embodiments, the semiconductor device further includes a gate structure that wraps around each of the first and second channel layers. In some embodiments, the first and second conductivity types are opposite.

In another exemplary aspect, the present disclosure is directed to a semiconductor device. The semiconductor device includes a substrate; a first transistor over the substrate, the first transistor including first channel layers and a first source/drain (S/D) feature adjoining active members of the first channel layers; and a second transistor over the first transistor, the second transistor including second channel layers and a second S/D feature adjoining active members of the second channel layers, wherein a number of the active members of the first channel layers is different from that of the active members of the second channel layers. In some embodiments, a number of the first channel layers is different from that of the second channel layers. In some embodiments, a number of the first channel layer equals that of the second channel layers. In some embodiments, the semiconductor device further includes a gate structure that wraps around each of the first and second channel layers. In some embodiments, the semiconductor device further includes a first gate structure that wraps around each of the first channel layers; a second gate structure that wraps around each of the second channel layers; and an isolation layer disposed between the first and second gate structures. In some embodiments, the semiconductor device further includes a power rail under the first channel layers, wherein both of the first and second S/D features are electrically coupled to the power rail.

In yet another exemplary aspect, the present disclosure is directed to a method. The method includes receiving a workpiece including a substrate portion and a stack portion over the substrate portion, the stack portion including a first stack of first channel layers interleaved by first sacrificial layers and a second stack of second channel layers interleaved by second sacrificial layers, the second stack being above the first stack; forming a fin-shaped structure from the stack portion and the substrate portion, the fin-shaped structure including a source region and a drain region; forming a first source feature in the source region and a first drain feature in the drain region; depositing an isolation layer over the first source feature and the first drain feature, the isolation layer adjoining at least a bottommost one of the second channel layers; and forming a second source feature in the source region and over the isolation layer and a second drain feature in the drain region and over the isolation layer. In some embodiments, the method further includes recessing the second source feature and the second drain feature below a topmost one of the second channel layers; and depositing a dielectric layer over the second source feature and the second drain feature, the dielectric layer adjoining the topmost one of the second channel layers. In some embodiments, the method further includes forming a first power rail under the first stack; forming a second power rail above the second stack; forming first interconnection features that electrically couple the first source feature and the second source feature to the first power rail; and forming second interconnection features that electrically couple the first drain feature and the second drain feature to the second power rail.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a stack of first channel layers;

first and second source/drain (S/D) epitaxial features adjacent to opposite sides of at least a portion of the first channel layers, respectively, wherein the first and second S/D epitaxial features have a first conductivity type;

a stack of second channel layers stacked over the first channel layers;

third and fourth S/D epitaxial features adjacent to opposite sides of at least a portion of the second channel layers, respectively, wherein the third and fourth S/D epitaxial features have a second conductivity type; and a dielectric isolation layer disposed under the first and second S/D epitaxial features, wherein a total active channel layer number of the first channel layers is different from a total active channel layer number of the second channel layers, and wherein the dielectric isolation layer is in physical contact with at least a bottommost one of the first channel layers.

2. The semiconductor device of claim 1, wherein the dielectric isolation layer is a first dielectric isolation layer, the semiconductor device further comprising:

a second dielectric isolation layer disposed vertically between the first and second S/D epitaxial features and the third and fourth S/D epitaxial features.

3. The semiconductor device of claim 2, wherein the second dielectric isolation layer isolates the first and second S/D epitaxial features from physically contacting a topmost one of the first channel layers.

4. The semiconductor device of claim 2, wherein the second dielectric isolation layer is in physical contact with the first and second S/D epitaxial features and the third and fourth S/D epitaxial features.

5. The semiconductor device of claim 1, wherein the third and fourth S/D epitaxial features are in physical contact with a bottommost one of the second channel layers.

6. The semiconductor device of claim 1, wherein the first and second S/D epitaxial features are in physical contact with a topmost one of the first channel layers.

7. The semiconductor device of claim 1, wherein at least one of the first and second S/D epitaxial features has a top surface below a topmost one of the first channel layers.

8. The semiconductor device of claim 1, further comprising:

a first power rail under the first channel layers; and a second power rail above the second channel layers, wherein the first and third S/D epitaxial features are electrically coupled to the first power rail, and the second and fourth S/D epitaxial features are electrically coupled to the second power rail.

9. The semiconductor device of claim 8, wherein the third S/D epitaxial feature is directly above the first S/D epitaxial feature, and the fourth S/D epitaxial feature is directly above the second S/D epitaxial feature.

10. The semiconductor device of claim 1, further comprising:

a first gate structure that wraps around each of the first channel layers; and a second gate structure that wraps around each of the second channel layers.

11. A semiconductor device, comprising:

a substrate;

a first transistor over the substrate, the first transistor including first channel layers and a first source/drain (S/D) feature adjoining active members of the first channel layers;

a second transistor over the first transistor, the second transistor including second channel layers and a second S/D feature adjoining active members of the second channel layers; and an isolation layer disposed under the first S/D feature, wherein a number of the active members of the first channel layers is different from a number of the active members of the second channel layers, and wherein the isolation layer separates a bottommost one of the first channel layers from physically contacting the first S/D feature.

12. The semiconductor device of claim 11, wherein a number of the first channel layers is different from a number of the second channel layers.

13. The semiconductor device of claim 11, wherein a number of the first channel layers equals a number of the second channel layers.

14. The semiconductor device of claim 11, wherein the number of the active members of the first channel layers is smaller than the number of the active members of the second channel layers.

15. The semiconductor device of claim 11, wherein the first and second transistors are of opposite conductivity types.

16. The semiconductor device of claim 11, wherein the isolation layer is in physical contact with both the bottommost one of the first channel layers and the first S/D feature.

17. The semiconductor device of claim 12, further comprising:

a power rail under the first channel layers, wherein both of the first and second S/D features are electrically coupled to the power rail.

18. A method, comprising:

receiving a workpiece including a substrate portion and a stack portion over the substrate portion, the stack portion including a first stack of first channel layers interleaved by first sacrificial layers and a second stack of second channel layers interleaved by second sacrificial layers, the second stack being above the first stack;

forming a fin-shaped structure from the stack portion, the fin-shaped structure including a source region and a drain region;

depositing an isolation layer in the source region and the drain region, the isolation layer adjoining at least a bottommost one of the first channel layers;

after the depositing of the isolation layer, forming a first source feature in the source region and a first drain feature in the drain region; and forming a second source feature in the source region and over the first source feature and a second drain feature in the drain region and over the first drain feature.

19. The method of claim 18, further comprising:

prior to the forming of the second source feature and the second drain feature, depositing a dielectric layer over the first source feature and the first drain feature.

20. The method of claim 19, wherein the dielectric layer is in physical contact with a topmost one of the first channel layers.

* * * * *